(12) United States Patent
Gundel

(10) Patent No.: US 9,119,292 B2
(45) Date of Patent: *Aug. 25, 2015

(54) SHIELDED ELECTRICAL CABLE IN TWINAXIAL CONFIGURATION

(75) Inventor: Douglas B. Gundel, Cedar Park, TX (US)

(73) Assignee: 3M Innovative Properties Company, St. Paul, MN (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/520,347

(22) PCT Filed: Dec. 16, 2010

(86) PCT No.: PCT/US2010/060640
§ 371 (c)(1),
(2), (4) Date: Jul. 3, 2012

(87) PCT Pub. No.: WO2012/030367
PCT Pub. Date: Mar. 8, 2012

(65) Prior Publication Data
US 2014/0209343 A1    Jul. 31, 2014

Related U.S. Application Data

(60) Provisional application No. 61/378,902, filed on Aug. 31, 2010.

(51) Int. Cl.
*H05K 9/00* (2006.01)
*H01B 11/06* (2006.01)
(Continued)

(52) U.S. Cl.
CPC ............ *H05K 9/0064* (2013.01); *H01B 7/0861* (2013.01); *H01B 9/02* (2013.01); *H01B 7/0838* (2013.01); *H01B 11/002* (2013.01); *H01B 11/203* (2013.01)

(58) Field of Classification Search
USPC .................. 174/36, 102 R, 113 R, 117 F, 350
See application file for complete search history.

(56) References Cited

U.S. PATENT DOCUMENTS 3,496,281 A    2/1970   McMahon
3,775,552 A    11/1973  Schumacher
(Continued)

FOREIGN PATENT DOCUMENTS

DE    911277    9/1954
DE    2644252   9/1976
(Continued)

OTHER PUBLICATIONS

PCT International Search Report for PCT/US2010/060640 mailed Jul. 21, 2011, 5 pages.

*Primary Examiner* — Timothy Thompson
*Assistant Examiner* — Sherman Ng
(74) *Attorney, Agent, or Firm* — Robert S. Moshrefzadeh

(57) ABSTRACT

A shielded electrical cable includes one or more conductor sets extending along a length of the cable and being spaced apart from each other along a width of the cable. Each conductor set has one or more conductors having a size no greater than 24 AWG and each conductor set has an insertion loss of less than about −20 dB/meter over a frequency range of 0 to 20 GHz. First and second shielding films are disposed on opposite sides of the cable, the first and second films including cover portions and pinched portions arranged such that, in transverse cross section, the cover portions of the first and second films in combination substantially surround each conductor set, and the pinched portions of the first and second films in combination form pinched portions of the cable on each side of each conductor.

4 Claims, 78 Drawing Sheets

(51) Int. Cl.
*H01B 9/02* (2006.01)
*H01B 7/00* (2006.01)
*H01B 7/08* (2006.01)
H01B 11/00 (2006.01)
H01B 11/20 (2006.01)

(56) References Cited

U.S. PATENT DOCUMENTS

| | | | |
|---|---|---|---|
| 3,993,394 A | 11/1976 | Cooper | |
| 4,099,323 A | 7/1978 | Bouvier | |
| 4,149,026 A | 4/1979 | Fritz et al. | |
| 4,185,162 A | 1/1980 | Bogese | |
| 4,234,759 A * | 11/1980 | Harlow | 174/104 |
| 4,287,385 A | 9/1981 | Dombrowsky | |
| 4,382,236 A | 5/1983 | Suzuki | |
| 4,404,424 A | 9/1983 | King et al. | |
| 4,412,092 A | 10/1983 | Hansell, III | |
| 4,449,778 A | 5/1984 | Lane | |
| 4,468,089 A | 8/1984 | Brorein | |
| 4,470,195 A | 9/1984 | Lang | |
| 4,475,006 A | 10/1984 | Olyphant | |
| 4,481,379 A | 11/1984 | Bolick et al. | |
| 4,487,992 A | 12/1984 | Tomita | |
| 4,490,574 A | 12/1984 | Tomita et al. | |
| 4,492,815 A | 1/1985 | Maros | |
| 4,611,656 A | 9/1986 | Kendall et al. | |
| 4,705,332 A | 11/1987 | Sadigh-Behzadi | |
| 4,720,155 A | 1/1988 | Schildkraut et al. | |
| 4,735,583 A | 4/1988 | Rudy, Jr. et al. | |
| 4,767,345 A | 8/1988 | Gutter et al. | |
| 4,780,157 A | 10/1988 | Coon | |
| 4,800,236 A | 1/1989 | Lemke | |
| 4,850,898 A | 7/1989 | Gallusser | |
| 4,920,234 A | 4/1990 | Lemke | |
| 5,057,646 A | 10/1991 | Nichols et al. | |
| 5,084,594 A | 1/1992 | Cady et al. | |
| 5,090,911 A | 2/1992 | Welsh | |
| 5,132,489 A | 7/1992 | Yamano | |
| 5,144,098 A * | 9/1992 | VanDeusen | 174/36 |
| 5,162,611 A | 11/1992 | Nichols, III et al. | |
| 5,171,161 A | 12/1992 | Kachlic | |
| 5,184,965 A | 2/1993 | Myschik et al. | |
| 5,235,132 A | 8/1993 | Ainsworth et al. | |
| 5,244,415 A | 9/1993 | Marsilio et al. | |
| 5,250,127 A | 10/1993 | Hara | |
| 5,268,531 A | 12/1993 | Nguyen et al. | |
| 5,279,415 A | 1/1994 | Edgley et al. | |
| 5,286,924 A | 2/1994 | Loder et al. | |
| 5,380,216 A | 1/1995 | Broesteeg et al. | |
| 5,441,424 A | 8/1995 | Morlion et al. | |
| 5,446,239 A | 8/1995 | Mizutani et al. | |
| 5,460,533 A | 10/1995 | Broeksteeg et al. | |
| 5,477,159 A | 12/1995 | Hamling | |
| 5,483,020 A | 1/1996 | Hardie et al. | |
| 5,507,653 A | 4/1996 | Stoner | |
| 5,511,992 A | 4/1996 | Thalhammer | |
| 5,518,421 A | 5/1996 | Davis | |
| 5,524,766 A | 6/1996 | Marchek et al. | |
| 5,600,544 A | 2/1997 | Thalhammer | |
| 5,632,634 A | 5/1997 | Soes | |
| 5,702,258 A | 12/1997 | Provencher et al. | |
| 5,743,765 A | 4/1998 | Andrews et al. | |
| 5,766,036 A | 6/1998 | Ahmad et al. | |
| 5,767,442 A | 6/1998 | Eisenberg et al. | |
| 5,775,924 A | 7/1998 | Miskin et al. | |
| 5,804,768 A | 9/1998 | Sexton | |
| 5,900,588 A | 5/1999 | Springer et al. | |
| 5,934,942 A | 8/1999 | Patel et al. | |
| 5,938,476 A | 8/1999 | Wu et al. | |
| 5,941,733 A | 8/1999 | Lai | |
| 6,007,385 A | 12/1999 | Wu | |
| 6,039,606 A | 3/2000 | Chiou | |
| 6,089,916 A | 7/2000 | Kuo | |
| 6,207,901 B1 * | 3/2001 | Smith et al. | 174/102 R |
| 6,367,128 B1 | 4/2002 | Galkiewicz et al. | |
| 6,403,887 B1 * | 6/2002 | Kebabjian et al. | 174/110 R |
| 6,444,902 B1 | 9/2002 | Tsao et al. | |
| 6,524,135 B1 | 2/2003 | Feldman et al. | |
| 6,546,604 B2 | 4/2003 | Galkiewicz et al. | |
| 6,588,074 B2 | 7/2003 | Galkiewicz et al. | |
| 6,717,058 B2 | 4/2004 | Booth et al. | |
| 6,763,556 B2 | 7/2004 | Fagan et al. | |
| 6,815,611 B1 * | 11/2004 | Gareis | 174/36 |
| 6,831,230 B2 | 12/2004 | Ide et al. | |
| 7,267,575 B1 | 9/2007 | Hwang et al. | |
| 7,329,141 B2 | 2/2008 | Kumakura et al. | |
| 7,807,927 B2 | 10/2010 | Yeh | |
| 2002/0020545 A1 | 2/2002 | Suzuki | |
| 2003/0085052 A1 | 5/2003 | Tsao et al. | |
| 2003/0213610 A1 | 11/2003 | Ide et al. | |
| 2006/0016615 A1 | 1/2006 | Schilson et al. | |
| 2006/0054334 A1 | 3/2006 | Vaupotic et al. | |
| 2006/0172588 A1 | 8/2006 | Peng | |
| 2006/0207784 A1 | 9/2006 | Chang | |
| 2007/0240898 A1 | 10/2007 | Reichert et al. | |
| 2010/0051314 A1 * | 3/2010 | Watanabe et al. | 174/102 R |
| 2010/0186225 A1 | 7/2010 | Reichert | |
| 2012/0090866 A1 | 4/2012 | Gundel | |
| 2012/0090872 A1 | 4/2012 | Gundel | |
| 2012/0090873 A1 | 4/2012 | Gundel | |
| 2012/0097421 A1 | 4/2012 | Gundel | |

FOREIGN PATENT DOCUMENTS

| | | |
|---|---|---|
| DE | 2547152 | 4/1977 |
| DE | 2758472 | 12/1977 |
| DE | 26 44 252 | 3/1978 |
| DE | 27 58 472 | 7/1979 |
| DE | 3522173 | 7/1986 |
| EP | 0 082 700 | 6/1983 |
| EP | 103430 | 3/1984 |
| EP | 0 284 245 | 9/1988 |
| EP | 0 446 980 | 9/1991 |
| EP | 0 477 006 | 3/1992 |
| EP | 0 548 942 | 6/1993 |
| EP | 0 654 859 | 5/1995 |
| EP | 0 696 085 | 2/1996 |
| EP | 0 907 221 | 4/1999 |
| EP | 0 961 298 | 12/1999 |
| GB | 1 546 609 | 5/1979 |
| JP | 60 140309 | 9/1985 |
| JP | 60-140309 | 9/1985 |
| JP | 61 133914 | 8/1986 |
| JP | 61-133914 | 8/1986 |
| JP | 1023947 | 1/1989 |
| JP | H03-48808 | 7/1989 |
| JP | H01-298605 | 12/1989 |
| JP | 4-36906 | 2/1992 |
| JP | 4 36906 | 2/1992 |
| JP | H06-5042 | 1/1994 |
| JP | 08-203350 | 8/1996 |
| JP | H10-223056 | 8/1998 |
| JP | 2000082346 | 3/2000 |
| JP | 2001135157 | 5/2001 |
| JP | 2002-117731 | 4/2002 |
| JP | 2003281944 | 10/2003 |
| JP | 2005-116300 | 4/2005 |
| JP | 2006 286480 | 10/2006 |
| JP | 2007265640 | 10/2007 |
| JP | 4164979 | 8/2008 |
| JP | 4164979 | 10/2008 |
| JP | 2009093934 | 4/2009 |
| JP | 2010 097882 | 4/2010 |
| WO | WO 2006/113702 | 10/2006 |
| WO | WO 2009/130859 | 10/2009 |

* cited by examiner

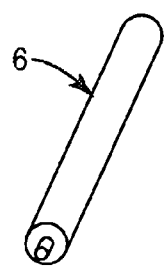
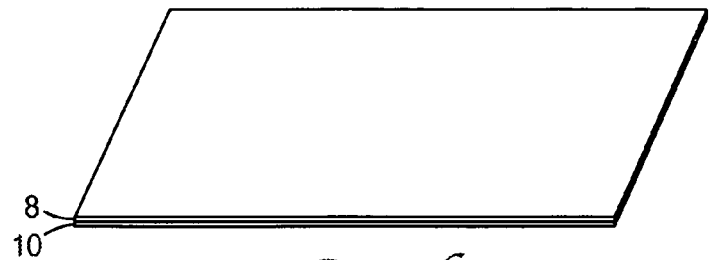
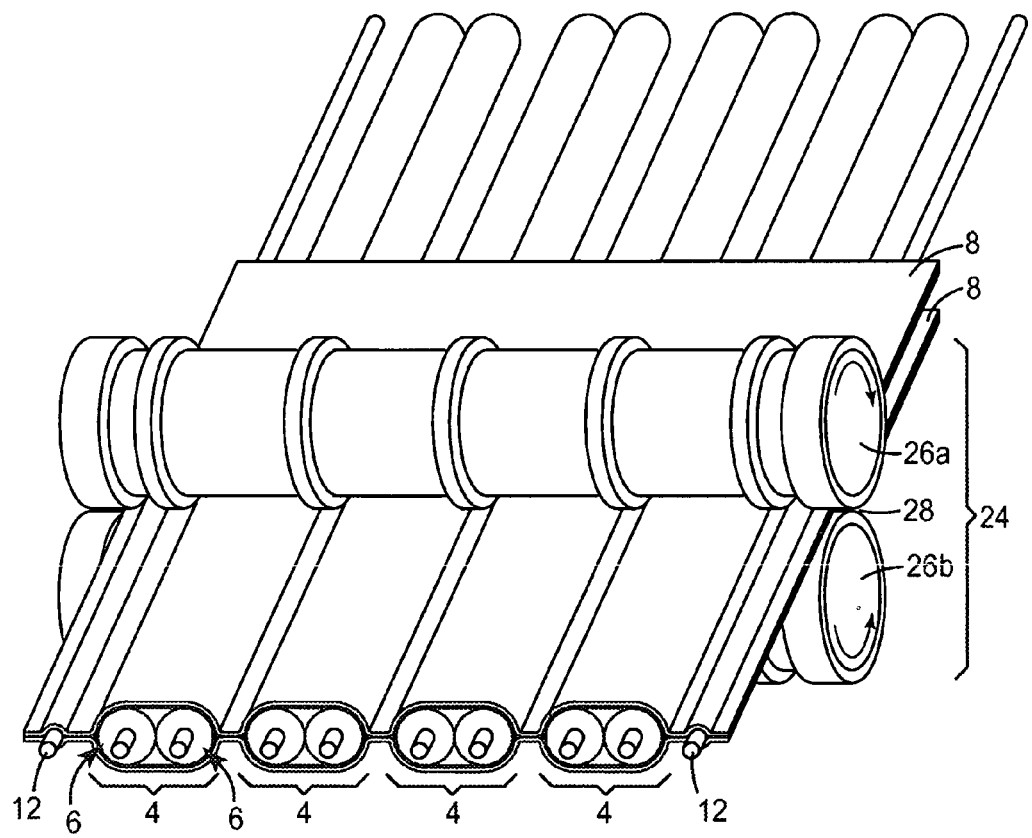

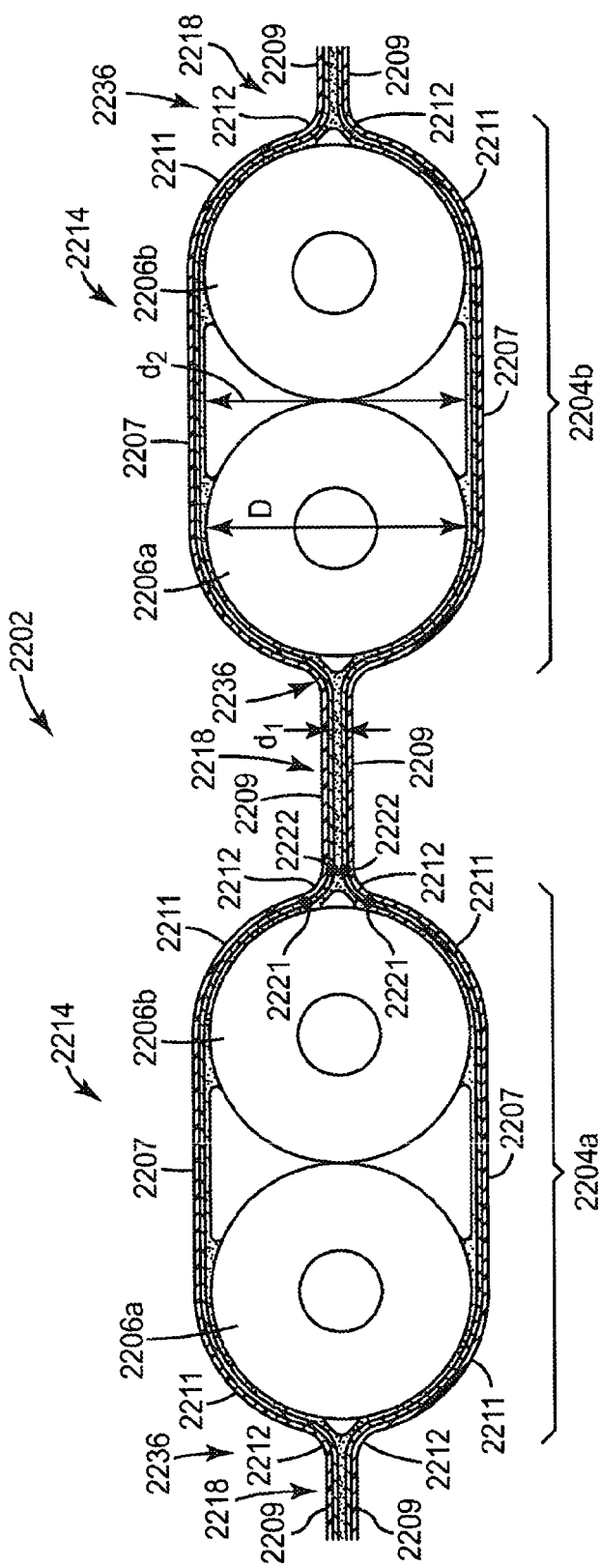

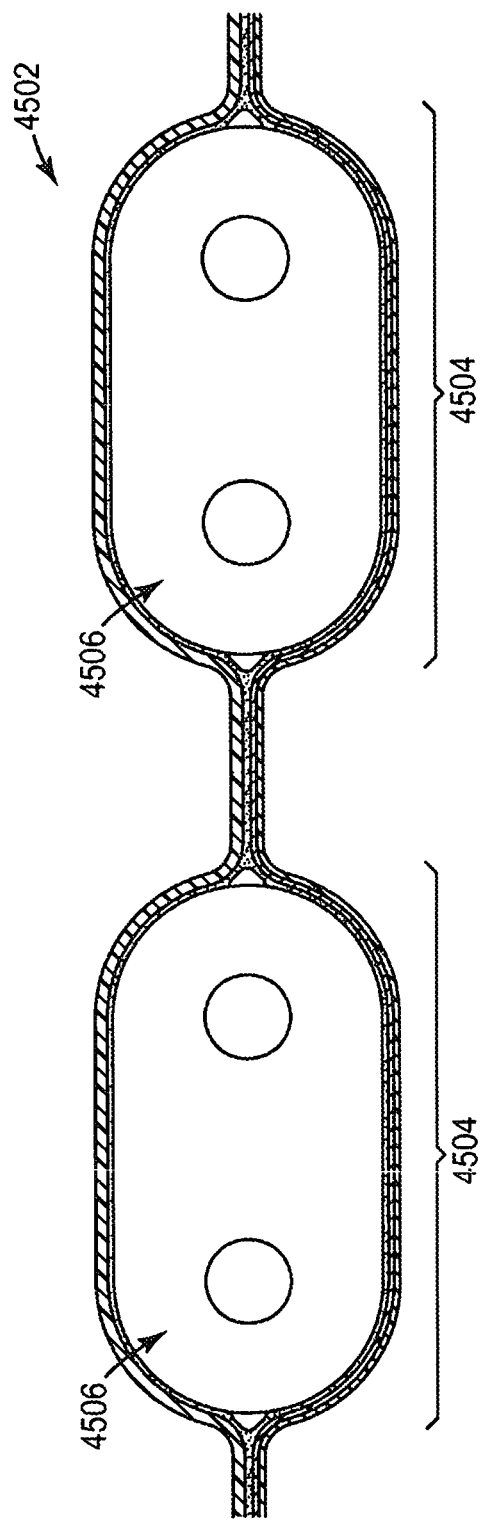

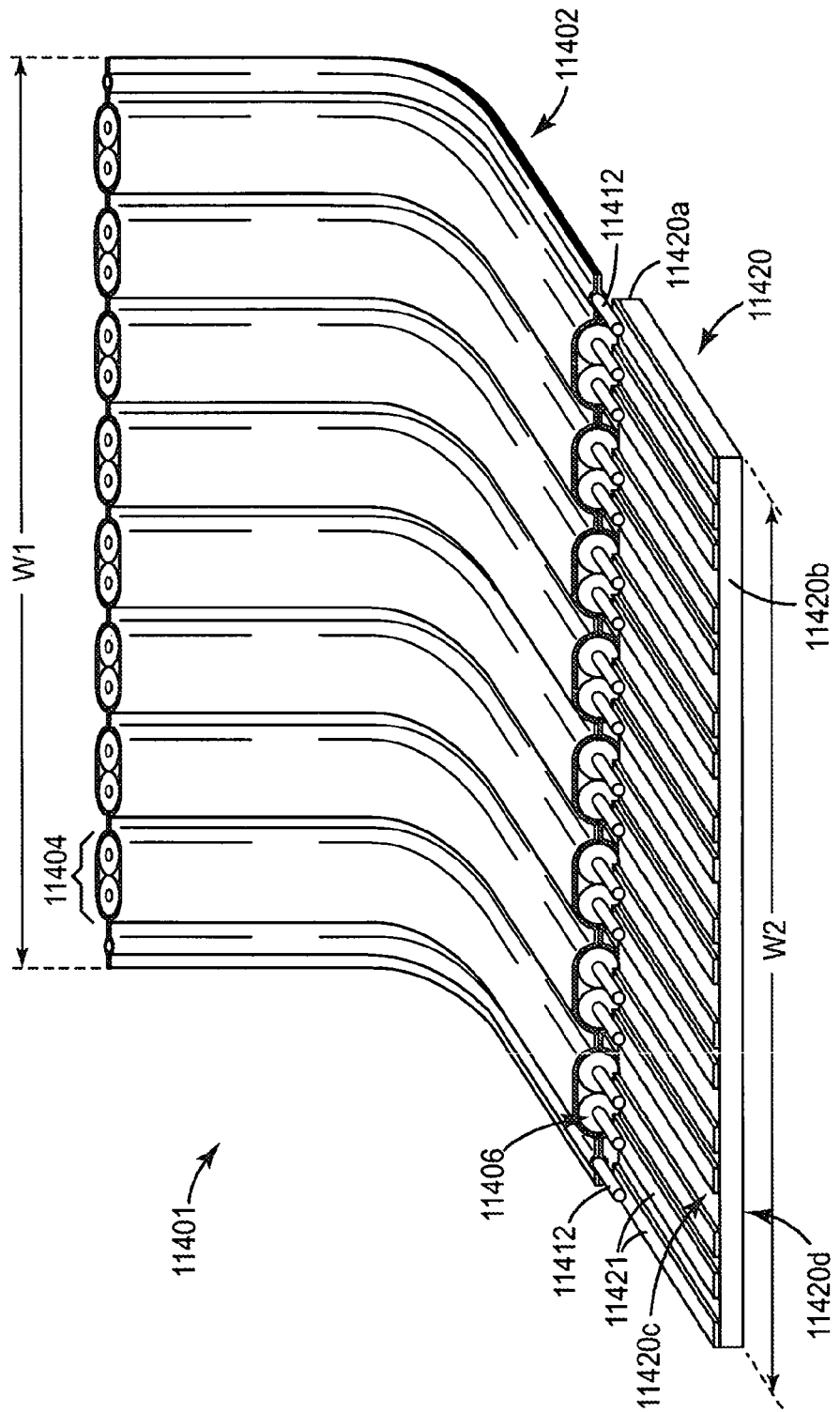

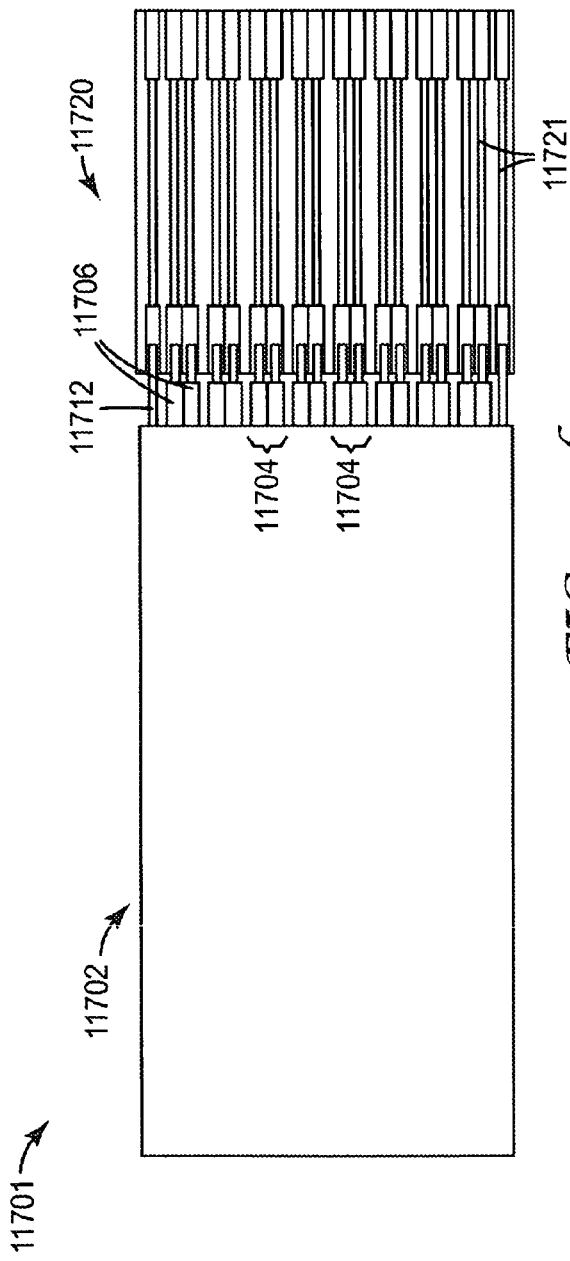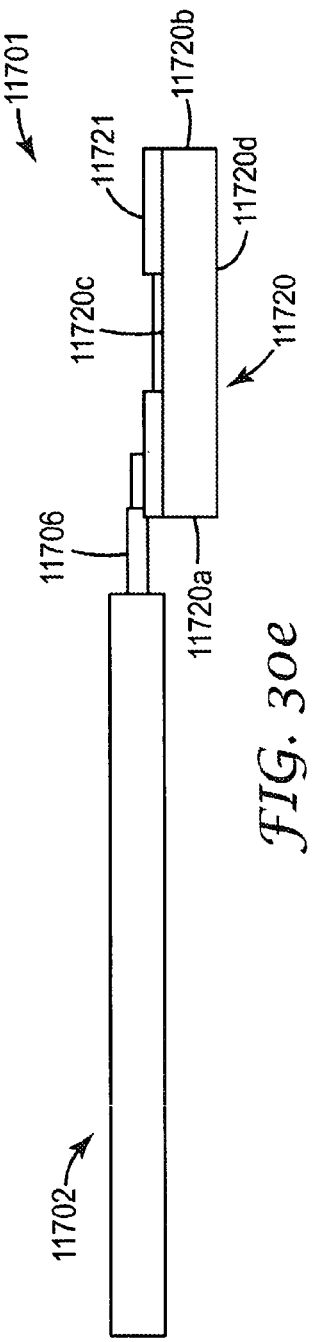

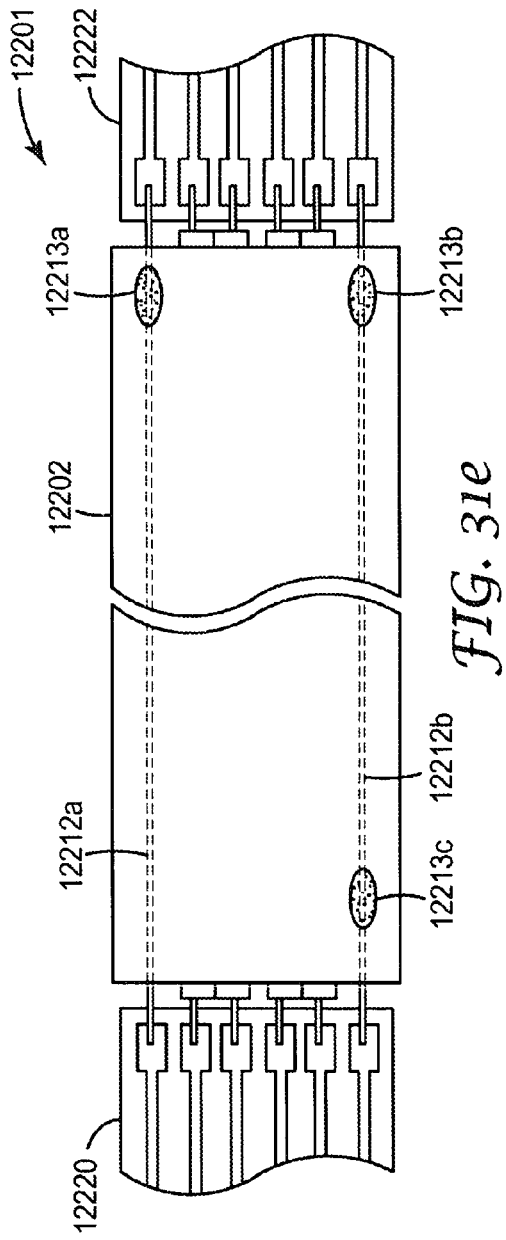
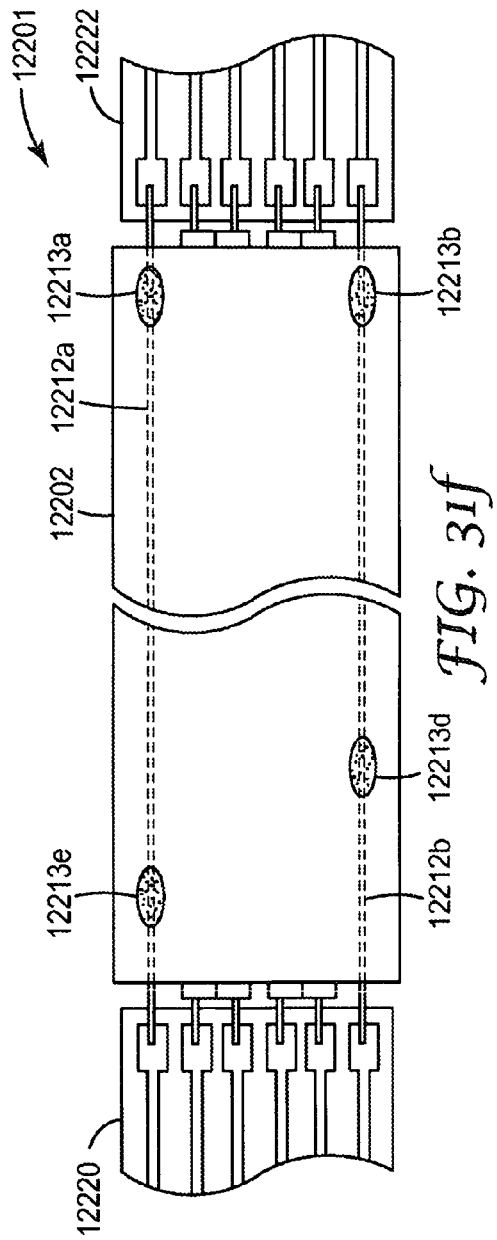

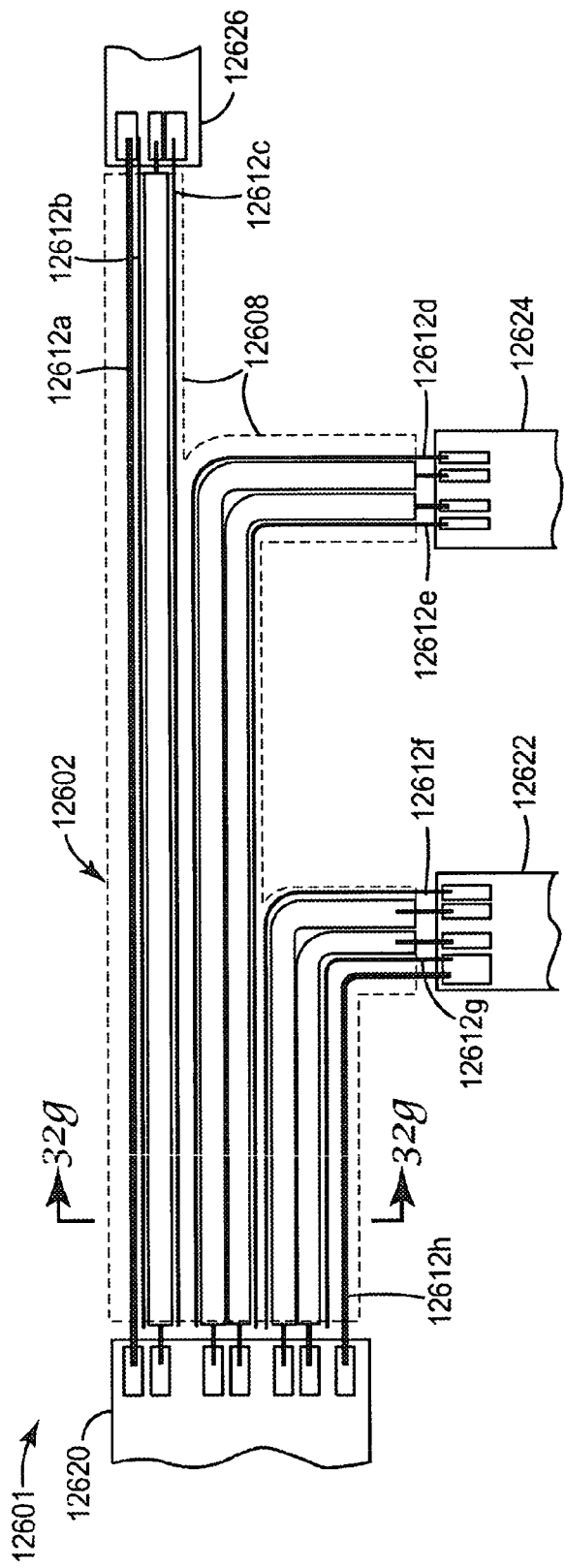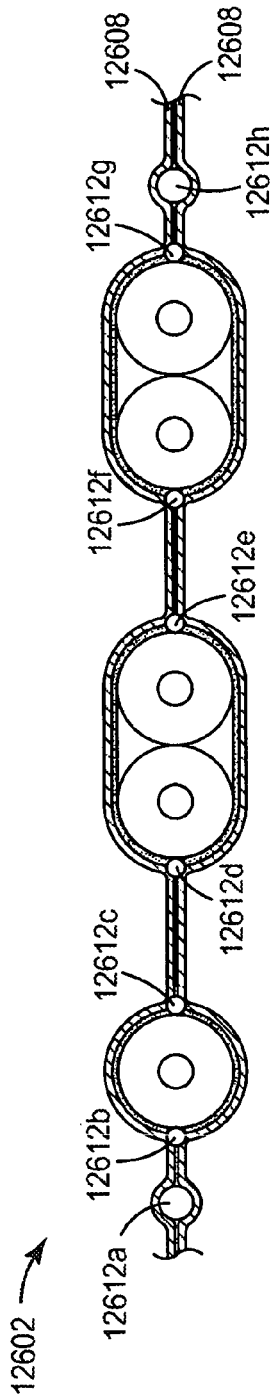
FIG. 32e
FIG. 32f

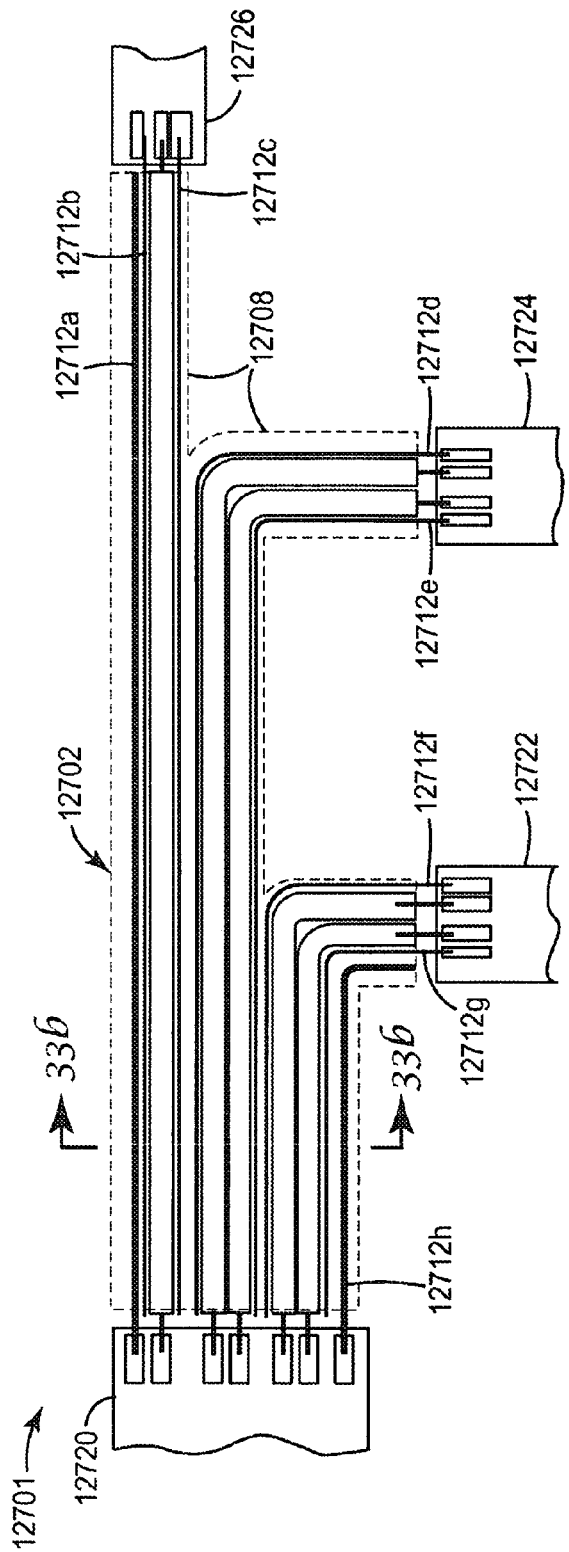
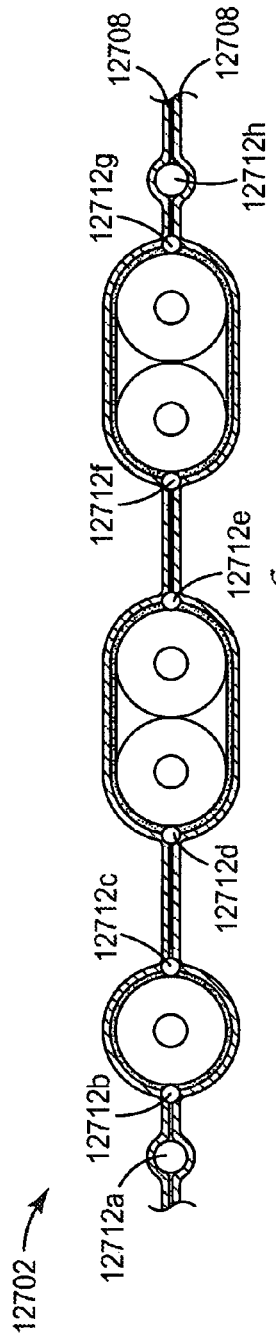
FIG. 33a
FIG. 33b

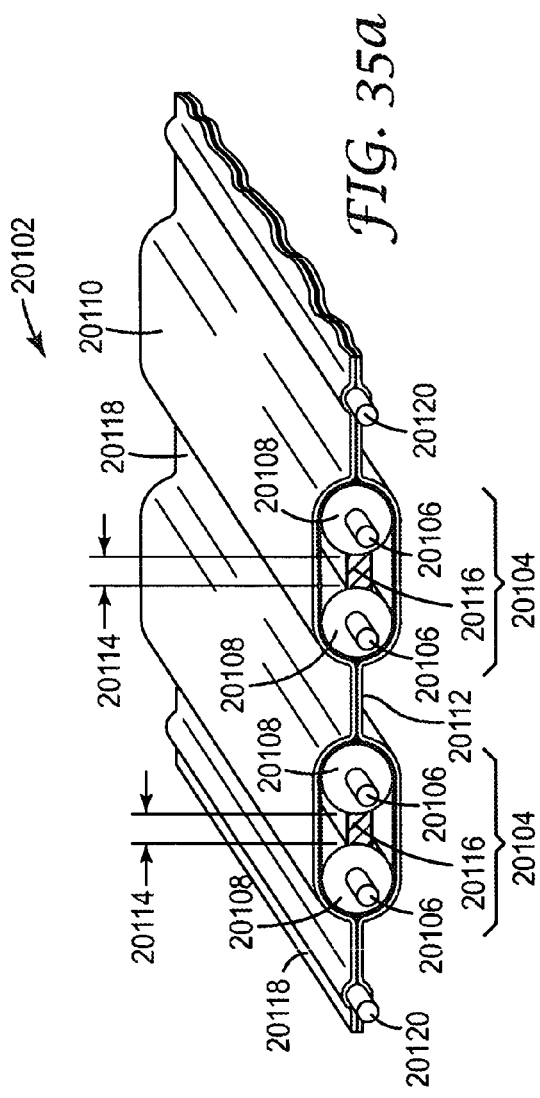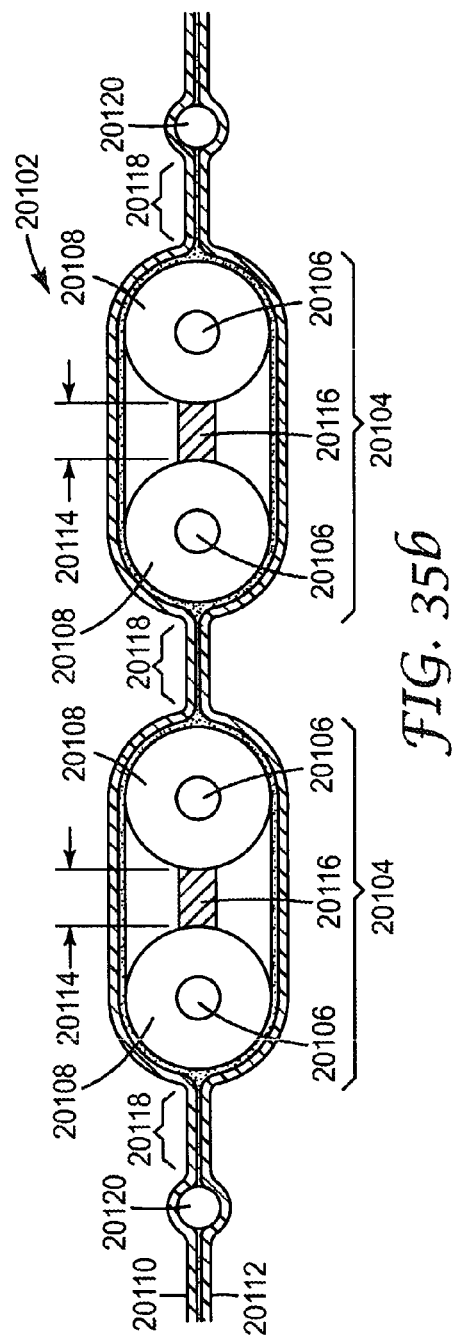

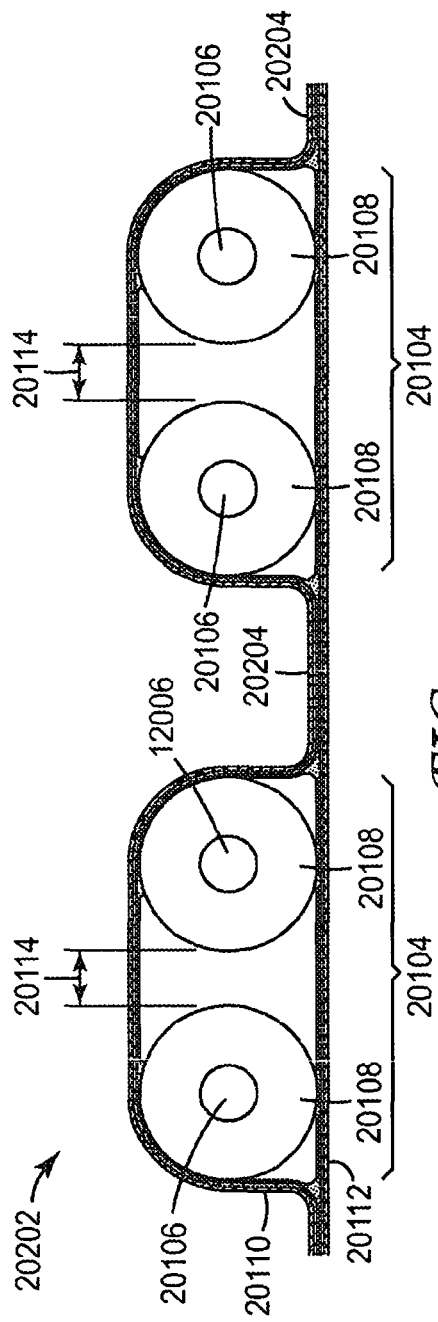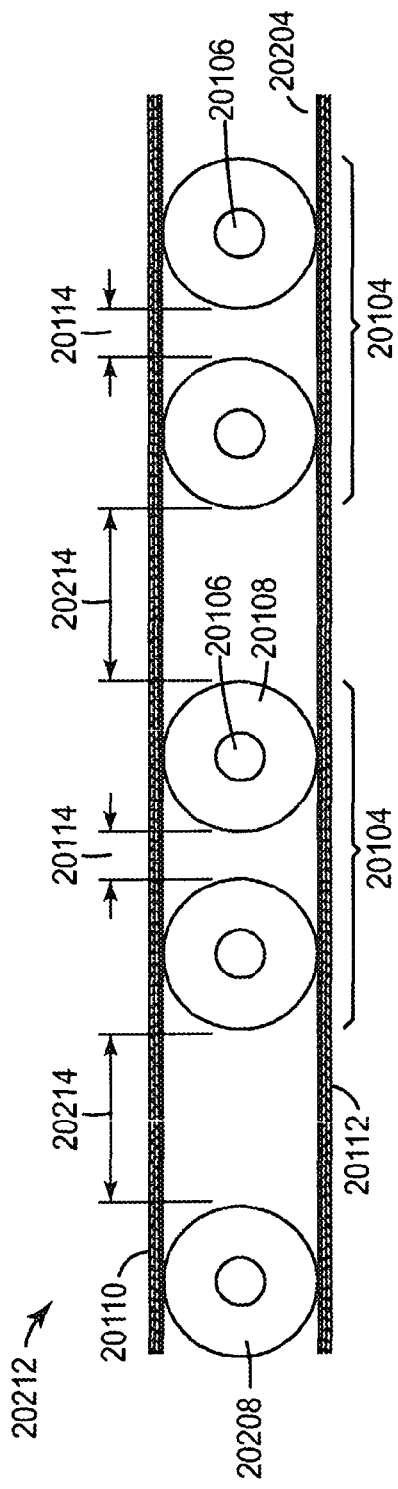

SHIELDED ELECTRICAL CABLE IN TWINAXIAL CONFIGURATION

CROSS REFERENCE TO RELATED APPLICATIONS

This application is a national stage filing under 35 U.S.C. 371 of PCT/US2010/060640, filed Dec. 16, 2010, which claims priority to U.S. Provisional Application No. 61/378,902, filed Aug. 31, 2010, the disclosures of which are incorporated by reference in their entirety herein.

TECHNICAL FIELD

The present disclosure relates generally to electrical cables and connectors.

BACKGROUND

Electrical cables for transmission of electrical signals are well known. One common type of electrical cable is a coaxial cable. Coaxial cables generally include an electrically conductive wire surrounded by an insulator. The wire and insulator are surrounded by a shield, and the wire, insulator, and shield are surrounded by a jacket. Another common type of electrical cable is a shielded electrical cable comprising one or more insulated signal conductors surrounded by a shielding layer formed, for example, by a metal foil. To facilitate electrical connection of the shielding layer, a further uninsulated conductor is sometimes provided between the shielding layer and the insulation of the signal conductor or conductors. Both these common types of electrical cable normally require the use of specifically designed connectors for termination and are often not suitable for the use of mass-termination techniques, i.e., the simultaneous connection of a plurality of conductors to individual contact elements, such as contacts of an electrical connector or contact elements on a printed circuit board.

SUMMARY

A shielded electrical cable includes one or more conductor sets extending along a length of the cable and being spaced apart from each other along a width of the cable. Each conductor set has one or more conductors having a size no greater than 24 AWG and each conductor set has an insertion loss of less than −20 dB/meter over a frequency range of 0 to 20 GHz. First and second shielding films are disposed on opposite sides of the cable, the first and second films including cover portions and pinched portions arranged such that, in transverse cross section, the cover portions of the first and second films in combination substantially surround each conductor set, and the pinched portions of the first and second films in combination form pinched portions of the cable on each side of each conductor. A maximum separation between the first cover portions of the first and second shielding films is D, a minimum separation between the first pinched portions of the first and second shielding films is $d_1$, and $d_1/D$ is less than about 0.25.

The conductor set may comprise two conductors in a twinaxial arrangement and the insertion loss due to resonance of the conductor set may be about zero.

The conductor set may comprise two conductors in a twinaxial arrangement, and a nominal insertion loss without insertion loss due to resonance may be about 0.5 times the insertion loss due to resonance of the conductor set.

The cable may include an adhesive layer disposed between the pinched portions of the shielding films.

The insertion loss of each conductor set may be less than about −5 dB per meter or about −4 dB per meter, or about −3 dB per meter.

The cable may have a skew of less than about 20 psec/meter or less than about 10 psec/meter at data transfer speeds of up to about 10 Gbps.

The cable may have a characteristic impedance that remains within 5-10% of a target characteristic impedance over a cable length of about 1 meter.

One or more conductor sets of the cable may comprise a first conductor set and a second conductor set, each conductor set having a first insulated conductor and a second insulated conductor and a high frequency electrical isolation of the first insulated conductor relative to the second insulated conductor in each conductor set may be substantially less than a high frequency electrical isolation of the first conductor set relative to an adjacent conductor set.

The high frequency isolation of the first insulated conductor relative to the second conductor is a first far end crosstalk C1 at a specified frequency range of 5-15 GHz and a length of 1 meter, and the high frequency isolation of the first conductor set relative to the adjacent conductor set is a second far end crosstalk C2 at the specified frequency. C2 can be at least 10 dB lower than C1.

The cable may have $d_1/D$ less than 0.1.

A shielded electrical cable includes a plurality of conductor sets extending along a length of the cable and being spaced apart from each other along a width of the cable, each conductor set having two conductors having a size no greater than 24 AWG and each conductor set having a signal attenuation of less than −20 dB/meter over a frequency range of 0 to 20 GHz. The cable also includes a drain wire and first and second shielding films disposed on opposite sides of the cable, the first and second shielding films including cover portions and pinched portions arranged such that, in transverse cross section, the cover portions of the first and second films, in combination, substantially surround each conductor set, and the pinched portions of the first and second films, in combination, form pinched portions of the cable on each side of each conductor set. For at least one conductor set, a separation between the drain wire and a closest conductor of the conductor set may be greater than 0.5 times a center to center spacing between the two conductors of the conductor set.

A shielded electrical cable may include a plurality of conductor sets extending along a length of the cable and being spaced apart from each other along a width of the cable, each conductor sets having two conductors arranged in a twinaxial configuration, each of the conductors having a size no greater than 24 AWG. First and second shielding films are disposed on opposite sides of the cable, neither shielding film comprises a longitudinal fold that orients the shielding film to cover the conductor sets on both sides of the cable. Each conductor set has an insertion loss of less than −20 dB/meter over a frequency range of 0 to 20 GHz and an insertion loss due to resonance of the conductor set is about zero.

The cable may also include at least one drain wire, wherein the first and second shielding films include cover portions and pinched portions arranged such that, in transverse cross section, the cover portions of the first and second films, in combination, substantially surround each conductor set, and the pinched portions of the first and second films, in combination, form pinched portions of the cable on each side of each conductor set, wherein, for at least one conductor set, a separation between the center of the drain wire and the center of closest conductor of the conductor set can be greater than 0.5 times a center to center spacing between the two conductors of the conductor set.

A shielded electrical cable includes a plurality of conductor sets extending along a length of the cable and being spaced apart from each other along a width of the cable, each of the conductors sets comprising two conductors arranged in a twinaxial configuration, neither conductor having a size greater than 24 AWG. First and second shielding films are disposed on opposite sides of the cable, neither shielding film comprising a seam that bonds the shielding film to itself, wherein each conductor set has an insertion loss of less than −20 dB/meter over a frequency range of 0 to 20 GHz and an insertion loss due to resonance loss of the conductor set is about zero.

Each shielding film, individually, may surround less than all of a periphery of each conductor set.

The above summary of the present invention is not intended to describe each disclosed embodiment or every implementation of the present invention. The Figures and detailed description that follow below more particularly exemplify illustrative embodiments.

BRIEF DESCRIPTION OF THE DRAWINGS

FIGS. 10a-10e and 10f-10g are perspective and front cross-sectional views, respectively, illustrating an exemplary method of making a shielded electrical cable;

FIGS. 15a-15c are front cross-sectional views of three other exemplary embodiments of a shielded electrical cable;

FIG. 25 is a front cross-sectional view of another exemplary embodiment of a shielded electrical cable;

FIG. 30a is a perspective view of a shielded electrical cable assembly that may utilize high packing density of the conductor sets;

FIG. 30d is a top view of an exemplary shielded electrical cable assembly in which a shielded cable is attached to a termination component, and FIG. 30e is a side view thereof;

FIGS. 31e and 31f are top views of a shielded electrical cable assembly, showing alternative configurations in which one may choose to provide on-demand contact between drain wires and shielding film(s);

FIG. 32b is an enlarged detail of a portion of FIG. 32a, and FIG. 32c is a schematic representation of a front elevational view of one end of the cable of FIG. 32a;

FIG. 32e is a top view of another shielded electrical cable assembly that employs multiple drain wires coupled to each other through a shielding film, the assembly being arranged in a fan-out configuration, and FIG. 32f is a cross-sectional view of the cable at line 32g-32g of FIG. 32e;

FIG. 33a is a top view of another shielded electrical cable assembly that employs multiple drain wires coupled to each other through a shielding film, the assembly also being arranged in a fan-out configuration, and FIG. 33b is a cross-sectional view of the cable at line 33b-33b of FIG. 33a;

FIG. 35a is a perspective view of an example cable construction;

FIG. 35b is a cross section view of the example cable construction of FIG. 35a;

FIGS. 35c-35e are a cross section views of example alternate cable constructions;

FIG. 36b is a cross section showing additional dimensions of interest relative to the analysis of FIG. 36a;

FIGS. 36g-37c are front cross-sectional views of further exemplary shielded electrical cables;

DETAILED DESCRIPTION

As the number and speed of interconnected devices increases, electrical cables that carry signals between such devices need to be smaller and capable of carrying higher speed signals without unacceptable interference or crosstalk. Shielding is used in some electrical cables to reduce interactions between signals carried by neighboring conductors. Many of the cables described herein have a generally flat configuration, and include conductor sets that extend along a length of the cable, as well as electrical shielding films disposed on opposite sides of the cable. Pinched portions of the shielding films between adjacent conductor sets help to electrically isolate the conductor sets from each other. Many of the cables also include drain wires that electrically connect to the shields, and extend along the length of the cable. The cable configurations described herein can help to simplify connections to the conductor sets and drain wires, reduce the size of the cable connection sites, and/or provide opportunities for mass termination of the cable.

Figure 1:
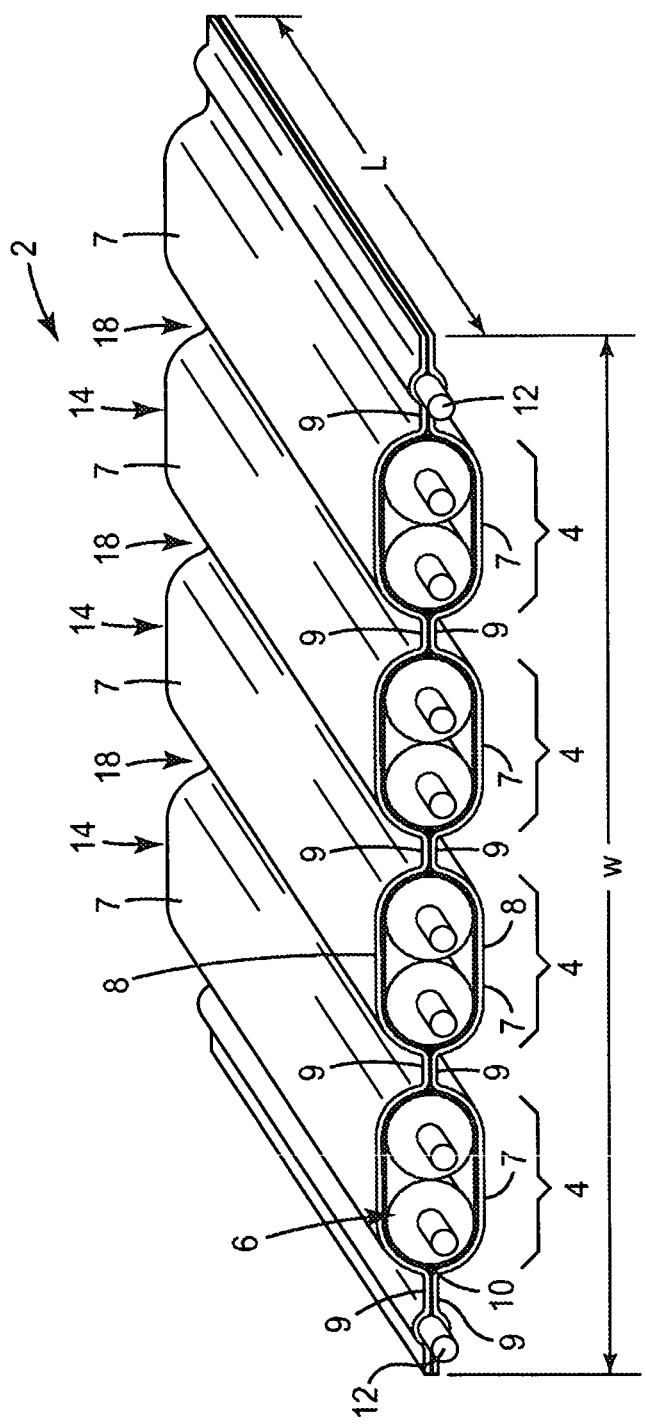
FIG. 1 is a perspective view of an exemplary embodiment of a shielded electrical cable.

FIG. 1 illustrates an exemplary shielded electrical cable 2 that includes a plurality of conductor sets 4 spaced apart from each other along all or a portion of a width, w, of the cable 2 and extend along a length, L, of the cable 2. The cable 2 may be arranged generally in a planar configuration as illustrated in FIG. 1 or may be folded at one or more places along its length into a folded configuration. In some implementations, some parts of cable 2 may be arranged in a planar configuration and other parts of the cable may be folded. In some configurations, at least one of the conductor sets 4 of the cable 2 includes two insulated conductors 6 extending along a length, L, of cable 2. The two insulated conductors 6 of the conductor sets 4 may be arranged substantially parallel along all or a portion of the length, L, of the cable 2. Insulated conductors 6 may include insulated signal wires, insulated power wires, or insulated ground wires. Two shielding films 8 are disposed on opposite sides of the cable 2.

The first and second shielding films 8 are arranged so that, in transverse cross section, cable 2 includes cover regions 14 and pinched regions 18. In the cover regions 14 of the cable 2, cover portions 7 of the first and second shielding films 8 in transverse cross section substantially surround each conductor set 4. For example, cover portions of the shielding films may collectively encompass at least 70%, or at least 75%, or at least 80%, or at least 85% or at least 90% of the perimeter of any given conductor set. Pinched portions 9 of the first and second shielding films form the pinched regions 18 of cable 2 on each side of each conductor set 4. In the pinched regions 18 of the cable 2, one or both of the shielding films 8 are deflected, bringing the pinched portions 9 of the shielding films 8 into closer proximity. In some configurations, as illustrated in FIG. 1, both of the shielding films 8 are deflected in the pinched regions 18 to bring the pinched portions 9 into closer proximity. In some configurations, one of the shielding films may remain relatively flat in the pinched regions 18 when the cable is in a planar or unfolded configuration, and the other shielding film on the opposite side of the cable may be deflected to bring the pinched portions of the shielding film into closer proximity.

The conductors 6 may comprise any suitable conductive material and may have a variety of cross sectional shapes and sizes. For example, in cross section, the conductors and/or ground wires may be circular, oval, rectangular or any other shape. One or more conductors and/or ground wires in a cable may have one shape and/or size that differs from other one or more conductors and/or ground wires in the cable. The conductors and/or ground wires may be solid or stranded wires. All of the conductors and/or ground wires in a cable may be stranded, all may be solid, or some may be stranded and some solid. Stranded conductors and/or ground wires may take on different sizes and/or shapes. The connectors and/or ground wires may be coated or plated with various metals and/or metallic materials, including gold, silver, tin, and/or other materials.

The material used to insulate the conductors of the conductor sets may be any suitable material that achieves the desired electrical properties of the cable. In some cases, the insulation used may be a foamed insulation which includes air to reduce the dielectric constant and the overall thickness of the cable.

The shielding films 8 may comprise a conductive material including but not limited to copper, silver, aluminum, gold, and/or alloys thereof. The shielding films 8 may comprise multiple layers of conductive and/or non-conductive layers. In some cases one or more of the shielding films 8 may include a conductive layer comprising the conductive material and a non-conductive polymeric layer. The shielding films 8 may have a thickness in the range of 0.01 mm to 0.05 mm and the overall thickness of the cable may be less than 2 mm or less than 1 mm.

The cable 2 may also include an adhesive layer 10 disposed between shielding films 8 at least between the pinched portions 9. The adhesive layer 10 bonds the pinched portions 9 of the shielding films 8 to each other in the pinched regions 18 of the cable 2. The adhesive layer 10 may or may not be present in the cover region 14 of the cable 2.

In some cases, conductor sets 4 have a substantially curvilinearly-shaped envelope or perimeter in transverse cross-section, and shielding films 8 are disposed around conductor sets 4 such as to substantially conform to and maintain the cross-sectional shape along at least part of, and preferably along substantially all of, the length L of the cable 6. Maintaining the cross-sectional shape maintains the electrical characteristics of conductor sets 4 as intended in the design of conductor sets 4. This is an advantage over some conventional shielded electrical cables where disposing a conductive shield around a conductor set changes the cross-sectional shape of the conductor set.

Although in the embodiment illustrated in FIG. 1, each conductor set 4 has two insulated conductors 6; in other embodiments, some or all of the conductor sets may include only one insulated conductor, or may include more than two insulated conductors 6. For example, an alternative shielded electrical cable similar in design to that of FIG. 1 may include one conductor set that has eight insulated conductors 6, or eight conductor sets each having only one insulated conductor 6. This flexibility in arrangements of conductor sets and insulated conductors allows the disclosed shielded electrical cables to be configured in ways that are suitable for a wide variety of intended applications. For example, the conductor sets and insulated conductors may be configured to form: a multiple twinaxial cable, i.e., multiple conductor sets each having two insulated conductors; a multiple coaxial cable, i.e., multiple conductor sets each having only one insulated conductor; or combinations thereof. In some embodiments, a conductor set may further include a conductive shield (not shown) disposed around the one or more insulated conductors, and an insulative jacket (not shown) disposed around the conductive shield.

In the embodiment illustrated in FIG. 1, shielded electrical cable 2 further includes optional ground conductors 12. Ground conductors 12 may include ground wires or drain wires. Ground conductors 12 can be spaced apart from and extend in substantially the same direction as insulated conductors 6. Shielding films 8 can be disposed around ground conductors 12. The adhesive layer 10 may bond shielding films 8 to each other in the pinched portions 9 on both sides of ground conductors 12. Ground conductors 12 may electrically contact at least one of the shielding films 8.

Figure 2A:
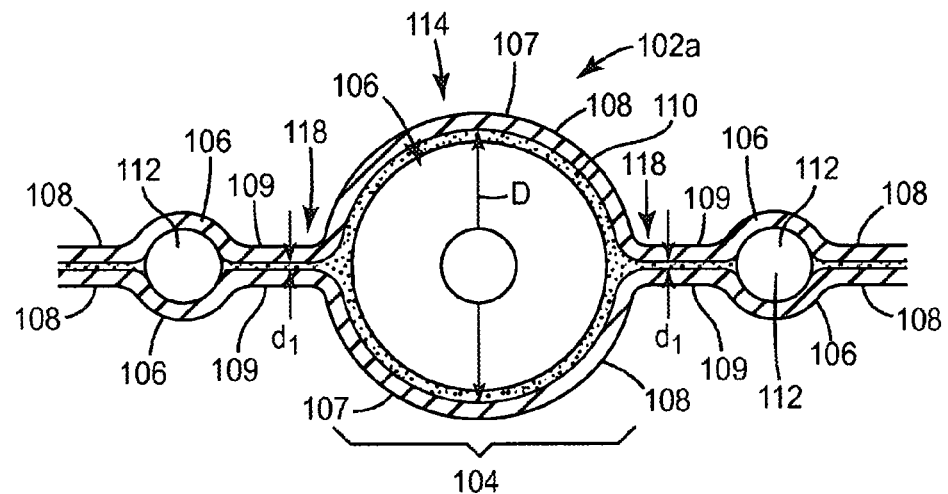
FIGS. 2a-2g are front cross-sectional views of seven exemplary embodiments of a shielded electrical cable.

The cross-sectional views of FIGS. 2a-2g may represent various shielded electrical cables, or portions of cables. In FIG. 2a, shielded electrical cable 102a includes a single conductor set 104. Conductor set 104 extends along the length of the cable and has only a single insulated conductor 106. If desired, the cable 102a may be made to include multiple conductor sets 104 spaced apart from each other across a width of the cable 102a and extending along a length of the cable. Two, shielding films 108 are disposed on opposite sides of the cable. The cable 102a includes a cover region 114 and pinched regions 118. In the cover region 114 of the cable 102a, the shielding films 108 include cover portions 107 that cover the conductor set 104. In transverse cross section, the cover portions 107, in combination, substantially surround the conductor set 104. In the pinched regions 118 of the cable 102a, the shielding films 108 include pinched portions 109 on each side of the conductor set 104.

An optional adhesive layer 110 may be disposed between shielding films 108. Shielded electrical cable 102a further includes optional ground conductors 112. Ground conductors 112 are spaced apart from and extend in substantially the same direction as insulated conductor 106. Conductor set 104 and ground conductors 112 can be arranged so that they lie generally in a plane as illustrated in FIG. 2a.

Second cover portions 113 of shielding films 108 are disposed around, and cover, the ground conductors 112. The adhesive layer 110 may bond the shielding films 108 to each other on both sides of ground conductors 112. Ground conductors 112 may electrically contact at least one of shielding films 108. In FIG. 2a, insulated conductor 106 and shielding films 108 are effectively arranged in a coaxial cable configuration. The coaxial cable configuration of FIG. 2a can be used in a single ended circuit arrangement.

As illustrated in the transverse cross sectional view of FIG. 2a, there is a maximum separation, D, between the cover portions 107 of the shielding films 108, and there is a minimum separation, $d_1$, between the pinched portions 109 of the shielding films 108.

FIG. 2a shows the adhesive layer 110 disposed between the pinched portions 109 of the shielding films 108 in the pinched regions 118 of the cable 102a and disposed between the cover portions 107 of the shielding films 108 and the insulated conductor 106 in the cover region 114 of the cable 102a. In this arrangement, the adhesive layer 110 bonds the pinched portions 109 of the shielding films 108 together in the pinched regions 118 of the cable, and bonds the cover portions 107 of the shielding films 108 to the insulated conductor 106 in the cover region 114 of the cable 102a.

Figure 2B:
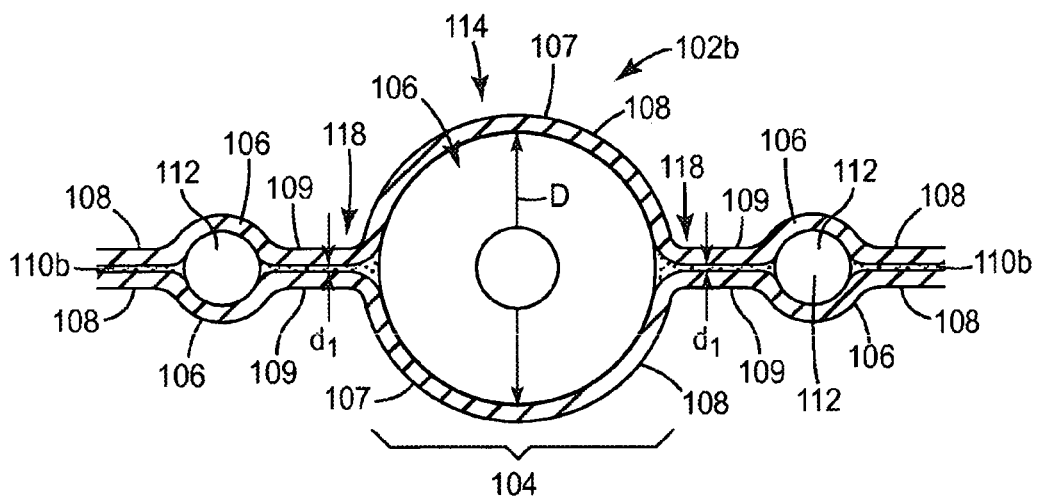

Shielded cable 102b of FIG. 2b is similar to cable 102a of FIG. 2a, with similar elements identified by similar reference numerals, except that in FIG. 2b, the optional adhesive layer 110b is not present between the cover portions 107 of the shielding films 108 and the insulated conductor 106 in the cover region 114 of the cable 102b. In this arrangement, the adhesive layer 110b bonds the pinched portions 109 of the shielding films 108 together in the pinched regions 118 of the cable, but the adhesive layer 110b does not bond cover portions 107 of the shielding films 108 to the insulated conductor 106 in the cover regions 114 of the cable 102b.

Figure 2C:
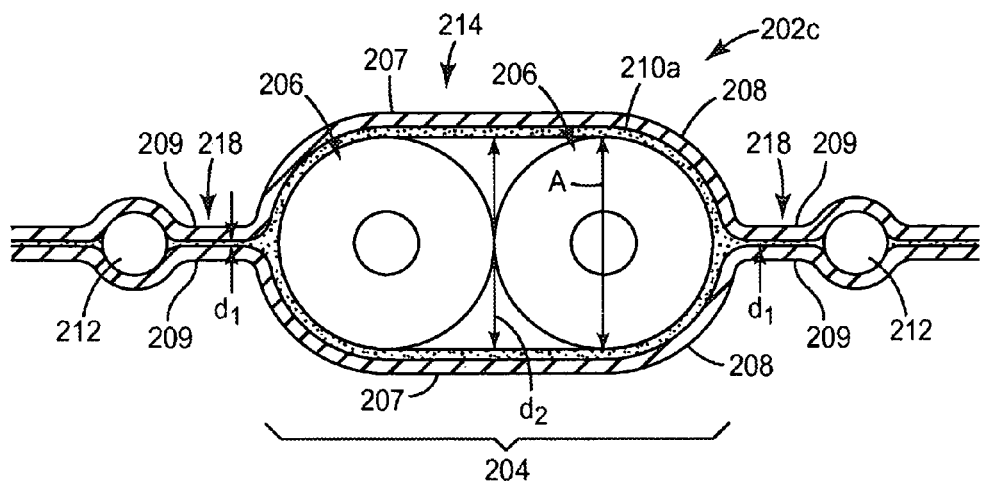

Referring to FIG. 2c, shielded electrical cable 202c is similar to shielded electrical cable 102a of FIG. 2a, except that cable 202c has a single conductor set 204 which has two insulated conductors 206. If desired, the cable 202c may be made to include multiple conductor sets 204 spaced part across a width of the cable 202c and extending along a length of the cable. Insulated conductors 206 are arranged generally in a single plane and effectively in a twinaxial configuration. The twin axial cable configuration of FIG. 2c can be used in a differential pair circuit arrangement or in a single ended circuit arrangement.

Two shielding films 208 are disposed on opposite sides of conductor set 204. The cable 202c includes a cover region 214 and pinched regions 218. In the cover region 214 of the cable 202, the shielding films 208 include cover portions 207 that cover the conductor set 204. In transverse cross section, the cover portions 207, in combination, substantially surround the conductor set 204. In the pinched regions 218 of the cable 202, the shielding films 208 include pinched portions 209 on each side of the conductor set 204.

An optional adhesive layer 210c may be disposed between shielding films 208. Shielded electrical cable 202c further includes optional ground conductors 212c similar to ground conductors 112 discussed previously. Ground conductors 212c are spaced apart from, and extend in substantially the same direction as, insulated conductors 206c. Conductor set 204c and ground conductors 212c can be arranged so that they lie generally in a plane as illustrated in FIG. 2c.

As illustrated in the cross section of FIG. 2c, there is a maximum separation, D, between the cover portions 207c of the shielding films 208c; there is a minimum separation, $d_1$, between the pinched portions 209c of the shielding films 208c; and there is a minimum separation, $d_2$, between the shielding films 208c between the insulated conductors 206c.

FIG. 2c shows the adhesive layer 210c disposed between the pinched portions 209 of the shielding films 208 in the pinched regions 218 of the cable 202 and disposed between the cover portions 207 of the shielding films 208 and the insulated conductors 206 in the cover region 214 of the cable 202c. In this arrangement, the adhesive layer 210c bonds the pinched portions 209 of the shielding films 208 together in the pinched regions 218 of the cable 202c, and also bonds the cover portions 207 of the shielding films 208 to the insulated conductors 206 in the cover region 214 of the cable 202c.

Figure 2D:
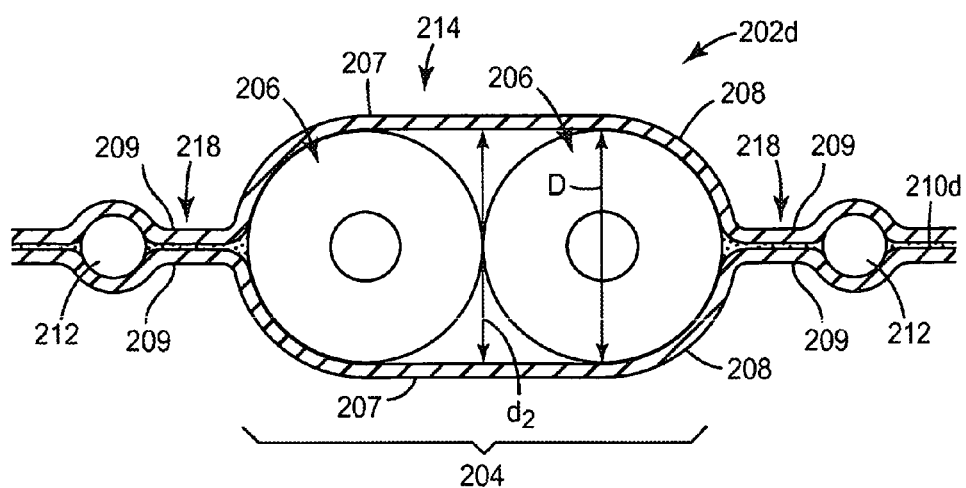

Shielded cable 202d of FIG. 2d is similar to cable 202c of FIG. 2c, with similar elements identified by similar reference numerals, except that in cable 202d the optional adhesive layer 210d is not present between the cover portions 207 of the shielding films 208 and the insulated conductors 206 in the cover region 214 of the cable. In this arrangement, the adhesive layer 210d bonds the pinched portions 209 of the shielding films 208 together in the pinched regions 218 of the cable, but does not bond the cover portions 207 of the shielding films 208 to the insulated conductors 206 in the cover region 214 of the cable 202d.

Figure 2E:
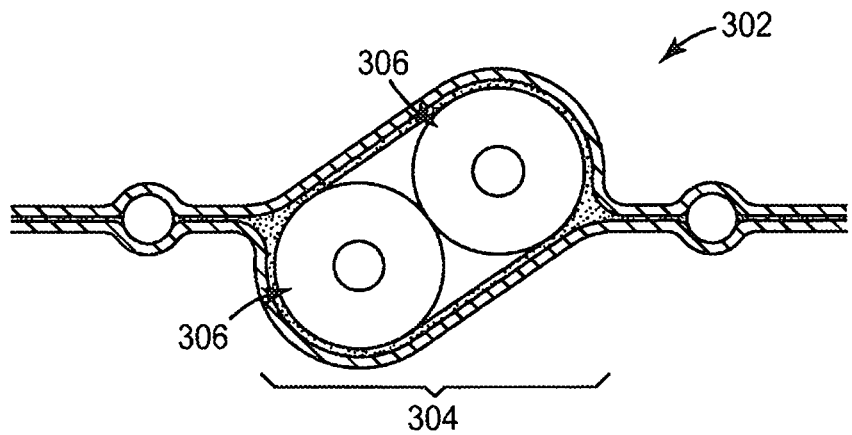

Referring now to FIG. 2e, we see there a transverse cross-sectional view of a shielded electrical cable 302 similar in many respects to the shielded electrical cable 102a of FIG. 2a. However, where cable 102a includes a single conductor set 104 having only a single insulated conductor 106, cable 302 includes a single conductor set 304 that has two insulated conductors 306 extending along a length of the cable 302. Cable 302 may be made to have multiple conductor sets 304 spaced apart from each other across a width of the cable 302 and extending along a length of the cable 302. Insulated conductors 306 are arranged effectively in a twisted pair cable arrangement, whereby insulated conductors 306 twist around each other and extend along a length of the cable 302.

Figure 2F:
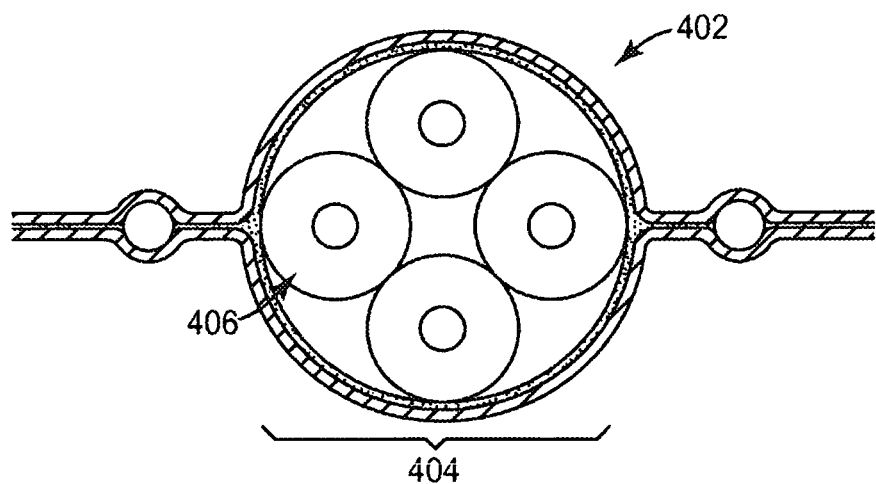

FIG. 2f depicts another shielded electrical cable 402 that is also similar in many respects to the shielded electrical cable 102a of FIG. 2a. However, where cable 102a includes a single conductor set 104 having only a single insulated conductor 106, cable 402 includes a single conductor set 404 that has four insulated conductors 406 extending along a length of the cable 402. The cable 402 may be made to have multiple conductor, sets 404 spaced apart from each other across a width of the cable 302 and extending along a length of the cable 302.

Insulated conductors 306 are arranged effectively in a quad cable arrangement, whereby insulated conductors 306 may or may not around each other as insulated conductors 106f extend along a length of the cable 302.

Figure 2G:
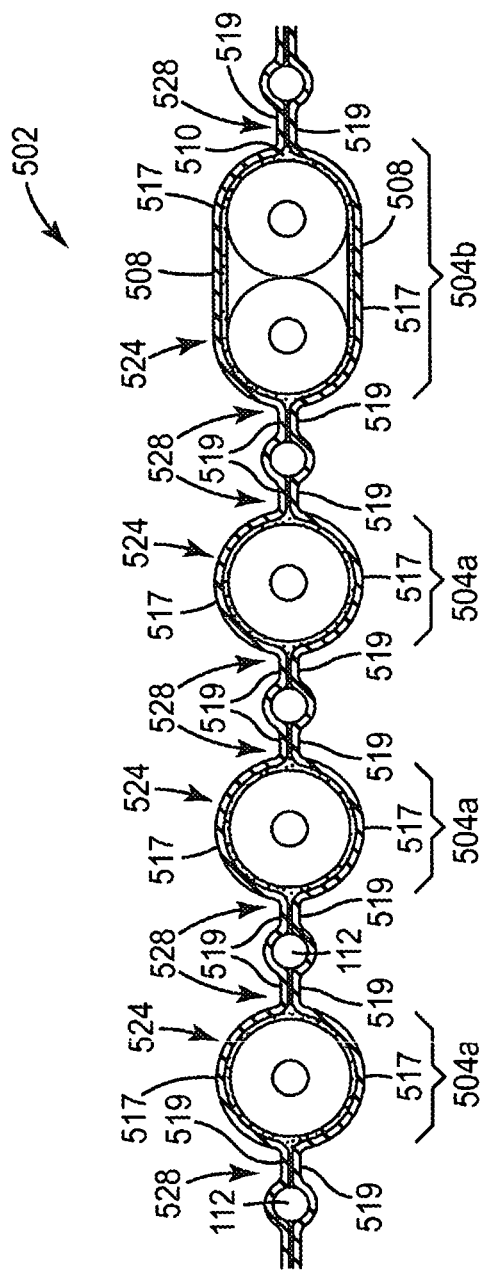

Referring back to FIGS. 2a-2f, further embodiments of shielded electrical cables may include a plurality of spaced apart conductor sets 104, 204, 304, or 404, or combinations thereof, arranged generally in a single plane. Optionally, the shielded electrical cables may include a plurality of ground conductors 112 spaced apart from, and extending generally in the same direction as, the insulated conductors of the conductor sets. In some configurations, the conductor sets and ground conductors can be arranged generally in a single plane. FIG. 2g illustrates an exemplary embodiment of such a shielded electrical cable.

Referring to FIG. 2g, shielded electrical cable 502 includes a plurality of spaced apart conductor sets 504a, 504b arranged generally in plane. Shielded electrical cable 504 further includes optional ground conductors 112 disposed between conductor sets 504a, 504b and at both sides or edges of shielded electrical cable 504.

First and second shielding films 508 are disposed on opposite sides of the cable 504 and are arranged so that, in transverse cross section, the cable 504 includes cover regions 524 and pinched regions 528. In the cover regions 524 of the cable, cover portions 517 of the first and second shielding films 508 in transverse cross section substantially surround each conductor set 504a, 506b. For example, the cover portions of the first and second shielding films in combination substantially surround each conductor set by encompassing at least 70%, or at least 75%, or at least 80%, or at least 85% or at least 90% of a periphery of each conductor set. Pinched portions 519 of the first and second shielding films 508 form the pinched regions 518 on two sides of each conductor set 504a, 504b.

The shielding films 508 are disposed around ground conductors 112. An optional adhesive layer 510 is disposed between shielding films 208 and bonds the pinched portions 519 of the shielding films 508 to each other in the pinched regions 528 on both sides of each conductor set 504a, 504b. Shielded electrical cable 502 includes a combination of coaxial cable arrangements (conductor sets 504a) and a twinaxial cable arrangement (conductor set 504b) and may therefore be referred to as a hybrid cable arrangement.

Figure 3:
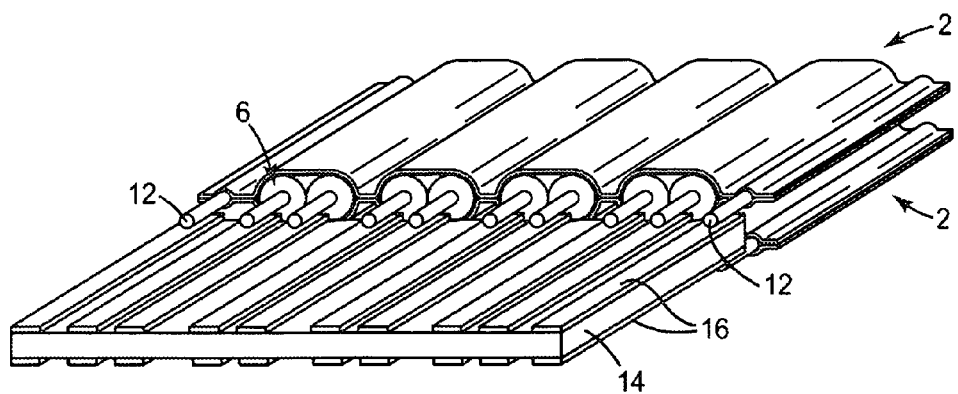
FIG. 3 is a perspective view of two shielded electrical cables of FIG. 1 terminated to a printed circuit board.

FIG. 3 illustrates two shielded electrical cables 2 terminated to a printed circuit board 14. Because insulated conductors 6 and ground conductors 12 can be arranged generally in a single plane, shielded electrical cables 2 are well suited for mass-stripping, i.e., the simultaneous stripping of shielding films 8 and insulated conductors 6, and mass-termination, i.e., the simultaneous terminating of the stripped ends of insulated conductors 6 and ground conductors 12, which allows a more automated cable assembly process. In FIG. 3, the stripped ends of insulated conductors 6 and ground conductors 12 are terminated to contact elements 16 on printed circuit board 14. The stripped ends of insulated conductors and ground conductors may be terminated to any suitable individual contact elements of any suitable termination point, such as, e.g., electrical contacts of an electrical connector.

FIGS. 4a-4d illustrate an exemplary termination process of shielded electrical cable 302 to a printed circuit board or other termination component 314. This termination process can be a mass-termination process and includes the steps of stripping (illustrated in FIGS. 4a-4b), aligning (illustrated in FIG. 4c), and terminating (illustrated in FIG. 4d). When forming shielded electrical cable 302, which may in general take the form of any of the cables shown and/or described herein, the arrangement of conductor sets 304, insulated conductors 306, and ground conductors 312 of shielded electrical cable 302 may be matched to the arrangement of contact elements 316 on printed circuit board 314, which would eliminate any significant manipulation of the end portions of shielded electrical cable 302 during alignment or termination.

Figure 4A:
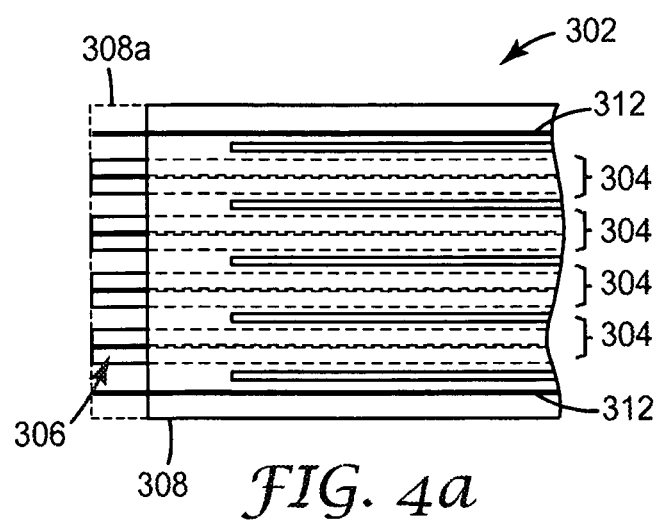
FIGS. 4a-4d are top views of an exemplary termination process of a shielded electrical cable.
Figure 4B:
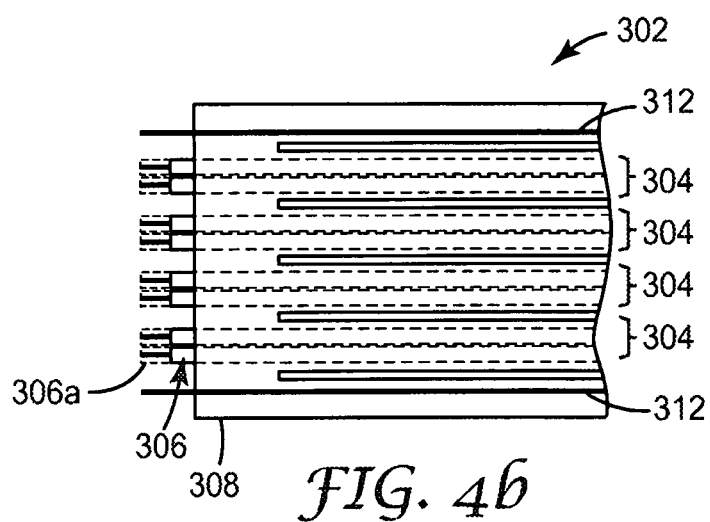
Figure 4C:
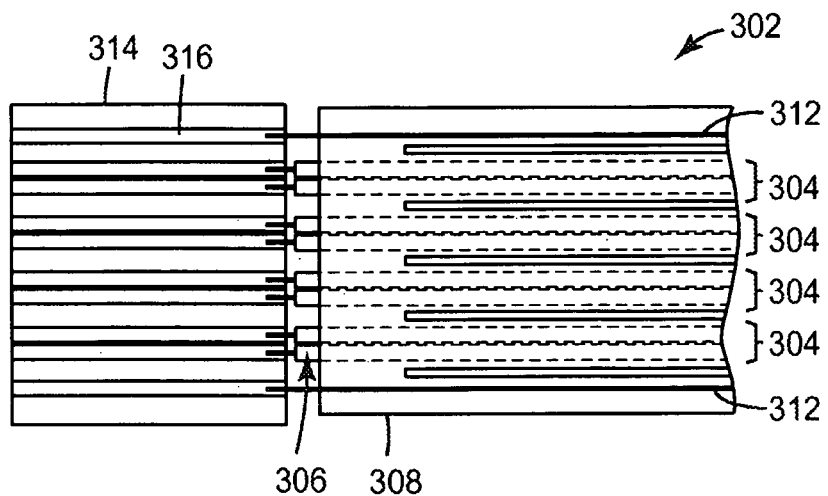
Figure 4D:
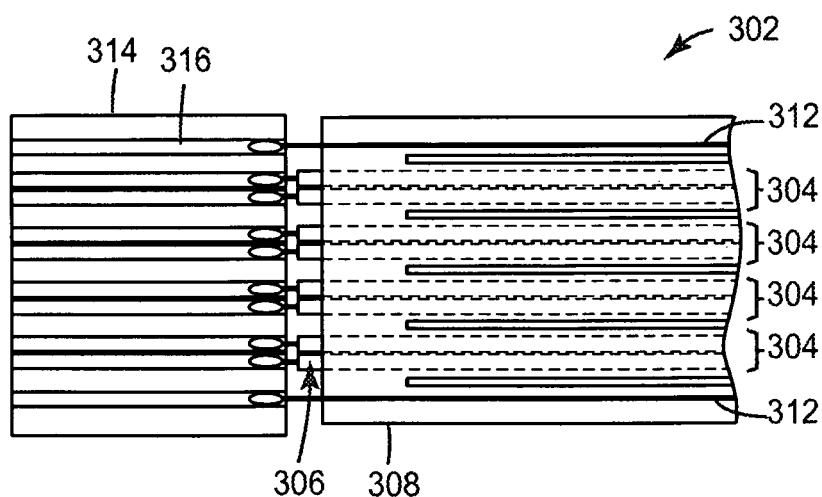

In the step illustrated in FIG. 4a, an end portion 308a of shielding films 308 is removed. Any suitable method may be used, such as, e.g., mechanical stripping or laser stripping. This step exposes an end portion of insulated conductors 306 and ground conductors 312. In one aspect, mass-stripping of end portion 308a of shielding films 308 is possible because they form an integrally connected layer that is separate from the insulation of insulated conductors 306. Removing shielding films 308 from insulated conductors 306 allows protection against electrical shorting at these locations and also provides independent movement of the exposed end portions of insulated conductors 306 and ground conductors 312. In the step illustrated in FIG. 4b, an end portion 306a of the insulation of insulated conductors 306 is removed. Any suitable method may be used, such as, e.g., mechanical stripping or laser stripping. This step exposes an end portion of the conductor of insulated conductors 306. In the step illustrated in FIG. 4c, shielded electrical cable 302 is aligned with printed circuit board 314 such that the end portions of the conductors of insulated conductors 306 and the end portions of ground conductors 312 of shielded electrical cable 302 are aligned with contact elements 316 on printed circuit board 314. In the step illustrated in FIG. 3d, the end portions of the conductors of insulated conductors 306 and the end portions of ground conductors 312 of shielded electrical cable 302 are terminated to contact elements 316 on printed circuit board 314. Examples of suitable termination methods that may be used include soldering, welding, crimping, mechanical clamping, and adhesively bonding, to name a few.

Figure 5:
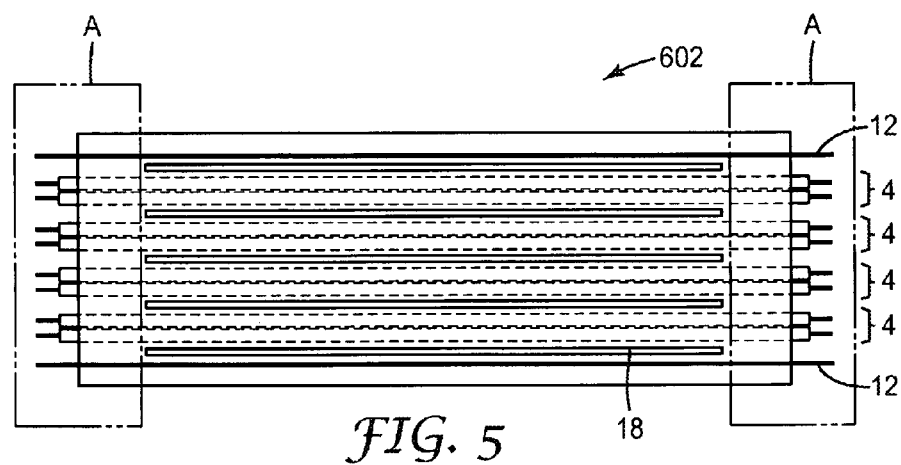
FIG. 5 is a top view of another exemplary embodiment of a shielded electrical cable.

FIG. 5 illustrates another exemplary embodiment of a shielded electrical cable according to an aspect of the present invention. Shielded electrical cable 602 is similar in some respects to shielded electrical cable 2 illustrated in FIG. 1. In addition, shielded electrical cable 602 includes a one or more longitudinal slits or splits 18 disposed between conductor sets 4. The splits 18 separate individual conductor sets at least along a portion of the length of shielded electrical cable 602, thereby increasing at least the lateral flexibility of the cable 602. This may allow, for example, the shielded electrical cable 602 to be placed more easily into a curvilinear outer jacket. In other embodiments, splits 18 may be placed such as to separate individual or multiple conductor sets 4 and ground conductors 12. To maintain the spacing of conductor sets 4 and ground conductors 12, splits 18 may be discontinuous along the length of shielded electrical cable 602. To maintain the spacing of conductor sets 4 and ground conductors 12 in at least one end portion A of shielded electrical cable 602 so as to maintain mass-termination capability, the splits 18 may not extend into one or both end portions A of the cable. Splits 18 may be formed in shielded electrical cable 602 using any suitable method, such as, e.g., laser cutting or punching. Instead of or in combination with longitudinal splits, other suitable shapes of openings may be formed in the disclosed electrical cable 602, such as, e.g., holes, e.g., to increase at least the lateral flexibility of the cable 602.

Figure 6:
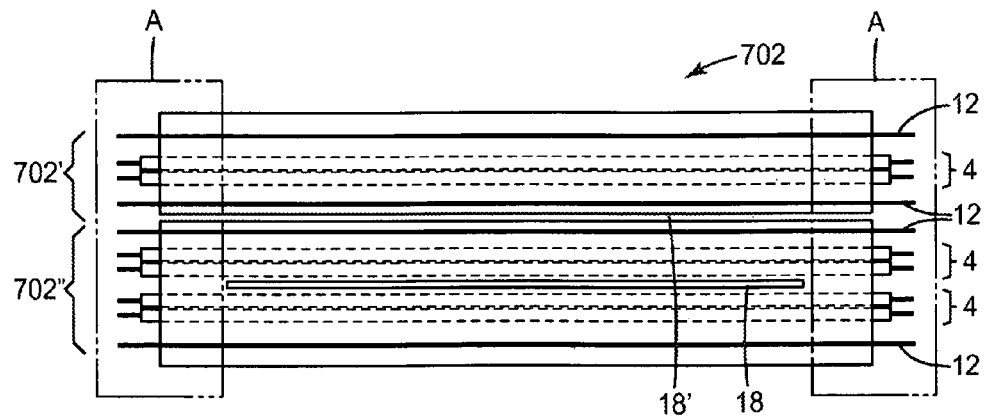
FIG. 6 is a top view of another exemplary embodiment of a shielded electrical cable.

FIG. 6 illustrates another exemplary embodiment of a shielded electrical cable according to an aspect of the present invention. Shielded electrical cable 702 is similar to shielded electrical cable 602 illustrated in FIG. 5. Effectively, in shielded electrical cable 702, one of conductor sets 4 is replaced by two ground conductors 12. Shielded electrical cable 702 includes longitudinal splits 18 and 18'. Split 18 separates individual conductor sets 4 along a portion of the length of shielded electrical cable 702 and does not extend into end portions A of shielded'electrical cable 702. Split 18' separates individual conductor sets 4 along the length of shielded electrical cable 702 and extends into end portions A of shielded electrical cable 702, which effectively splits shielded electrical cable 702 into two individual shielded electrical cables 702', 702". Shielding films 8 and ground conductors 12 provide an uninterrupted ground plane in each of the individual shielded electrical cables 702', 702". This exemplary embodiment illustrates the advantage of the parallel processing capability of the shielded electrical cables according to aspects of the present invention, whereby multiple shielded electrical cables may be formed simultaneously.

The shielding films used in the disclosed shielded cables can have a variety of configurations and can be made in a variety of ways. FIGS. 7a-7d illustrate four exemplary embodiments of a shielded electrical cable according to aspects of the present invention. FIGS. 7a-7d illustrate various examples of constructions of the shielding films of the shielded electrical cables. In one aspect, at least one of the shielding films may include a conductive layer and a non-conductive polymeric layer. The conductive layer may include any suitable conductive material, including but not limited to copper, silver, aluminum, gold, and alloys thereof. The non-conductive polymeric layer may include any suitable polymeric material, including but not limited to polyester, polyimide, polyamide-imide, polytetrafluoroethylene, polypropylene, polyethylene, polyphenylene, sulfide, polyethylene naphthalate, polycarbonate, silicone rubber, ethylene propylene diene rubber, polyurethane, acrylates, silicones, natural rubber, epoxies, and synthetic rubber adhesive. The non-conductive polymeric layer may include one or more additives and/or fillers to provide properties suitable for the intended application. In another aspect, at least one of the shielding films may include a laminating adhesive layer disposed between the conductive layer and the non-conductive polymeric layer. For shielding films that have a conductive layer disposed on a non-conductive layer, or that otherwise have one major exterior surface that is electrically conductive and an opposite major exterior surface that is substantially non-conductive, the shielding film may be incorporated into the shielded cable in several different orientations as desired. In some cases, for example, the conductive surface may face the conductor sets of insulated wires and ground wires, and in some cases the non-conductive surface may face those components. In cases where two shielding films are used on opposite sides of the cable, the films may be oriented such that their conductive surfaces face each other and each face the conductor sets and ground wires, or they may be oriented such that their non-conductive surfaces face each other and each face the conductor sets and ground wires, or they may be oriented such that the conductive surface of one shielding film faces the conductor sets and ground wires, while the non-conductive surface of the other shielding film faces conductor sets and ground wires from the other side of the cable.

In some cases, at least one of the shielding films may include a stand-alone conductive film, such as a compliant or flexible metal foil. The construction of the shielding films may be selected based on a number of design parameters suitable for the intended application, such as, e.g., flexibility, electrical performance, and configuration of the shielded electrical cable (such as, e.g., presence and location of ground conductors). In some cases, the shielding films have an integrally formed construction. In some cases, the shielding films may have a thickness in the range of 0.01 mm to 0.05 mm. The shielding films desirably provide isolation, shielding, and precise spacing between the conductor sets, and allow for a more automated and lower cost cable manufacturing process. In addition, the shielding films prevent insertion loss due to resonance of the cable, a phenomenon known as "signal suckout", whereby high signal attenuation occurs at a particular frequency range. This phenomenon typically occurs in conventional shielded electrical cables where a conductive shield is wrapped around a conductor set.

Figure 7A:
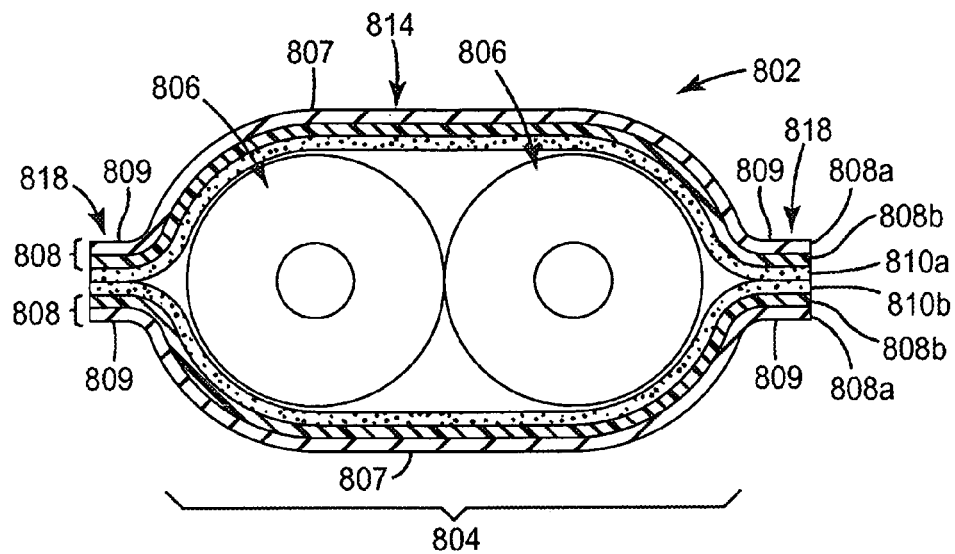
FIGS. 7a-7d are front cross-sectional views of four other exemplary embodiments of a shielded electrical cable.

FIG. 7a is a cross sectional view across a width of a shielded electrical cable 802 that shows a single conductor set 804. Conductor set 804 includes two insulated conductors 806 that extend along a length of the cable 802. Cable 802 may include multiple conductor sets 804 spaced apart from each other across the width of the cable 802. Two shielding films 808 are disposed on opposite sides of the cable 802. In transverse cross section, cover portions 807 of the shielding films 808, in combination, substantially surround the conductor set 804 in the cover region 814 of the cable 802. For example, the cover portions of the first and second shielding films in combination substantially surround each conductor set by encompassing at least 70% of a periphery of each conductor set. Pinched portions 809 of the shielding films 808 form pinched regions 818 of the cable 802 on each side of the conductor set 804.

Shielding films 808 may include optional adhesive layers 810a, 810b that bond the pinched portions 809 of the shielding films 808 to each other in the pinched regions 818 of the cable 802. Adhesive layer 810a is disposed on one of the non-conductive polymeric layers 808b and adhesive layer 810b is disposed on another of the non-conductive polymeric layers 808b. The adhesive layers 810a, 810b may or may not be present in the cover region 814 of the cable 802. If present, the adhesive layers 810a, 810b may extend fully or partially across the width of the cover portions 807 of the shielding film 808, bonding the cover portions 807 of the shielding films 808 to the insulated conductors 806.

In this example, insulated conductors 806 and shielding films 808 are arranged generally in a single plane and effectively in a twinaxial configuration which may be used in a single ended circuit arrangement or a differential pair circuit arrangement. Shielding films 808 include a conductive layer 808a and a non-conductive polymeric layer 808b. Non-conductive polymeric layer 808b faces insulated conductors 806. Conductive layer 808a may be deposited onto non-conductive polymeric layer 808b using any suitable method.

Figure 7B:
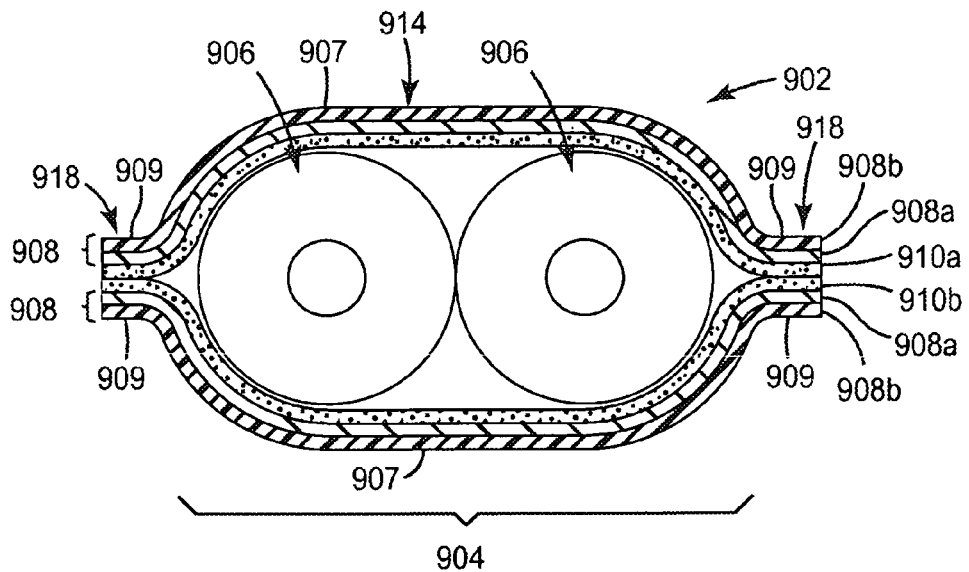

FIG. 7b is a cross sectional view across a width shielded electrical cable 902 that shows a single conductor set 904. Conductor set 904 includes two insulated conductors 906 that extend along a length of the cable 902. Cable 902 may include multiple conductor sets 904 spaced apart from each other along a width of the cable 902 and extending along a length of the cable 902. Two shielding films 908 are disposed on opposite sides of the cable 902. In transverse cross section, cover portions 907 of the shielding films 908, in combination, substantially surround the conductor set 904 in the cover regions 914 of the cable 902. Pinched portions 909 of the shielding films 908 form pinched regions 918 of the cable 902 on each side of the conductor set 904.

One or more optional adhesive layers 910a, 910b bond the pinched portions 909 of the shielding films 908 to each other in the pinched regions 918 on both sides of conductor set 904. The adhesive layers 910a, 910b may extend fully or partially across the width of the cover portions 907 of the shielding film 908. Insulated conductors 906 are arranged generally in a single plane and effectively form a twinaxial cable configuration and can be used in a single ended circuit arrangement or a differential pair circuit arrangement. Shielding films 908 include a conductive layer 908a and a non-conductive polymeric layer 908b. Conductive layer 908a faces insulated conductors 906. Conductive layer 908a may be deposited onto non-conductive polymeric layer 908b using any suitable method.

Figure 7C:
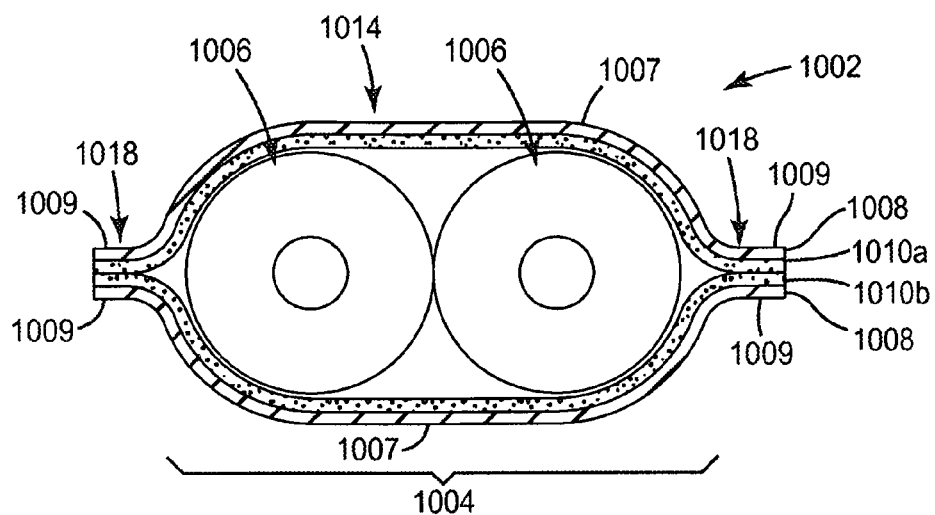

FIG. 7c is a cross sectional view across a width of a shielded electrical cable 1002 showing a single conductor set 1004. Conductor set 1004 includes two insulated conductors 1006 that extend a length of the cable 1002. Cable 1002 may include multiple conductor sets 1004 spaced apart from each other along a width of the cable 1002 and extending along a length of the cable 1002. Two shielding films 1008 are disposed on opposite sides of the cable 1002 and include cover portions 1007. In transverse cross section, the cover portions 1007, in combination, substantially surround the conductor set 1004 in a cover region 1014 of the cable 1002. Pinched portions 1009 of the shielding films 1008 form pinched regions 1018 of the cable 1002 on each side of the conductor set 1004.

Shielding films 1008 include one or more optional adhesive layers 1010a, 1010b that bond the pinched portions 1009 of the shielding films 1008 to each other on both sides of conductor set 1004 in the pinched regions 1018. The adhesive layers 1010a, 1010b may extend fully or partially across the width of the cover portions 1007 of the shielding film 1008. Insulated conductors 1006 are arranged generally in a single plane and effectively in a twinaxial cable configuration that can be used in a single ended circuit arrangement or a differential pair circuit arrangement. Shielding films 1008 include a stand-alone conductive film.

Figure 7D:
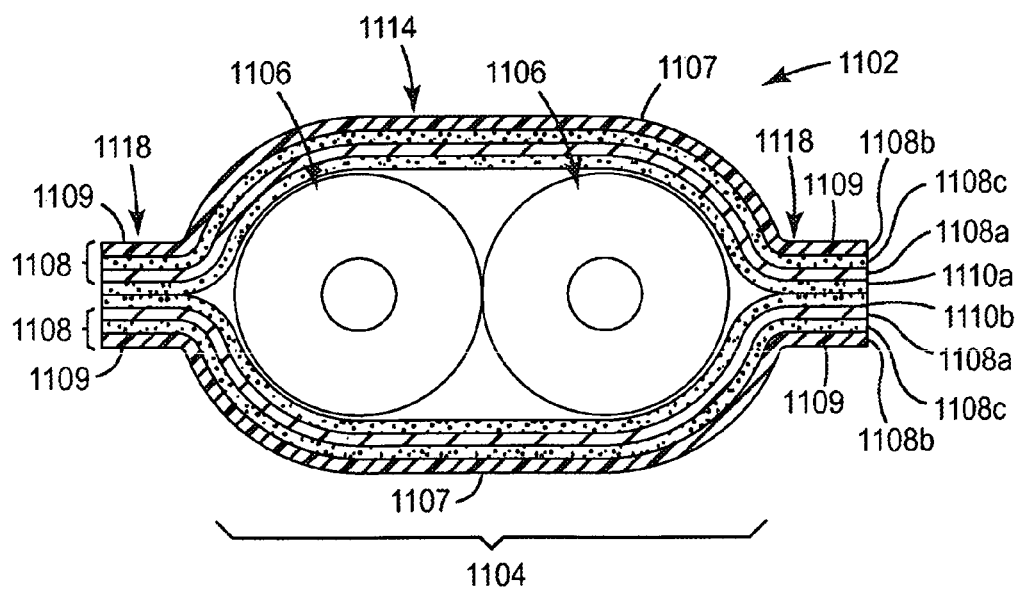

FIG. 7d is a cross sectional view of a shielded electrical cable 1102 that shows a single conductor set 1104. Conductor set 1104 includes two insulated conductors 1106 with extend along a length of the cable 1102. Cable 1102 may include multiple conductor sets 1104 spaced apart from each other along a width of the cable 1102 and extending along a length of the cable 1102. Two shielding films 1108 are disposed on opposite sides of the cable 1102 and include cover portions 1107. In transverse cross section, the cover portions 1107, in combination, substantially surround conductor set 1104 in a cover region 1114 of the cable 1102. Pinched portions 1109 of the shielding films 1108 form pinched regions 1118 of the cable 1102 on each side of the conductor set 1104.

Shielding films 1108 include one or more optional adhesive layers 1110 that bond the pinched portions 1109 of the shielding films 1108 to each other in the pinched regions 1118 on both sides of conductor set 1104. The adhesive layer 1010a, 1010b may extend fully or partially across the width of the cover portions 1107 of the shielding film 1108.

Insulated conductors 1106 are arranged generally in a single plane and effectively in a twinaxial cable configuration. The twinaxial cable configuration can be used in a single ended circuit arrangement or a differential circuit arrangement. Shielding films 1108 include a conductive layer 1108a, a non-conductive polymeric layer 1108b, and a laminating adhesive layer 1108c disposed between conductive layer 1108a and non-conductive polymeric layer 1108b, thereby laminating conductive layer 1108a to non-conductive polymeric layer 1108b. Conductive layer 1108a faces insulated conductors 1106.

As discussed elsewhere herein, adhesive material may be used in the cable construction to bond one or two shielding films to one, some, or all of the conductor sets at cover regions of the cable, and/or adhesive material may be used to bond two shielding films together at pinched regions of the cable. A layer of adhesive material may be disposed on at least one shielding film, and in cases where two shielding films are used on opposite sides of the cable, a layer of adhesive material may be disposed on both shielding films. In the latter cases, the adhesive used on one shielding film is preferably the same as, but may if desired be different from, the adhesive used on the other shielding film. A given adhesive layer may include an electrically insulative adhesive, and may provide an insulative bond between two shielding films. Furthermore, a given adhesive layer may provide an insulative bond between at least one of shielding films and insulated conductors of one, some, or all of the conductor sets, and between at least one of shielding films and one, some, or all of the ground conductors (if any). Alternatively, a given adhesive layer may include an electrically conductive adhesive, and may provide a conductive bond between two shielding films. Furthermore, a given adhesive layer may provide a conductive bond between at least one of shielding films and one, some, or all of the ground conductors (if any). Suitable conductive adhesives include conductive particles to provide the flow of electrical current. The conductive particles can be any of the types of particles currently used, such as spheres, flakes, rods, cubes, amorphous, or other particle shapes. They may be solid or substantially solid particles such as carbon black, carbon fibers, nickel spheres, nickel coated copper spheres, metal-coated oxides, metal-coated polymer fibers, or other similar conductive particles. These conductive particles can be made from electrically insulating materials that are plated or coated with a conductive material such as silver, aluminum, nickel, or indium tin-oxide. The metal-coated insulating material can be substantially hollow particles such as hollow glass spheres, or may comprise solid materials such as glass beads or metal oxides. The conductive particles may be on the order of several tens of microns to nanometer sized materials such as carbon nanotubes. Suitable conductive adhesives may also include a conductive polymeric matrix.

When used in a given cable construction, an adhesive layer is preferably substantially conformable in shape relative to other elements of the cable, and conformable with regard to bending motions of the cable. In some cases, a given adhesive layer may be substantially continuous, e.g., extending along substantially the entire length and width of a given major surface of a given shielding film. In some cases, the adhesive layer may include be substantially discontinuous. For example, the adhesive layer may be present only in some portions along the length or width of a given shielding film. A discontinuous adhesive layer may for example include a plurality of longitudinal adhesive stripes that are disposed, e.g., between the pinched portions of the shielding films on both sides of each conductor set and between the shielding films beside the ground conductors (if any). A given adhesive material may be or include at least one of a pressure sensitive adhesive, a hot melt adhesive, a thermoset adhesive, and a curable adhesive. An adhesive layer may be configured to provide a bond between shielding films that is substantially stronger than a bond between one or more insulated conductor and the shielding films. This may be achieved, e.g., by appropriate selection of the adhesive formulation. An advantage of this adhesive configuration is to allow the shielding films to be readily strippable from the insulation of insulated conductors. In other cases, an adhesive layer may be configured to provide a bond between shielding films and a bond between one or more insulated conductor and the shielding films that are substantially equally strong. An advantage of this adhesive configuration is that the insulated conductors are anchored between the shielding films. When a shielded electrical cable having this construction is bent, this allows for little relative movement and therefore reduces the likelihood of buckling of the shielding films. Suitable bond strengths may be chosen based on the intended application. In some cases, a conformable adhesive layer may be used that has a thickness of less than about 0.13 mm. In exemplary embodiments, the adhesive layer has a thickness of less than about 0.05 mm.

A given adhesive layer may conform to achieve desired mechanical and electrical performance characteristics of the shielded electrical cable. For example, the adhesive layer may conform to be thinner between the shielding films in areas between conductor sets, which increases at least the lateral flexibility of the shielded cable. This may allow the shielded cable to be placed more easily into a curvilinear outer jacket. In some cases, an adhesive layer may conform to be thicker in areas immediately adjacent the conductor sets and substantially conform to the conductor sets. This may increase the mechanical strength and enable forming a curvilinear shape of shielding films in these areas, which may increase the durability of the shielded cable, for example, during flexing of the cable. In addition, this may help to maintain the position and spacing of the insulated conductors relative to the shielding films along the length of the shielded cable, which may result in more uniform impedance and superior signal integrity of the shielded cable.

A given adhesive layer may conform to effectively be partially or completely removed between the shielding films in areas between conductor sets, e.g., in pinched regions of the cable. As a result, the shielding films may electrically contact each other in these areas, which may increase the electrical performance of the cable. In some cases, an adhesive layer may conform to effectively be partially or completely removed between at least one of the shielding films and the ground conductors. As a result, the ground conductors may electrically contact at least one of shielding films in these areas, which may increase the electrical performance of the cable. Even in cases where a thin layer of adhesive remains between at least one of shielding films and a given ground conductor, asperities on the ground conductor may break through the thin adhesive layer to establish direct electrical contact as intended.

Figure 8A:
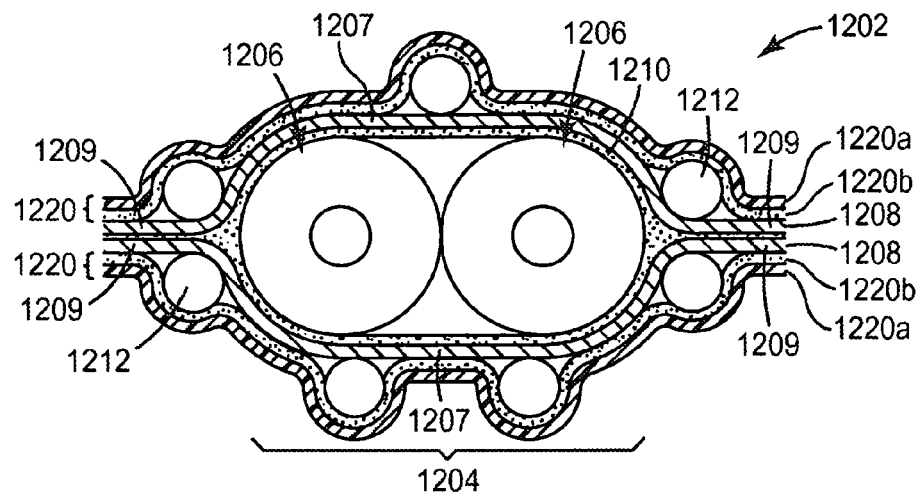
FIGS. 8a-8c are front cross-sectional views of three other exemplary embodiments of a shielded electrical cable.
Figure 8B:
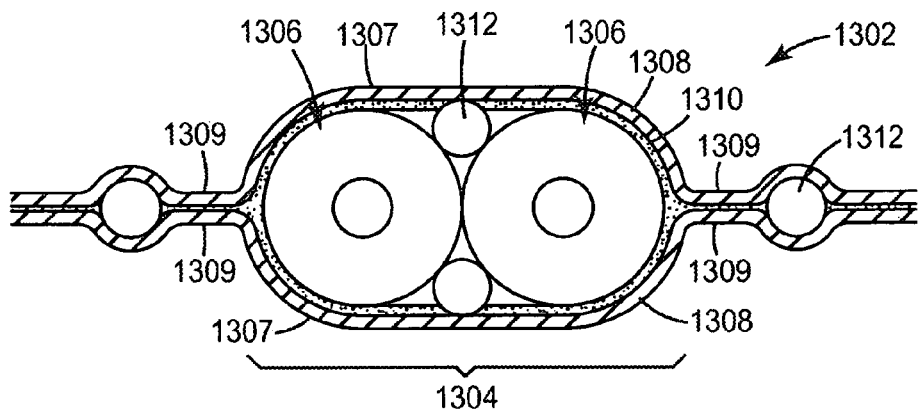
Figure 8C:
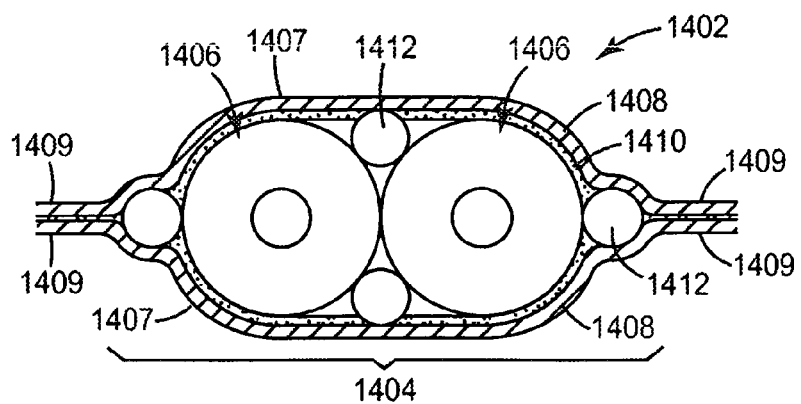

FIGS. 8a-8c are cross sectional views of three exemplary embodiments of a shielded electrical cable which illustrate examples of the placement of ground conductors in the shielded electrical cables. An aspect of a shielded electrical cable is proper grounding of the shield and such grounding can be accomplished in a number of ways. In some cases, a given ground conductor can electrically contact at least one of the shielding films such that grounding the given ground conductor also grounds the shielding films. Such a ground conductor may also be referred to as a "drain wire". Electrical contact between the shielding film and the ground conductor may be characterized by a relatively low DC resistance, e.g., a DC resistance of less than 10 ohms, or less than 2 ohms, or of substantially 0 ohms. In some cases, a given ground conductor does not electrically contact the shielding films, but may be an individual element in the cable construction that is independently terminated to any suitable individual contact element of any suitable termination component, such as, e.g., a conductive path or other contact element on a printed circuit board, paddle board, or other device. Such a ground conductor may also be referred to as a "ground wire". FIG. 8a illustrates an exemplary shielded electrical cable in which ground conductors are positioned external to the shielding films. FIGS. 8b-8c illustrate embodiments in which the ground conductors are positioned between the shielding films, and may be included in the conductor set. One or more ground conductors may be placed in any suitable position external to the shielding films, between the shielding films, or a combination of both.

Referring to FIG. 8a, a shielded electrical cable 1202 includes a single conductor set 1204 that extends along a length of the cable 1202. Conductor set 1204 includes two insulated conductors 1206, i.e., one pair of insulated conductors. Cable 1202 may include multiple conductor sets 1204 spaced apart from each other across a width of the cable and extending along a length of the cable 1202. Two shielding films 1208 disposed on opposite sides of the cable 1202 include cover portions 1207. In transverse cross section, the cover portions 1207, in combination, substantially surround conductor set 1204. An optional adhesive layer 1210 is disposed between pinched portions 1209 of the shielding films 1208 and bonds shielding films 1208 to each other on both sides of conductor set 1204. Insulated conductors 1206 are arranged generally in a single plane and effectively in a twinaxial cable configuration that can be used in a single ended circuit arrangement or a differential pair circuit arrangement. Shielded electrical cable 1202 further includes a plurality of ground conductors 1212 positioned external to shielding films 1208. Ground conductors 1212 are placed over, under, and on both sides of conductor set 1204. Optionally, shielded electrical cable 1202 includes protective films 1220 surrounding shielding films 1208 and ground conductors 1212. Protective films 1220 include a protective layer 1220a and an adhesive layer 1220b bonding protective layer 1220a to shielding films 1208 and ground conductors 1212. Alternatively, shielding films 1208 and ground conductors 1212 may be surrounded by an outer conductive shield, such as, e.g., a conductive braid, and an outer insulative jacket (not shown).

Referring to FIG. 8b, shielded electrical cable 1302 includes a single conductor set 1304 that extends along a length of cable 1302. Conductor set 1304 includes two insulated conductors 1306. Cable 1302 may include multiple conductor sets 1304 spaced apart from each other across a width of the cable 1302 and extending along the length of the cable 1302. Two shielding films 1308 are disposed on opposite sides of the cable 1302 and include cover portions 1307. In transverse cross section, cover portions, in combination, substantially surround conductor set 1304. An optional adhesive layer 1310 is disposed between pinched portions 1309 of the shielding films 1308 and bonds shielding films 1308 to each other on both sides of conductor set 1304. Insulated conductors 1306 are arranged generally in a single plane and effectively in a twinaxial or differential pair cable arrangement. Shielded electrical cable 1302 further includes a plurality of ground conductors 1312 positioned between shielding films 1308. Two of the ground conductors 1312 are included in conductor set 1304, and two of the ground conductors 1312 are spaced apart from conductor set 1304.

Referring to FIG. 8c, shielded electrical cable 1402 includes a single conductor set 1404 that extends along a length of cable 1402. Conductor set 1404 includes two insulated conductors 1406. Cable 1402 may include multiple conductor sets 1304 spaced apart from each other across a width of the cable 1402 and extending along the length of the cable 1402. Two shielding films 1408 are disposed on opposite sides of the cable 1402 and include cover portions 1407. In transverse cross section, the cover portions 1407, in combination, substantially surround conductor set 1404. An optional adhesive layer 1410 is disposed between pinched portions 1409 of the shielding films 1408 and bonds shielding films 1408 to each other on both sides of conductor set 1404. Insulated conductors 1406 are arranged generally in a single plane and effectively in a twinaxial or differential pair cable arrangement. Shielded electrical cable 1402 further includes a plurality of ground conductors 1412 positioned between shielding films 1408. All of the ground conductors 1412 are included in conductor set 1404. Two of the ground conductors 1412 and insulated conductors 1406 are arranged generally in a single plane.

Figure 9A:
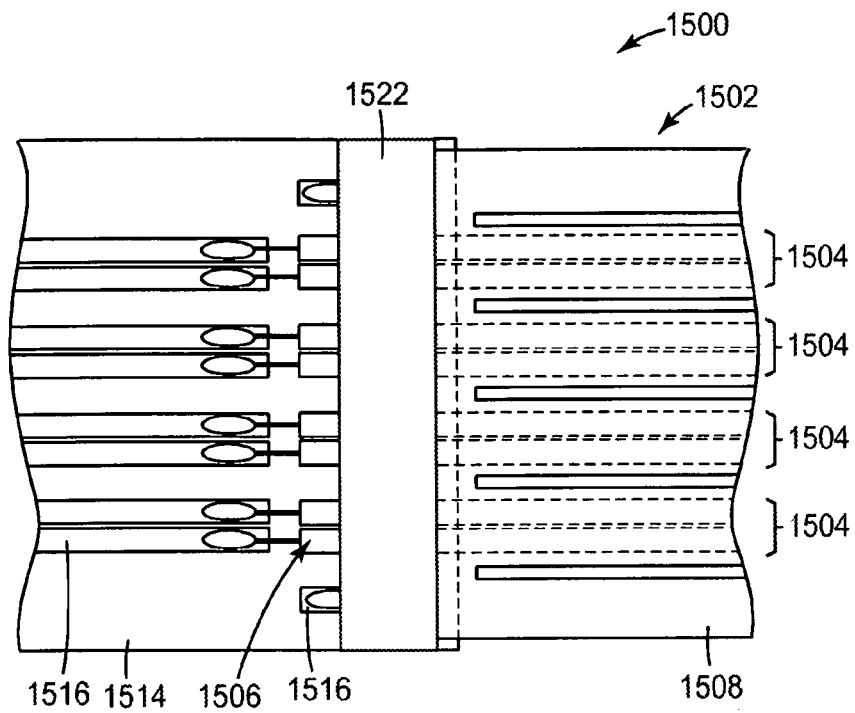
FIGS. 9a-9b are top and partially cross-sectional front views, respectively, of an exemplary embodiment of an electrical assembly terminated to a printed circuit board.
Figure 9B:
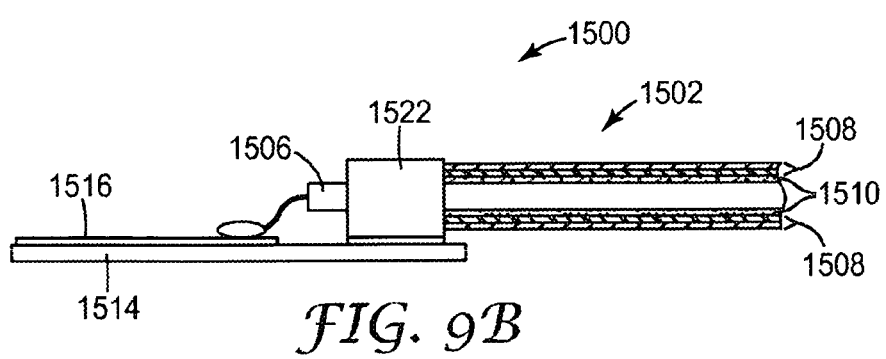

FIGS. 9a-9b illustrate an electrical assembly 1500 including a cable 1502 terminated to a printed circuit board 1514. Electrical assembly 1500 includes a shielded electrical cable 1502 and an electrically conductive cable clip 1522. Shielded electrical cable 1502 includes a plurality of spaced apart conductor sets 1504 arranged generally in a single plane. Each conductor set 1504 includes two insulated conductors 1506 that extend along a length of the cable 1502. Two shielding films 1508 are disposed on opposite sides of the cable 1502 and, in transverse cross section, substantially surround conductor sets 1504. One or more optional adhesive layers 1510 are disposed between shielding films 1508 and bond shielding films 1508 to each other on both sides of each conductor set 1504.

Cable clip 1522 is clamped or otherwise attached to an end portion of shielded electrical cable 1502 such that at least one of shielding films 1508 electrically contacts cable clip 1522. Cable clip 1522 is configured for termination to a ground reference, such as, e.g., contact element 1516 on printed circuit board 1514, to establish a ground connection between shielded electrical cable 1502 and the ground reference. Cable clip may be terminated to the ground reference using any suitable method, including soldering, welding, crimping, mechanical clamping, and adhesively bonding, to name a few. When terminated, cable clip 1522 may facilitate termination of the end portions of the conductors of insulated conductors 1506 of shielded electrical cable 1502 to contact elements of a termination point, such as, e.g., contact elements 1516 on printed circuit board 1514. Shielded electrical cable 1502 may include one or more ground conductors as described herein that may electrically contact cable clip 1522 in addition to or instead of at least one of shielding films 1508.

FIGS. 10a-10g illustrate an exemplary method of making a shielded electrical cable that may be substantially the same as that shown in FIG. 1.

In the step illustrated in FIG. 10a, insulated conductors 6 are formed using any suitable method, such as, e.g., extrusion, or are otherwise provided. Insulated conductors 6 may be formed of any suitable length. Insulated conductors 6 may then be provided as such or cut to a desired length. Ground conductors 12 (see FIG. 10c) may be formed and provided in a similar fashion.

In the step illustrated in FIG. 10b, one or more shielding films 8 are formed. A single layer or multilayer web may be formed using any suitable method, such as, e.g., continuous wide web processing. Each shielding film 8 may be formed of any suitable length. The shielding film 8 may then be provided as such or cut to a desired length and/or width. The shielding film 8 may be pre-formed to have transverse partial folds to increase flexibility in the longitudinal direction. One or both of the shielding films 8 may include a conformable adhesive layer 10, which may be formed on the shielding film 8 using any suitable method, such as, e.g., laminating or sputtering.

In the step illustrated in FIG. 10c, a plurality of insulated conductors 6, ground conductors 12, and shielding films 8 are provided. A forming tool 24 is provided. Forming tool 24 includes a pair of forming rolls 26a, 26b having a shape corresponding to a desired cross-sectional shape of the shielded electrical cable 2, the forming tool also including a bite 28. Insulated conductors 6, ground conductors 12, and shielding films 8 are arranged according to the configuration of desired shielded electrical cable 2, such as any of the cables shown and/or described herein, and positioned in proximity to forming rolls 26a, 26b, after which they are concurrently fed into bite 28 of forming rolls 26a, 26b and disposed between forming rolls 26a, 26b. Forming tool 24 forms shielding films 8 around conductor sets 4 and ground conductor 12 and bonds shielding films 8 to each other on both sides of each conductor set 4 and ground conductors 12. Heat may be applied to facilitate bonding. Although in this embodiment, forming shielding films 8 around conductor sets 4 and ground conductor 12 and bonding shielding films 8 to each other on both sides of each conductor set 4 and ground conductors 12 occur in a single operation, in other embodiments, these steps may occur in separate operations.

Figure 10D:
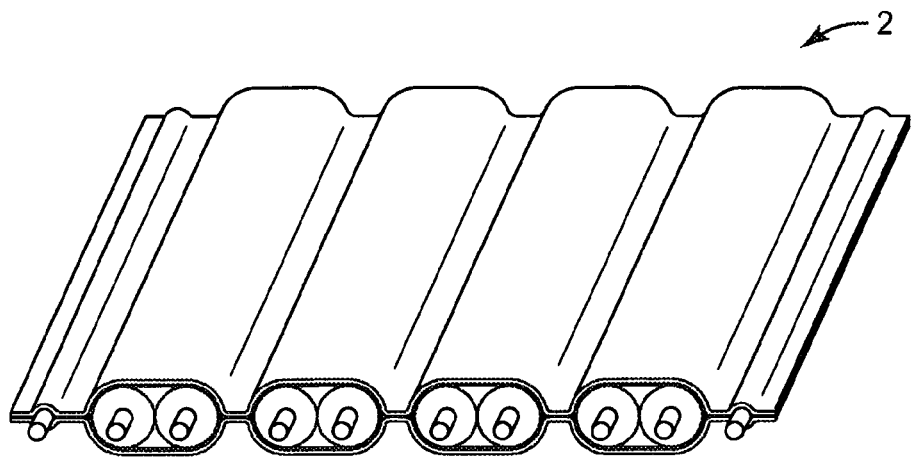
Figure 10E:
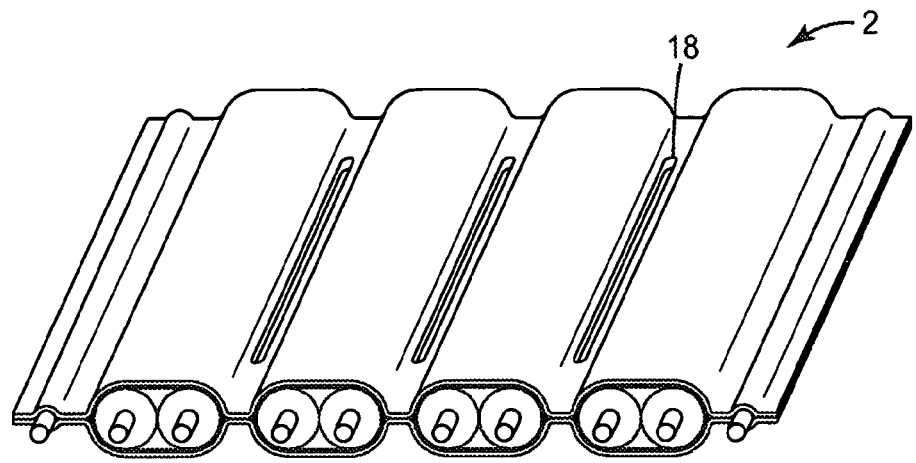

FIG. 10d illustrates shielded electrical cable 2 as it is formed by forming tool 24. In the optional step illustrated in FIG. 10e, longitudinal splits 18 are formed between conductor sets 4. Splits 18 may be formed in shielded electrical cable 2 using any suitable method, such as, e.g., laser cutting or punching.

Figure 10F:
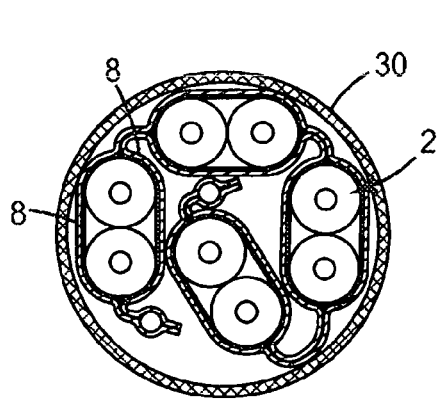
Figure 10G:
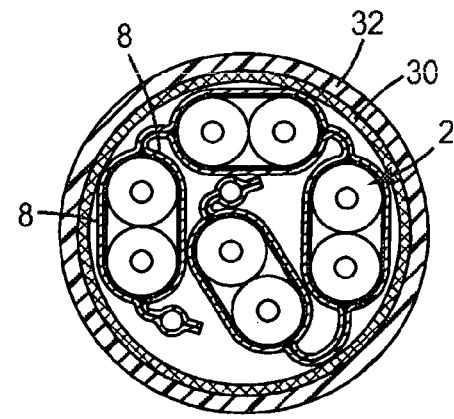

In another optional step illustrated in FIG. 10f, shielding films 8 of shielded electrical cable 2 may be folded lengthwise along the pinched regions multiple times into a bundle, and an outer conductive shield 30 may be provided around the folded bundle using any suitable method. An outer jacket 32 may also be provided around outer conductive shield 30 using any suitable method, such as, e.g., extrusion. In some embodiments, the outer conductive shield 30 may be omitted and the outer jacket 32 may be provided around the folded shielded cable.

Figure 11A:
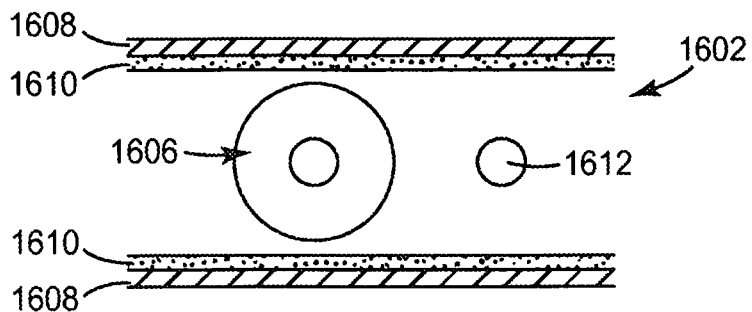
FIGS. 11a-11c are front cross-sectional views illustrating a detail of an exemplary method of making a shielded electrical cable.
Figure 11B:
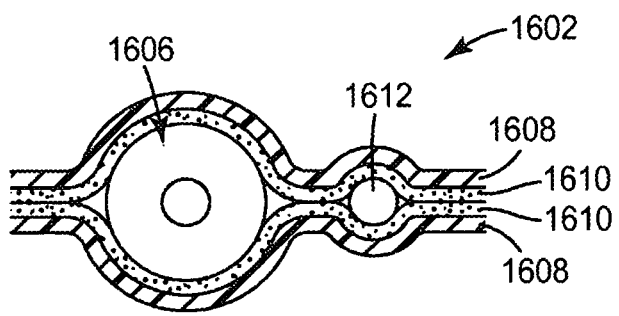
Figure 11C:
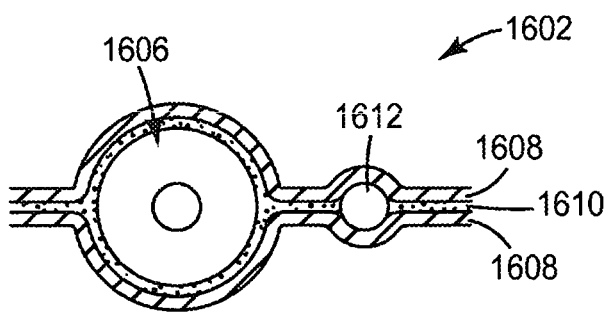

FIGS. 11a-11c illustrate a detail of an exemplary method of making a shielded electrical cable. FIGS. 11a-11c illustrate how one or more adhesive layers may be conformably shaped during the forming and bonding of the shielding films.

In the step illustrated in FIG. 11a, an insulated conductor 1606, a ground conductor 1612 spaced apart from insulated conductor 1606, and two shielding films 1608 are provided. Shielding films 1608 each include a conformable adhesive layer 1610. In the steps illustrated in FIGS. 11b-11c, shielding films 1608 are formed around insulated conductor 1606 and ground conductor 1612 and bonded to each other. Initially, as illustrated in FIG. 11b, adhesive layers 1610 still have their original thickness. As the forming and bonding of shielding films 1608 proceeds, conformable adhesive layers 1610 conform to achieve desired mechanical and electrical performance characteristics of shielded electrical cable 1602 (FIG. 11c).

As illustrated in FIG. 11c, adhesive layers 1610 conform to be thinner between shielding films 1608 on both sides of insulated conductor 1606 and ground conductor 1612; a portion of adhesive layers 1610 displaces away from these areas. Further, conformable adhesive layers 1610 conform to be thicker in areas immediately adjacent insulated conductor 1606 and ground conductor 1612, and substantially conform to insulated conductor 1606 and ground conductor 1612; a portion of adhesive layers 1610 displaces into these areas. Further, conformable adhesive layers 1610 conform to effectively be removed between shielding films 1608 and ground conductor 1612; conformable adhesive layers 1610 displace away from these areas such that ground conductor 1612 electrically contacts shielding films 1608.

In some approaches, a semi-rigid cable can be formed using a thicker metal or metallic material as a shielding layer. For example, aluminum or other metal may be used in this approach without a backing film. The aluminum (or other material) is passed through shaping dies to create corrugations or channels in the aluminum which form cover portions and pinched portions of the shield. The insulated conductors are placed in the corrugations that form the cover portions. If drain wires are used, corrugations may also be formed for the drain wires. The insulated conductors and, optionally, drain wires, are sandwiched in between opposite layers of corrugated aluminum. The aluminum layers may be bonded together with adhesive, or welded, for example; Connection between the upper and lower corrugated aluminum shielding films could be through un-insulated drain wires. Alternatively, the pinched portions of the aluminum could be embossed, pinched further and/or punched through to provide positive contact between the corrugated shielding layers.

In exemplary embodiments, the cover regions of the shielded electrical cable include concentric regions and transition regions positioned on one or both sides of a given conductor set. Portions of a given shielding film in the concentric regions are referred to as concentric portions of the shielding film and portions of the shielding film in the transition regions are referred to as transition portions of the shielding film. The transition regions can be configured to provide high manufacturability and strain and stress relief of the shielded electrical cable. Maintaining the transition regions at a substantially constant configuration (including aspects such as, e.g., size, shape, content, and radius of curvature) along the length of the shielded electrical cable may help the shielded electrical cable to have substantially uniform electrical properties, such as, e.g., high frequency isolation, impedance, skew, insertion loss, reflection, mode conversion, eye opening, and jitter.

Additionally, in certain embodiments, such as, e.g., embodiments wherein the conductor set includes two insulated conductors that extend along a length of the cable that are arranged generally in a single and effectively as a twinaxial cable that can be connected in a differential pair circuit arrangement, maintaining the transition portion at a substantially constant configuration along the length of the shielded electrical cable can beneficially provide substantially the same electromagnetic field deviation from an ideal concentric case for both conductors in the conductor set. Thus, careful control of the configuration of this transition portion along the length of the shielded electrical cable can contribute to the advantageous electrical performance and characteristics of the cable. FIGS. 12a-14b illustrate various exemplary embodiments of a shielded electrical cable that include transition regions of the shielding films disposed on one or both sides of the conductor set.

Figure 12A:
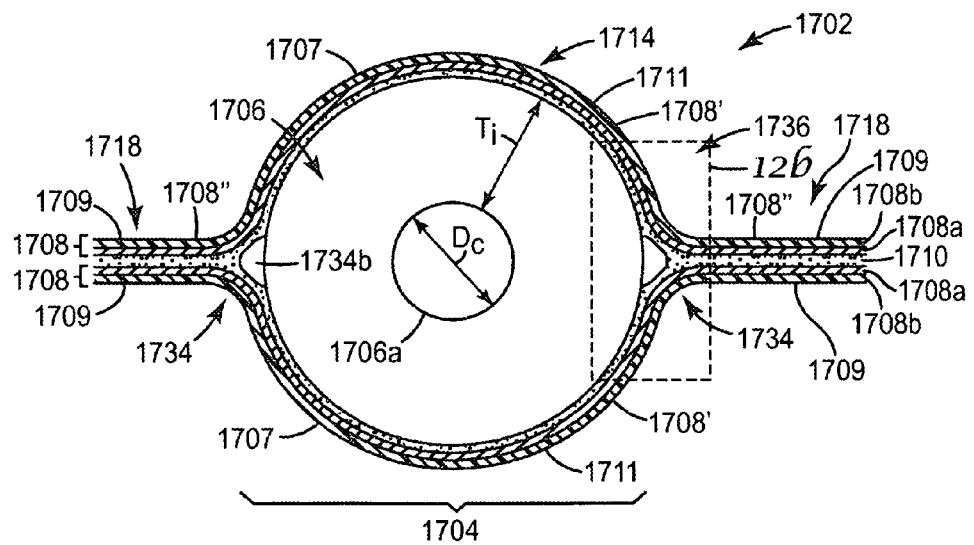
FIGS. 12a-12b are a front cross-sectional view of another exemplary embodiment of a shielded electrical cable according to an aspect of the present invention and a corresponding detail view, respectively.
Figure 12B:
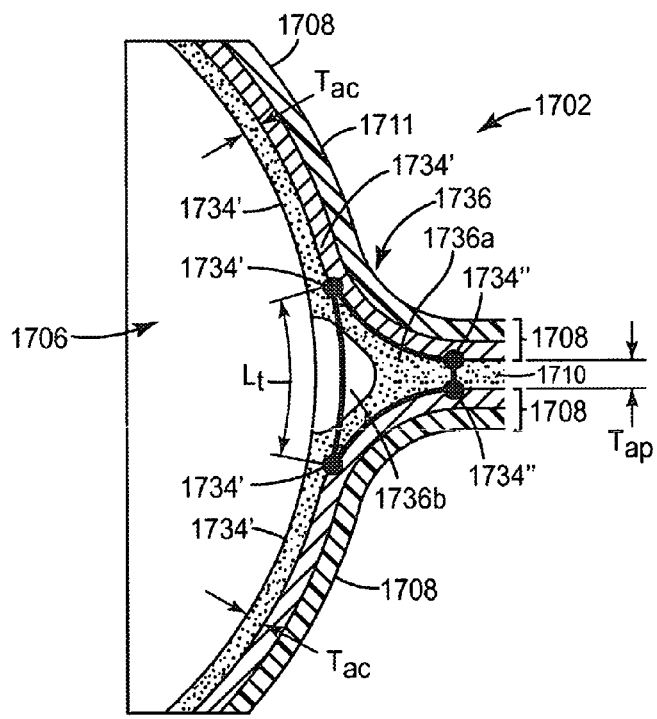

The shielded electrical cable 1702, which is shown in cross section in FIGS. 12a and 12b, includes a single conductor set 1704 that extends along a length of the cable 1702. The shielded electrical cable 1702 may be made to have multiple conductor sets 1704 spaced apart from each other along a width of the cable 1702 and extending along a length of the cable 1702. Although only one insulated conductor 1706 is shown in FIG. 12a, multiple insulated conductors may be included in the conductor set 1704, if desired.

The insulated conductor of a conductor set that is positioned nearest to a pinched region of the cable is considered to be an end conductor of the conductor set. The conductor set 1704, as shown, has a single insulated conductor 1706 and it is also an end conductor, since it is positioned nearest to the pinched region 1718 of the shielded electrical cable 1702.

First and second shielding films 1708 are disposed on opposite sides of the cable and include cover portions 1707. In transverse cross section, the cover portions 1707 substantially surround conductor set 1704. An optional adhesive layer 1710 is disposed between the pinched portions 1709 of the shielding films 1708 and bonds shielding films 1708 to each other in the pinched regions 1718 of the cable 1702 on both sides of conductor set 1704. The optional adhesive layer 1710 may extend partially or fully across the cover portion 1707 of the shielding films 1708, e.g., from the pinched portion 1709 of the shielding film 1708 on one side of the conductor set 1704 to the pinched portion 1709 of the shielding film 1708 on the other side of the conductor set 1704.

Insulated conductor 1706 is effectively arranged as a coaxial cable which may be used in a single ended circuit arrangement. Shielding films 1708 may include a conductive layer 1708a and a non-conductive polymeric layer 1708b. In some embodiments, as illustrated by FIGS. 12a and 12b, the conductive layer 1708a faces the insulated conductors. Alternatively, the orientation of the conductive layers of one or both of shielding films 1708 may be reversed, as discussed elsewhere herein.

Shielding films 1708 include a concentric portion that is substantially concentric with the end conductor 1706 of the conductor set 1704. The shielded electrical cable 1702 includes transition regions 1736. Portions of the shielding film 1708 in the transition region 1736 of the cable 1702 are transition portions 1734 of the shielding films 1708. In some embodiments, shielded electrical cable 1702 includes a transition regions 1736 positioned on both sides of the conductor set 1704 and in some embodiments, the transition regions 1736 may be positioned on only one side of conductor set 1704.

Transition regions 1736 are defined by shielding films 1708 and conductor set 1704. The transition portions 1734 of the shielding films 1708 in the transition regions 1736 provide a gradual transition between concentric portions 1711 and pinched portions 1709 of the shielding films 1708. As opposed to a sharp transition, such as, e.g., a right-angle transition or a transition point (as opposed to a transition portion), a gradual or smooth transition, such as, e.g., a substantially sigmoidal transition, provides strain and stress relief for shielding films 1708 in transition regions 1736 and prevents damage to shielding films 1708 when shielded electrical cable 1702 is in use, e.g., when laterally or axially bending shielded electrical cable 1702. This damage may include, e.g., fractures in conductive layer 1708a and/or debonding between conductive layer 1708a and non-conductive polymeric layer 1708b. In addition, a gradual transition prevents damage to shielding films 1708 in manufacturing of shielded electrical cable 1702, which may include, e.g., cracking or shearing of conductive layer 1708a and/or non-conductive polymeric layer 1708b. Use of the disclosed transition regions on one or both sides of one, some or all of the conductor sets in a shielded electrical ribbon cable represents a departure from conventional cable configurations, such as, e.g., an typical coaxial cable, wherein a shield is generally continuously disposed around a single insulated conductor, or a typical conventional twinaxial cable, in which a shield is continuously disposed around a pair of insulated conductors.

According to one aspect of at least some of the disclosed shielded electrical cables, acceptable electrical properties can be achieved by reducing the electrical impact of the transition region, e.g., by reducing the size of the transition region and/or carefully controlling the configuration of the transition region along the length of the shielded electrical cable. Reducing the size of the transition region reduces the capacitance deviation and reduces the required space between multiple conductor sets, thereby reducing the conductor set pitch and/or increasing the electrical isolation between conductor sets. Careful control of the configuration of the transition region along the length of the shielded electrical cable contributes to obtaining predictable electrical behavior and consistency, which provides for high speed transmission lines so that electrical data can be more reliably transmitted. Careful control of the configuration of the transition region along the length of the shielded electrical cable is a factor as the size of the transition portion approaches a lower size limit.

An electrical characteristic that is often considered is the characteristic impedance of the transmission line. Any impedance changes along the length of a transmission line may cause power to be reflected back to the source instead of being transmitted to the target. Ideally, the transmission line will have no impedance variation along its length, but, depending on the intended application, variations up to 5-10% may be acceptable. Another electrical characteristic that is often considered in twinaxial cables (differentially driven) is skew or unequal transmission speeds of two transmission lines of a pair along at least a portion of their length. Skew produces conversion of the differential signal to a common mode signal that can be reflected back to the source, reduces the transmitted signal strength, creates electromagnetic radiation, and can dramatically increase the bit error rate, in particular jitter. Ideally, a pair of transmission lines will have no skew, but, depending on the intended application, a differential S-parameter SCD21 or SCD12 value (representing the differential-to common mode conversion from one end of the transmission line to the other) of less than −25 to −30 dB up to a frequency of interest, such as, e.g., 6 GHz, may be acceptable. Alternatively, skew can be measured in the time domain and compared to a required specification. Shielded electrical cables described herein may achieve skew values of less than about 20 picoseconds/meter (psec/m) or less than about 10 psec/m, for example at data transfer speeds of up to 10 Gbps.

Referring again to FIGS. 12a-12b, in part to help achieve acceptable electrical properties, transition regions 1736 of shielded electrical cable 1702 may each include a cross-sectional transition area 1764a. The transition area 1764a is smaller than a cross-sectional area 1706a of conductor 1706. As best shown in FIG. 12b, cross-sectional transition area 1736a of transition region 1736 is defined by transition points 1734' and 1734".

The transition points 1734' occur where the shielding films deviate from being substantially concentric with the end insulated conductor 1706 of the conductor set 1704. The transition points 1734' are the points of inflection of the shielding films 1708 at which the curvature of the shielding films 1708 changes sign. For example, with reference to FIG. 12b, the curvature of the upper shielding film 1708 transitions from concave downward to concave upward at the inflection point which is the upper transition point 1734'. The curvature of the lower shielding film 1708 transitions from concave upward to concave downward at the lower inflection point which is the transition point 1734'. The other transition points 1734" occur where a separation between the pinched portions 1709 of the shielding films 1708 exceeds the minimum separation, $d_1$, of the pinched portions 1709, by a predetermined factor, e.g, within a range of about 1.2 to about 1.5, for example.

In addition, each transition area 1736a may include a void area 1736b. Void areas 1736b on either side of the conductor set 1704 may be substantially the same. Further, adhesive layer 1710 may have a thickness $T_{ac}$ at the concentric portion 1711 of the shielding film 1708, and a thickness at the transition portion 1734 of the shielding film 1708 that is greater than thickness $T_{ac}$. Similarly, adhesive layer 1710 may have a thickness $T_{ap}$ between the pinched portions 1709 of the shielding films 1708, and a thickness at the transition portion 1734 of the shielding film 1708 that is greater than thickness $T_{ap}$. Adhesive layer 1710 may represent at least 25% of cross-sectional transition area 1736a. The presence of adhesive layer 1710 in transition area 1736a, in particular at a thickness that is greater than thickness $T_{ac}$ or thickness $T_{ap}$, contributes to the strength of the cable 1702 in the transition region 1736.

Careful control of the manufacturing process and the material characteristics of the various elements of shielded electrical cable 1702 may reduce variations in void area 1736b and the thickness of conformable adhesive layer 1710 in transition region 1736, which may in turn reduce variations in the capacitance of cross-sectional transition area 1736a. Shielded electrical cable 1702 may include transition region 1736 positioned on one or both sides of conductor set 1704 that includes a cross-sectional transition area 1736a that is substantially equal to or smaller than a cross-sectional area 1706a of conductor 1706. Shielded electrical cable 1702 may include a transition region 1736 positioned on one or both sides of conductor set 1704 that includes a cross-sectional transition area 1736a that is substantially the same along the length of conductor 1706. For example, cross-sectional transition area 1736a may vary less than 50% over a length of 1 meter. Shielded electrical cable 1702 may include transition regions 1736 positioned on both sides of conductor set 1704 that each include a cross-sectional transition area, wherein the sum of cross-sectional areas 1734a is substantially the same along the length of conductor 1706. For example, the sum of cross-sectional areas 1734a may vary less than 50% over a length of 1 meter. Shielded electrical cable 1702 may include transition regions 1736 positioned on both sides of conductor set 1704 that each include a cross-sectional transition area 1736a, wherein the cross-sectional transition areas 1736a are substantially the same. Shielded electrical cable 1702 may include transition regions 1736 positioned on both sides of conductor set 1704, wherein the transition regions 1736 are substantially identical. Insulated conductor 1706 has an insulation thickness $T_1$, and transition region 1736 may have a lateral length $L_t$ that is less than insulation thickness $T_1$. The central conductor of insulated conductor 1706 has a diameter $D_c$, and transition region 1736 may have a lateral length $L_t$ that is less than the diameter $D_c$. The various configurations described above may provide a characteristic impedance that remains within a desired range, such as, e.g., within 5-10% of a target impedance value, such as, e.g., 50 Ohms, over a given length, such as, e.g., 1 meter.

Factors that can influence the configuration of transition region 1736 along the length of shielded electrical cable 1702 include the manufacturing process, the thickness of conductive layers 1708a and non-conductive polymeric layers 1708b, adhesive layer 1710, and the bond strength between insulated conductor 1706 and shielding films 1708, to name a few.

In one aspect, conductor set 1704, shielding films 1708, and transition region 1736 are cooperatively configured in an impedance controlling relationship. An impedance controlling relationship means that conductor set 1704, shielding films 1708, and transition region 1736 are cooperatively configured to control the characteristic impedance of the shielded electrical cable.

Figure 13A:
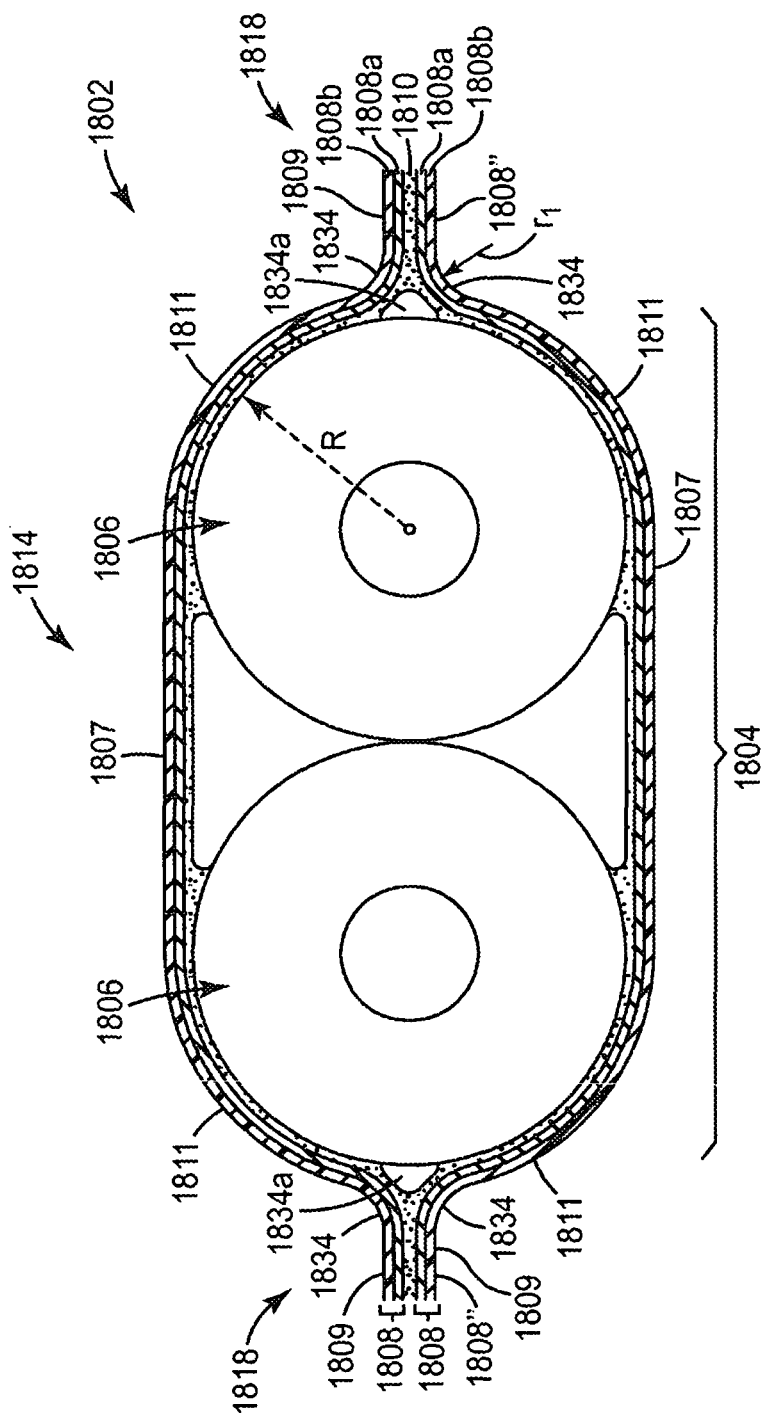
FIGS. 13a-13b are front cross-sectional views of two other exemplary embodiments of a shielded electrical cable according to an aspect of the present invention.
Figure 13B:
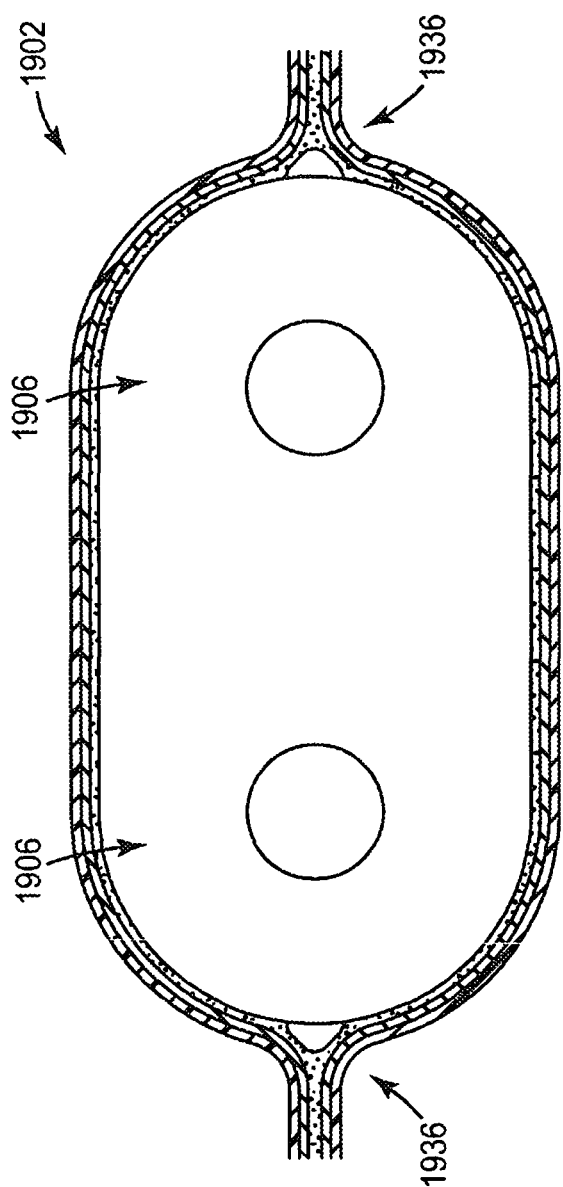

FIGS. 13a-13b illustrate, in transverse cross section, two exemplary embodiments of a shielded electrical cable which has two insulated conductors in a conductor set. Referring to FIG. 13a, shielded electrical cable 1802 includes a single conductor set 1804 including two individually insulated conductors 1806 extending along a length of the cable 1802. Two shielding films 1808 are disposed on opposite sides of the cable 1802 and in combination substantially surround conductor set 1804. An optional adhesive layer 1810 is disposed between pinched portions 1809 of the shielding films 1808 and bonds shielding films 1808 to each other on both sides of conductor set 1804 in the pinched regions 1818 of the cable 1802. Insulated conductors 1806 can be arranged generally in a single plane and effectively in a twinaxial cable configuration. The twinaxial cable configuration can be used in a differential pair circuit arrangement or in a single ended circuit arrangement. Shielding films 1808 may include a conductive layer 1808a and a non-conductive polymeric layer 1808b or may include the conductive layer 1808a without the non-conductive polymeric layer 1808b. FIG. 13a shows conductive layer 1808a facing insulated conductors 1806, but in alternative embodiments, one or both of the shielding films may have a reversed orientation.

The cover portion 1807 of at least one of the shielding films 1808 includes concentric portions 1811 that are substantially concentric with corresponding end conductors 1806 of the conductor set 1804. In the transition region 1836 of the cable 1802, transition portion 1834 of the shielding films 1808 are between the concentric portions 1811 and the pinched portions 1809 of the shielding films 1808. Transition portions 1836 are positioned on both sides of conductor set 1804 and each such portion includes a cross-sectional transition area 1836a. The sum of cross-sectional transition areas 1836a is preferably substantially the same along the length of conductors 1806. For example, the sum of cross-sectional areas 1834a may vary less than 50% over a length of 1 meter.

In addition, the two cross-sectional transition areas 1834a may be substantially the same and/or substantially identical. This configuration of transition regions contributes to a characteristic impedance for each conductor 1806 (single-ended) and a differential impedance that both remain within a desired range, such as, e.g., within 5-10% of a target impedance value over a given length, such as, e.g., 1 meter. In addition, this configuration of transition region 1836 may minimize skew of the two conductors 1806 along at least a portion of their length.

When the cable is in an unfolded, planar configuration, each of the shielding films may be characterizable in transverse cross section by a radius of curvature that changes across a width of the cable 1802. The maximum radius of curvature of the shielding film 1808 may occur, for example, at the pinched portion 1809 of the cable 1802 or near the center point of the cover portion 1807 of the multi-conductor cable set 1804 illustrated in FIG. 13a. At these positions, the film may be substantially flat and the radius of curvature may be substantially infinite. The minimum radius of curvature of the shielding film 1808 may occur, for example, at the transition portion 1834 of the shielding film 1808. In some embodiments, the radius of curvature of the shielding film across the width of the cable is at least about 50 micrometers, i.e., the radius of curvature does not have a magnitude smaller than 50 micrometers at any point along the width of the cable, between the edges of the cable. In some embodiments, for shielding films that include a transition portion, the radius of curvature of the transition portion of the shielding film is similarly at least about 50 micrometers.

In an unfolded, planar configuration, shielding films 1808 that include a concentric portion and a transition portion are characterizable by a radius of curvature of the concentric portion, $R_1$, and/or a radius of curvature of the transition portion $r_1$, which are illustrated in FIG. 13*a*. In some embodiments, $R_1/r_1$ is in a range of 2 to 15.

Referring to FIG. 13*b*, shielded electrical cable 1902 is similar in some aspects to shielded electrical cable 1802. Whereas shielded electrical cable 1802 has individually insulated conductors 1806, shielded electrical cable 1902 has jointly insulated conductors 1906. Nonetheless, transition regions 1936 are substantially similar to transition regions 1836 and provide the same benefits to shielded electrical cable 1902.

Figure 14A:
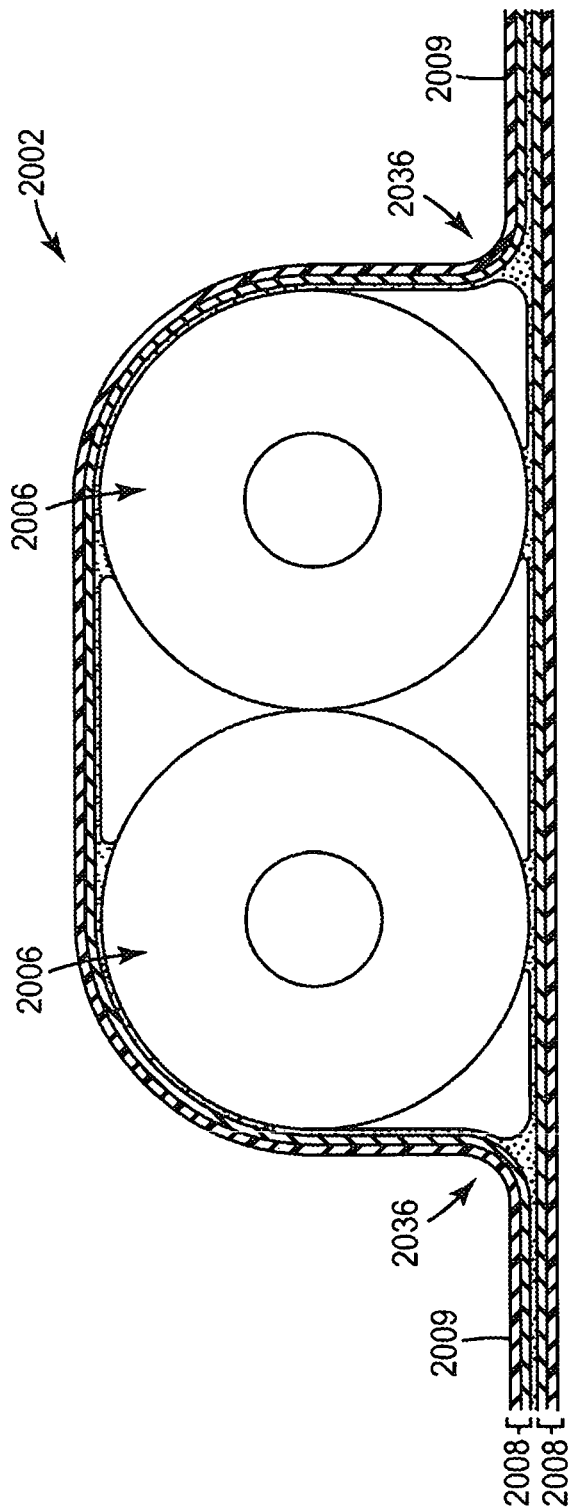
FIGS. 14a-14b are front cross-sectional views of two other exemplary embodiments of a shielded electrical cable.
Figure 14B:
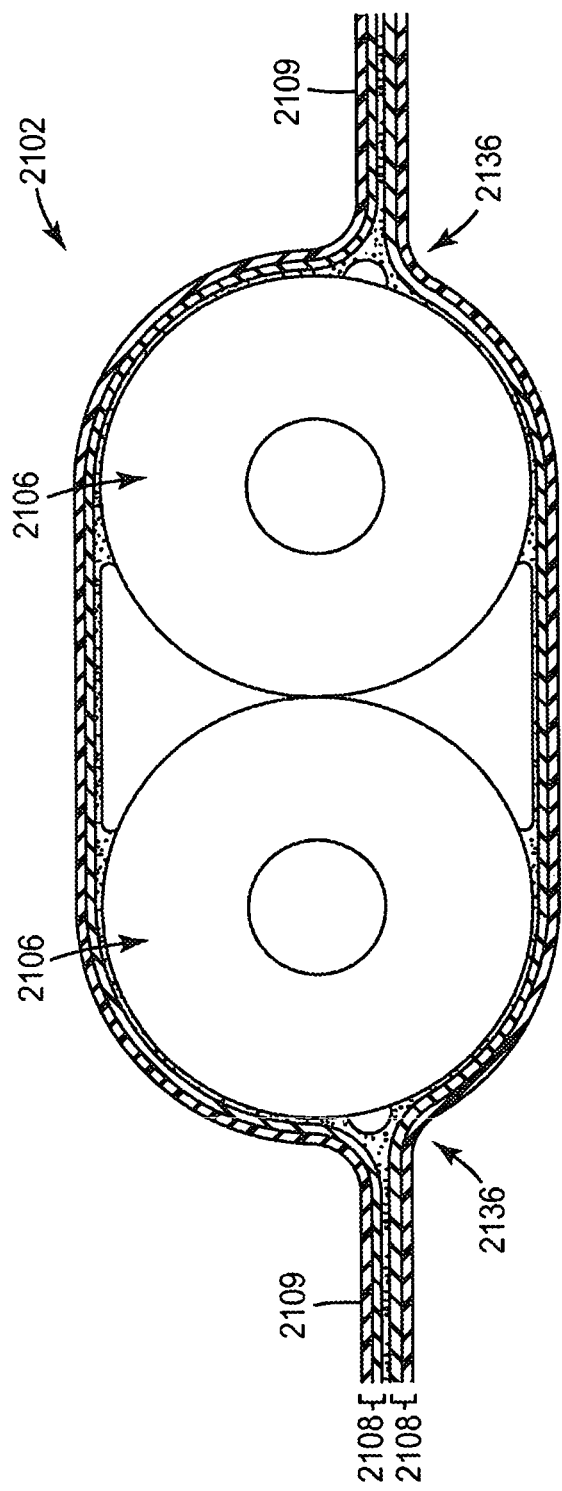

FIGS. 14*a*-14*b* illustrate variations in position and configuration of the transition portions. In these exemplary embodiments, the shielding films 2008, 2108 have an asymmetric configuration which changes the position of the transition portions relative to more symmetric embodiment such that of FIG. 13*a*. Shielded electrical cables 2002 (FIG. 14*a*) and 2102 (FIG. 14*b*) have pinched portions 2009 of shielding films 2008, 2108 lie in a plane that is offset from the plane of symmetry of the insulated conductors 2006, 2106. As a result, the transition regions 2036, 2136 have a somewhat offset position and configuration relative to other depicted embodiments. However, by ensuring that the transition regions 2036, 2136 are positioned substantially symmetrically with respect to corresponding insulated conductors 2006, 2106 (e.g., with respect to a vertical plane between the conductors 2006, 2106), and that the configuration of transition regions 2036, 2136 is carefully controlled along the length of shielded electrical cables 2002, 2102, shielded electrical cables 2002, 2102 can be configured to still provide acceptable electrical properties.

FIGS. 15*a*-15*c*, 18 and 19 illustrate additional exemplary embodiments of shielded electrical cables. FIGS. 16*a*-16*g*, 17*a*-17*b* and 20*a*-20*f* illustrate several exemplary embodiments of a pinched portion of a shielded electrical cable. FIGS. 15*a*-20*f* illustrate examples of a pinched portion that is configured to electrically isolate a conductor set of the shielded electrical cable. The conductor set may be electrically isolated from an adjacent conductor set (e.g., to minimize crosstalk between adjacent conductor sets, FIGS. 15*a*-15*c* and 16*a*-16*g*) or from the external environment of the shielded electrical cable (e.g., to minimize electromagnetic radiation escape from the shielded electrical cable and minimize electromagnetic interference from external sources, FIGS. 19 and 20*a*-20*f*). In both cases, the pinched portion may include various mechanical structures to change the electrical isolation. Examples include close proximity of the shielding films, high dielectric constant material between the shielding films, ground conductors that make direct or indirect electrical contact with at least one of the shielding films, extended distance between adjacent conductor sets, physical breaks between adjacent conductor sets, intermittent contact of the shielding films to each other directly either longitudinally, transversely, or both, and conductive adhesive, to name a few. In one aspect, a pinched portion of the shielding films is defined as a portion of the shielding films that is not covering a conductor set.

FIG. 15*a* shows, in cross section, a shielded electrical cable 2202 that includes two conductor sets 2204*a*, 2204*b* spaced apart across a width of the cable 2202 and extending longitudinally along a length of the cable 2202. Each conductor set 2204*a*, 2204*b* includes two insulated conductors 2206*a*, 2206*b*. Two shielding films 2208 are disposed on opposite sides of the cable 2202. In transverse cross section, cover portions 2207 of the shielding films 2208 substantially surround conductor sets 2204*a*, 2204*b* in cover regions 2214 of the cable 2202. For example, the cover portions 2207 of the shielding films 2208 in combination substantially surround each conductor set 2204*a*, 2204*b* by encompassing at least 70% of a periphery of each conductor set 2204*a*, 2204*b*. In pinched regions 2218 of the cable 2202, on both sides of the conductor sets 2204*a*, 2204*b*, the shielding films 2208 include pinched portions 2209. In shielded electrical cable 2202, the pinched portions 2209 of shielding films 2208 and insulated conductors 2206 are arranged generally in a single plane when the cable 2202 is in a planar and/or unfolded arrangement. Pinched portions 2209 positioned in between conductor sets 2204*a*, 2204*b* are configured to electrically isolate conductor sets 2204*a*, 2204*b* from each other.

When arranged in a generally planar, unfolded arrangement, as illustrated in FIG. 15*a*, the high frequency electrical isolation of the first insulated conductor 2206*a* in the conductor set 2204 relative to the second insulated conductor 2206*b* in the conductor set 2204 is substantially less than the high frequency electrical isolation of the first conductor set 2204*a* relative to the second conductor set 2204*b*. For example, the high frequency isolation of the first insulated conductor relative to the second conductor is a first far end crosstalk C1 at a specified frequency of 3-15 GHz and a length of 1 meter, and the high frequency isolation of the first conductor set relative to the adjacent conductor set is a second far end crosstalk C2 at the specified frequency, and wherein C2 is at least 10 dB lower than C1.

As illustrated in the cross section of FIG. 15*a*, the cable 2202 can be characterized by a maximum separation, D, between the cover portions 2207 of the shielding films 2208, a minimum separation, $d_2$, between the cover portions 2207 of the shielding films 2208, and a minimum separation, $d_1$, between the pinched portions 2209 of the shielding films 2208. In some embodiments, $d_1/D$ is less than 0.25 or less than 0.1. In some embodiments, $d_2/D$ is greater than 0.33.

An optional adhesive layer 2210 may be included as shown between the pinched portions 2209 of the shielding films 2208. Adhesive layer 2210 may be continuous or discontinuous. In some embodiments, the adhesive layer extends fully or partially in the cover region 2214 of the cable 2202, e.g., between the cover portion 2207 of the shielding films 2208 and the insulated conductors 2206*a*, 2206*b*. The adhesive layer 2210 may be disposed on the cover portion 2207 of the shielding film 2208 and may extend fully or partially from the pinched portion 2209 of the shielding film 2208 on one side of a conductor set 2204*a*, 2204*b* to the pinched portion 2209 of the shielding film 2208 on the other side of the conductor set 2204*a*, 2204*b*.

The shielding films 2208 can be characterized by a radius of curvature, R, across a width of the cable 2202 and/or by a radius of curvature, $r_1$, of the transition portion 2212 of the shielding film and/or by a radius of curvature, $r_2$, of the concentric portion 2211 of the shielding film.

In the transition region 2236, the transition portion 2212 of the shielding film 2208 can be arranged to provide a gradual transition between the concentric portion 2211 of the shielding film 2208 and the pinched portion 2209 of the shielding film 2208. The transition portion 2212 of the shielding film 2208 extends from a first transition point 2221, which is the inflection point of the shielding film 2208 and marks the end of the concentric portion 2211, to a second transition point 2222 where the separation between the shielding films exceeds the minimum separation, $d_1$, of the pinched portions 2209 by a predetermined factor.

In some embodiments, the cable 2202 includes at least one shielding film that has a radius of curvature, R, across the width of the cable that is at least about 50 micrometers and/or the minimum radius of curvature, $r_1$, of the transition portion 2212 of the shielding film 2202 is at least about 50 micrometers. In some embodiments, the ratio of the minimum radius of curvature of the concentric portion to the minimum radius of curvature of the transition portion, $r_2/r_1$ is in a range of 2 to 15.

Figure 15B:
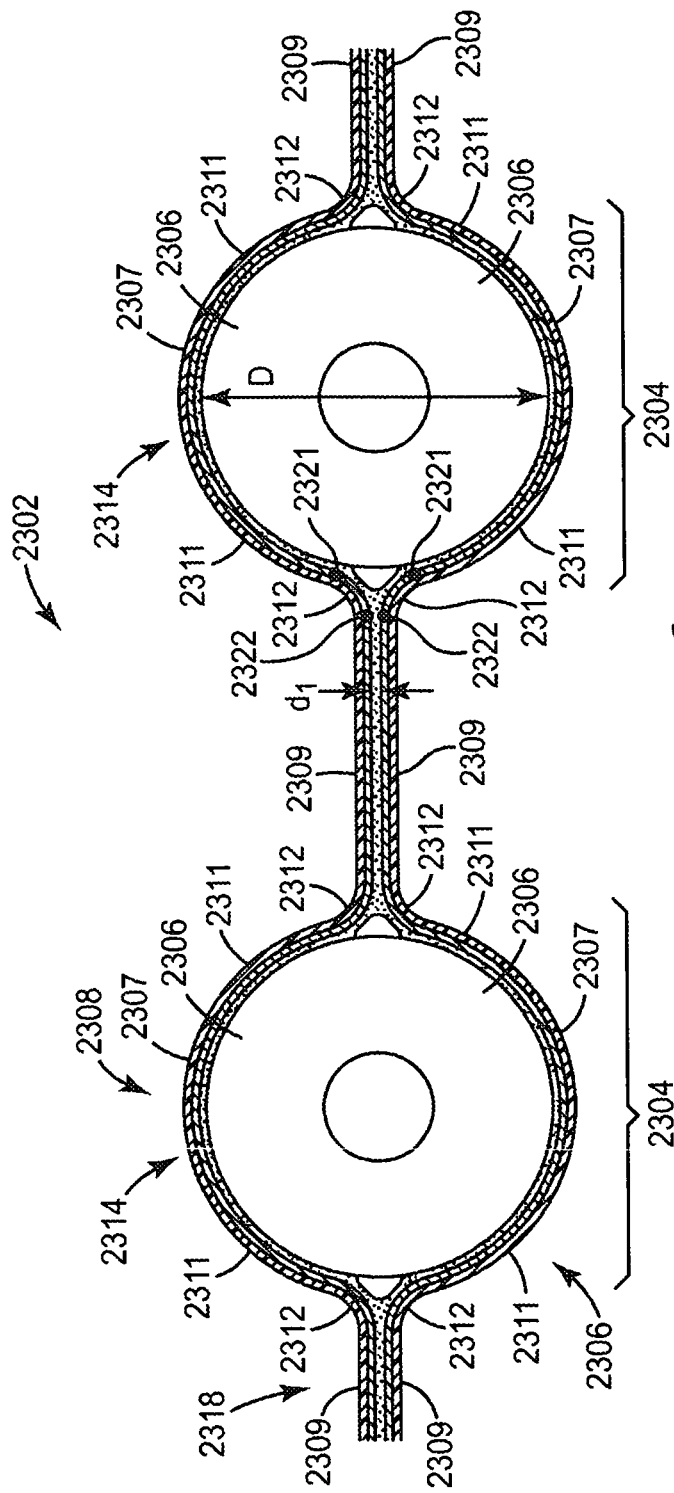

FIG. 15b is a cross sectional view of a shielded electrical cable 2302 that includes two conductor sets 2204 spaced apart from each other across a width of the cable 2302 and extending longitudinally along a length of the cable 2302. Each conductor set 2304 includes one insulated conductor 2306, and two shielding films 2308 disposed on opposite sides of the cable 2302. In transverse cross section, the cover portions 2307 of the shielding films 2308 in combination substantially surround the insulated conductor 2306 of conductor sets 2304 in a cover region 2314 of the cable 2302. In pinched regions 2318 of the cable 2302, on both sides of the conductor sets 2304, the shielding films 2308 include pinched portions 2309. In shielded electrical cable 2302, pinched portions 2309 of shielding films 2308 and insulated conductors 2306 can be arranged generally in a single plane when, the cable 2302 is in a planar and/or unfolded arrangement. The cover portions 2307 of the shielding films 2308 and/or the pinched portions 2309 of the cable 2302 are configured to electrically isolate the conductor sets 2304 from each other.

As illustrated in the cross section of FIG. 15b, the cable 2302 can be characterized by a maximum separation, D, between the cover portions 2307 of the shielding films 2308 and a minimum separation, $d_1$, between the pinched portions 2309 of the shielding films 2308. In some embodiments, $d_1/D$ is less than 0.25, or less than 0.1.

An optional adhesive layer 2310 may be included between the pinched portions 2309 of the shielding films 2308. Adhesive layer 2310 may be continuous or discontinuous. In some embodiments, the adhesive layer 2310 extends fully or partially in the cover region 2314 of the cable, e.g., between the cover portion 2307 of the shielding films 2308 and the insulated conductors 2306. The adhesive layer 2310 may be disposed on the cover portions 2307 of the shielding films 2308 and may extend fully or partially from the pinched portions 2309 of the shielding films 2308 on one side of a conductor set 2304 to the pinched portions 2309 of the shielding films 2308 on the other side of the conductor set 2304.

The shielding films 2308 can be characterized by a radius of curvature, R, across a width of the cable 2302 and/or by a minimum radius of curvature, $r_1$, in the transition portion 2312 of the shielding film 2308 and/or by a minimum radius of curvature, $r_2$, of the concentric portion 2311 of the shielding film 2308. In the transition regions 2236 of the cable 2302, transition portions 2312 of the shielding films 2302 can be configured to provide a gradual transition between the concentric portions 2311 of the shielding films 2308 and the pinched portions 2309 of the shielding films 2308. The transition portion 2312 of the shielding film 2308 extends from a first transition point 2321, which is the inflection point of the shielding film 2308 and marks the end of the concentric portion 2311, to a second transition point 2322 where the separation between the shielding films equals the minimum separation, $d_1$, of the pinched portions 2309 or exceeds $d_1$ by a predetermined factor, e.g., a factor of about 1.2 or about 1.5.

In some embodiments, the radius of curvature, R, of the shielding film across the width of the cable is at least about 50 micrometers and/or the minimum radius of curvature in the transition portion of the shielding film is at least 50 micrometers.

Figure 15C:
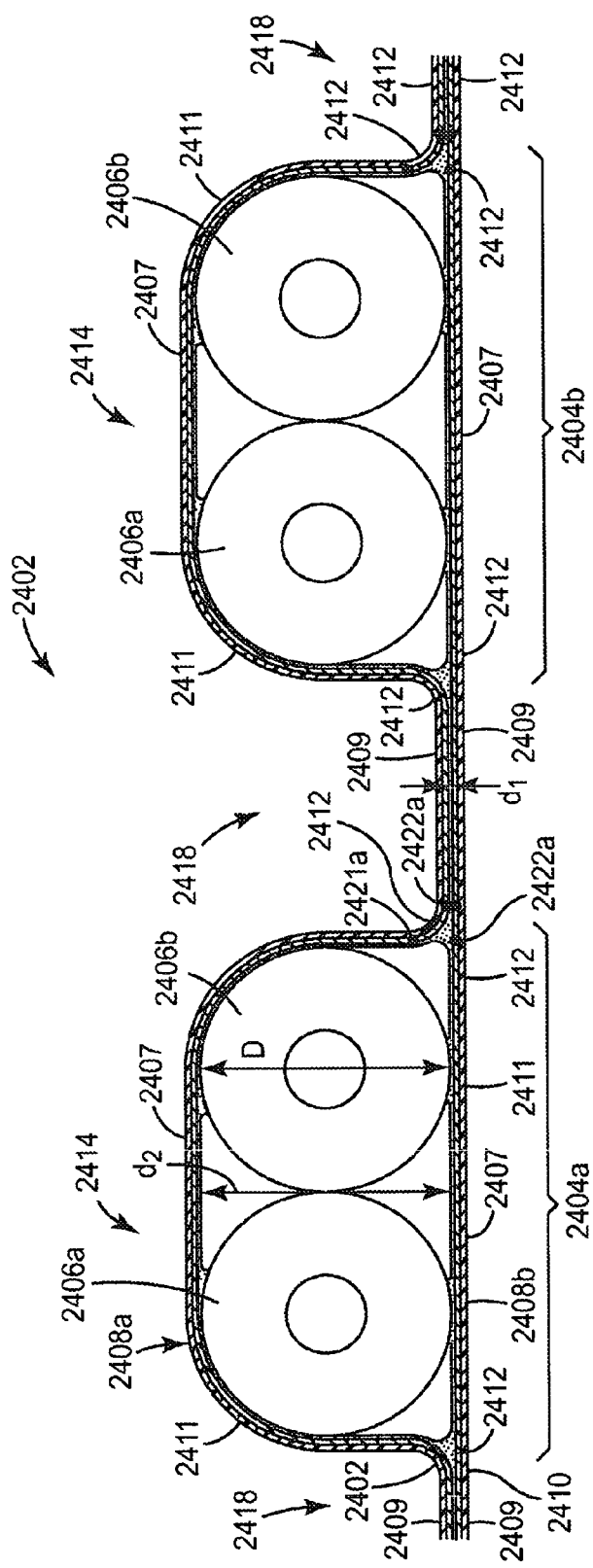

FIG. 15c shows, in cross section, a shielded electrical cable 2402 that includes two conductor sets 2404a, 2404b spaced apart from each other across a width of the cable 2402 and extending longitudinally along a length of the cable 2402. Each conductor set 2404a, 2404b includes two insulated conductors 2206a, 2206b. Two shielding films 2408a, 2408b are disposed on opposite sides of the cable 2402. In transverse cross section, cover portions 2407 of the shielding films 2408a, 2408b, in combination, substantially surround conductor sets 2404a, 2404b in a cover region 2414 of the cable 2402. In pinched regions 2418 of the cable 2402 on both sides of the conductor sets 2404a, 2404b, the upper and lower shielding films 2408a, 2408b include pinched portions 2409.

In shielded electrical cable 2402, pinched portions 2409 of shielding films 2408 and insulated conductors 2406a, 2406b are arranged generally in different planes when the cable 2402 is in a planar and/or unfolded arrangement. One of the shielding films 2408b is substantially flat. The portion of the substantially flat shielding film 2408b in the pinched region 2418 of the cable 2402 is referred to herein as a pinched portion 2409, even though there is little or no out of plane deviation of the shielding film 2408b in the pinched region 2418. When the cable 2402 is in a planar or unfolded configuration, the concentric 2411, transition 2412, and pinched 2407 portions of shielding film 2408b are substantially coplanar.

The cover portions 2407 and/or the pinched portions 2409 of the cable 2402 between conductor sets 2404a, 2404b are configured to electrically isolate the conductor sets 2404a, 2404b from each other. When arranged in a generally planar, unfolded arrangement, as illustrated in FIG. 15c, the high frequency electrical isolation of the first insulated conductor 2406a in the first conductor set 2404a relative to the second insulated conductor 2406b in the first conductor set 2404a is substantially less than the high frequency electrical isolation of either conductor 2406a, 2406b of the first conductor set 2404a relative to either conductor 2406a, 2406b of the second conductor set 2404b, as previously discussed.

As illustrated in the cross section of FIG. 15c, the cable 2402 can be characterized by a maximum separation, D, between the cover portions 2407 of the shielding films 2408a; 2408b, a minimum separation, $d_2$, between the cover portions 2407 of the shielding films 2408a, 2408b, and a minimum separation, $d_1$, between the pinched portions 2409 of the shielding films 2408a, 2408b. In some embodiments, $d_1/D$ is less than 0.25, or less than 0.1. In some embodiments, $d_2/D$ is greater than 0.33.

An optional adhesive layer 2410 may be disposed between the pinched portions 2409 of the shielding films 2408a, 2408b. Adhesive layer 2410 may be continuous or discontinuous. In some embodiments, the adhesive layer 2410 extends fully or partially in the cover region 2414 of the cable 2402, e.g., between the cover portions 2407 of one or more of the shielding films 2408a, 2408b and the insulated conductors 2406a, 2406b. The adhesive layer 2410 may be disposed on the cover portion 2407 of one or more shielding films 2408a, 2408b and may extend fully or partially from the pinched portion 2409 of the shielding films 2408a, 2408b on one side of a conductor set 2404a, 2404b to the pinched portions 2409 of the shielding films 2408a, 2408b on the other side of the conductor set 2404a, 2404b.

The transition portions 2412 of the curved shielding film 2408a provide a gradual transition between the concentric portions 2411 of the shielding film 2408a and the pinched portions 2409 of the shielding film 2408a. The transition portions 2412 of the shielding film 2408a extends from a first transition point 2421a, which is the inflection point of the shielding film 2408a to a second transition point 2422a where the separation between the shielding films is equal to the minimum separation, $d_1$, of the pinched portions 2409, or exceeds $d_1$ by a predetermined factor. The transition portion of the substantially flat shielding film 2808b extends from a first transition point 2421b to a second transition point 2422b where the separation between the shielding films is equal to the minimum separation, $d_1$, of the pinched portions 2409, or exceeds $d_1$ by a predetermined factor. The first transition point 2421b is defined by a line perpendicular to the substantially flat shielding film 2408b which intersects the first transition point 2421a of the shielding film 2408a.

Curved shielding film 2408a can be characterized by a radius of curvature, R, across a width of the cable 2402 and/or by a minimum radius of curvature, $r_1$, of the transition portions 2412 of the shielding film 2408a and/or by a minimum radius of curvature, $r_2$, of the concentric portions 2411 of the shielding film. In some embodiments, the cable 2402 includes at least one shielding film 2408 that has a radius of curvature across the width of the cable that is at least about 50 micrometers and/or a minimum radius of curvature, $r_1$, of the transition portion of the shielding film that is at least about 50 micrometers. In some embodiments, the ratio $r_2/r_1$ of the minimum radius of curvature, $r_2$, of the concentric portion of the shielding film to the minimum radius of curvature, $r_1$, of the transition portion of the shielding film is in a range of 2 to 15.

Figure 16A:
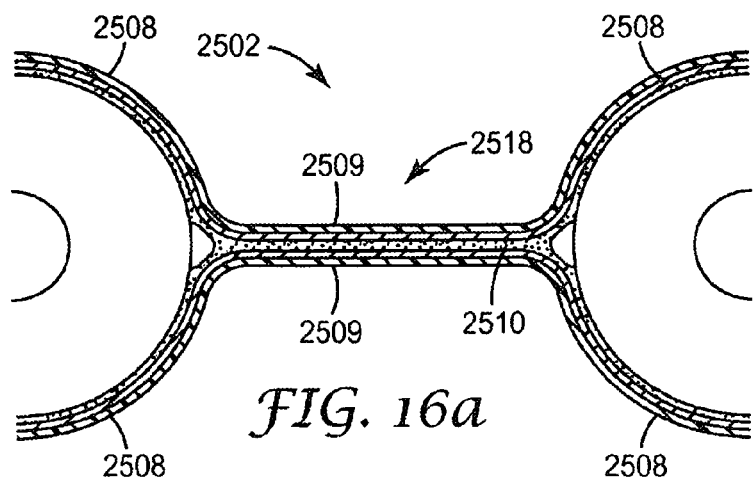
FIGS. 16a-16g are front cross-sectional detail views illustrating seven exemplary embodiments of a parallel portion of a shielded electrical cable.

In FIG. 16a, shielded electrical cable 2502 includes a pinched region 2518 wherein shielding films 2508 are spaced apart by a distance. Spacing apart shielding films 2508, i.e., not having shielding films 2508 make direct electrical contact continuously along their seam, increases the strength of pinched region 2518. Shielded electrical cables having relatively thin and fragile shielding films may fracture or crack during manufacturing if forced to make direct electrical contact continuously along their seam. Spacing apart shielding films 2508 may permit crosstalk between adjacent conductor sets if effective means are not used to reduce the crosstalk potential. Reducing crosstalk involves containing the electrical and magnetic fields of one conductor set so that they to not impinge on an adjacent conductor set. In the embodiment illustrated in FIG. 16a, an effective shield against crosstalk is achieved by providing a low DC resistance between shielding films 2508. A low DC resistance can be achieved by orienting the shielding films 2508 in close proximity. For example, pinched portions 2509 of shielding films 2508 may be spaced apart by less than about 0.13 mm in at least one location of pinched region 2518. The resulting DC resistance between shielding films 2508 may be less than about 15 ohms, and the resulting crosstalk between adjacent conductor sets may be less than about −25 dB. In some cases, the pinched region 2518 of the cable 2502 has a minimum thickness of less than about 0.13 mm.

The shielding films 2508 can be spaced apart by a separation medium. The separation medium may include conformable adhesive layer 2510. For example, the separation medium may have a dielectric constant of at least 1.5. A high dielectric constant decreases the impedance between shielding films 2508, thereby increasing the electrical isolation and decreasing the crosstalk between adjacent conductor sets. Shielding films 2508 may make direct electrical contact with each other in at least one location of pinched region 2518'.

Shielding films 2508 may be forced together in selected locations so that the thickness of conformable adhesive layer 2510 is reduced in the selected locations. Forcing the shielding film together in selected locations may be accomplished, for example, with a patterned tool making intermittent pinch contact between shielding films 2508 in these locations. These locations may be patterned longitudinally or transversely. In some cases, the separation medium may be electrically conductive to enable direct electrical contact between shielding films 2508.

Figure 16B:
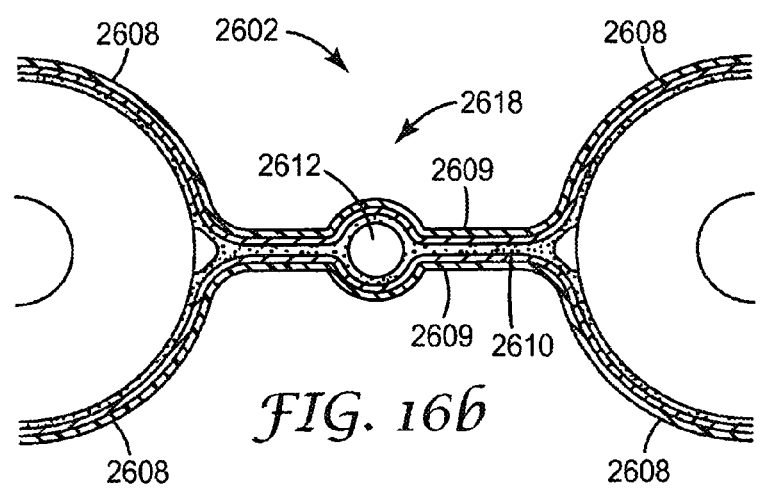

In FIG. 16b, shielded electrical cable 2602 includes a pinched region 2618 including a ground conductor 2612 disposed between shielding films 2608 and extending along a length of the cable 2602. The ground conductor 2612 may make indirect electrical contact with both shielding films 2608, e.g., a low but non-zero DC resistance between the shielding films 2608. In some cases, the ground conductor 2612 may make direct or indirect electrical contact with at least one of the shielding films 2608 in at least one location of pinched region 2618. The shielded electrical cable 2602 may include a conformable adhesive layer 2610 disposed between shielding films 2608 and configured to provide controlled separation of at least one of shielding films 2608 and ground conductor 2612. The conformable adhesive layer 2610 may have a non-uniform thickness that allows ground conductor 2612 to make direct or indirect electrical contact with at least one of shielding films 2608 in selective locations. In some cases, the ground conductor 2612 may include surface asperities or a deformable wire, such as, e.g., a stranded wire, to provide the controlled electrical contact between ground conductor 2612 and at least one of shielding films 2608.

Figure 16C:
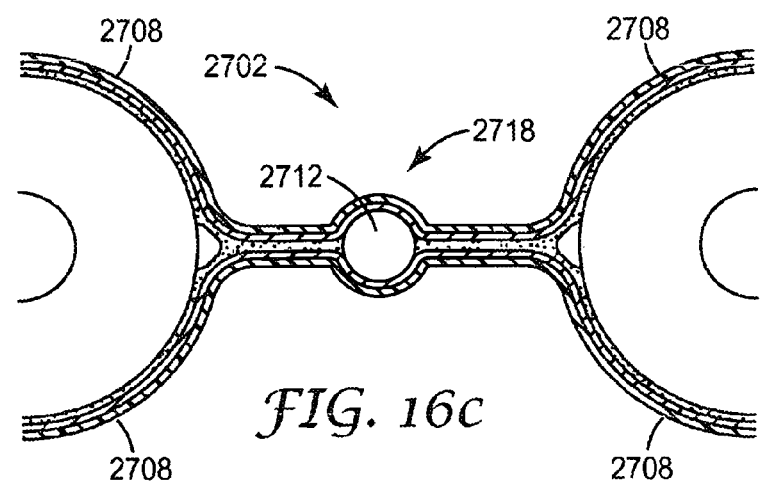

In FIG. 16c, shielded electrical cable 2702 includes a pinched region 2718. A ground conductor 2712 disposed between shielding films 2708 and makes direct electrical contact with both shielding films 2708.

Figure 16D:
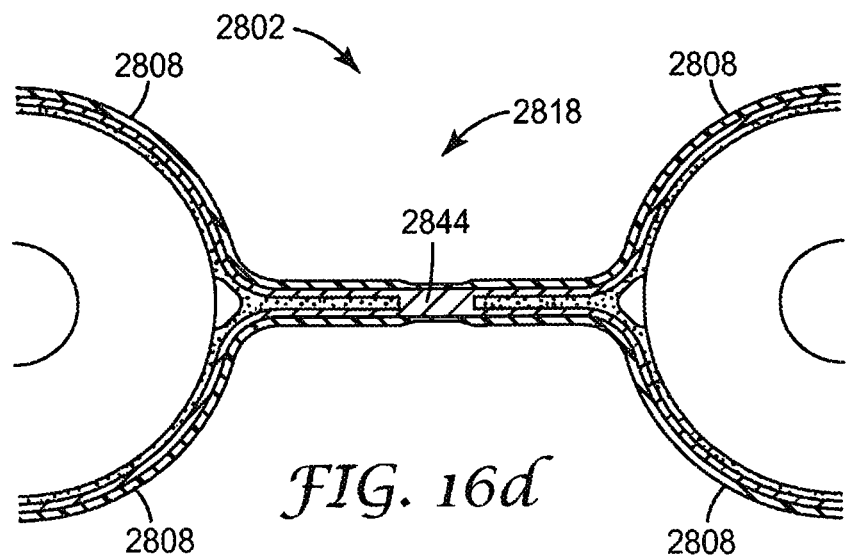

In FIG. 16d, shielded electrical cable 2802 includes a pinched region 2818 wherein shielding films 2808 make direct electrical contact with each other by any suitable means, such as, e.g., conductive element 2844. Conductive element 2844 may include a conductive plated via or channel, a conductive filled via or channel, or a conductive adhesive, to name a few.

Figure 16E:
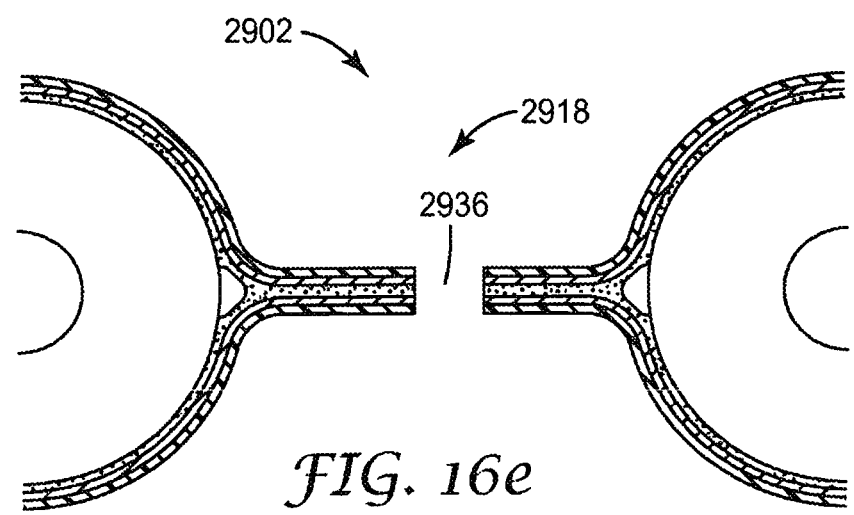

In FIG. 16e, shielded electrical cable 2902 includes a pinched region 2918 that has an opening 2936 in at least one location of the pinched region 2918. In other words, pinched region 2918 is discontinuous. Opening 2936 may include a hole, a perforation, a slit, and any other suitable element. Opening 2936 provides at least some level of physical separation, which contributes to the electrical isolation performance of pinched region 2918 and increases at least the lateral flexibility of shielded electrical cable 2902. This separation may be discontinuous along the length of pinched region 2918, and may be discontinuous across the width of pinched region 2918.

Figure 16F:
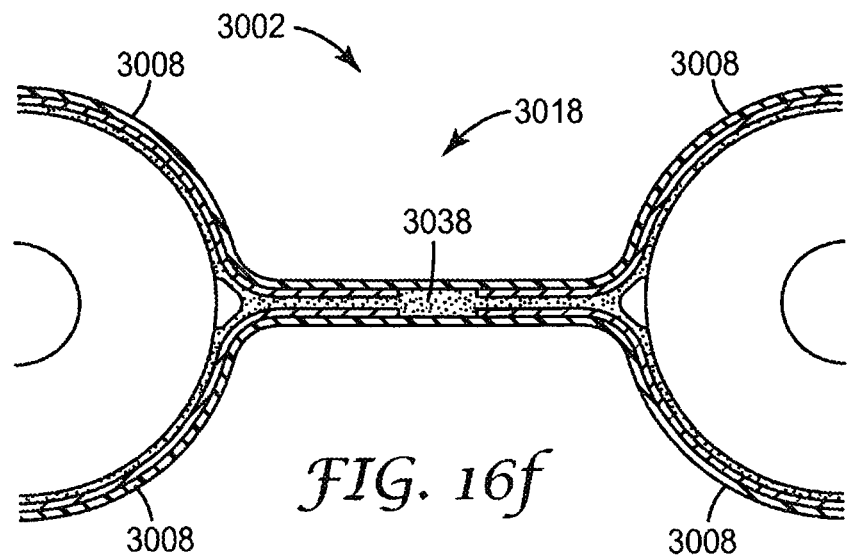

In FIG. 16f, shielded electrical cable 3002 includes a pinched region 3018 where at least one of shielding films 3008 includes a break 3038 in at least one location of pinched region 3018. In other words, at least one of shielding films 3008 is discontinuous. Break 3038 may include a hole, a perforation, a slit, and any other suitable element. Break 3038 provides at least some level of physical separation, which contributes to the electrical isolation performance of pinched region 3018 and increases at least the lateral flexibility of shielded electrical cable 3002. This separation may be discontinuous or continuous along the length of pinched region, and may be discontinuous across the width of the pinched portion 3018.

Figure 16G:
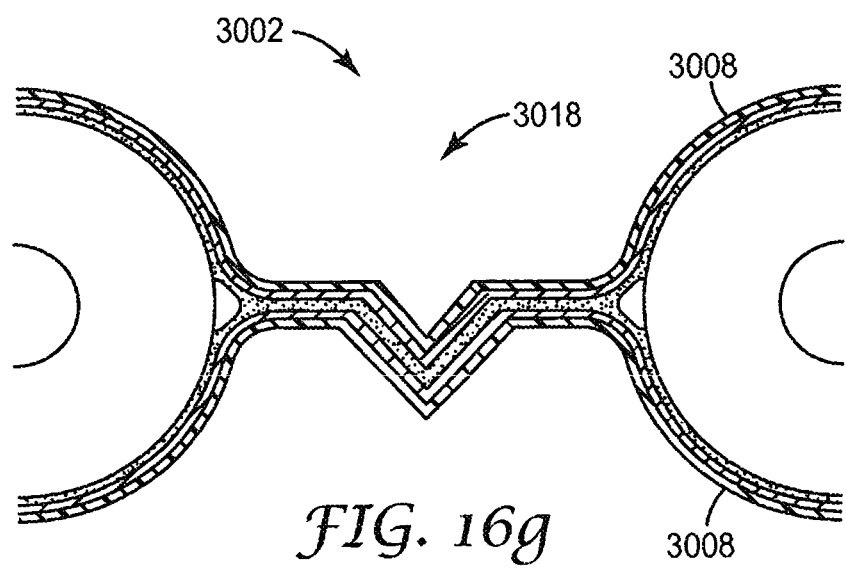

In FIG. 16g, shielded electrical cable 3102 includes a pinched region 3118 that is piecewise planar in a folded configuration. All other things being equal, a piecewise planar pinched region has a greater actual surface area than a planar pinched region having the same projected width. If the surface area of a pinched region is much greater than the spacing between the shielding films 3108, the DC resistance is decreased which improves the electrical isolation performance of the pinched region 3118. In one embodiment, a DC resistance of less than 5 to 10 Ohms results in good electrical isolation. In one embodiment, parallel portion 3118 of shielded electrical cable 3102 has an actual width to minimum spacing ratio of at least 5. In one embodiment, pinched region 3118 is pre-bent and thereby increases at least the lateral flexibility of shielded electrical cable 3102. Pinched region 3118 may be piecewise planar in any other suitable configuration.

Figure 17A:
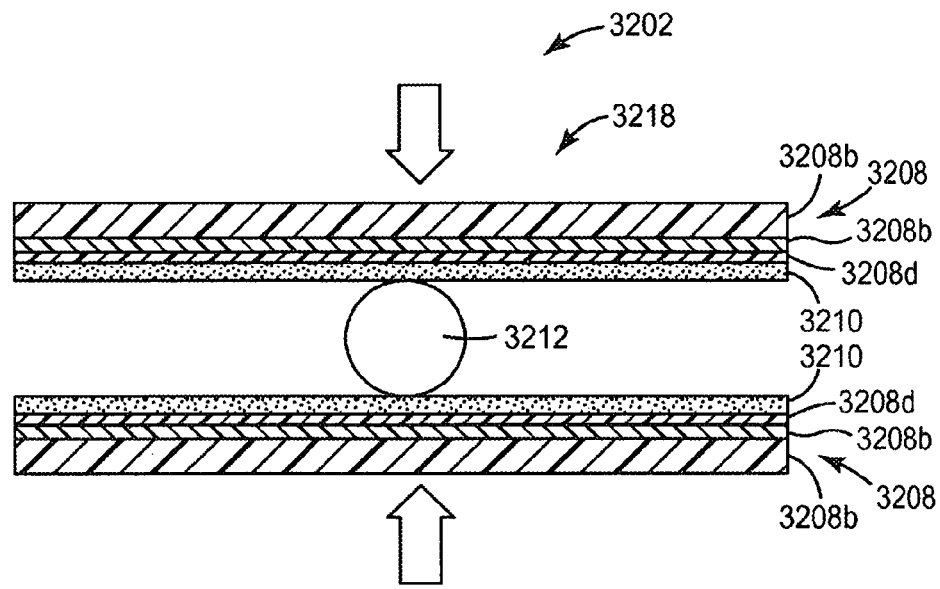
FIGS. 17a-17b are front cross-sectional detail views of another exemplary embodiment of a parallel portion of a shielded electrical cable.
Figure 17B:
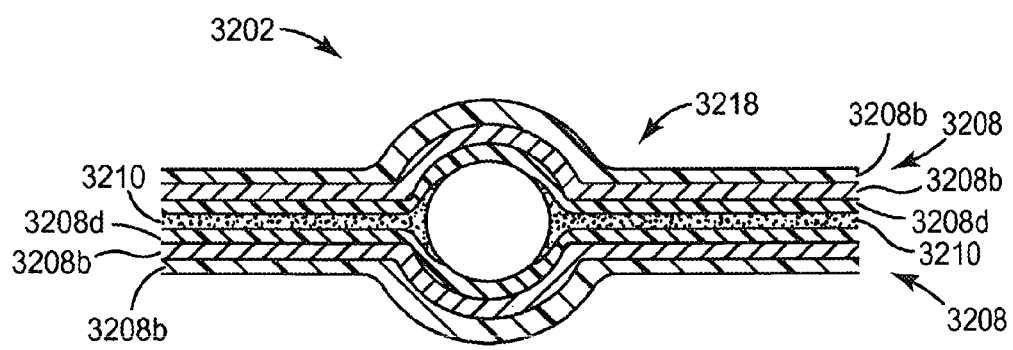

FIGS. 17a-17b, illustrate details pertaining to a pinched region during the manufacture of an exemplary shielded electrical cable. Shielded electrical cable 3202 includes two shielding films 3208 and includes a pinched region 3218 (wherein FIG. 17b) is made wherein shielding films 3208 may be substantially parallel. Shielding films 3208 include a non-conductive polymeric layer 3208b, a conductive layer 3208a disposed on non-conductive polymeric layer 3208b, and a stop layer 3208d disposed on the conductive layer 3208a. A conformable adhesive layer 3210 is disposed on stop layer 3208d. Pinched region 3218 includes a longitudinal ground conductor 3212 disposed between shielding films 3208.

After the shielding films are forced together around the ground conductor, the ground conductor 3212 makes indirect electrical contact with conductive layers 3208a of the shielding films 3208. This indirect electrical contact is enabled by a controlled separation of conductive layer 3208a and ground conductor 3212 provided by stop layer 3208d. In some cases, the stop layer 3208d may be or include a non-conductive polymeric layer. As shown in the figures, an external pressure (see FIG. 17a) is used to press conductive layers 3208a together and force conformable adhesive layers 3210 to conform around the ground conductor the (FIG. 17b). Because stop layer 3208d does not conform at least under the same processing conditions, it prevents direct electrical contact between the ground conductor 3212 and conductive layer 3208a of shielding films 3208, but achieves indirect electrical contact. The thickness and dielectric properties of stop layer 3208d may be selected to achieve a low target DC resistance, i.e., electrical contact of an indirect type. In some embodiments, the characteristic DC resistance between the ground conductor and the shielding film may be less than 10 ohms, or less than 5 ohms, for example, but greater than 0 ohms, to achieve the desired indirect electrical contact. In some cases, it is desirable to make direct electrical contact between a given ground conductor and one or two shielding films, whereupon the DC resistance between such ground conductor and such shielding film(s) may be substantially 0 ohms.

Figure 18:
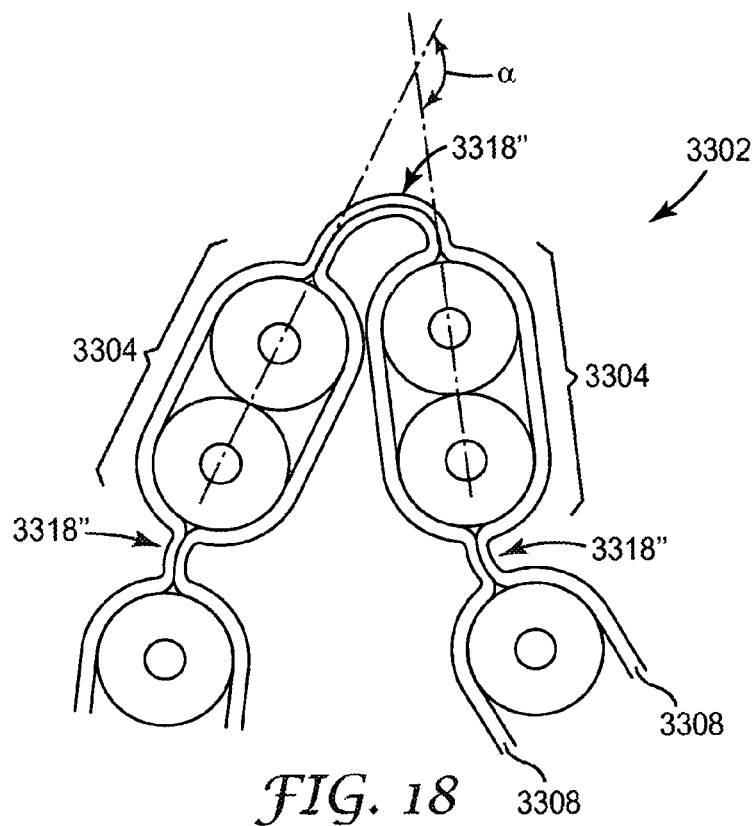
FIG. 18 is a front cross-sectional detail view of another exemplary embodiment of a shielded electrical cable in a bent configuration.

FIG. 18 shows a folded shielded cable 3302. Shielded cable 3302 includes two shielding films 3308 disposed around spaced apart conductor sets 3304. Shielding films 3308 are disposed on opposite sides of the cable 3302 and include pinched regions 3318 on each side of the conductor sets 3304. The pinched regions 3318 are configured to be laterally bent at an angle α of at least 30°. This lateral flexibility of pinched regions 3318 enables shielded electrical cable 3302 to be folded in any suitable configuration, such as, e.g., a configuration that can be used in a round cable (see, e.g., FIG. 10g). In one embodiment, the shielding films 3308 having relatively thin individual layers increases the lateral flexibility of pinched regions 3318. To maintain the integrity of these individual layers in particular under bending conditions, it is preferred that the bonds between them remain intact. For example, for pinched regions 3318 may have a minimum thickness of less than about 0.13 mm, and a bond strength between individual layers of at least 17.86 g/mm (1 lbs/inch) after thermal exposures during processing or use.

In one aspect, it is beneficial to the electrical performance of a shielded electrical cable for the pinched regions to have approximately the same size and shape on both sides of a conductor set. Any dimensional changes or imbalances may produce imbalances in capacitance and inductance along the length of the parallel portion. This in turn may cause impedance differences along the length of the pinched region and impedance imbalances between adjacent conductor sets. At least for these reasons, control of the spacing between the shielding films may be desired. In some cases, the pinched portions of the shielding films in the pinched regions of the cable on both sides of a conductor set are spaced apart within about 0.05 mm of each other.

Figure 19:
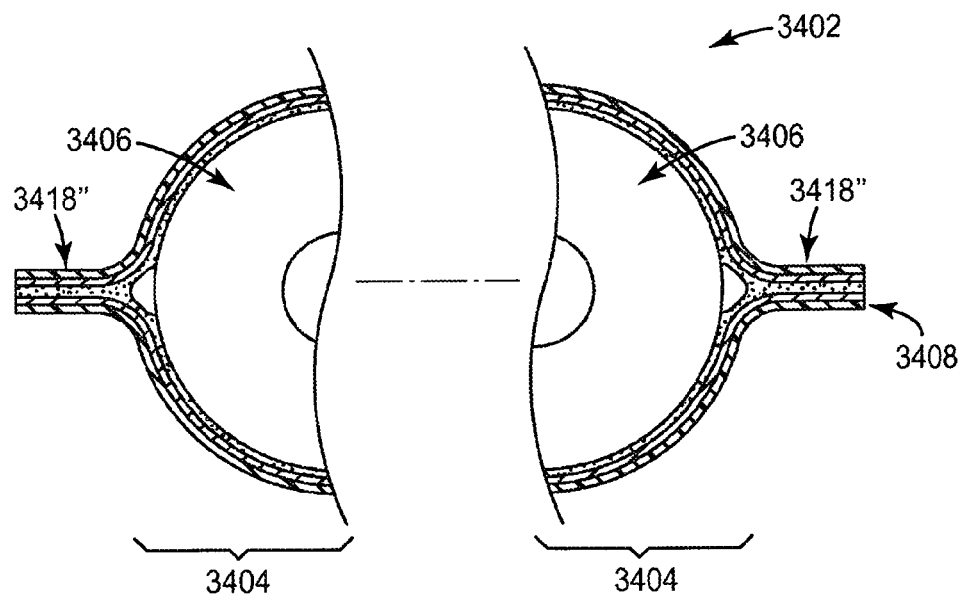
FIG. 19 is a front cross-sectional detail view of another exemplary embodiment of a shielded electrical cable.

In FIG. 19, shielded electrical cable 3402 includes two conductor sets 3404, each including two insulated conductors 3406, and two generally shielding films 3408 disposed on opposite sides of the electrical cable 3402 around conductor sets 3404. Shielding films 3408 include pinched portions 3418. Pinched portions 3418 are positioned at or near an edge of shielded electrical cable 3402 are configured to electrically isolate conductor sets 3404 from the external environment. In shielded electrical cable 3402, pinched portions 3418 of shielding films 3408 and insulated conductors 3406 are arranged generally in a single plane.

Figure 20A:
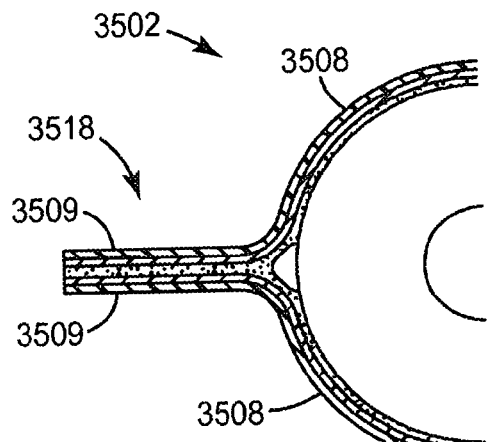
FIGS. 20a-20f are front cross-sectional detail views illustrating six other exemplary embodiments of a parallel portion of a shielded electrical cable.

In FIG. 20a, shielded electrical cable 3502 includes a pinched region 3518 wherein pinched portions 3509 of shielding films 3508 are spaced apart. Pinched region 3518 is similar to pinched region 2518 described above and illustrated in FIG. 16a. Whereas pinched region 2518 is positioned in between conductor sets, pinched region 3518 is positioned at or near an edge of shielded electrical cable 3502.

Figure 20B:
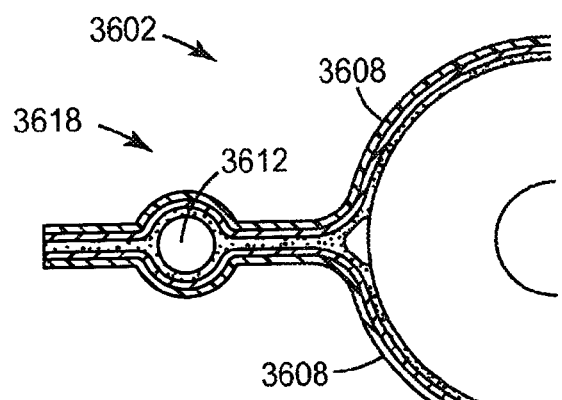

In FIG. 20b, shielded electrical cable 3602 includes a pinched region 3618 that includes a longitudinal ground conductor 3612 disposed between shielding films 3608. Pinched region 3618 is similar to pinched region 2618 described above and illustrated in FIG. 16b. Whereas pinched region 2618 is positioned in between conductor sets, pinched region 3618 is positioned at or near an edge of shielded electrical cable 3602.

Figure 20C:
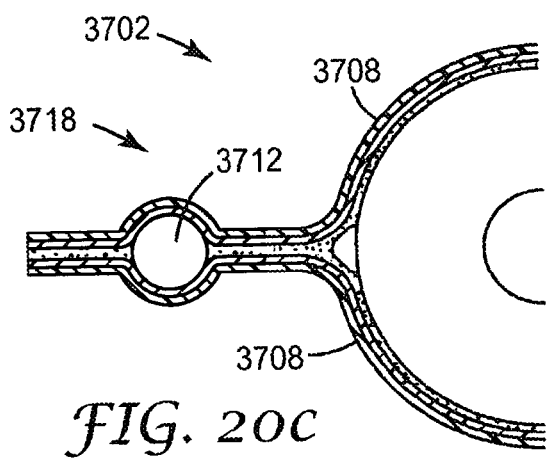

In FIG. 20c, shielded electrical cable 3702 includes a pinched region 3718 including a longitudinal ground conductor 3712 disposed between shielding films 3708. Pinched region 3718 is similar to pinched region 2718 described above and illustrated in FIG. 16c. Whereas pinched region 2718 is positioned in between conductor sets, pinched region 3718 is positioned at or near an edge of shielded electrical cable 3702.

Figure 20D:
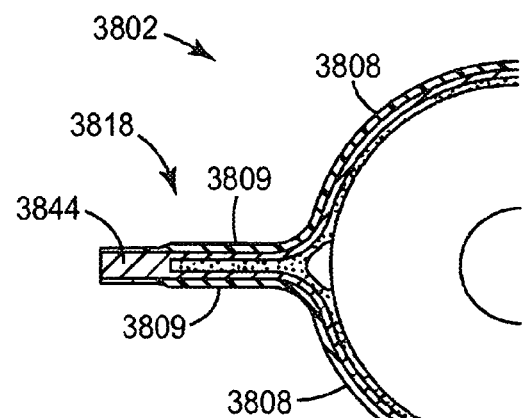

In FIG. 20d, shielded electrical cable 3802 includes a pinched region 3818 wherein the pinched portions 3809 of shielding films 3808 make direct electrical contact with each other by any suitable means, such as, e.g., conductive element 3844. Conductive element 3844 may include a conductive plated via or channel, a conductive filled via or channel, or a conductive adhesive, to name a few. Pinched region 3818 is similar to pinched region 2818 described above and illustrated in FIG. 16d. Whereas pinched region 2818 is positioned in between conductor sets, pinched region 3818 is positioned at or near an edge of shielded electrical cable 3802.

Figure 20E:
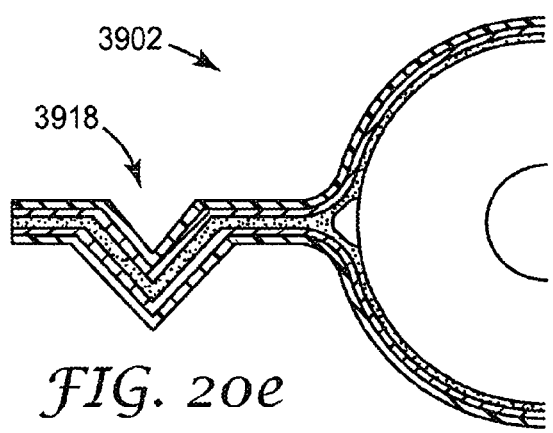

In FIG. 20e, shielded electrical cable 3902 includes a pinched region 3918 that is piecewise planar in a folded configuration. Pinched region 3918 is similar to pinched region 3118 described above and illustrated in FIG. 16g. Whereas pinched region 3118 is positioned in between conductor sets, pinched region 3918 is positioned at or near an edge of shielded electrical cable 3902.

Figure 20F:
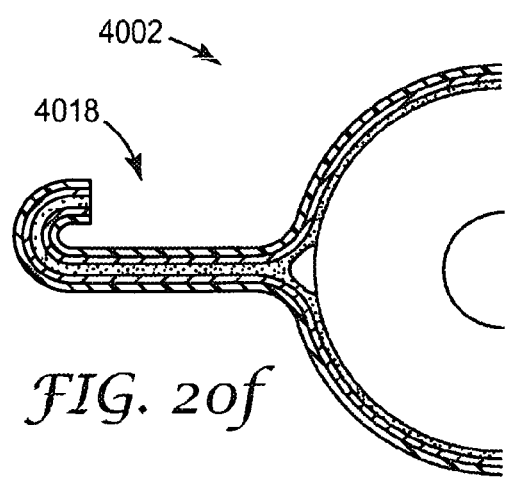

In FIG. 20f, shielded electrical cable 4002 includes a pinched region 4018 that is piecewise planar in a curved configuration and positioned at or near an edge of shielded electrical cable 4002.

A shielded electrical cable according to an aspect of the present invention may include at least one longitudinal ground conductor, an electrical article extending in substantially the same direction as the ground conductor, and two shielding films disposed on opposite sides of the shielded electrical cable. In transverse cross section, the shielding films substantially surround the ground conductor and the electrical article. In this configuration, the shielding films and ground conductor are configured to electrically isolate the electrical article. The ground conductor may extend beyond at least one of the ends of the shielding films, e.g., for termination of the shielding films to any suitable individual contact element of any suitable termination point, such as, e.g., a contact element on a printed circuit board or an electrical contact of an electrical connector. Beneficially, only a limited number of ground conductors is needed for a cable construction, and can, along with the shielding films, complete an electromagnetic enclosure of the electrical article. The electrical article may include at least one conductor that extends along a length of the cable, at least one conductor set that extends along a length of the cable including one or more insulated conductors, a flexible printed circuit, or any other suitable electrical article of which electrical isolation is desired. FIGS. 21a-21b illustrate two exemplary embodiments of such shielded electrical cable configuration.

In FIG. 21a, shielded electrical cable 4102 includes two spaced apart ground conductors 4112 that extend along a length of the cable 4102, an electrical article 4140 positioned between and extending in substantially the same direction as ground conductors 4112, and two shielding films 4108 disposed on opposite sides of the cable. In transverse cross section, the shielding films 4108, in combination, substantially surround ground conductors 4112 and electrical article 4140.

Electrical article 4140 includes three conductor sets 4104 that are spaced apart across a width of the cable 4102. Each conductor set 4104 includes two substantially insulated conductors 4106 that extend along a length of the cable. Ground conductors 4112 may make indirect electrical contact with both shielding films 4108 resulting in a low but non-zero impedance between the ground conductors 4112 and the shielding films 4108. In some cases, ground conductors 4112 may make direct or indirect electrical contact with at least one of the shielding films 4108 in at least one location of shielding films 4108. In some cases, an adhesive layer 4110 is disposed between the shielding films 4108 and bonds the shielding films 4108 to each other on both sides of ground conductors 4112 and electrical article 4140. Adhesive layer 4110 can be configured to provide controlled separation of at least one of shielding films 4108 and ground conductors 4112. In one aspect, this means that adhesive layer 4110 has a non-uniform thickness that allows ground conductors 4112 to make direct or indirect electrical contact with at least one of shielding films 4108 in selective locations. The ground conductors 4112 may include surface asperities or a deformable wire, such as, e.g., a stranded wire, to provide this controlled electrical contact between ground conductors 4112 and at least one of shielding films 4108. The shielding films 4108 can be spaced apart by a minimum spacing in at least one location of shielding films 4108, where ground conductors 4112 have a thickness that is greater than the minimum spacing. For example, the shielding films 4108 may have a thickness of less than about 0.025 mm.

Figure 21:
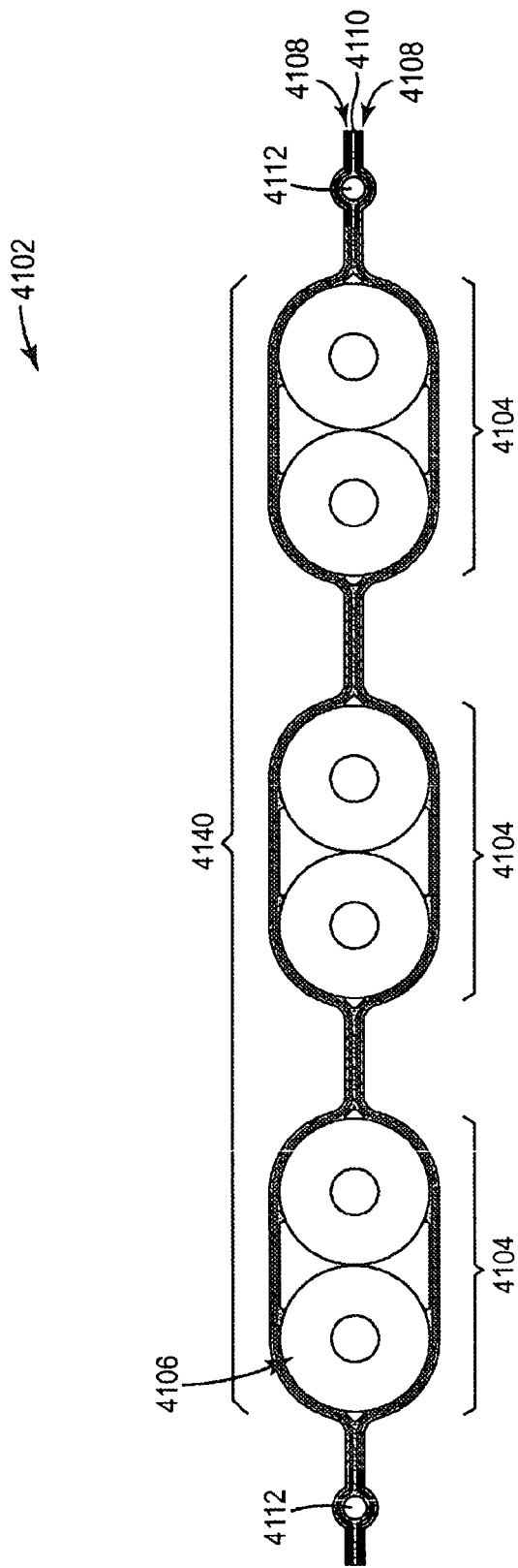
FIGS. 21-22 are front cross-sectional views of two other exemplary embodiments of a shielded electrical cable.
Figure 22:
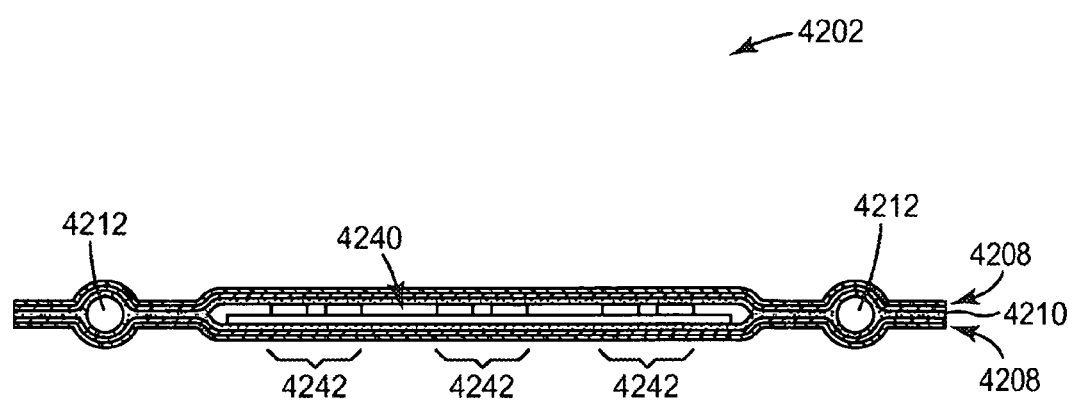

In FIG. 22, shielded electrical cable 4202 includes two spaced apart ground conductors 4212 that extend along a length of the cable 4202, an electrical article 4240 positioned between and extending in substantially the same direction as ground conductors 4212, and two shielding films 4208 disposed on opposite sides of the cable 4202. In transverse cross section, the shielding films, in combination, substantially surround ground conductors 4212 and electrical article 4240. Shielded electrical cable 4202 is similar in some respects to shielded electrical cable 4102 described above and illustrated in FIG. 21a. Whereas in shielded electrical cable 4102, electrical article 4140 includes three conductor sets 4104 each including two substantially parallel longitudinal insulated conductors 4106, in shielded electrical cable 4202, electrical article 4240 includes a flexible printed circuit including three conductor sets 4242.

In exemplary embodiments described above, the shielded electrical cable includes two shielding films disposed on opposite sides of the cable such that, in transverse cross section, cover portions of the shielding films in combination substantially surround a given conductor set, and surround each of the spaced apart conductor sets individually. In some embodiments, however, the shielded electrical cable may contain only one shielding film, which is disposed on only one side of the cable. Advantages of including only a single shielding film in the shielded cable, compared to shielded cables having two shielding films, include a decrease in material cost and an increase in mechanical flexibility, manufacturability, and ease of stripping and termination. A single shielding film may provide an acceptable level of electromagnetic interference (EMI) isolation for a given application, and may reduce the proximity effect thereby decreasing signal attenuation. FIG. 13 illustrates one example of such a shielded electrical cable that includes only one shielding film.

Figure 23:
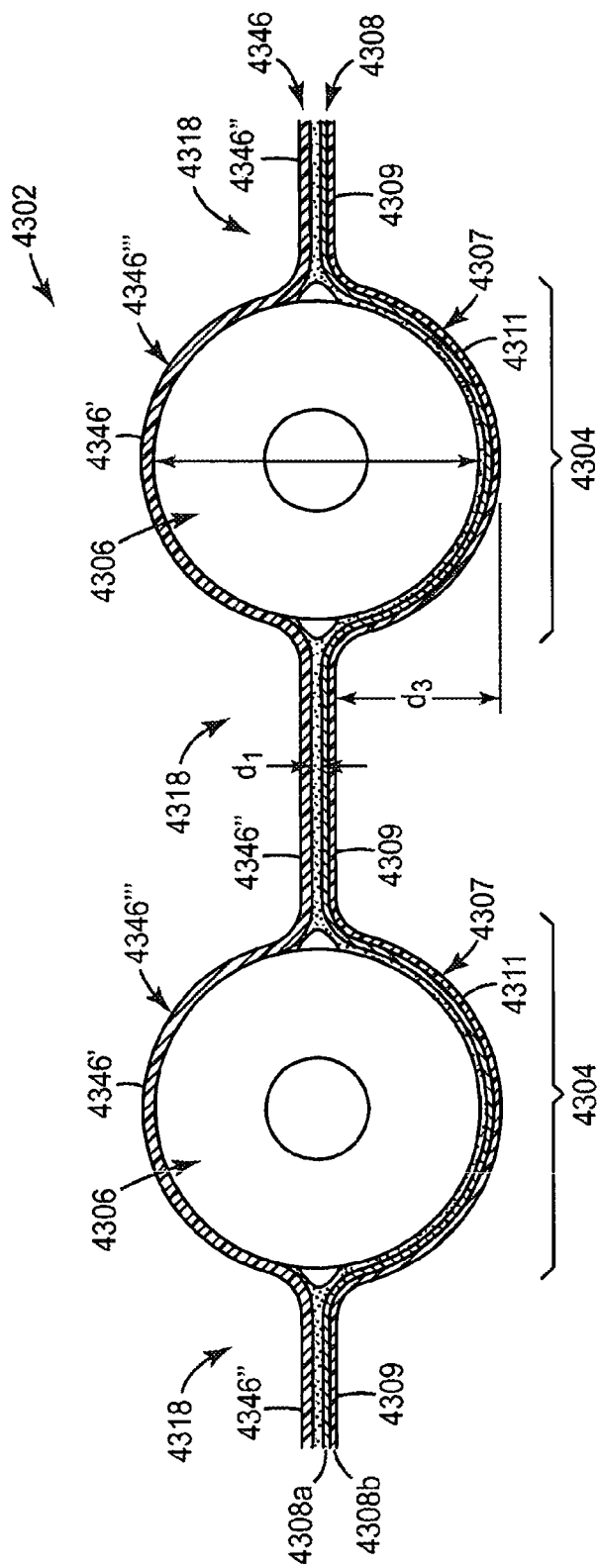
FIG. 23 is a front cross-sectional view of another exemplary embodiment of a shielded electrical cable.

Shielded electrical cable 4302, illustrated in FIG. 23, includes two spaced apart conductor sets 4304 and a single shielding film 4308. Each conductor set 4304 includes a single insulated conductor 4306 that extends along a length of the cable 4302. Insulated conductors 4306 are arranged generally in a single plane and effectively in a coaxial cable configuration that can be used in a single ended circuit arrangement. Cable 4302 includes pinched regions 4318. In the pinched regions 4318, the shielding film 4308 includes pinched portions 4309 extending from both sides of each conductor set 4304. Pinched regions 4318 cooperatively define a generally planar shielding film. The shielding film 4308 includes two cover portions 4307 each partially covering a conductor set 4304. Each cover portion 4307 includes a concentric portion 4311 substantially concentric with corresponding conductor 4306. Shielding film 4308 includes a conductive layer 4308a and a non-conductive polymeric layer 4308b. The conductive layer 4308a faces the insulated conductors 4306. The cable 4302 may optionally include an non-conductive carrier film 4346. Carrier film 4346 includes pinched portions 4346" that extend from both sides of each conductor set 4304 and opposite pinched portions 4309 of the shielding film 4308. The carrier film 4346 includes two cover portions 4346''' each partially covering a conductor set 4304 opposite cover portion 4307 of shielding film 4308. Each cover portion 4346''' includes a concentric portion 4346' substantially concentric with corresponding conductor 4306. Carrier film 4346 may include any suitable polymeric material, including but not limited to polyester, polyimide, polyamide-imide, polytetrafluoroethylene, polypropylene, polyethylene, polyphenylene sulfide, polyethylene naphthalate, polycarbonate, silicone rubber, ethylene propylene diene rubber, polyurethane, acrylates, silicones, natural rubber, epoxies, and synthetic rubber adhesive. Carrier film 4346 may include one or more additives and/or fillers to provide properties suitable for the intended application. Carrier film 4346 may be used to complete physical coverage of conductor sets 4304 and add to the mechanical stability of shielded electrical cable 4302.

Figure 24:
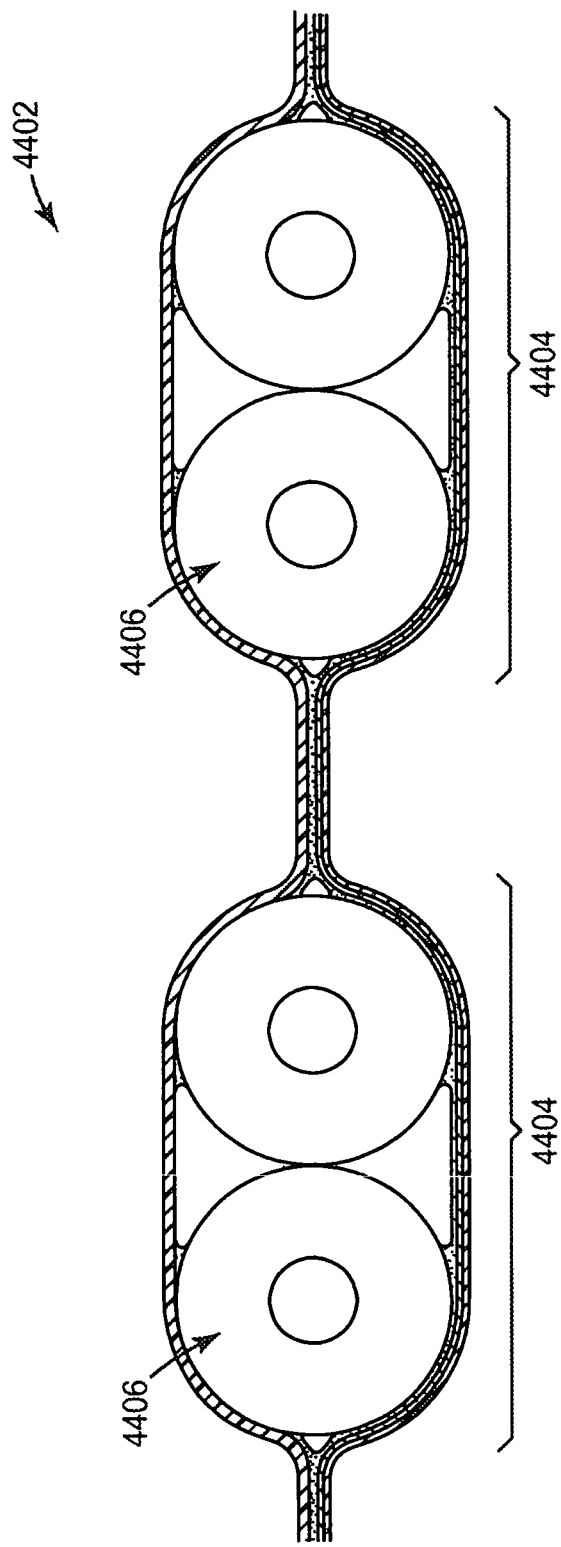
FIG. 24 is a front cross-sectional view of another exemplary embodiment of a shielded electrical cable.

Referring to FIG. 24, shielded electrical cable 4402 is similar in some respects to shielded electrical cable 4302 described above and illustrated in FIG. 23. Whereas shielded electrical cable 4302 includes conductor sets 4304 each including a single insulated conductor 4306, shielded electrical cable 4402 includes conductor sets 4404 that have two insulated conductors 4406. The insulated conductors 4406 are arranged generally in a single plane and effectively in a twinaxial cable configuration which can be used in a single ended or differential pair circuit arrangement.

Referring to FIG. 25, shielded electrical cable 4502 is similar in some respects to shielded electrical cable 4402 described above and illustrated in FIG. 24. Whereas shielded electrical cable 4402 has individually insulated conductors 4406, shielded electrical cable 4502 has jointly insulated conductors 4506.

In one aspect, as can be seen in FIGS. 23-25, the shielding film is re-entrant between adjacent conductor sets. In other words, the shielding film includes a pinched portion that is disposed between adjacent conductor sets. This pinched portion is configured to electrically isolate the adjacent conductor sets from each other. The pinched portion may eliminate the need for a ground conductor to be positioned between adjacent conductor sets, which simplifies the cable construction and increases the cable flexibility, among other benefits. The pinched portion may be positioned at a depth d (FIG. 23) that is greater than about one third of the diameter of the insulated conductors. In some cases, the pinched portion may be positioned at a depth d that is greater than about one half of the diameter of the insulated conductors. Depending on the spacing between adjacent conductor sets, the transmission distance, and the signaling scheme (differential versus single-ended), this re-entrant configuration of the shielding film more than adequately electrically isolates the conductor sets from each other.

The conductor sets and shielding film may be cooperatively configured in an impedance controlling relationship. In one aspect, this means that the partial coverage of the conductor sets by the shielding film is accomplished with a desired consistency in geometry along the length of the shielded electrical cable such as to provide an acceptable impedance variation as suitable for the intended application. In one embodiment, this impedance variation is less than 5 Ohms and preferably less than 3 Ohms along a representative cable length, such as, e.g., 1 m. In another aspect, if the insulated conductors are arranged effectively in a twinaxial and/or differential pair cable arrangement, this means that the partial coverage of the conductor sets by the shielding film is accomplished with a desired consistency in geometry between the insulated conductors of a pair such as to provide an acceptable impedance variation as suitable for the intended application. In some cases, the impedance variation is less than 2 Ohms and preferably less than 0.5 Ohms along a representative cable length, such as, e.g., 1 m.

FIGS. 26a-26d illustrate various examples of partial coverage of the conductor set by the shielding film. The amount of coverage by the shielding film varies between the embodiments. In the embodiment illustrated in FIG. 26a, the conductor set has the most coverage. In the embodiment illustrated in FIG. 26d, the conductor set has the least coverage. In the embodiments illustrated in FIGS. 26a and 26b, more than half of the periphery of the conductor set is covered by the shielding film. In the embodiments illustrated in FIGS. 26c and 26d, less than half of the periphery of the conductor set is covered by the shielding film. A greater amount of coverage provides better electromagnetic interference (EMI) isolation and reduced signal attenuation (resulting from a reduction in the proximity effect).

Figure 26A:
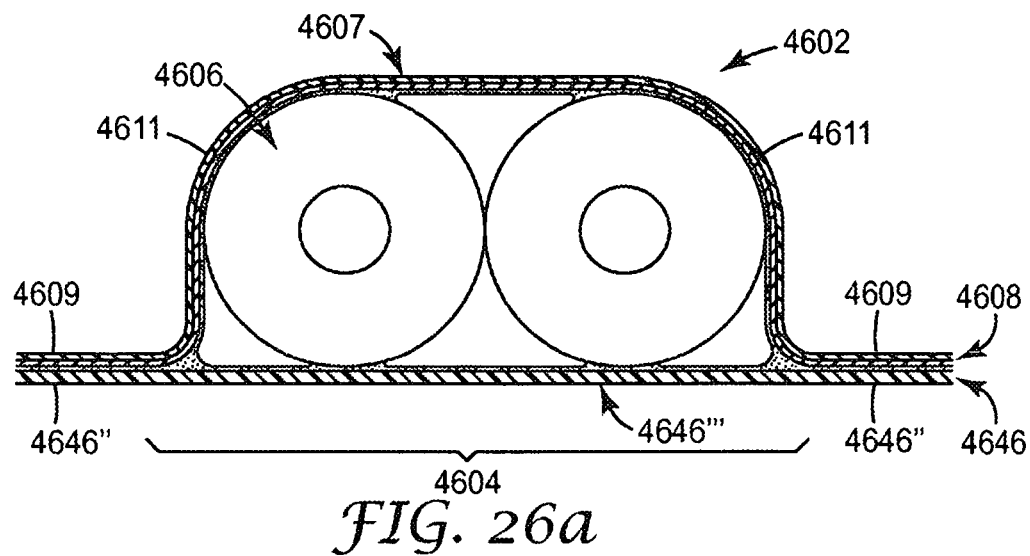
FIG. 26a-26d are front cross-sectional views of four other exemplary embodiments of a shielded electrical cable.

Referring to FIG. 26a, shielded electrical cable 4602 includes a conductor set 4604 and a shielding film 4608. Conductor set 4604 includes two insulated conductors 4606 which extend along a length of the cable 4602. Shielding film 4608 includes pinched portions 4609 extending from both sides of conductor set 4604. Pinched portions 4609 cooperatively define a generally planar shielding film. Shielding film 4608 further includes a cover portion 4607 partially covering conductor set 4604. Cover portion 4607 includes concentric portions 4611 substantially concentric with a corresponding end conductor 4306 of the conductor set 4604. Shielded electrical cable 4602 may also have an optional non-conductive carrier film 4646. Carrier film 4646 includes pinched portions 4646" extending from both sides of conductor set 4604 and disposed opposite pinched portions 4609 of shielding film 4608. Carrier film 4646 further includes a cover portion 4646' partially covering conductor set 4604 opposite cover portion 4607 of shielding film 4608. Cover portion 4607 of shielding film 4608 covers the top side and the entire left and right sides of conductor set 4604. Cover portion 4646" of carrier film 4646 covers the bottom side of conductor set 4604, completing the substantial enclosure of conductor set 4604. In this embodiment, pinched portions 4646" and cover portion 4646" of carrier film 4646 are substantially coplanar.

Figure 26B:
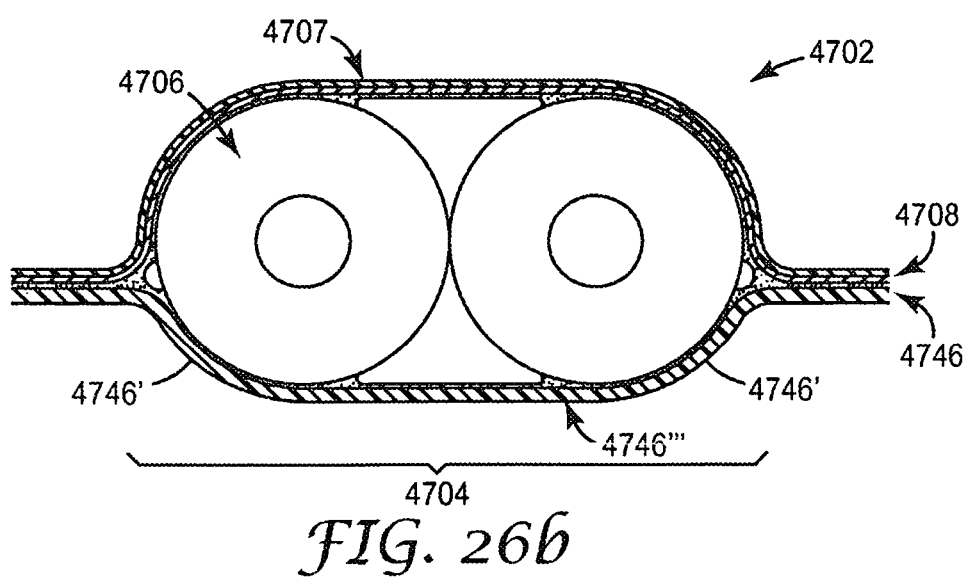

Referring to FIG. 26b, shielded electrical cable 4702 is similar in some respects to shielded electrical cable 4602 described above and illustrated in FIG. 26a. However, in shielded electrical cable 4702, the cover portion 4707 of shielding film 4708 covers the top side and more than half of the left and right sides of conductor set 4704. The cover portion 4746" of carrier film 4746 covers the bottom side and the remainder (less than half) of the left and right sides of conductor set 4704, completing the substantial enclosure of conductor set 4704. Cover portion 4746"' of carrier film 4746 includes concentric portions 4746' substantially concentric with corresponding conductor 4706.

Figure 26C:
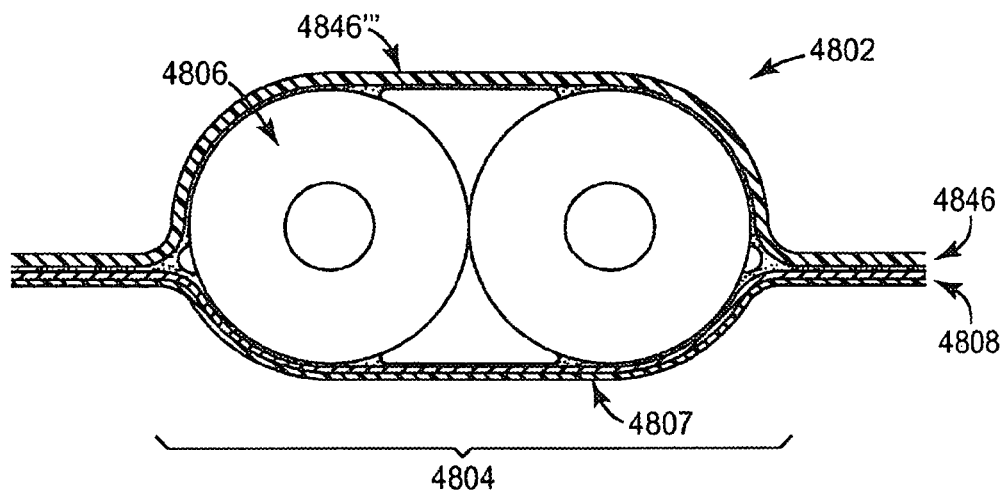

Referring to FIG. 26c, shielded electrical cable 4802 is similar in some respects to shielded electrical cable 4602 described above and illustrated in FIG. 26a. In shielded electrical cable 4802, the cover portion 4807 of shielding film 4808 covers the bottom side and less than half of the left and right sides of conductor set 4804. Cover portion 4846' of carrier film 4846 covers the top side and the remainder (more than half) of the left and right sides of conductor set 4804, completing the enclosure of conductor set 4804.

Figure 26D:
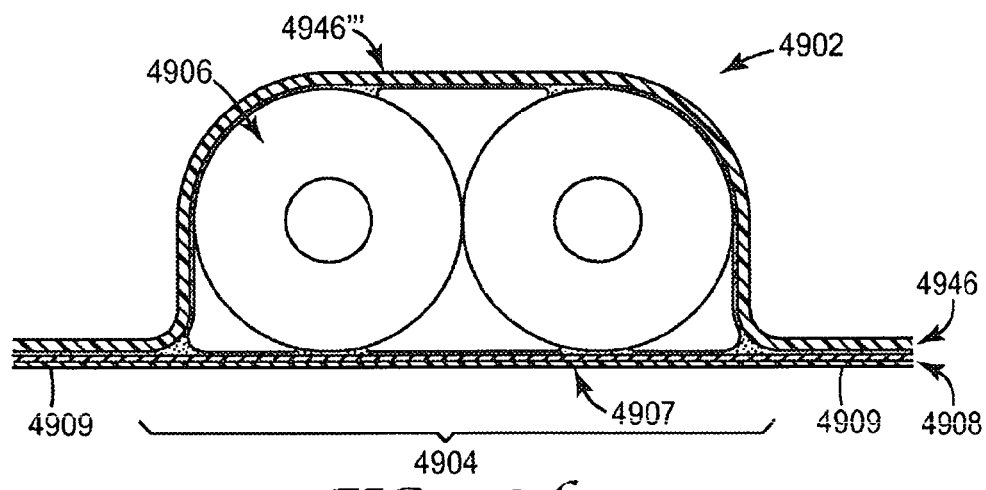

Referring to FIG. 26d, shielded electrical cable 4902 is similar to shielded electrical cable 4602 described above and illustrated in FIG. 26a. However, in shielded electrical cable 4902, cover portion 4907 of shielding film 4908 covers the bottom side of conductor set 4904. Cover portion 4946' of carrier film 4946 covers the top side and the entire left and right sides of conductor set 4904, completing the substantial enclosure of conductor set 4904. In some cases, pinched portions 4909 and cover portion 4907 of shielding film 4908 are substantially coplanar.

Similar to embodiments of the shielded electrical cable including two shielding films disposed on opposite sides of the cable around a conductor set and/or around a plurality of spaced apart conductor sets, embodiments of the shielded electrical cable including a single shielding film may include at least one longitudinal ground conductor. In one aspect, this ground conductor facilitates electrical contact of the shielding film to any suitable individual contact element, of any suitable termination point, such as, e.g., a contact element on a printed circuit board or an electrical contact of an electrical connector. The ground conductor may extend beyond at least one of the ends of the shielding film to facilitate this electrical contact. The ground conductor may make direct or indirect electrical contact with the shielding film in at least one location along its length, and may be placed in suitable locations of the shielded electrical cable.

Figure 27:
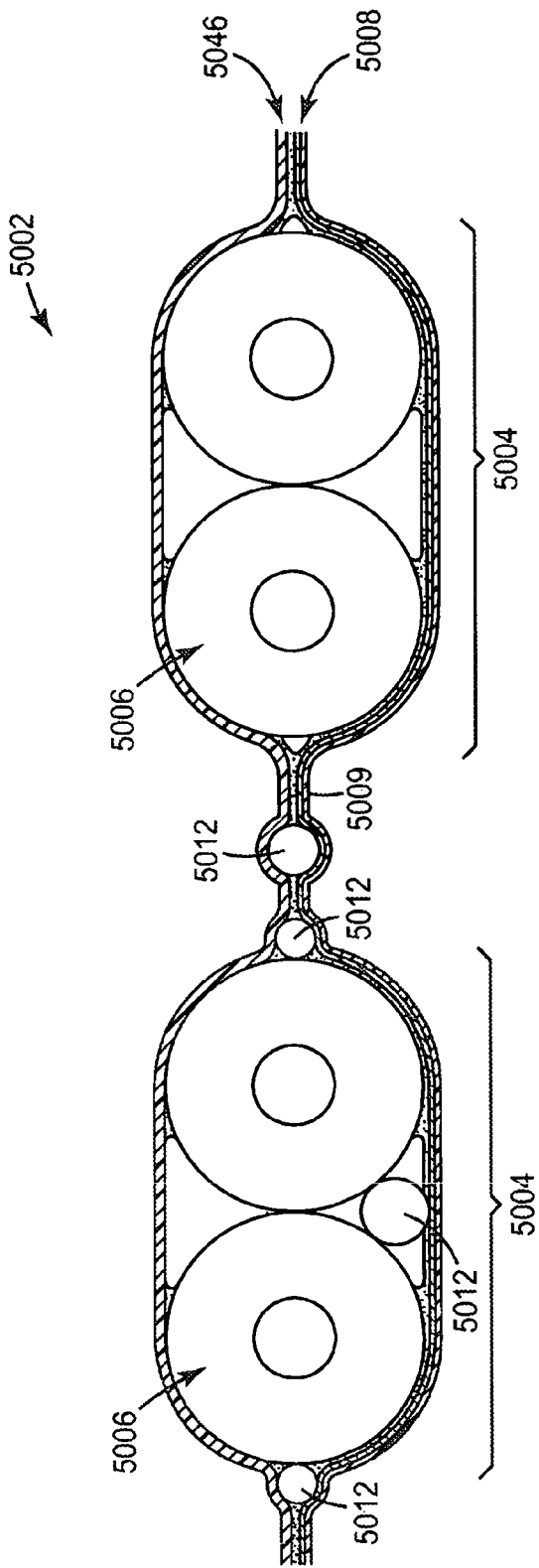
FIG. 27 is a front cross-sectional view of another exemplary embodiment of a shielded electrical cable.

FIG. 27 illustrates a shielded electrical cable 5002 having only one shielding film 5008. Insulated conductors 5006 are arranged in two conductor sets 5004, each having only one pair of insulated conductors, although conductor sets having other numbers of insulated conductors as discussed herein are also contemplated. Shielded electrical cable 5002 is shown to include ground conductors 5012 in various exemplary locations but any or all of the ground conductors 5012 may be omitted if desired, or additional ground conductors can be included. Ground conductors 5012 extend in substantially the same direction as insulated conductors 5006 of conductor sets 5004 and are positioned between shielding film 5008 and carrier film 5046. One ground conductor 5012 is included in a pinched portion 5009 of shielding film 5008 and three ground conductors 5012 are included in a conductor set 5004. One of these three ground conductors 5012 is positioned between insulated conductors 5006 and shielding film 5008 and two of these three ground conductors 5012 and insulated conductors 5006 are arranged generally in a single plane.

FIGS. 28*a*-28*d* are cross sectional views that illustrate various exemplary embodiments of a shielded electrical cable according to aspects of the present invention. FIGS. 28*a*-28*d* illustrate various examples of partial coverage of the conductor set by the shielding film without the presence of a carrier film. The amount of coverage by the shielding film varies between the embodiments. In the embodiment illustrated in FIG. 28*a*, the conductor set has the most coverage. In the embodiment illustrated in FIG. 28*d*, the conductor set has the least coverage. In the embodiments illustrated in FIGS. 28*a* and 28*b*, more than half of the periphery of the conductor set is covered by the shielding film. In the embodiment illustrated in FIG. 28*c*, about half of the periphery of the conductor set is covered by the shielding film. In the embodiment illustrated in FIG. 28*d*, less than half of the periphery of the conductor set is covered by the shielding film. A greater amount of coverage provides better electromagnetic interference (EMI) isolation and reduced signal attenuation (resulting from a reduction in the proximity effect). Although in these embodiments, a conductor set includes two substantially parallel longitudinal insulated conductors, in other embodiments, a conductor set may include one or more than two substantially parallel longitudinal insulated conductors.

Figure 28A:
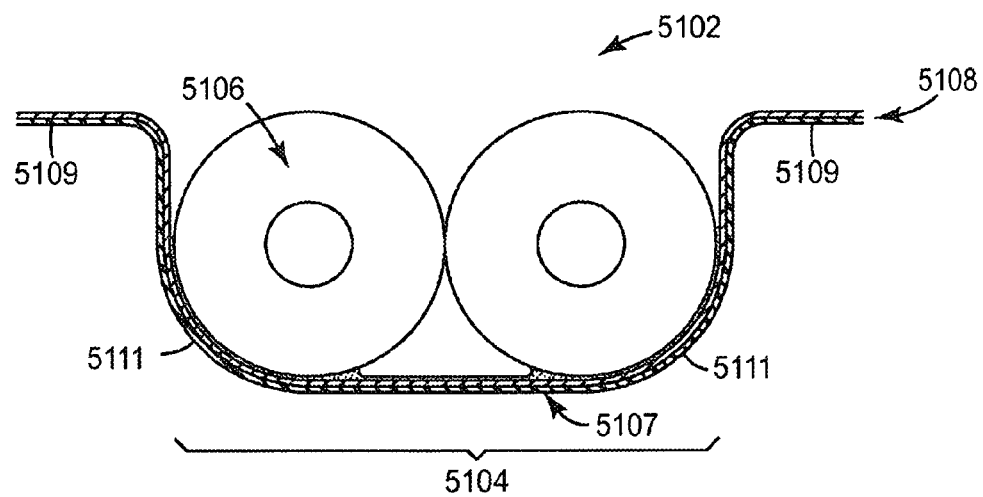
FIG. 28a-28d are front cross-sectional views of four other exemplary embodiments of a shielded electrical cable.

Referring to FIG. 28*a*, a shielded electrical cable 5102 includes a conductor set 5104 and a shielding film 5108. The conductor set 5104 includes two insulated conductors 5106 that extend along a length of the cable 5102. Shielding film 5108 includes pinched portions 5109 extending from both sides of conductor set 5104. Pinched portions 5109 cooperatively define a generally planar shielding film. Shielding film 5108 further includes a cover portion 5107 partially covering conductor set 5104. Cover portion 5107 includes concentric portions 5111 substantially concentric with a corresponding end conductor 5106 of the conductor 5104. Cover portion 5107 of shielding film 5108 covers the bottom side and the entire left and right sides of conductor set 5104 in FIG. 28*a*.

Figure 28B:
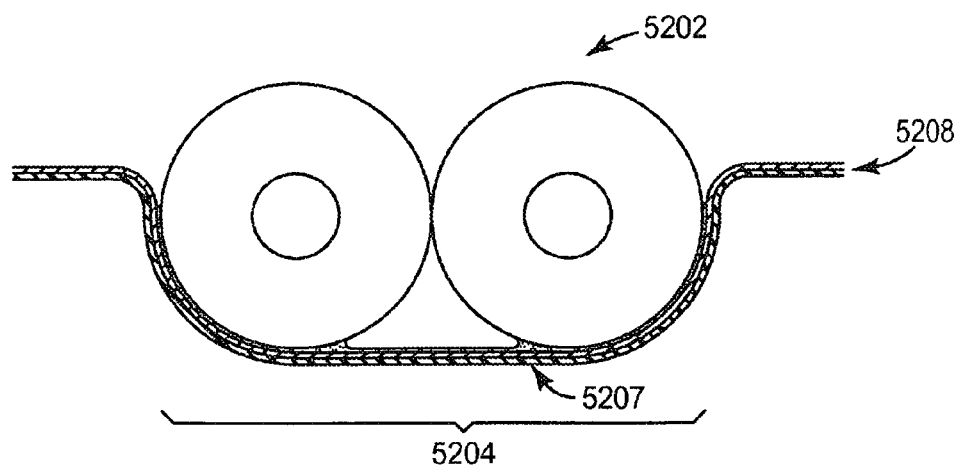

Referring to FIG. 28*b*, shielded electrical cable 5202 is similar in some respects to shielded electrical cable 5102 described above and illustrated in FIG. 28*a*. However, in shielded electrical cable 5202, cover portion 5207 of shielding film 5208 covers the bottom side and more than half of the left and right sides of conductor set 5204.

Figure 28C:
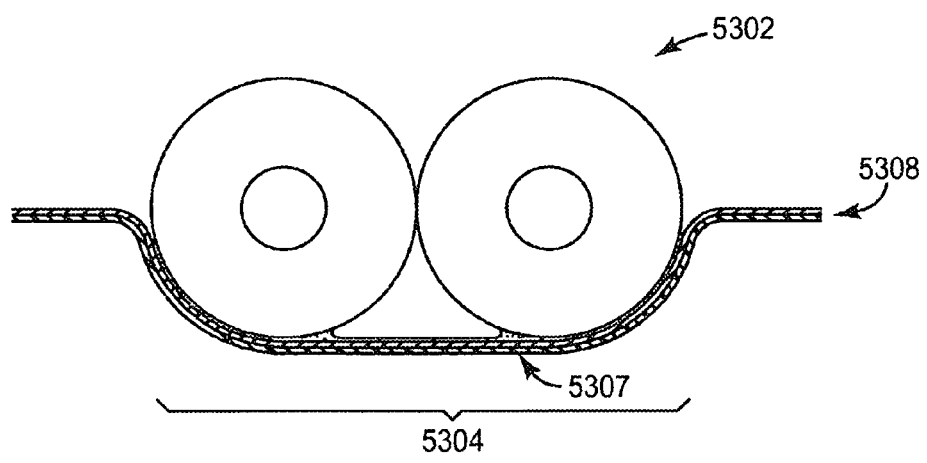

Referring to FIG. 28*c*, shielded electrical cable 5302 is similar to shielded electrical cable 5102 described above and illustrated in FIG. 28*a*. However, in shielded electrical cable 5302, cover portion 5307 of shielding film 5308 covers the bottom side and about half of the left and right sides of conductor set 5304.

Figure 28D:
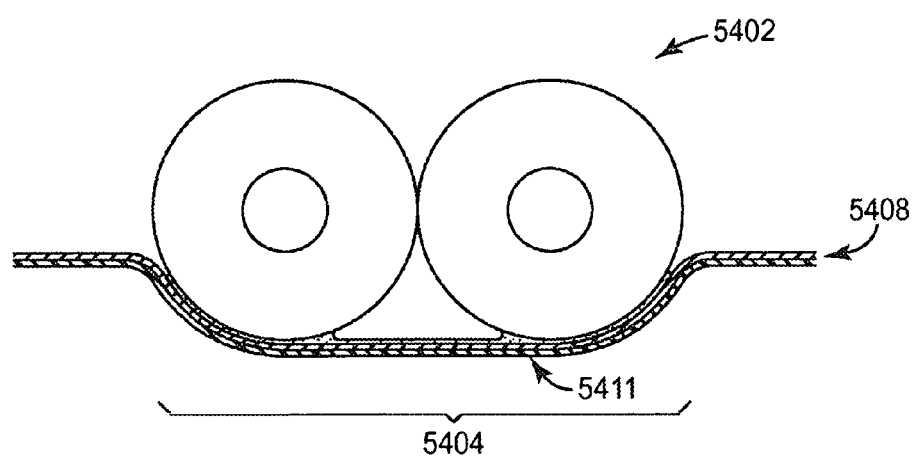

Referring to FIG. 28*d*, shielded electrical cable 5402 is similar in some respects to shielded electrical cable 5102 described above and illustrated in FIG. 28*a*. However, in shielded electrical cable 5402, cover portion 5411 of shielding film 5408 covers the bottom side and less than half of the left and right sides of conductor set 5404.

As an alternative to a carrier film, for example, shielded electrical cables according to aspects of the present invention may include an optional non-conductive support. This support may be used to complete physical coverage of a conductor set and add to the mechanical stability of the shielded electrical cable. FIGS. 29*a*-29*d* are cross sectional views that illustrate various exemplary embodiments of a shielded electrical cable according to aspects of the present invention including a non-conductive support. Although in these embodiments, a non-conductive support is used with a conductor set that includes two insulated conductors, in other embodiments, a non-conductive support may be used with a conductor set that includes one or more than two substantially parallel longitudinal insulated conductors, or with a ground conductor. The support may include any suitable polymeric material, including but not limited to polyester, polyimide, polyamide-imide, polytetrafluoroethylene, polypropylene, polyethylene, polyphenylene sulfide, polyethylene naphthalate, polycarbonate, silicone rubber, ethylene propylene diene rubber, polyurethane, acrylates, silicones, natural rubber, epoxies, and synthetic rubber adhesive. The support may include one or more additives and/or fillers to provide properties suitable for the intended application.

Figure 29A:
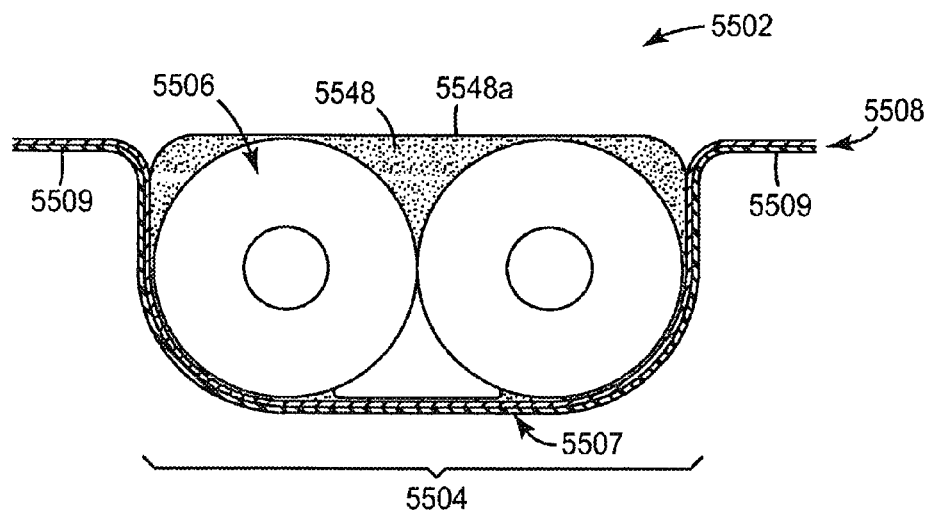
FIG. 29a-29d are front cross-sectional views of four other exemplary embodiments of a shielded electrical cable.

Referring to FIG. 29*a*, shielded electrical cable 5502 is similar to shielded electrical cable 5102 described above and illustrated in FIG. 28*a*, but further includes a non-conductive support 5548 partially covering conductor set 5504 opposite cover portion 5507 of shielding film 5508. The support 5548 can cover the top side of conductor set 5504, to enclose insulated conductors 5506. The support 5548 includes a generally planar top surface 5548*a*. Top surface 5548*a* and pinched portions 5509 of the shielding film 5508 are substantially coplanar.

Figure 29B:
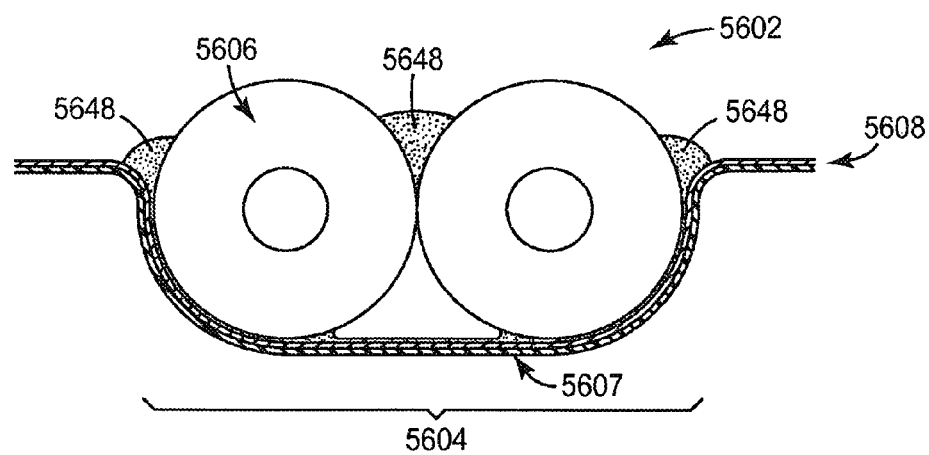

Referring to FIG. 29*b*, shielded electrical cable 5602 is similar to shielded electrical cable 5202 described above and illustrated in FIG. 28*b*, but further includes a non-conductive support 5648 partially covering conductor set 5604 opposite cover portion 5607 of shielding film 5608. Support 5648 only partially covers the top side of conductor set 5604, leaving insulated conductors 5606 partially exposed.

Figure 29C:
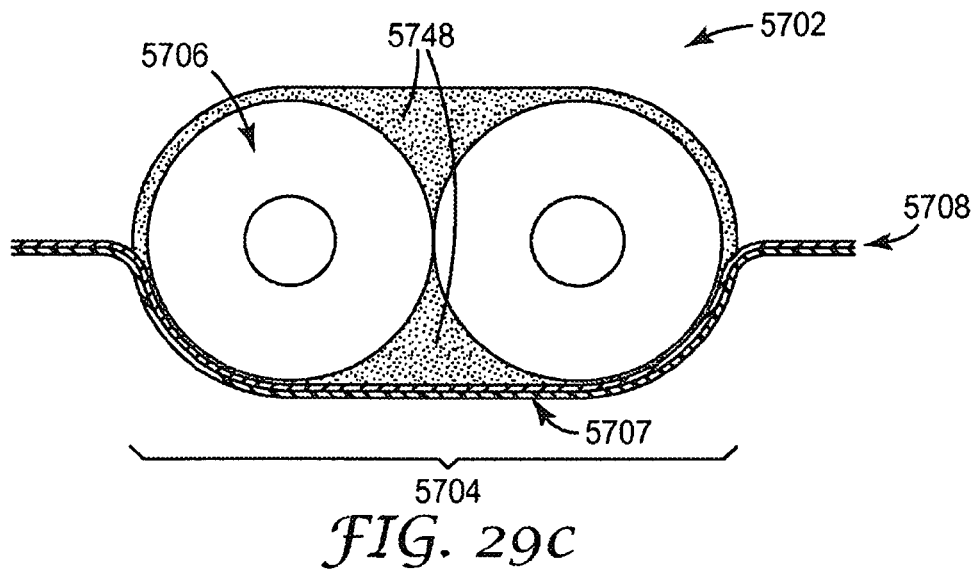

Referring to FIG. 29*c*, shielded electrical cable 5702 is similar to shielded electrical cable 5302 described above and illustrated in FIG. 28c, but further includes a non-conductive support 5748 partially covering conductor set 5704 opposite cover portion 5707 of shielding film 5708. Support 5748 covers essentially the entire top side of conductor set 5704, essentially fully enclosing insulated conductors 5706. At least a portion of support 5748 is substantially concentric with insulated conductors 5706. A portion of support 5748 is disposed between insulated conductors 5706 and shielding film 5708.

Figure 29D:
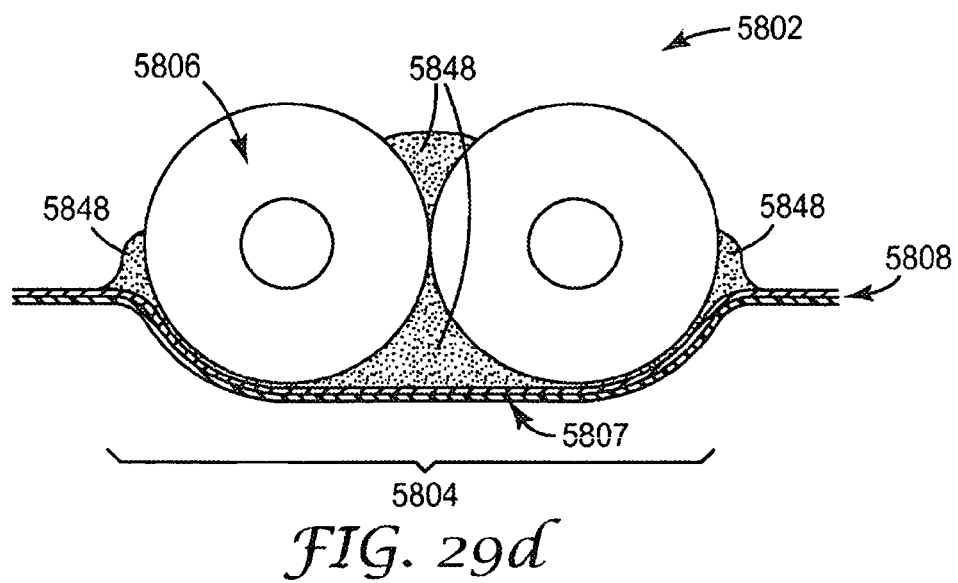

Referring to FIG. 29d, shielded electrical cable 5802 is similar to shielded electrical cable 5402 described above and illustrated in FIG. 28d, but further includes a non-conductive support 5848 partially covering conductor set 5804 opposite cover portion 5807 of shielding film 5808. Support 5848 only partially covers the top side of conductor set 5804, leaving insulated conductors 5806 partially exposed. A portion of support 5848 is disposed between insulated conductors 5806 and shielding film 5808.

Additional discussion of shielded cables is provided in "Connector Arrangements for Shielded Electrical Cables" (Attorney Docket 66887US002) filed on even date herewith and incorporated herein by reference.

We now provide, further details regarding shielded ribbon cables that can employ high packing density of mutually shielded conductor sets. The design features of the disclosed cables allow them to be manufactured in a format that allows very high density of signal lines in a single ribbon cable. This can enable a high density mating interface and ultra thin connector, and/or can enable crosstalk isolation with standard connector interfaces. In addition, high density cable can reduce the manufacturing cost per signal pair, reduce the bending stiffness of the assembly of pairs (for example, in general, one ribbon of high density bends more easily than two stacked ribbons of lower density), and reduce the total thickness since one ribbon is generally thinner than two stacked ribbons.

One potential application for at least some of the disclosed shielded cables is in high speed (I/O) data transfer between components or devices of a computer system or other electronic system. A protocol known as SAS (Serial Attached SCSI), which is maintained by the International Committee for Information Technology Standards (INCITS), is a computer bus protocol involving the movement of data to and from computer storage devices such as hard drives and tape drives. SAS uses the standard SCSI command set and involves a point-to-point serial protocol. A convention known as mini-SAS has been developed for certain types of connectors within the SAS specification.

Conventional twinaxial (twinax) cable assemblies for internal applications, such as mini-SAS cable assemblies, utilize individual twinax pairs, each pair having its own accompanying drain wire, and in some cases two drain wires. When terminating such a cable, not only must each insulated conductor of each twinax pair be managed, but each drain wire (or both drain wires) for each twinax pair must also be managed. These conventional twinax pairs are typically arranged in a loose bundle that is placed within a loose outer braid that contains the pairs so that they can be routed together. In contrast, the shielded ribbon cables described herein can if desired be used in configurations where, for example, a first four-pair ribbon cable is mated to one major surface of the paddle card (see e.g. FIG. 3d above) and a second four-pair ribbon cable, which may be similar or substantially identical in configuration or layout to the first four-pair ribbon cable, is mated to the other major surface at the same end of the paddle card to make a 4x or 4i mini-SAS assembly, having 4 transmit shielded pairs and 4 receive shielded pairs. This configuration is advantageous relative to the construction utilizing the twinax pairs of a conventional cable, in part because fewer than one drain wire per twinax pair can be used, and thus fewer drain wires need to be managed for termination. However, the configuration utilizing the stack of two four-pair ribbon cables retains the limitation that two separate ribbons are needed to provide a 4x/4i assembly, with the concomitant requirement to manage two ribbons, and with the disadvantageous increased stiffness and thickness of two ribbons relative to only one ribbon.

We have found that the disclosed shielded ribbon cables can be made densely enough, i.e., with a small enough wire-to-wire spacing, a small enough conductor set-to-conductor set spacing, and with a small enough number of drain wires and drain wire spacing, and with adequate loss characteristics and crosstalk or shielding characteristics, to allow for a single ribbon cable, or multiple ribbon cables arranged side-by-side rather than in a stacked configuration, to extend along a single plane to mate with a connector. This ribbon cable or cables may contain at least three twinax pairs total, and if multiple cables are used, at least one ribbon may contain at least two twinax pairs. In an exemplary embodiment, a single ribbon cable may be used, and if desired, the signal pairs may be routed to two planes or major surfaces of a connector or other termination component, even though the ribbon cable extends along only one plane. The routing can be achieved in a number of ways, e.g., tips or ends of individual conductors can be bent out of the plane of the ribbon cable to contact one or the other major surface of the termination component, or the termination component may utilize conductive through-holes or vias that connect one conductive pathway portion on one major surface to another conductive pathway portion on the other major surface, for example. Of particular significance to high density cables, the ribbon cable also preferably contains fewer drain wires than conductor sets; in cases where some or all of the conductor sets are twinax pairs, i.e., some or all of the conductor sets each contains only one pair of insulated conductors, the number of drain wires is preferably less than the number of twinax pairs. Reducing the number of drain wires allows the width of the cable to be reduced since drain wires in a given cable are typically spaced apart from each other along the width dimension of the cable. Reducing the number of drain wires also simplifies manufacturing by reducing the number of connections needed between the cable and the termination component, thus also reducing the number of fabrication steps and reducing the time needed for fabrication.

Furthermore, by using fewer drain wires, the drain wire(s) that remain can be positioned farther apart from the nearest signal wire than is normal so as to make the termination process significantly easier with only a slight increase in cable width. For example, a given drain wire may be characterized by a spacing al from a center of the drain wire to a center of a nearest insulated wire of a nearest conductor set, and the nearest conductor set may be characterized by a center-to-center spacing of insulated conductors of σ2; and σ1/σ2 may be greater than 0.7. In contrast, conventional twinax cable has a drain wire spacing of 0.5 times the insulated conductor separation, plus the drain wire diameter.

In exemplary high density embodiments of the disclosed shielded electrical ribbon cables, the center-to-center spacing or pitch between two adjacent twinax pairs (which distance is referred to below in connection with FIG. 16 as Σ) is at least less than four times, and preferably less than 3 times, the center-to-center spacing between the signal wires within one pair (which distance is referred to below in connection with FIG. 16 as σ). This relationship, which can be expressed as $\Sigma/\sigma<4$ or $\Sigma/\sigma<3$, can be satisfied both for unjacketed cables designed for internal applications, and jacketed cables designed for external applications. As explained elsewhere herein, we have demonstrated shielded electrical ribbon cables with multiple twinax pairs, and having acceptable loss and shielding (crosstalk) characteristics, in which $\Sigma/\sigma$ is in a range from 2.5 to 3.

An alternative way of characterizing the density of a given shielded ribbon cable (regardless of whether any of the conductor sets of the cable have a pair of conductors in a twinax configuration) is by reference to the nearest insulated conductors of two adjacent conductor sets. Thus, when the shielded cable is laid flat, a first insulated conductor of a first conductor set is nearest a second (adjacent) conductor set, and a second insulated conductor of the second conductor set is nearest the first conductor set. The center-to-center separation of the first and second insulated conductors is S. The first insulated conductor has an outer dimension D1, e.g., the diameter of its insulation, and the second insulated conductor has an outer dimension D2, e.g. the diameter if its insulation. In many cases the conductor sets use the same size insulated conductors, in which case D1=D2. In some cases, however, D1 and D2 may be different. A parameter Dmin can be defined as the lesser of D1 and D2. Of course, if D1=D2, then Dmin=D1=D2. Using the design characteristics for shielded electrical ribbon cables discussed herein, we are able to fabricate such cables for which S/Dmin is in a range from 1.7 to 2.

The close packing or high density can be achieved in part by virtue of one or more of the following features of the disclosed cables: the need for a minimum number of drain wires, or, stated differently, the ability to provide adequate shielding for some or all of the connector sets in the cable using fewer than one drain wire per connector set (and in some cases fewer than one drain wire for every two, three, or four or more connector sets, for example, or only one or two drain wires for the entire cable); the high frequency signal isolating structures, e.g., shielding films of suitable geometry, between adjacent conductor sets; the relatively small number and thickness of layers used in the cable construction; and the forming process which ensures proper placement and configuration of the insulated conductors, drain wires, and shielding films, and does so in a way that provides uniformity along the length of the cable. The high density characteristic can advantageously be provided in a cable capable of being mass stripped and mass terminated to a paddle card or other linear array. The mass stripping and termination is facilitated by separating one, some, or all drain wires in the cable from their respective closest signal line, i.e. the closest insulated conductor of the closest conductor set, by a distance greater than one-half the spacing between adjacent insulated conductors in the conductor set, and preferably greater than 0.7 times such spacing.

By electrically connecting the drain wires to the shielding films, and properly forming the shielding films to substantially surround each conductor set, the shield structure alone can provide adequate high frequency crosstalk isolation between adjacent conductor sets, and we can construct shielded ribbon cables with only a minimum number of drain wires. In exemplary embodiments, a given cable may have only two drain wires (one of which may be located at or near each edge of the cable), but only one drain wire is also possible, and more than two drain wires is of course also possible. By using fewer drain wires in the cable construction, fewer termination pads are required on the paddle card or other termination component, and that component can thus be made smaller and/or can support higher signal densities. The cable likewise can be made smaller (narrower) and can have a higher signal density, since fewer drain wires are present to consume less ribbon width. The reduced number of drain wires is a significant factor in allowing the disclosed shielded cables to support higher densities than conventional discrete twinax cables, ribbon cables composed of discrete twinax pairs, and ordinary ribbon cables.

Near-end crosstalk and/or far-end crosstalk can be important measures of signal integrity or shielding in any electrical cable, including the disclosed cables and cable assemblies. Grouping signal lines (e.g. twinax pairs or other conductor sets) closer together in a cable and in a termination area tends to increase undesirable crosstalk, but the cable designs and termination designs disclosed herein can be used to counteract this tendency. The subject of crosstalk in the cable and crosstalk within the connector can be addressed separately, but several of these methods for crosstalk reduction can be used together for enhanced crosstalk reduction. To increase high frequency shielding and reduce crosstalk in the disclosed cables, it is desirable to form as complete a shield surrounding the conductor sets (e.g. twinax pairs) as possible using the two shielding films on opposite sides of the cable. It is thus desirable to form the shielding films such that their cover portions, in combination, substantially surround any given conductor set, e.g., at least 75%, or at least 80, 85, or 90%, of the perimeter of the conductor set. It is also often desirable to minimize (including eliminate) any gaps between the shielding films in the pinched zones of the cable, and/or to use a low impedance or direct electrical contact between the two shielding films such as by direct contact or touching, or electrical contact through one or more drain wires, or using a conductive adhesive between the shielding films. If separate "transmit" and "receive" twinax pairs or conductors are defined or specified for a given cable or system, high frequency shielding may also be enhanced in the cable and/or at the termination component by grouping all such "transmit" conductors physically next to each another, and grouping all such "receive" conductors next to each other but segregated from the transmit pairs, to the extent possible, in the same ribbon cable. The transmit group of conductors may also be separated from the receive group of conductors by one or more drain wires or other isolation structures as described elsewhere herein. In some cases, two separate ribbon cables, one for transmit conductors and one for receive conductors, may be used, but the two (or more) cables are preferably arranged in a side-by-side configuration rather than stacked, so that advantages of a single flexible plane of ribbon cable can be maintained.

The described shielded cables may exhibit a high frequency isolation between adjacent insulated conductors in a given conductor set characterized by a crosstalk C1 at a specified frequency in a range from 3-15 GHz and for a 1 meter cable length, and may exhibit a high frequency isolation between the given conductor set and an adjacent conductor set (separated from the first conductor set by a pinched portion of the cable) characterized by a crosstalk C2 at the specified frequency, and C2 is at least 10 dB lower than C1. Alternatively or in addition, the described shielded cables may satisfy a shielding specification similar to or the same as that used in mini-SAS applications: a signal of a given signal strength is coupled to one of the transmit conductor sets (or one of the receive conductor sets) at one end of the cable, and the cumulative signal strength in all of the receive conductor sets (or in all of the transmit conductor sets), as measured at the same end of the cable, is calculated. The near-end crosstalk, computed as the ratio of the cumulative signal strength to the original signal strength, and expressed in decibels, is preferably less than −26 dB.

If the cable ends are not properly shielded, the crosstalk at the cable end can become significant for a given application. A potential solution with the disclosed cables is to maintain the structure of the shielding films as close as possible to the termination point of the insulated conductors, so as to contain any stray electromagnetic fields within the conductor set. Beyond the cable, design details of the paddle card or other termination component can also be tailored to maintain adequate crosstalk isolation for the system. Strategies include electrically isolating transmit and receive signals from each other to the extent possible, e.g. terminating and routing wires and conductors associated with these two signal types as physically far apart from each other as possible. One option is to terminate such wires and conductors on separate sides (opposed major surfaces) of the paddle card, which can be used to automatically route the signals on different planes or opposite sides of the paddle card. Another option is to terminate such wires and conductors laterally as far apart as possible to laterally separate transmit wires from receive wires. Combinations of these strategies can also be used for further isolation. (Reference in this regard is made to previously cited "Connector Arrangements for Shielded Electrical Cable" (Attorney Docket 66887US002), previously incorporated herein by reference.) These strategies can be used with the disclosed high density ribbon cables in combination with paddle cards of conventional size or reduced size, as well as with a single plane of ribbon cable, both of which may provide significant system advantages.

The reader is reminded that the above discussion relating to paddle card terminations, and discussion elsewhere herein directed to paddle cards, should also be understood as encompassing any other type of termination. For example, stamped metal connectors may include linear arrays of one or two rows of contacts to connect to a ribbon cable. Such rows may be analogous to those of a paddle card, which may also include two linear arrays of contacts. The same staggered, alternating, and segregated termination strategies for the disclosed cables and termination components can be employed.

Loss or attenuation is another important consideration for many electrical cable applications. One typical loss specification for high speed I/O applications is that the cable have a loss of less than −6 dB at, for example, a frequency of 5 GHz. (In this regard, the reader will understand that, for example, a loss of −5 dB is less than a loss of −6 dB.) Such a specification places a limit on attempting to miniaturize a cable simply by using thinner wires for the insulated conductors of the conductor sets and/or for the drain wires. In general, with other factors being equal, as the wires used in a cable are made thinner, cable loss increases. Although plating of wire, e.g., silver plating, tin plating, or gold plating, can have an impact on cable loss, in many cases, wire sizes smaller than about 32 gauge (32 AWG) or slightly smaller, whether of solid core or stranded wire design, may represent a practical lower size limit for signal wires in some high speed I/O applications. However, smaller wire sizes may be feasible in other high speed applications, and advances in technology can also be expected to render smaller wire sizes acceptable.

Turning now to FIG. 30a, we see there a cable system 11401 which includes a shielded electrical ribbon cable 11402 in combination with a termination component 11420 such as a paddle card or the like. The cable 11402, which may have any of the design features and characteristics shown and described elsewhere herein, is shown to have eight conductor sets 11404 and two drain wires 11412, each of which is disposed at or near a respective edge of the cable. Each conductor set is substantially a twinax pair, i.e., each includes only two insulated conductors 11406, each conductor set preferably being tailored to transmit and/or receive high speed data signals. Of course, other numbers of conductor sets, other numbers of insulated conductors within a given conductor set, and other numbers of drain wires (if any) can in general be used for the cable 11402. Eight twinax pairs are however of some significance due to the existing prevalence of paddle cards designed for use with four "lanes" or "channels", each lane or channel having exactly one transmit pair and exactly one receive pair. The generally flat or planar design of the cable, and its design characteristics, allow it to be readily bent or otherwise manipulated as shown while maintaining good high frequency shielding of the conductor sets and acceptable losses. The number of drain wires (2) is substantially less than the number of conductor sets (8), allowing the cable 11402 to have a substantially reduced width w1. Such a reduced width may be realized even in cases where the drain wires 11412 are spaced relative to the nearest signal wire (nearest insulated conductor 11406) by at least 0.7 times the spacing of signal wires in the nearest conductor set, since only two drain wires (in this embodiment) are involved.

The termination component 11420 has a first end 11420a and an opposed second end 11420b, and a first major surface 11420c and an opposed second major surface 11420d. Conductive paths 11421 are provided, e.g. by printing or other conventional deposition process(es) and/or etching process (es), on at least the first major surface 11420c of the component 11420. In this regard, the conductive paths are disposed on a suitable electrically insulating substrate, which is typically stiff or rigid but may in some cases be flexible. Each conductive path typically extends from the first end 11420a to the second end 11420b of the component. In the depicted embodiment, the individual wires and conductors of the cable 11402 are electrically connected to respective ones of the conductive paths 11421.

For simplicity, each path is shown to be straight, extending from one end of the component 11420 or substrate to the other on the same major surface of the component. In some cases, one or more of the conductive paths may extend through a hole or "via" in the substrate so that, for example, one portion and one end of the path resides on one major surface, and another portion and the other end of the path resides on the opposed major surface of the substrate. Also, in some cases, some of the wires and conductors of the cable can attach to conductive paths (e.g. contact pads) on one major surface of the substrate, while others of the wires and conductors can attach to conductive paths (e.g. contact pads) on the opposite major surface of the substrate but at the same end of the component. This may be accomplished by e.g. slightly bending the ends of the wires and conductors upward towards one major surface, or downward towards the other major surface. In some cases, all of the conductive paths corresponding to the signal wires and/or drain wires of the shielded cable may be disposed on one major surface of the substrate. In some cases, at least one of the conductive paths may be disposed on one major surface of the substrate, and at least another of the conductive paths may be disposed on an opposed major surface of the substrate. In some cases, at least one of the conductive paths may have a first portion on a first major surface of the substrate at the first end, and a second portion on an opposed second major surface of the substrate at the second end. In some cases, alternating conductor sets of the shielded cable may attach to conductive paths on opposite major surfaces of the substrate.

The termination component 11420 or substrate thereof has a width w2. In exemplary embodiments, the width w1 of the cable is not significantly larger than the width w2 of the component so that, for example, the cable need not be folded over or bunched together at its end in order to make the necessary connections between the wires of the cable and the conductive paths of the component. In some cages w1 may be slightly greater than w2, but still small enough so that the ends of the conductor sets may be bent in the plane of the cable in a funnel-type fashion in order to connect to the associated conductor paths, while still preserving the generally planar configuration of the cable at and near the connection point. In some cases, w1 may be equal to or less than w2. Conventional four channel paddle cards currently have a width of 15.6 millimeters, hence, it is desirable in at least some applications for the shielded cable to have a width of about 16 mm or less, or about 15 mm or less.

Figure 30B:
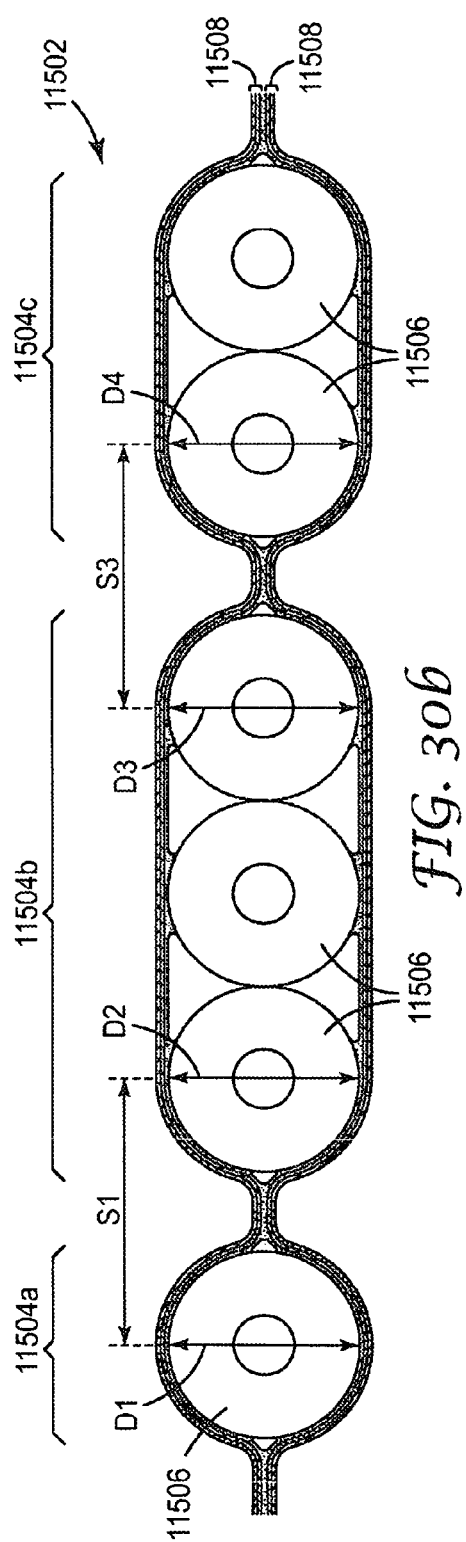
FIGS. 30b and 30c are front cross-sectional views of exemplary shielded electrical cables, which figures also depict parameters useful in characterizing the density of the conductor sets.
Figure 30C:
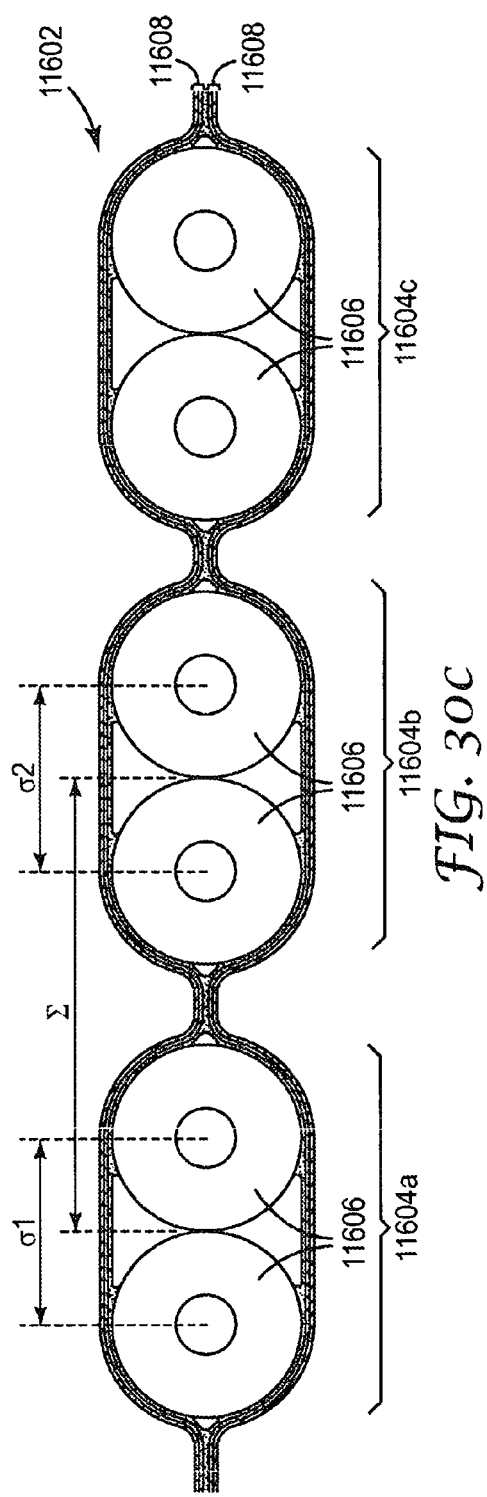

FIGS. 30b and 30c are front cross-sectional views of exemplary shielded electrical cables, which figures also depict parameters useful in characterizing the density of the conductor sets. Shielded cable 11502 includes at least three conductor sets 11504a, 11504b, and 11504c, which are shielded from each other by virtue of first and second shielding films 11508 on opposite sides of the cable, with their respective cover portions, pinched portions, and transition portions suitably formed. Shielded cable 11602 likewise includes at least three conductor sets 11604a, 11604b, and 11604c, which are shielded from each other by virtue of first and second shielding films 11608. The conductor sets of cable 11502 contain different numbers of insulated conductors 11506, with conductor set 11504a having one, conductor set 11504b having three, and conductor set 11504c having two (for a twinax design). Conductor sets 11604a, 11604b, 11604c are all of twinax design, having exactly two of the insulated conductors 1606. Although not shown in FIGS. 30b and 30c, each cable 11502, 11602 preferably also includes at least one and optionally two (or more) drain wires, preferably sandwiched between the shielding films at or near the edge(s) of the cable such as shown in FIG. 1 or FIG. 30a.

In FIG. 30b we see some dimensions identified that relate to the nearest insulated conductors of two adjacent conductor sets. Conductor set 11504a is adjacent conductor set 11504b. The insulated conductor 11506 of set 11504a is nearest the set 11504b, and the left-most (from the perspective of the drawing) insulated conductor 11506 of set 11504b is nearest the set 11504a. The insulated conductor of set 11504a has an outer dimension D1, and the left-most insulated conductor of set 11504b has an outer dimension D2. The center-to-center separation of these insulated conductors is S1. If we define a parameter Dmin as the lesser of D1 and D2, then we may specify for a densely packed shielded cable that S1/Dmin is in a range from 1.7 to 2.

We also see in FIG. 30b that conductor set 11504b is adjacent conductor set 11504c. The right-most insulated conductor 11506 of set 11504b is nearest the set 11504c, and the left-most insulated conductor 11506 of set 11504c is nearest the set 11504b. The right-most insulated conductor 11506 of set 11504b has an outer dimension D3, and the left-most insulated conductor 11506 of set 11504c has an outer dimension D4. The center-to-center separation of these insulated conductors is S3. If we define a parameter Dmin as the lesser of D3 and D4, then we may specify for a densely packed shielded cable that S3/Dmin is in a range from 1.7 to 2.

In FIG. 30c we see some dimensions identified that relate to cables having at least one set of adjacent twinax pairs. Conductor sets 11604a, 11604b represent one such set of adjacent twinax pairs. The center-to-center spacing or pitch between these two conductor sets is expressed as $\Sigma$. The center-to-center spacing between signal wires within the twinax-conductor set 11604a is expressed as $\sigma1$. The center-to-center spacing between signal wires within the twinax conductor set 11604b is expressed as $\sigma2$. For a densely packed shielded cable, we may specify that one or both of $\Sigma/\sigma1$ and $\Sigma/\sigma2$ is less than 4, or less than 3, or in a range from 2.5 to 3.

In FIGS. 30d and 30e, we see a top view and side view respectively of a cable system 11701 which includes a shielded electrical ribbon cable 11702 in combination with a termination component 11720 such as a paddle card or the like. The cable 11702, which may have any of the design features and characteristics shown and described elsewhere herein, is shown to have eight conductor sets 11704 and two drain wires 11712, each of which is disposed at or near a respective edge of the cable. Each conductor set is substantially a twinax pair, i.e., each includes only two insulated conductors 11706, each conductor set preferably being tailored to transmit and/or receive high speed data signals. Just as in FIG. 30a, the number of drain wires (2) is substantially less than the number of conductor sets (8), allowing the cable 11702 to have a substantially reduced width relative to a cable having one or two drain wires per conductor set, for example. Such a reduced width may be realized even in cases where the drain wires 11712 are spaced relative to the nearest signal wire (nearest insulated conductor 11706) by at least 0.7 times the spacing of signal wires in the nearest conductor set, since only two drain wires (in this embodiment) are involved.

The termination component 11720 has a first end 11720a and an opposed second end 11720b, and includes a suitable substrate having a first major surface 11720c and an opposed second major surface 11720d. Conductive paths 11721 are provided on at least the first major surface 11720c of the substrate. Each conductive path typically extends from the first end 11720a to the second end 11720b of the component. The conductive paths are shown to include contact pads at both ends of the component, in the figure the individual wires and conductors of the cable 11702 are shown as being electrically, connected to respective ones of the conductive paths 11721 at the corresponding contact pad. Note that the variations discussed elsewhere herein regarding placement, configuration, and arrangement of the conductive paths on the substrate, and placement, configuration, and arrangement of the various wires and conductors of the cable and their attached to one or both of the major surfaces of the termination component, are also intended to apply to the system 11701.

EXAMPLE

Figure 30F:
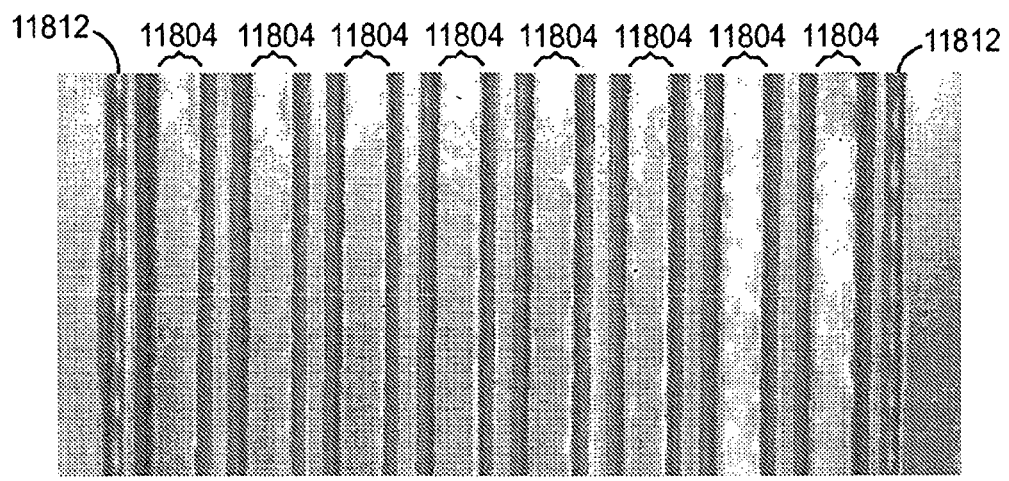
FIGS. 30f and 30g are photographs of a shielded electrical cable that was fabricated.
Figure 30G:
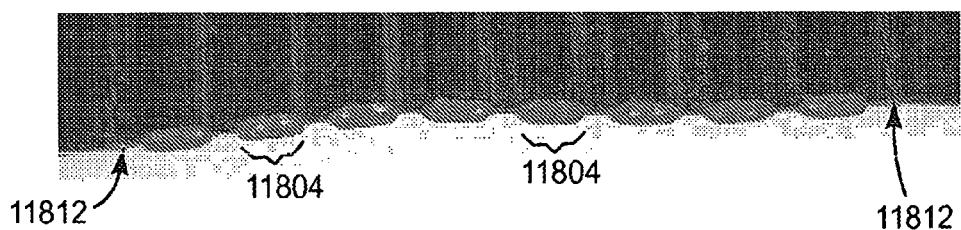

A shielded electrical ribbon cable having the general layout of cable 11402 (see FIG. 30a) was fabricated. The cable utilized sixteen insulated 32 gauge (AWG) wires arranged into eight twinax pairs for signal wires, and two non-insulated 32 (AWG) wires arranged along the edges of the cable for drain wires. Each of the sixteen signal wires used had a solid copper core with silver plating. The two drain wires each had a stranded construction (7 strands each) and were tin-plated. The insulation of the insulated wires had a nominal outer diameter of 0.025 inches. The sixteen insulated and two non-insulated wires were fed into a device similar to that shown in FIG. 5c, sandwiched between two shielding films. The shielding films were substantially identical, and had the following construction: a base layer of polyester (0.00048 inches thick), on which a continuous layer of aluminum (0.00028 inches thick) was disposed, on which a continuous layer of electrically non-conductive adhesive (0.001 inches thick) was disposed. The shielding films were oriented such that the metal coatings of the films faced each other and faced the conductor sets. The process temperature was about 270 degrees F. The resulting cable made by this process was photographed and is shown in top view in FIG. 30f, and an oblique view of the end of the cable is shown in FIG. 30g. In the figures, 1804 refers to the twinax conductor sets, and 1812 refers to the drain wires.

The resulting cable was non-ideal due to lack of concentricity of the solid core in the insulated conductor used for the signal wires. Nevertheless, certain parameters and characteristics of the cable could be measured, taking into account (correcting for) the non-concentricity issue. For example, the dimensions D, d1, d2 (see FIG. 2c) were about 0.028 inches, 0.0015 inches, and 0.028 inches, respectively. No portion of either one of the shielding films had a radius of curvature at any point along the width of the cable of less than 50 microns, in transverse cross section. The center-to-center spacing from a given drain wire to the nearest insulated wire of the nearest twinax conductor set was about 0.83 mm, and the center-to-center spacing of the insulated wires within each conductor set (see e.g. parameters σ1 and σ2 in FIG. 30c) was about 0.025 inches (0.64 mm). The center-to-center spacing of adjacent twinax conductor sets (see e.g. the parameter Σ in FIG. 30c) was about 0.0715 inches (1.8 mm). The spacing parameter S (see S1 and S3 in FIG. 30b) was about 0.0465 inches. The width of the cable, measured from edge to edge, was about 16 to 17 millimeters, and the spacing between the drain wires was 15 millimeters. The cable was readily capable of mass termination, including the drain wires.

From these values we see that: the spacing from the drain wire to the nearest signal wire was about 1.3 times the wire-to-wire spacing within each twinax pair, thus, greater than 0.7 times the wire-to-wire spacing; the cable density parameter E/a was about 2.86, i.e., in the range from 2.5 to 3; the other cable density parameter S/Dmin was about 1.7, i.e., in the range from 1.7 to 2; the ratio $d_1/D$ (minimum separation of the pinched portions of the shielding films divided by the maximum separation between the cover portions of the shielding films) was about 0.05, i.e., less than 0.25 and also less than 0.1; the ratio $d_2/D$ (minimum separation between the cover portions of the shielding films in a region between insulated conductors divided by the maximum separation between the cover portions of the shielding films) was about 1, i.e., greater than 0.33.

Note also that the width of the cable (i.e., about 16 mm edge-to-edge, and 15.0 mm from drain wire to drain wire) was less than the width of a conventional mini-SAS internal cable outer molding termination (typically 17.1 mm), and about the same as the typical width of a mini-SAS paddle card (15.6 mm). A smaller width than the paddle card allows simple one-to-one routing from the cable to the paddle card with no lateral adjustment of the wire ends needed. Even if the cable were slightly wider than the termination board or housing, the outer wire could be routed or bent laterally to meet the pads on the outside edges of the board. Physically this cable can provide a double density versus other ribbon cables, can be half as thick in an assembly (since one less ribbon is needed), and can allow for a thinner connector than other common cables. The cable ends can be terminated and manipulated in any suitable fashion to connect with a termination component as discussed elsewhere herein.

We now provide further details regarding shielded ribbon cables that can employ an on-demand drain wire feature.

In many of the disclosed shielded electrical cables, a drain wire that makes direct or indirect electrical contact with one or both of the shielding films makes such electrical contact over substantially the entire length of the cable. The drain wire may then be tied to an external ground connection at a termination location to provide a ground reference to the shield so as to reduce (or "drain") any stray signals that can produce crosstalk and reduce electromagnetic interference (EMI). In this section of the detailed description, we more fully describe constructions and methods that provide electrical contact between a given drain wire and a given shielding film at one or more isolated areas of the cable, rather than along the entire cable length. We sometimes refer to the constructions and methods characterized by the electrical contact at the isolated area(s) as the on-demand technique.

This on-demand technique may utilize the shielded cables described elsewhere herein, wherein the cable is made to include at least one drain, wire that has a high DC electrical resistance between the drain wire and at least one shielding film over all of, or at least over a substantial portion of, the length of the drain wire. Such a cable may be referred to, for purposes of describing the on-demand technique, as an untreated cable. The untreated cable can then be treated in at least one specific localized region in order to substantially reduce the DC resistance and provide electrical contact (whether direct or indirect) between the drain wire and the shielding film(s) in the localized region. The DC resistance in the localized region may for example be less than 10 ohms, or less than 2 ohms, or substantially zero ohms.

Figure 31A:
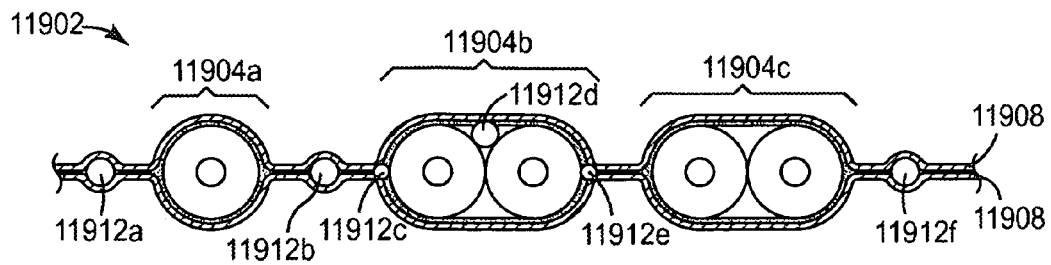
FIG. 31a is a front cross-sectional view of an exemplary shielded electrical cable showing some possible drain wire positions.

The untreated cable may include at least one drain wire, at least one shielding film, and at least one conductor set that includes at least one insulated conductor suitable for carrying high speed signals. FIG. 31a is a front cross-sectional view of an exemplary shielded electrical cable 11902 which may serve as an untreated cable, although virtually any other shielded cable shown or described herein can also be used. The cable 11902 includes three conductor sets 11904a, 11904b, 11904c, which each include one or more insulated conductors, the cable also having six drain wires 11912a-f which are shown in a variety of positions for demonstration purposes. The cable 11902 also includes two shielding films 11908 disposed on opposite sides of the cable and preferably having respective cover portions, pinched portions, and transition portions. Initially, a non-conductive adhesive material or other compliant non-conductive material separates each drain wire from one or both shielding films. The drain wire, the shielding film(s), and the non-conductive material therebetween are configured so that the shielding film can be made to make direct or indirect electrical contact with the drain wire on demand in a localized or treated region. Thereafter, a suitable treatment process is used to accomplish this selective electrical contact between any of the depicted drain wires 11912a-f and the shielding films 11908.

Figure 31B:
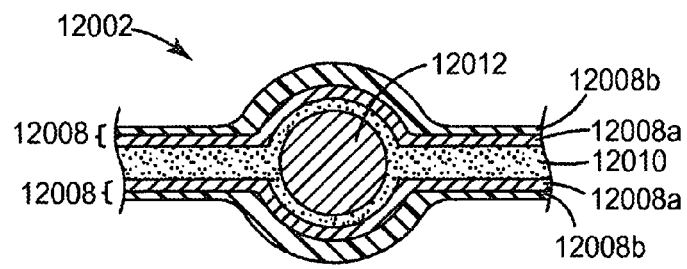
FIGS. 31b and 31c are detailed front cross-sectional views of a portion of a shielded cable, demonstrating one technique for providing on-demand electrical contact between a drain wire and shielding film(s) at a localized area.
Figure 31C:
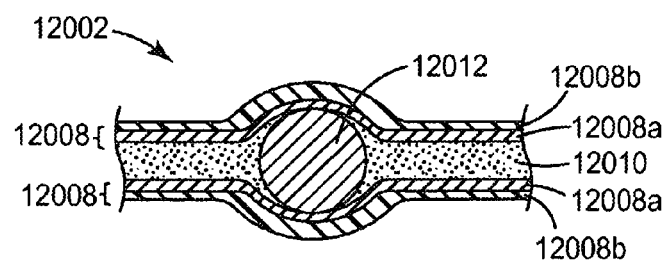
Figure 31D:
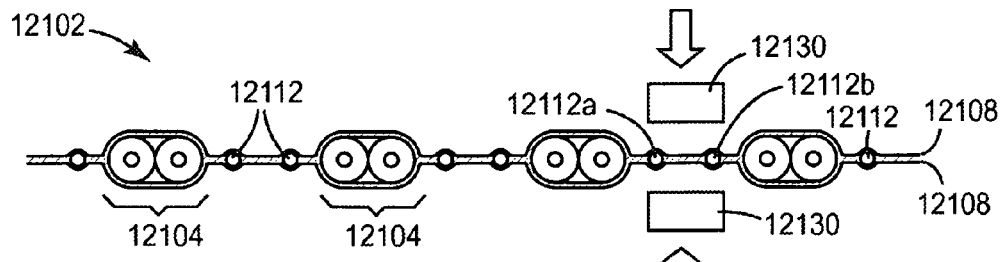
FIG. 31d is a schematic front cross-sectional view of a cable showing one procedure for treating the cable at a selected area to provide on-demand contact.

FIGS. 31b, 31c, and 31d are front cross-sectional views of shielded cables or portions thereof that demonstrate at least some such treatment processes. In FIG. 31ba, a portion of a shielded electrical cable 12002 includes opposed shielding films 12008, each of which may include a conductive layer 12008a and a non-conductive layer 12008b. The shielding films are oriented so that the conductive layer of each shielding film faces a drain wire 12012 and the other shielding film. In an alternative embodiment, the non-conductive layer of one or both shielding films may be omitted. Significantly, the cable 12002 includes a non-conductive material (e.g. a dielectric material) 12010 between the shielding films 12008 and that separates the drain wire 12012 from each of the shielding films 12008. In some cases, the material 12010 may be or comprise a non-conductive compliant adhesive material. In some cases, the material 12010 may be or comprise a thermoplastic dielectric material such as polyolefin at a thickness of less than 0.02 mm, or some other suitable thickness. In some cases, the material 12010 may be in the form of a thin layer that covers one or both shielding films prior to cable manufacture. In some cases, the material 12010 may be in the form of a thin insulation layer that covers the drain wire prior to cable manufacture (and in the untreated cable), in which case such material may not extend into the pinched regions of the cable unlike the embodiment shown in FIGS. 31*b* and 31*c*.

To make a localized connection, compressive force and/or heat may be applied within a limited area or zone to force the shielding films 12008 into permanent electrical contact with the drain wire 12012 by effectively forcing the material 12010 out of the way. The electrical contact may be direct or indirect, and may be characterized by a DC resistance in the localized treated region of less than 10 ohms, or less than 2 ohms, or substantially zero ohms. (Untreated portions of the drain wire 12012 continue to be physically separated from the shielding film and would be characterized by a high DC resistance (e.g. >100 ohms), except of course for the fact that the untreated portions of the drain wire electrically connect to the shielding film through the treated portion(s) of the drain wire.) The treatment procedure can be repeated at different isolated areas of the cable in subsequent steps, and/or can be performed at multiple isolated areas of the cable in any given single step. The shielded cable also preferably contains at least one group of one ore more insulated signal wires for high speed data communication. In FIG. 31*d*, for example, shielded cable 12102 has a plurality of twinax conductor sets 12104 with shielding provided by shielding films 12108. The cable 12102 includes drain wires 12112, two of which (12112*a*, 12112*b*) are shown as being treated in a single step, for example with pressure, heat, radiation, and/or any other suitable agent, using treating components 12130. The treating components preferably have a length (a dimension along an axis perpendicular to the plane of the drawing) which is small compared to the length of the cable 12102 such that the treated region is similarly small compared to the length of the cable. The treatment process for on-demand drain wire contact can be performed (a) during cable manufacture, (b) after the cable is cut to length for termination process, (c) during the termination process (even simultaneously when the cable is terminated), (d) after the cable has been made into an cable assembly (e.g. by attachment of termination components to both ends of the cable), or (e) any combination of (a) through (d).

The treatment to provide localized electrical contact between the drain wire and one or both shielding films may in some cases utilize compression. The treatment may be carried out at room temperature with high local force that severely deforms the materials and causes contact, or at elevated temperatures at which, for example, a thermoplastic material as discussed above may flow more readily. Treatment may also include delivering ultrasonic energy to the area in order to make the contact. Also, the treatment process may be aided by the use of conductive particles in a dielectric material separating the shielding film and drain wire, and/or with asperities provided on the drain wire and/or shielding film.

FIGS. 31*e* and 31*f* are top views of a shielded electrical cable assembly 12201, showing alternative configurations in which one may choose to provide on-demand contact between drain wires and shielding film(s). In both figures, a shielded electrical ribbon cable 12202 is connected at both ends thereof to termination components 12220, 12222. The termination components each comprise a substrate with individual conductive paths provided thereon for electrical connection to the respective wires and conductors of the cable 12202. The cable 12202 includes several conductor sets of insulated conductors, such as twinax conductor sets adapted for high speed data communication. The cable 12202 also includes two drain wires 12212*a*, 12212*b*. The drain wires have ends that connect to respective conductive paths of each termination component. The drain wires are also positioned near (e.g. covered by) at least one shielding film of the cable, and preferably are positioned between two such films as shown for example in the cross-sectional views of FIGS. 31*a* and 31*b*. Except for localized treated areas or zones that will be described below, the drain wires 12212*a*, 12212*b* do not make electrical contact with the shielding film(s) at any point along the length of the cable, and this may be accomplished by any suitable means e.g. by employing any of the electrical isolation techniques described elsewhere herein: A DC resistance between the drain wires and the shielding film(s) in the untreated areas may, for example, be greater than 100 ohms. However, the cable is preferably treated at selected zones or areas as described above to provide electrical contact between a given drain wire and a given shielding film(s). In FIG. 31*e*, the cable 12202 has been treated in localized area 12213*a* to provide electrical contact between drain wire 12212*a* and the shielding film(s), and it has also been treated in localized areas 12213*b*, 12213*c* to provide electrical contact between drain wire 12212*b* and the shielding film(s). In FIG. 31*f*, the cable 12202 is shown as being treated in the same localized areas 12213*a* and 12213*b*, but also in different localized areas 12213*d*, 2213*e*.

Note that in some cases multiple treated areas can be used for a single drain wire for redundancy or for other purposes. In other cases, only a single treated area may be used for a given drain wire. In some cases, a first treated area for a first drain wire may be disposed at a same lengthwise position as a second treated area for a second drain wire—see e.g. areas 12213*a*, 12213*b* of FIGS. 31*e*, 31*f*, and see also the procedure shown in FIG. 31 *d*. In some cases, a treated area for one drain wire may be disposed at a different lengthwise position than a treated area for another drain wire—see e.g. areas 12231*a* and 12213*c* of FIG. 31*e*, or areas 12213*d* and 12213*e* of FIG. 31*f*. In some cases, a treated area for one drain wire may be disposed at a lengthwise position of the cable at which another drain wire lacks any localized electrical contact with the shielding film(s)—see e.g. area 12213*c* of FIG. 31*e*, or area 12213*d* or area 12213*e* of FIG. 31*f*.

Figure 31G:
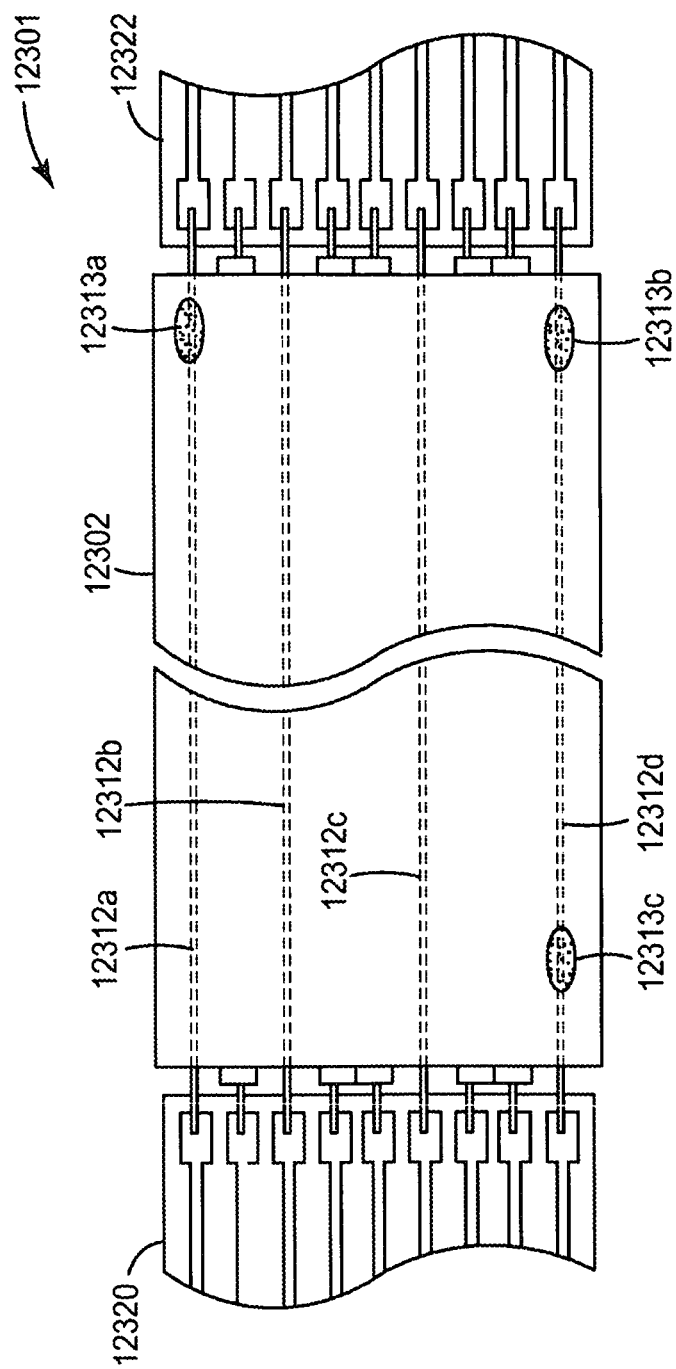
FIG. 31g is a top view of another shielded electrical cable assembly, showing another configuration in which one may choose to provide on-demand contact between drain wires and shielding film(s)

FIG. 31*g* is a top view of another shielded electrical cable assembly 12301, showing another configuration in which one may choose to provide on-demand contact between drain wires and shielding film(s). In assembly 12301, a shielded electrical ribbon cable 12302 is connected at both ends thereof to termination components 12320, 12322. The termination components each comprise a substrate with individual conductive paths provided thereon for electrical connection to the respective wires and conductors of the cable 12302. The cable 12302 includes several conductor sets of insulated conductors, such as twinax conductor sets adapted for high speed data communication. The cable 12302 also includes several drain wires 12312*a*-*d*. The drain wires have ends that connect to respective conductive paths of each termination component. The drain wires are also positioned near (e.g. covered by) at least one shielding film of the cable, and preferably are positioned between two such films as shown for example in the cross-sectional views of FIGS. 31*a* and 31*b*. Except for localized treated areas or zones that will be described below, at least the drain wires 112312*a*, 112312*d* do not make electrical contact with the shielding film(s) at any point along the length of the cable, and this may be accomplished by any suitable means e.g. by employing any of the electrical isolation techniques described elsewhere herein. A DC resistance between these drain wires and the shielding film(s) in the untreated areas may, for example, be greater than 100 ohms. However, the cable is preferably treated at selected zones or areas as described above to provide electrical contact between these drain wires and a given shielding film(s). In the figure, the cable 12302 is shown to be treated in localized area 12313a to provide electrical contact between drain wire 12312a and the shielding film(s), and is also shown to be treated in localized areas 12313b, 12313c to provide electrical contact between drain wire 2312d and the shielding film(s). One or both of the drain wires 12313b, 12312c may be of the type that are suitable for localized treatment, or one or both may be made in a more standard manner in which they make electrical contact with the shielding film(s) along substantially their entire length during cable manufacture.

EXAMPLES

Two examples are presented in this section. First, two substantially identical untreated shielded electrical ribbon cables were made with the same number and configuration of conductor sets and drain wires as the shielded cable shown in FIG. 31d. Each cable was made using two opposed shielding films having the same construction: a base layer of polyester (0.00048 inches thick), on which a continuous layer of aluminum (0.00028 inches thick) was disposed, on which a continuous layer of electrically non-conductive adhesive (0.001 inch thick) was, disposed. The eight insulated conductors used in each cable to make the four twinax conductor sets were 30 gauge (AWG), solid core, silver plated copper wire. The eight drain wires used for each cable were 32 gauge (AWG), tin-plated, 7-stranded wires. The settings used for the manufacturing process were adjusted so that a thin layer (less than 10 micrometers) of the adhesive material (a polyolefin) remained between each drain wire and each shielding film to prevent electrical contact therebetween in the untreated cables. The two untreated cables were each cut to a length of about 1 meter, and were mass stripped at one end.

A first one of these untreated cables was initially tested to determine if any of the drain wires were in electrical contact with either of the shielding films. This was done by connecting a micro-ohmmeter at the stripped end of the cable to all 28 possible combinations of two drain wires. These measurements yielded no measurable DC resistance for any of the combinations—i.e., all combinations produced DC resistances well over 100 ohms. Then, two adjacent drain wires, as depicted in FIG. 31d, were treated in one step to provide localized areas of contact between those drain wires and the two shielding films. Another two adjacent drain wires, e.g., the two adjacent wires labeled 12112 at the left side of FIG. 31d, were also treated in the same way in a second step. Each treatment was accomplished by compressing a portion of the cable with a tool that was about 0.25 inches long and 0.05 inches wide, the tool width covering two adjacent drain wires at one lengthwise position of the cable. Each treated portion was about 3 cm from one end of the cable. In this first example, the tool temperature was 220 degrees C., and a force of about 75-150 pounds was applied for 10 seconds for each treatment. The tool was then removed and the cable allowed to cool. The micro-ohmmeter was then connected at the end of the cable opposite the treated end, and all 28 possible combinations of two drain wires were again tested. The DC resistance of one pair (two of the treated drain wires) was measured as 1.1 ohms, and the DC resistance of all other combinations of two drain wires (measured at the end of the cable opposite the treated end) was not measurable, i.e., was well over 100 ohms.

The second one of the untreated cables was also initially tested to determine if any of the drain wires were in electrical contact with either of the shielding films. This was again done by connecting a micro-ohmmeter at the stripped end of the cable to all 28 possible combinations of two drain wires, and the measurements again yielded no measurable DC resistance for any of the combinations—i.e., all combinations produced DC resistances well over 100 ohms. Then, two adjacent drain wires, as depicted in FIG. 21, were treated in a first step to provide localized areas of contact between those drain wires and the two shielding films. This treatment was done with the same tool as in example 1, and the treated portion was about 3 cm from a first end of the cable. In a second treatment step, the same two drain wires were treated under the same conditions as the first step, but at a position 3 cm from a second end of the cable opposite the first end. In a third step, another two adjacent drain wires, e.g., the two adjacent wires labeled 12112 at the left side of FIG. 31d, were treated in the same way as the first step, again 3 cm from the first end of the cable. In a fourth treatment step, the same two drain wires treated in step 3 were treated under the same conditions, but at a treatment location 3 cm from the second end of the cable. In this second example, the tool temperature was 210 degrees C., and a force of about 75-150 pounds was applied for 10 seconds for each treatment step. The tool was then removed and the cable allowed to cool. The micro-ohmmeter was then connected at one end of the cable, and all 28 possible combinations of two drain wires were attain tested. An average DC resistance of 0.6 ohms was measured for five of the combinations (all five of these combinations involving the four drain wires having treated areas), and a DC resistance of 21.5 ohms was measured as for the remaining combination involving the four drain wires having treated areas. The DC resistance of all other combinations of two drain wires was not measurable, i.e., was well over 100 ohms.

Figure 32A:
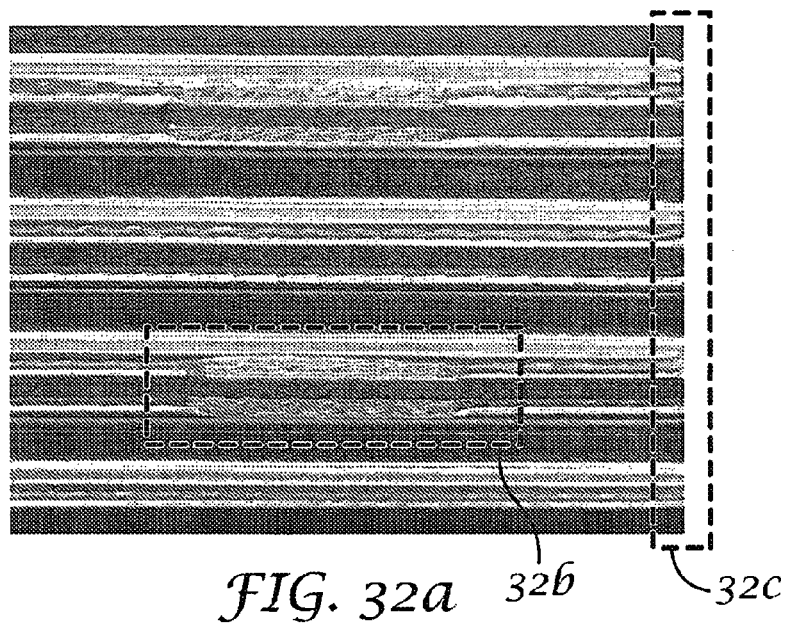
FIG. 32a is a photograph of a shielded electrical cable that was fabricated and treated to have on-demand drain wire contacts.
Figure 32B:
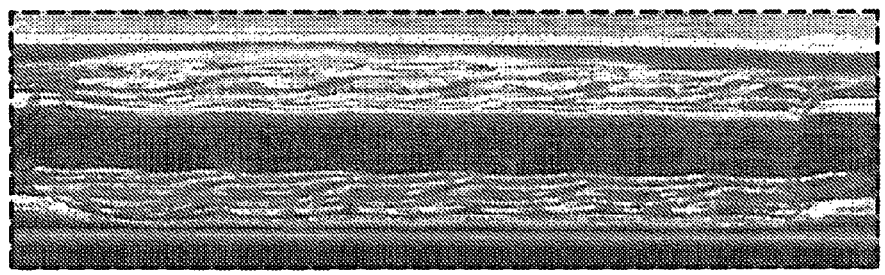
Figure 32C:

FIG. 32a is a photograph of one of the shielded electrical cables that was fabricated and treated for these examples. Four localized treated areas can be seen. FIG. 32b is an enlarged detail of a portion of FIG. 32a, showing two of the localized treated areas. FIG. 32c is a schematic representation of a front elevational view of the front cross-sectional layout of the cable of FIG. 32a.

We now provide further details regarding shielded ribbon cables that can employ multiple drain wires, and unique combinations of such cables with one or more termination components at one or two ends of the cable.

Conventional coaxial or twinax cable uses multiple independent groups of wires, each with their own drain wires to make ground connection between the cable and the termination point. An advantageous aspect of the shielded cables described herein is that they can include drain wires in multiple locations throughout the structure, as was shown e.g. in FIG. 31a. Any given drain wire can be directly (DC) connected to the shield structure, AC connected to the shield (low impedance AC connection), or can be poorly or not connected at all to the shield (high AC impedance). Because the drain wires are elongated conductors, they can extend beyond the shielded cable and make connection to the ground termination of a mating connector. An advantage of the disclosed cables is that in general fewer drain wires can be used in some applications since the electrical shields provided by the shielding films are common for the entire cable structure.

We have found that one can use the disclosed shielded cables to advantageously provide a variety of different drain wire configurations that can interconnect electrically through the conductive shield of the shielded ribbon cable. Stated simply, any of the disclosed shielded cables may include at least a first and second drain wire. The first and second drain wires may extend along the length of the cable, and may be electrically connected to each other at least as a result of both of them being in electrical contact with a first shielding film. This cable may be combined with one or more first termination components at a first end of the cable and one or more second termination components at a second end of the cable. In some cases, the first drain wire may electrically connect to the one or more first termination components but may not electrically connect to the one or more second termination components. In some cases, the second drain wire may electrically connect to the one or more second termination components but may not electrically connect to the one or more first termination components.

The first and second drain wires may be members of a plurality of drain wires extending along the length of the cable, and a number n1 of the drain wires may connect to the one or more first termination components, and a number n2 of the drain wires may connect to the one or more second termination components. The number n1 may not be equal to n2. Furthermore, the one or more first termination components may collectively have a number m1 of first termination components, and the one or more second termination components may collectively have a number m2 of second termination components. In some cases, n2>n1, and m2>m1. In some cases, m1=1. In some cases, m1=m2. In some cases, m1<m2. In some cases, m1>1 and m2>1.

Arrangements such as these provides the ability to connect one drain wire to an external connection and have one or more other drain wires be connected only to the common shield, thereby effectively tying all of them to the external ground. Thus, advantageously, not all drain wires in the cable need to connected to the external ground structure, which can be used to simplify the connection by requiring fewer mating connections at the connector. Another potential advantage is that redundant contacts can be made if more than one of the drain wire is connected to the external ground and to the shield. In such cases, one may fail to make contact to the shield or the external ground with one drain wire, but still successfully make electrical contact between the external ground and the shield through the other drain wire. Further, if the cable assembly has a fan-out configuration, wherein one end of the cable is connected to one external connector (m1=1) and common ground, and the other end is tied to multiple connectors (m2>1), then fewer connections (n1) can be made on the common end than are used (n2) for the multiple connector ends. The simplified grounding offered by such configurations may provide benefits in terms of reduced complexity and reduced number of contact pads required at the terminations.

Figure 32D:
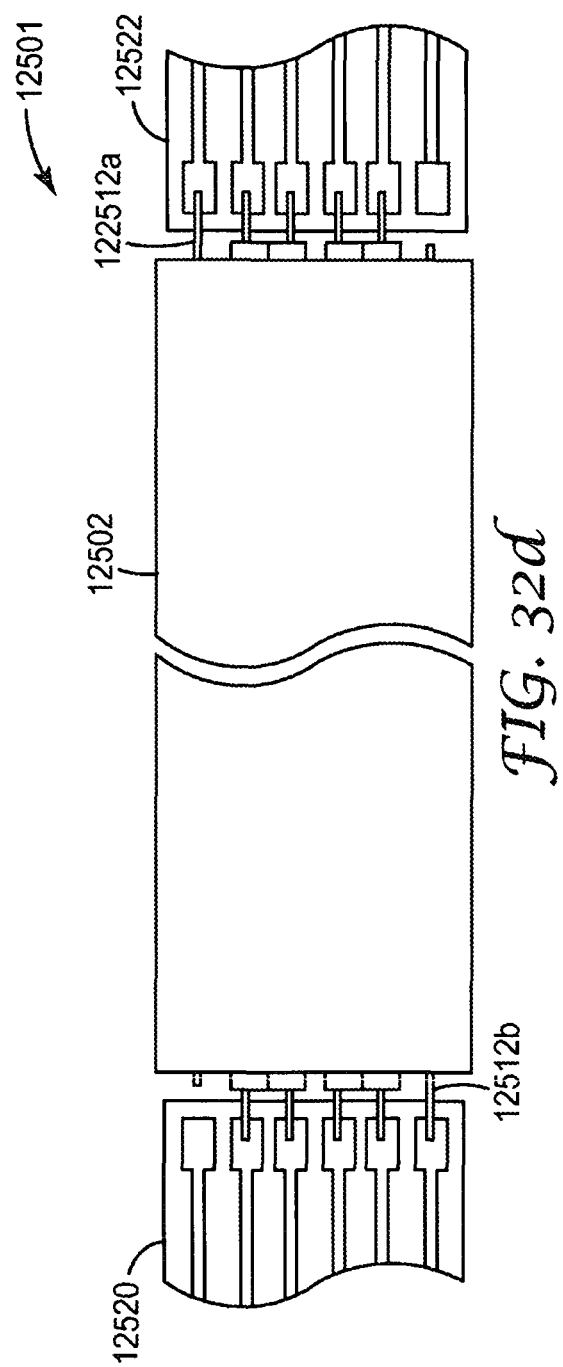
FIG. 32d is a top view of a shielded electrical cable assembly that employs multiple drain wires coupled to each other through a shielding film.

In many of these arrangements, the unique interconnected nature of the drain wires through the shielding film(s), provided of course all of the drain wires at issue are in electrical contact with the shielding film(s), is used to simplify the termination structure and can provide a tighter (narrower) connection pitch. One straightforward embodiment is where a shielded cable that includes high speed conductor sets and multiple drain wires is terminated at both ends to one connector at each end, and fewer than all of the drain wires are terminated at each end, but each drain wire terminated at one end is also terminated at the other end. The drain wires that are not terminated are still maintained at low potential since they are also directly or indirectly tied to ground. In a related embodiment, one of the drain wires may be connected at one end but not connected (either intentionally or in error) at the other end. Again in this situation, the ground structure is maintained as long as one drain wire is connected at each end. In another related embodiment, the drain wire(s) attached at one end are not the same as the drain wire(s) that are attached at the other end. A simple version of this is depicted in FIG. 32d. In that figure, a cable assembly 12501 includes a shielded electrical cable 12502 connected at one end to a termination component 12520 and connected at the other end to a termination component 12522. The cable 12502 may be virtually any shielded cable shown or described herein, so long as it includes a first drain wire 12512a and a second drain wire 12512b that are both electrically connected to at least one shielding film. As shown, the drain wire 12512b connects to component 12520 but not to component 12522, and drain wire 12512a connects to component 12522 but not to component 12520. Since the ground potential (or other controlled potential) is shared among the drain wires 12512a, 12512b and the shielding film of the cable 12502 by virtue of their mutual electrical connections, the same potential is maintained in the structure due to the common grounding. Note that both termination components 12520, 12522 could advantageously be made smaller (narrower) by eliminating the unused conduction path.

A more complex embodiment demonstrating these techniques is shown in FIGS. 32e-32f. In those figures, a shielded cable assembly 12601 has a fan-out configuration. The assembly 12601 includes a shielded electrical ribbon cable 12602 connected at a first end to a termination component 12620, and connected at a second end (which is split into three separate fan-out sections) to termination components 12622, 12624, 12626. As best seen in the cross-sectional view of FIG. 32e, taken along lines 32g-32g of FIG. 32e, the cable 12602 includes three conductor sets of insulated conductors, one coaxial type and two twinax types, and eight drain wires 12612a-h. The eight drain wires are all electrically connected to at least one, and preferably two shielding films in the cable 12602. The coaxial conductor set connects to termination component 12626, one twinax conductor set connects to termination component 12624, and the other twinax conductor set connects to termination component 12622, and all three conductor sets connect to the termination component 12620 at the first end of the cable. All eight of the drain wires may be connected to the termination components at the second end of the cable, i.e., drain wires 12612a, 12612b, and 12612c may be connected to appropriate conductive paths on termination component 12626, and drain wires 12612d and 12612e may be connected to appropriate conductive paths on termination component 12624, and drain wires 12612f and 12612g may be connected to appropriate conductive paths on termination component 12622. Advantageously, however, less than all eight of the drain wires can be connected to the termination component 12620 at the first end of the cable. In the figure, only drain wires 12612a and 12612h are shown as being connected to appropriate conductive paths on the component 12620. By omitting termination connections between the drain wires 12612b-g and termination component 12620, the manufacture of the assembly 12601 is simplified and streamlined. Yet, for example, the drain wires 12612d and 12612e adequately tie the conductive paths to ground potential (or another desired potential) even though neither of them is physically connected to the termination component 12620.

With regard to the parameters n1, n2, m1, and m2 discussed above, the cable assembly 12601 has n1=2, n2=8, m1=1, and m2=3.

Another fan-out shielded cable assembly 12701 is shown in FIGS. 33a-b. The assembly 12701 includes a shielded electrical ribbon cable 12702 connected at a first end to a termination component 12720, and connected at a second end (which is split into three separate fan-out sections) to termination components 12722, 12724, 12726. As best seen in the cross-sectional view of FIG. 33b, taken along lines 33b-33b of FIG. 33a, the cable 12702 includes three conductor sets of insulated conductors, one coaxial type and two twinax types, and eight drain wires 12712a-h. The eight drain wires are all electrically connected to at least one, and preferably two shielding films in the cable 12702. The coaxial conductor set connects to termination component 12726, one twinax conductor set connects to termination component 12724, and the other twinax conductor set connects to termination component 12722, and all three conductor sets connect to the termination component 12720 at the first end of the cable. Six of the drain wires may be connected to the termination components at the second end of the cable, i.e., drain wires 12712b and 12712c may be connected to appropriate conductive paths on termination component 12726, and drain wires 12712d and 12712e may be connected to appropriate conductive paths on termination component 2724, and drain wires 12712f and 12712g may be connected to appropriate conductive paths on termination component 12722. None of those six drain wires are connected to the termination component 12720 on the first end of the cable. At the first end of the cable, the other two drain wires, i.e., drain wires 12712a and 12712h, are connected to appropriate conductive paths on the component 2720. By omitting termination connections between the drain wires 12712b-g and termination component 12720, and between drain wire 12712a and termination component 2726, and between drain wire 12712h and termination component 12722, the manufacture of the assembly 12701 is simplified and streamlined.

With regard to the parameters n1, n2, m1, and m2 discussed above, the cable assembly 12701 has n1=2, n2=6, m1=1, and m2=3.

Many other embodiments are possible, but in general it can be advantageous to utilize the shield of the cable to connect two separate ground connections (conductors) together to ensure that the grounding is complete and at least one ground is connected to each termination location at each end of the cable, and more than two for a fanout cable. This means that each drain wire does not need to be connected to each termination point. If more than one drain wire is connected at any end, then the connection is made redundant and less prone to failure.

We now provide further details regarding shielded ribbon cables that can employ mixed conductor sets, e.g., a conductor set adapted for high speed data transmission and another conductor set adapted for power transmission or low speed data transmission. Conductor sets adapted for power transmission or low speed data transmission can be referred to as a sideband.

Some interconnections and defined standards for high speed signal transmission allow for both high speed signal transmission (provided e.g. by twinax or coax wire arrangements) and low speed or power conductors, both of which require insulation on the conductors. An example of this is the SAS standard which defines high speed pairs and "sidebands" included in its mini-SAS 4i interconnection scheme. While the SAS standard indicates sideband usage is outside its scope and vendor-specific, a common sideband use is a SGPIO (Serial General Purpose Input Output) bus, as described in industry specification SFF-8485. SGPIO has a clock rate of only 100 kHz, and does not require high performance shielded wire.

This section therefore focuses on aspects of cables that are tailored to transmit both high speed signals and low speed signals (or power transmission), including cable configuration, termination to a linear contact array, and the termination component (e.g. paddle card) configuration. In general, the shielded electronic ribbon-like cables discussed elsewhere herein can be used with slight modification. Specifically, the disclosed shielded cables can be modified to include insulated wires in the construction that are suitable for low speed signal transmission but not high speed signal transmission, in addition to the conductor sets that are adapted for high speed data transmission, and the drain/ground wires that may also be included. The shielded cable may thus include at least two sets of insulated wires that carry signals whose data rates are significantly different. Of course, in the case of a power conductor, the line does not have a data rate. We also disclose termination components for the combination high speed/low speed shielded cables in which conductive paths for the low speed conductors are re-routed between opposite ends of the termination component, e.g., between the termination end and a connector mating end.

Stated differently, a shielded electrical cable may include a plurality of conductor sets and a first shielding film. The plurality of conductor sets may extend along a length of the cable and be spaced apart from each other along a width of the cable, each conductor set including one or more insulated conductors. The first shielding film may include cover portions and pinched portions arranged such that the cover portions cover the conductor sets and the pinched portions are disposed at pinched portions of the cable on each side of each conductor set. The plurality of conductor sets may include one or more first conductor sets adapted for high speed data transmission and one or more second conductor sets adapted for power transmission or low speed data transmission.

The electrical cable may also include a second shielding film disposed on an opposite side of the cable from the first shielding film. The cable may include a first drain wire in electrical contact with the first shielding film and also extending along the length of the cable. The one or more first conductor sets may include a first conductor set comprising a plurality of first insulated conductors having a center-to-center spacing of σ1, and the one or more second conductor sets may include a second conductor set comprising a plurality of second insulated conductors having, a center-to-center spacing of σ2, and σ1 may be greater than σ2. The insulated conductors of the one or more first conductor sets may all be arranged in a single plane when the cable is laid flat. Furthermore, the one or more second conductor sets may include a second conductor set having a plurality of the insulated conductors in a stacked arrangement when the cable is laid flat. The one or more first conductor sets may be adapted for maximum data transmission rates of at least 1 Gbps (i.e., about 0.5 GHz), up to e.g. 25 Gbps (about 12.5 GHz) or more, or for a maximum signal frequency of at least 1 GHz, for example, and the one or more second conductor sets may be adapted for maximum data transmission rates that are less than 1 Gbps (about 0.5 GHz), or less than 0.5 Gbps (about 250 MHz), for example, or for a maximum signal frequency of less than 1 GHz or 0.5 GHz, for example. The one or more first may be adapted for maximum data transmission rates of at least 3 Gbps (about 1.5 GHz).

Such an electrical cable may be combined with a first termination component disposed at a first end of the cable. The first termination component may include a substrate and a plurality of conductive paths thereon, the plurality of conductive paths having respective first termination pads arranged on a first end of the first termination component. The shielded conductors of the first and second conductor sets may connect to respective ones of the first termination pads at the first end of the first termination component in an ordered arrangement that matches an arrangement of the shielded conductors in the cable. The plurality of conductive paths may have respective second termination pads arranged on a second end of the first termination component that are in a different arrangement than that of the first termination pads on the first end.

The conductor set(s) adapted for power transmission and/or lower speed data transmission may include groups of, or individual, insulated conductors that do not necessarily need to be shielded from one another, do not necessarily require associated ground or drain wires, and may not need to have a specified impedance. The benefit of incorporating them together in a cable having high speed signal pairs is that they can be aligned and terminated in one step. This differs from conventional cables, which require handling several wire groups without the automatic alignment to a paddle card, for example. The simultaneous stripping and termination process (to a linear array on a single paddle card or linear array of contacts) for both the low speed signals and the high speed signals is particularly advantageous, as is the mixed signal wire cable itself.

FIGS. 33c-f are front cross-sectional views of exemplary shielded electrical cables 12802a, 12802b, 12802c, and 12802d that can incorporate the mixed signal wire feature. Each of the embodiments preferably include two opposed shielding films as discussed elsewhere herein, with suitable cover portions and pinched portions, and some shielded conductors grouped into conductor sets adapted for high speed data transmission (see conductor sets 12804a), and some shielded conductors grouped into conductor sets adapted for low speed data transmission or power transmission (see conductor sets 12804b, 12804c). Each embodiment also preferably includes one or more drain wires 12812. The high speed conductor sets 12804a are shown as twinax pairs, but other configurations are also possible as discussed elsewhere herein. The lower speed insulated conductors are shown as being smaller (having a smaller diameter or transverse dimension) than the high speed insulated conductors, since the former conductors may not need to have a controlled impedance. In alternative embodiments it may be necessary or advantageous to have a larger insulation thickness around the low speed conductors compared to the high speed conductors in the same cable. However, since space is often at a premium, it is usually desirable to make the insulation thickness as small as possible. Note also that wire gauge and plating may be different for the low speed lines compared to the high speed lines in a given cable. In FIGS. 33c-f, the high speed and low speed insulated conductors are all arranged in a single plane. In such configurations, it can be advantageous to group multiple low speed insulated conductors together in a single set, as in conductor set 12804b, to maintain as small a cable width as possible.

When grouping the low speed insulated conductors into sets, the conductors need not be disposed in exactly the same geometrical plane in order for the cable to retain a generally planar configuration. Shielded cable 12902 of FIG. 33g, for example, utilizes low speed insulated conductors stacked together in a compact space to form conductor set 12904b, the cable 12902 also including high speed conductor sets 12904a and 12904c. Stacking the low speed insulated conductors in this manner helps provide a compact and narrow cable width, but may not provide the advantage of having the conductors lined up in an orderly linear fashion (for mating with a linear array of contacts on a termination component) after mass termination. The cable 12902 also includes opposed shielding films 12908 and drain wires 12912, as shown. In alternative embodiments involving different numbers of low speed insulated conductors, stacking arrangements for the low speed insulated conductors such as shown in sets 12904d-h of FIG. 33h may also be used.

Another aspect of mixed signal wire shielded cable relates to termination components used with the cables. In particular, conductor paths on a substrate of the termination component can be configured to re-route low speed signals from one arrangement on one end of the termination component (e.g. a termination end of the cable) to a different arrangement on an opposite end of the component (e.g. a mating end for a connector). The different arrangement may for example comprise a different order of contacts or of conductor paths on one end relative to another end of the termination component. The arrangement on the termination end of the component may be tailored to match the order or arrangement of conductors in the cable, while the arrangement on an opposite end of the component may be tailored to match a circuit board or connector arrangement different from that of the cable.

The re-routing may be accomplished by utilizing any suitable technique, including in exemplary embodiments using one or more vias in combination with a multi-layer circuit board construction to transition a given conductive path from a first layer to at least a second layer in the printed circuit board, and then optionally transitioning back to the first layer. Some examples are shown in the top views of FIGS. 34a and 34b.

Figure 34A:
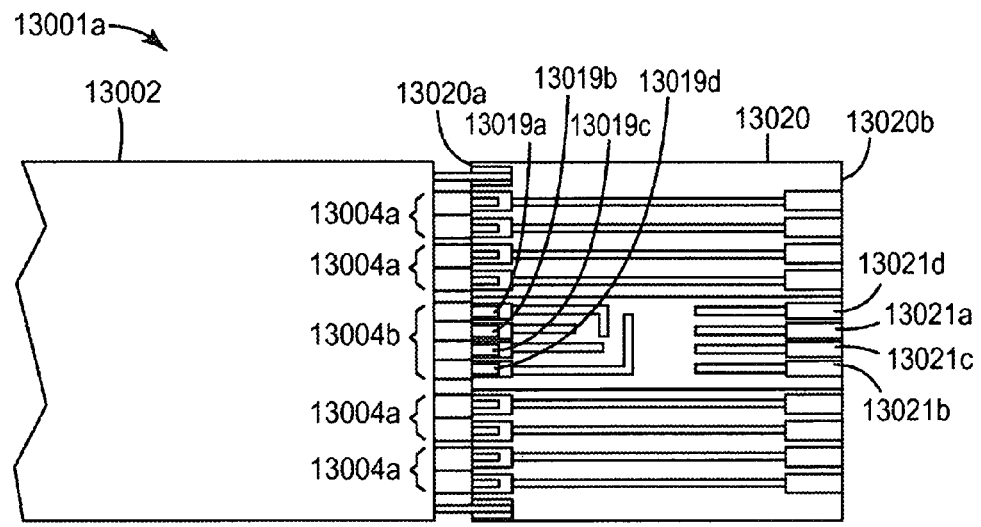
FIGS. 34a, 34b, and 34c are schematic top views of shielded cable assemblies in which a termination component of the assembly includes one or more conduction path that re-routes one or more low speed signal lines from one end of the termination component to the other.

In FIG. 34a, a cable assembly 13001a includes a shielded electrical cable 13002 connected to a termination component 13020 such as a paddle card or circuit board, having a substrate and conductive paths (including e.g. contact pads) formed thereon. The cable 13002 includes conductor sets 13004a, e.g. in the form of twinax pairs, adapted for high speed data communication. The cable 13002 also includes a sideband comprising a conductor set 13004b adapted for low speed data and/or power transmission, the conductor set 13004b having four insulated conductors in this embodiment. After the cable 13002 has been mass terminated, the conductors of the various conductor sets have conductor ends that are connected (e.g. by soldering) to respective ends (e.g. contact pads) of the conductive paths on the termination component 13020, at a first end 31020a of the component. The contact pads or other ends of the conductive paths corresponding to the sideband of the cable are labeled 13019a, 13019b, 13019c, 13019d, and they are arranged in that order from top to bottom of the termination component 13020 (although other contact pads, associated with high speed conductors, are present above and below the sideband contact pads on the first end 13020a). The conductive paths for the sideband contact pads 13019a-d, which are shown only schematically in the figure, utilize vias and/or other patterned layers of the component 13020 as needed to connect contact pad 13019a to contact pad 13021a on the second end 13020b of the component, and to connect contact pad 13019b to contact pad 13021b on the second end 13020b of the component, and to connect contact pad 13019c to contact pad 13021c on the second end 13020b of the component, and to connect contact pad 13019d to contact pad 13021d on the second end 13020b of the component. In this way, conductor paths on the termination component are configured to re-route low speed signals from conductor set 13004b from one arrangement (a-b-c-d) on one end 13020a of the termination component to a different arrangement (d-a-c-b) on the opposite end 13020b of the component.

Figure 34B:
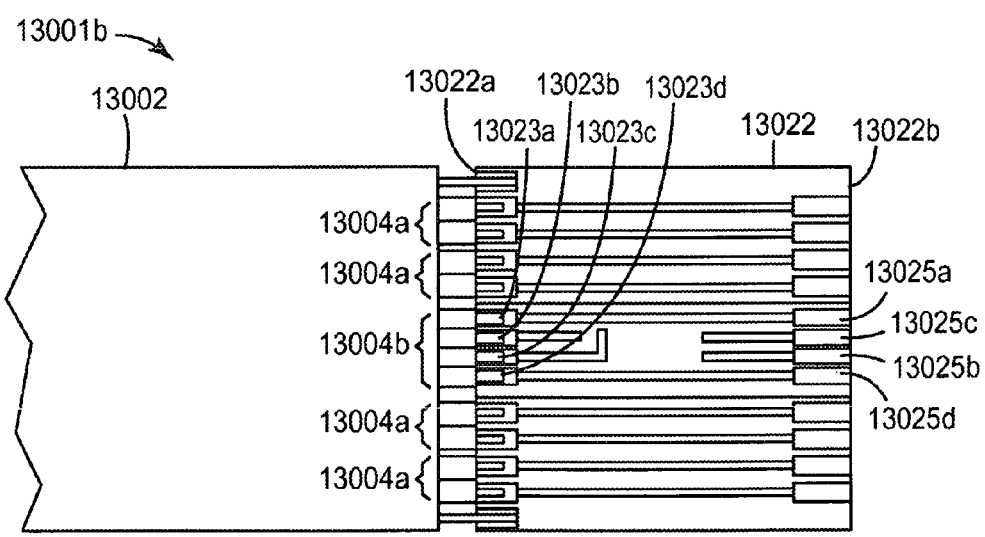

FIG. 34b shows a top view of an alternative cable assembly 13001b, and similar reference numerals are used to identify the same or similar parts. In FIG. 34b, the cable 13002 is mass terminated and connected to a termination component 13022 which is similar in design to termination component 13020 of FIG. 34a. Like component 13020, component 13022 includes contact pads or other ends of conductive paths corresponding to the sideband of the cable 13002, the contact pads being labeled 13023a, 13023b, 13023c, 13023d, and they are arranged in that order from top to bottom of the termination component 13022 (although other contact pads, associated with high speed conductors of the cable, are present above and below the sideband contact pads on the first end 13022a of the component 13022). The conductive paths for the sideband contact pads 13023a-d are again shown only schematically in the figure. They utilize vias and/or other patterned layers of the component 13022 as needed to connect contact pad 13023a to contact pad 13025a on the second end 13022b of the component, and to connect contact pad 13023b to contact pad 13025b on the second end 13022b of the component, and to connect contact pad 13023c to contact pad 13025c on the second end 13022b of the component, and to connect contact pad 13023d to contact pad 13025d on the second end 13022b of the component. In this way, conductor paths on the termination component are configured to re-route low speed signals from conductor set 3004b from one arrangement (a-b-c-d) on one end 13022a of the termination component to a different arrangement (a-c-b-d) on the opposite end 13022b of the component.

Figure 34C:
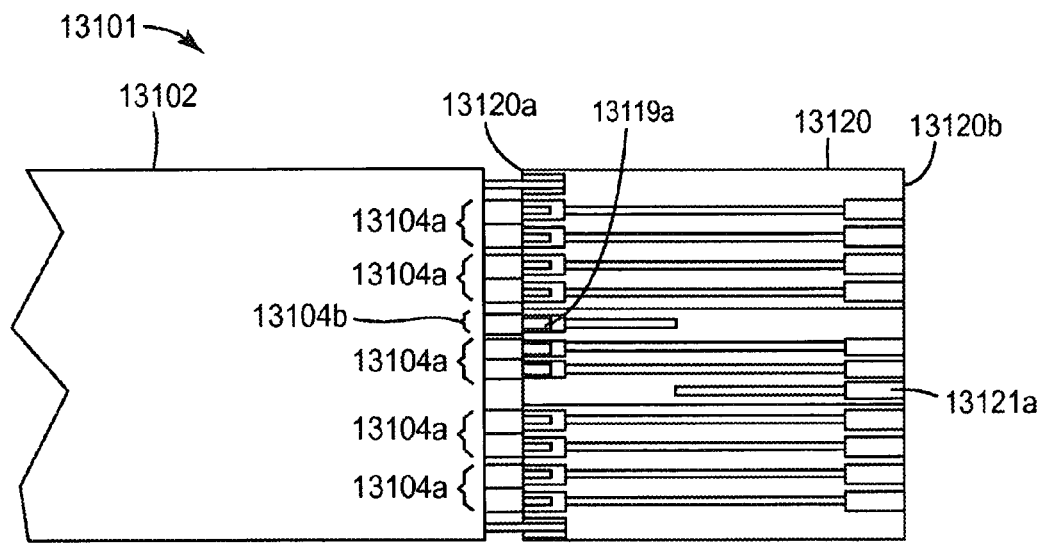

The cable assemblies of FIGS. 34a and 34b are similar to each other insofar as, in both cases, the termination component physically re-routes conductive paths for low speed signals across other conductive paths for other low speed signals, but not across any conductive paths for high speed signals. In this regard, it is usually not desirable to route low speed signals across a high speed signal path in order to maintain a high quality high speed signal. In some circumstances, however, with proper shielding (e.g. a many layer circuit board and adequate shielding layers), this may be accomplished with limited signal degradation in the high speed signal path as shown in FIG. 34c. There, a shielded electrical cable 13102, which has been mass terminated, connects to a termination component 13120. The cable 13102 includes conductor sets 13104a, e.g. in the form of twinax pairs, adapted for high speed data communication. The cable 13102 also includes a sideband comprising a conductor set 13104b adapted for low speed data and/or power transmission, the conductor set 13004b having one insulated conductor in this embodiment. After the cable 13102 has been mass terminated, the conductors of the various conductor sets have conductor ends that are connected (e.g. by soldering) to respective ends (e.g. contact pads) of the conductive paths on the termination component 13120, at a first end 13120a of the component. The contact pad or other end of the conductive path corresponding to the sideband of the cable is labeled 13119a, and it is arranged immediately above (from the perspective of FIG. 34c) contact pads for the middle one of the conductor sets 13104a. The conductive path for the sideband contact pad 13119a, which is shown only schematically in the figure, utilizes vias and/or other patterned layers of the component 13120 as needed to connect contact pad 13119a to contact pad 13121a on the second end 13120b of the component. In this way, conductor paths on the termination component are configured to re-route a low speed signal from conductor set 13104b from one arrangement (immediately above the middle one of conductor sets 13104a) on one end 13120a of the termination component to a different arrangement (immediately below the contact pads for the middle one of conductor sets 13104a) on the opposite end 13120b of the component.

Figure 33C:
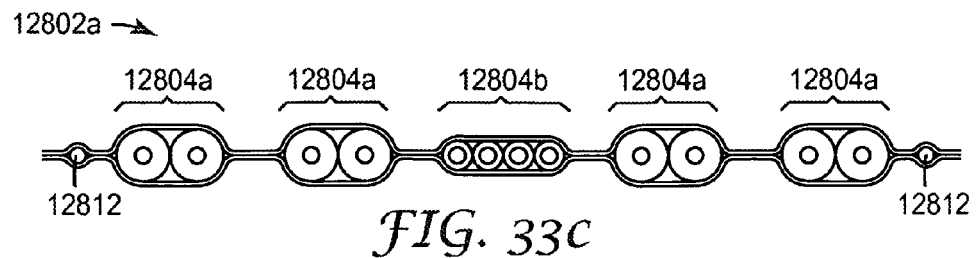
FIGS. 33c-f are schematic front cross-sectional views of shielded electrical cables having mixed conductor sets.
Figure 33D:
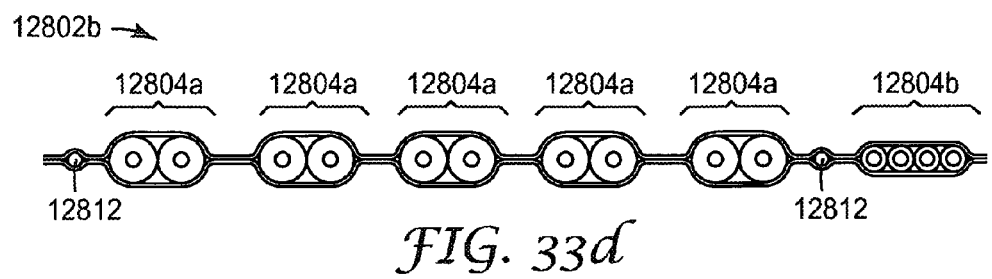
Figure 33E:
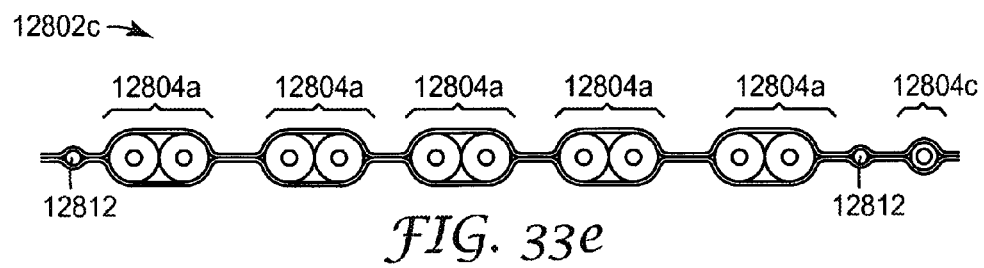
Figure 33F:
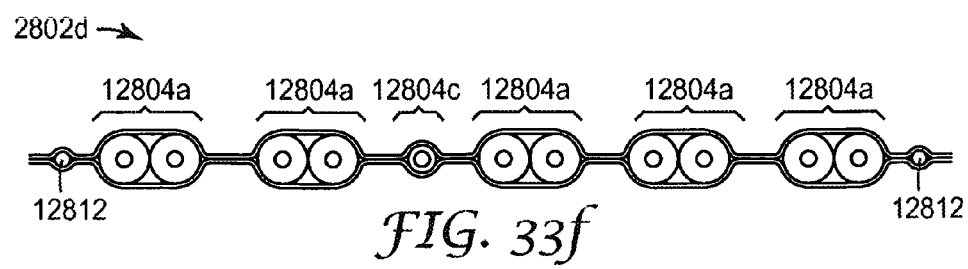
Figure 33G:
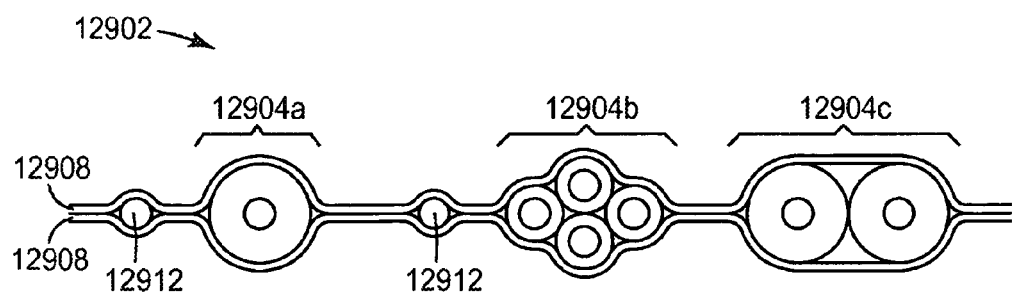
FIG. 33g is a schematic front cross-sectional view of another shielded electrical cable having mixed conductor sets, and FIG. 33h schematically depicts groups of low speed insulated conductor sets useable in a mixed conductor set shielded cable.
Figure 33H:
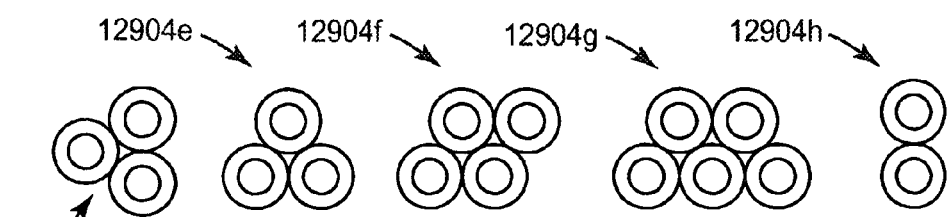
Figure 34D:
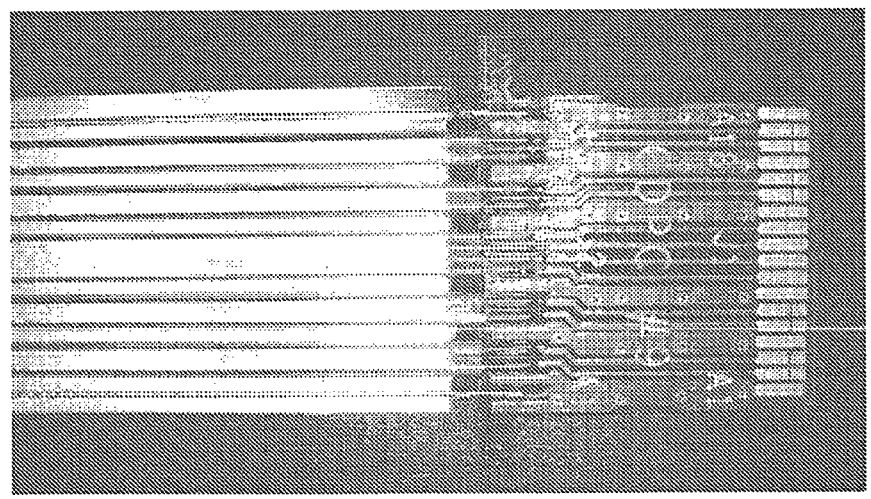
FIG. 34d is a photograph of a mixed conductor set shielded cable assembly that was fabricated.

A mixed signal wire shielded electrical cable having the general design of cable 12802a in FIG. 33c was fabricated. As shown in FIG. 33c, the cable included four high speed twinax conductor sets and one low speed conductor set disposed in the middle of the cable. The cable was made using 30 gauge (AWG) silver-plated wires for the high speed signal wires in the twinax conductor sets, and 30 gauge (AWG) tin-plated wires for the low speed signal wire in the low speed conductor set. The outside diameter (OD) of the insulation used for the high speed wires was about 0.028 inches, and the OD of the insulation used for the low speed wires was about 0.022 inches. A drain wire was also included along each edge of the cable as shown in FIG. 33c. The cable was mass stripped, and individual wire ends were soldered to corresponding contacts on a mini-SAS compatible paddle card. In this embodiment, all conductive paths on the paddle card were routed from the cable end of the paddle card to the opposite (connector) end without crossing each other, such that the contact pad configuration was the same on both ends of the paddle card. A photograph of the resulting terminated cable assembly is shown in FIG. 34d.

In reference now to FIGS. 35a and 35b, respective perspective and cross sectional views shows a cable construction according to an example embodiment of the invention. Generally, an electrical ribbon cable 20102 includes one or more conductor sets 20104. Each conductor set 20104 includes two or more conductors (e.g., wires) 20106 extending from end-to-end along the length of the cable 20102. Each of the conductors 20106 is encompassed by a first dielectric 20108 along the length of the cable. The conductors 20106 are affixed to first and second films 20110, 20112 that extend from end-to-end of the cable 20102 and are disposed on opposite sides of the cable 20102. A consistent spacing 20114 is maintained between the first dielectrics 20108 of the conductors 106 of each conductor set 20104 along the length of the cable 20102. A second dielectric 20116 is disposed within the spacing 20114. The dielectric 20116 may include an air gap/void and/or some other material.

The spacing 20114 between members of the conductor sets 20104 can be made consistent enough such that the cable 20102 has equal or better electrical characteristics than a standard wrapped twinax cable, along with improved ease of termination and signal integrity of the termination. The films 20110, 20112 may include shielding material such as metallic foil, and the films 20110, 20112 may be conformably shaped to substantially surround the conductor sets 20104. In the illustrated example, films 20110, 20112 are pinched together to form flat portions 20118 extending lengthwise along the cable 20102 outside of and/or between conductor sets 20104. In the flat portions 29118, the films 20110, 20112 substantially surround the conductor sets 20104, e.g., surround a perimeter of the conductor sets 20104 except where a small layer (e.g., of insulators and/or adhesives) the films 20110, 20112 join each other. For example, cover portions of the shielding films may collectively encompass at least 75%, or at least 80%, or at least 85%, or at least 90%, of the perimeter of any given conductor set. While the films 20110, 20112 may be shown here (and elsewhere herein) as separate pieces of film; those of skill in the art will appreciate that the films 20110, 20112 may alternatively be formed from a single sheet of film, e.g., folded around a longitudinal path/line to encompass the conductor sets 20104.

The cable 20102 may also include additional features, such as one or more drain wires 20120. The drain wires 20120 may be electrically coupled to shielded films 20110, 20112 continually or at discrete locations along the length of the cable 20102. Generally the drain wire 20102 provides convenient access at one or both ends of the cable for electrically terminating (e.g., grounding) the shielding material. The drain wire 20120 may also be configured to provide some level of DC coupling between the films 20110, 20112, e.g., where both films 20110, 20112 include shielding material.

Figure 35E:
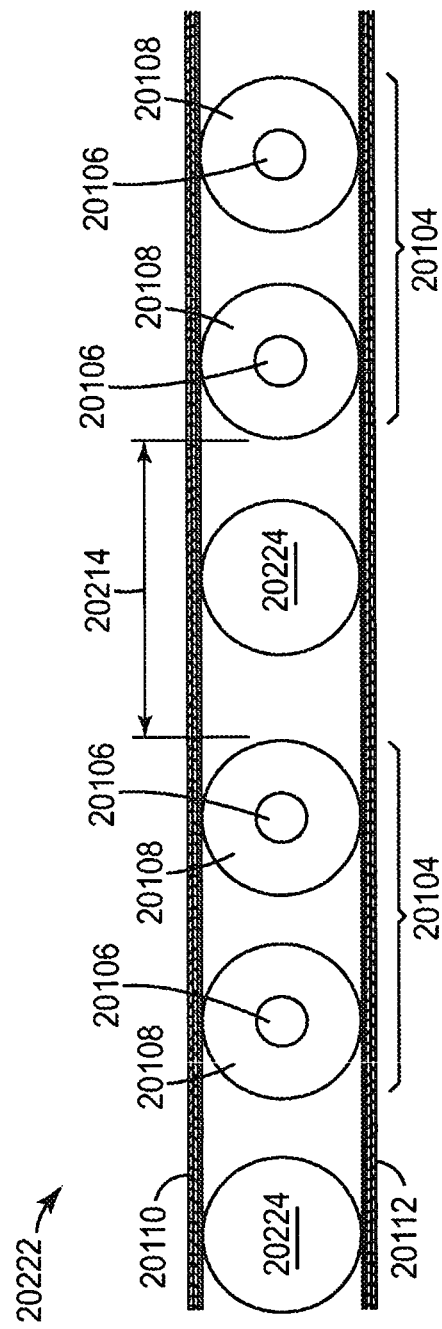

In reference now to FIGS. 35*a-e*, cross-section diagrams illustrate various alternate cable construction arrangements, wherein the same reference numbers may be used to indicate analogous components as in other figures. In FIG. 35*c*, cable 20202 may be of a similar construction as shown in FIGS. 35*a-b*, however only one film 20110 is conformably shaped around the conductor sets to form pinched/flat portions 20204. The other film 20112 is substantially planar on one side of the cable 20202. This cable 20202 (as well as cables 20212 and 20222 in FIGS. 35*d-e*) uses air in the gaps 20114 as a second dielectric between first dielectrics 20108, therefore there is no explicit second dielectric material 20116 shown between closest points of proximity of the first dielectrics 20108. Further, a drain wire is not shown in these alternate arrangements, but can be adapted to include drain wires as discussed elsewhere herein.

In FIGS. 35*d* and 35*e*, cable arrangements 20212 and 20222 may be of a similar construction as those previously described, but here both films are configured to be substantially planar along the outer surfaces of the cables 20212, 20222. In cable 20212, there are voids/gaps 20214 between conductor sets 20104. As shown here, these gaps 20214 are larger than gaps 114 between members of the sets 20104, although this cable configuration need not be so limited. In addition to this gap 20214, cable 20222 of FIG. 35*e* includes supports/spacers 20224 disposed in the gap 20214 between conductor sets 20104 and or outside of the conductor sets 20104 (e.g., between a conductor set 20104 and a longitudinal edge of the cable).

The supports 20224 may be fixably attached (e.g., bonded) to films 20110, 20112 and assist in providing structural stiffness and/or adjusting electrical properties of the cable 20222. The supports 20224 may include any combination of dielectric, insulating, and/or shielding materials for tuning the mechanical and electrical properties of the cable 20222 as desired. The supports 20224 are shown here as circular in cross-section, but be configured as having alternate cross sectional shapes such as ovular and rectangular. The supports 20224 may be formed separately and laid up with the conductor sets 104 during cable construction. In other variations, the supports 20224 may be formed as part of the films 110, 112 and/or be assembled with the cable 20222 in a liquid form (e.g., hot melt).

The cable constructions 20102, 20202, 20212, 20222 described above may include other features not illustrated. For example, in addition to signal wires, drain wires, and ground wires, the cable may include one or more additional isolated wires sometime referred to as sideband. Sideband can be used to transmit power or any other signals of interest. Sideband wires (as well as drain wires) may be enclosed within the films 110, 20112 and/or may be disposed outside the films 20110, 20112, e.g., being sandwiched between the films and an additional layer of material.

The variations described above may utilize various combinations of materials and physical configurations based on the desired cost, signal integrity, and mechanical properties of the resulting cable. One consideration is the choice of the second dielectric material 20116 positioned in the gap 20114 between conductor sets 20104. This second dielectric may be particular of interest in cases where the conductor sets include a differential pair, are one ground and one signal, and/or are carrying two interfering signals. For example, use of an air gap 20114 as a second dielectric may result in a low dielectric constant and low loss. Use of an air gap 20114 may also have other advantages, such as low cost, low weight, and increased cable flexibility. However, precision processing may be required to ensure consistent spacing of the conductors that form the air gaps 20114 along a length of the cable.

Figure 35F:
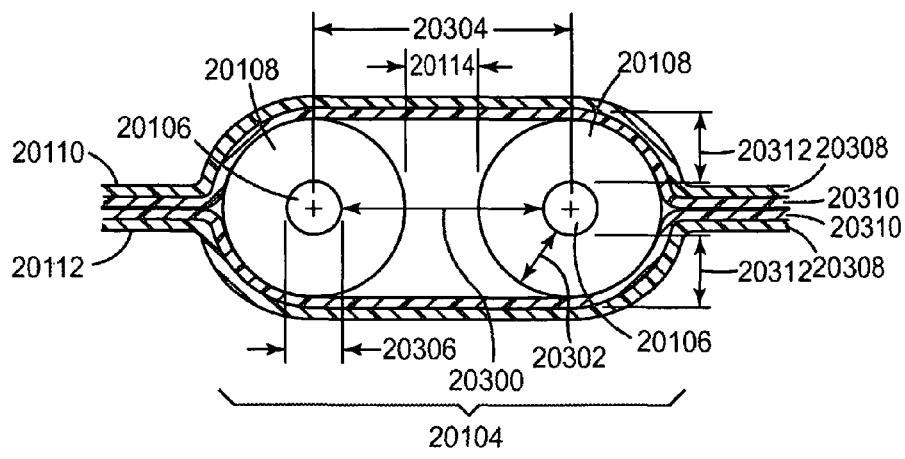
FIG. 35f is a cross section of a portion of an example cable showing dimensions of interest.

In reference now to FIG. 35*f*, a cross sectional view of a conductor set 104 identifies parameters of interest in maintaining a consistent dielectric constant between conductors 20106. Generally, the dielectric constant of the conductor set 20104 may be sensitive to the dielectric materials between the closest points of proximity between the conductors of the set 20104, as represented here by dimension 20300. Therefore, a consistent dielectric constant may be maintained by maintaining a consistent thicknesses 20302 of the dielectric 20108 and consistent size of gap 20114 (which may be an air gap or filled with another dielectric material such as dielectric 20116 shown in FIG. 35*a*).

It may be desirable to tightly control geometry of coatings of both the conductor 20106 and the conductive film 20110, 20112 in order to ensure consistent electrical properties along the length of the cable. For the wire coating, this may involve coating the conductor 20106 (e.g., solid wire) precisely with uniform thickness of insulator/dielectric material 20108 and ensuring the conductor 20106 is well-centered within the coating 20108. The thickness of the coating 20108 can be increased or decreased depending on the particular properties desired for the cable. In some situations, a conductor with no coating may offer optimal properties (e.g., dielectric constant, easier termination and geometry control), but for some applications industry standards require that a primary insulation of a minimum thickness is used. The coating 20108 may also be beneficial because it may be able to bond to the dielectric substrate material 20110, 20112 better than bare wire. Regardless, the various embodiments described above may also include a construction with no insulation thickness.

The dielectric 20108 may be formed/coated over the conductors 20106 using a different process/machinery than used to assemble the cable. As a result, during final cable assembly, tight control over variation in the size of the gap 20114 (e.g., the closest point of proximity between the dielectrics 20108) may be of primary concern to ensure maintaining constant dielectric constant. Depending on the assembly process and apparatus used, a similar result may be had by controlling a centerline distance 304 between the conductors 20106 (e.g., pitch). The consistency of this may depend on how tightly the outer diameter dimension 20306 of the conductors 106 can be maintained, as well as consistency of dielectric thickness 20302 all around (e.g., concentricity of conductor 20106 within dielectric 20108). However, because dielectric effects are strongest at the area of closest proximity of the conductors 20106, if thickness 20302 can be controlled at least near the area of closest proximity of adjacent dielectrics 20108, then consistent results may be obtained during final assembly by focusing on controlling the gap size 20114.

The signal integrity (e.g., impedance and skew) of the construction may not only depend on the precision/consistency of placing the signal conductors 20106 relative to each other, but also in precision of placing the conductors 106 relative to a ground plane. As shown in FIG. 35*f*, films 20110 and 20112 include respective shielding and dielectric layers 20308, 20310. The shielding layer 20308 may act as a ground plane in this case, and so tight control of dimension 20312 along the length of the cable may be advantageous. In this example, dimension 20312 is shown being the same relative to both the top and bottom films 20110, 20112, although it is possible for these distances to be asymmetric in some arrangements (e.g., use of different dielectric 20310 thicknesses/constants of films 20110, 20112, or one of the films 20110, 20112 does not have the dielectric layer 20310).

Figure 35G:
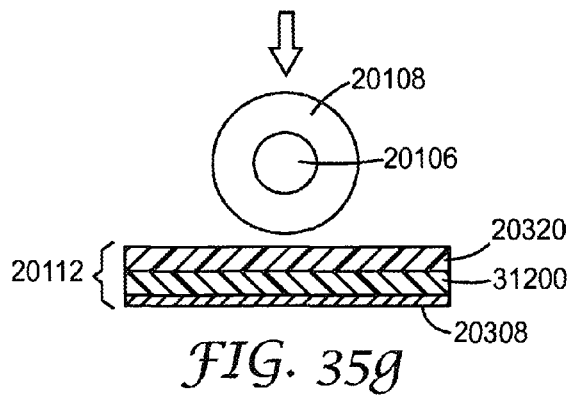
FIGS. 35g and 35h are block diagrams illustrating steps of an example manufacturing procedure.

One challenge in manufacturing a cable as shown in FIG. 35*f* may be to tightly control distance 20312 (and/or equivalent conductor to ground plane distances) when the insulated conductors 20106, 20108 are attached to the conductive film 20110, 20112. In reference now to FIGS. 35*g-h*, block diagrams illustrate an example of how consistent conductor to ground plane distances may be maintained during manufacture according to an embodiment of the invention. In this example a film (which by way of example is designated as film 20112) includes a shielding layer 20308 and dielectric layer 20310 as previously described.

Figure 35H:
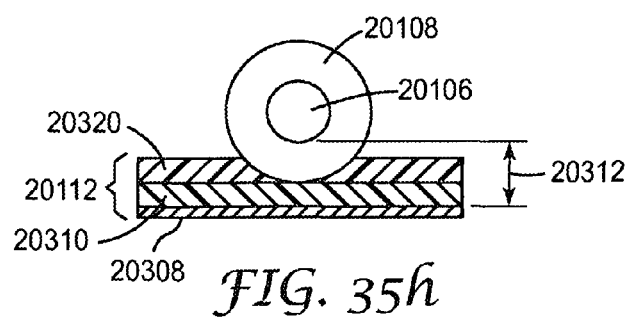

To help ensure a consistent conductor to ground plane distance (e.g., distance 20312 seen in FIG. 35*h*) the film 20112 uses a multilayer coated film as the base (e.g., layers 20308 and 20310). A known and controlled thickness of deformable material 20320 (e.g., a hot melt adhesive), is placed on the less deformable film base 20308, 20310. As the insulated wire 20106, 20108 is pressed into the surface, the deformable material 20320 deforms until the wire 20106, 20108 presses down to a depth controlled by the thickness of deformable material 20320, as seen in FIG. 35*h*. An example of materials 20320, 20310, 20308 may include a hot melt 20320 placed on a polyester backing 20308 or 20310, where the other of layers 20308, 20310 includes a shielding material. Alternatively, or in addition to this, tool features can press the insulated wire 20106, 20108 into the film 20112 at a controlled depth.

In some embodiments described above, an air gap 20114 exists between the insulated conductors 20106, 20108 at the mid-plane of the conductors. This may be useful in many end applications, include between differential pair lines, between ground and signal lines (GS) and/or between victim and aggressor signal lines. An air gap 20114 between ground and, signal conductors may exhibit similar benefits as described for the differential lines, e.g., thinner construction and lower dielectric constant. For two wires of a differential pair, the air gap 20114 can separate the wires, which provides less coupling and therefore a thinner construction than if the gap were not present (providing more flexibility, lower cost, and less crosstalk). Also, because of the high fields that exist between the differential pair conductors at this closest line of approach between them, the lower capacitance in this location contributes to the effective dielectric constant of the construction.

Figure 36A:
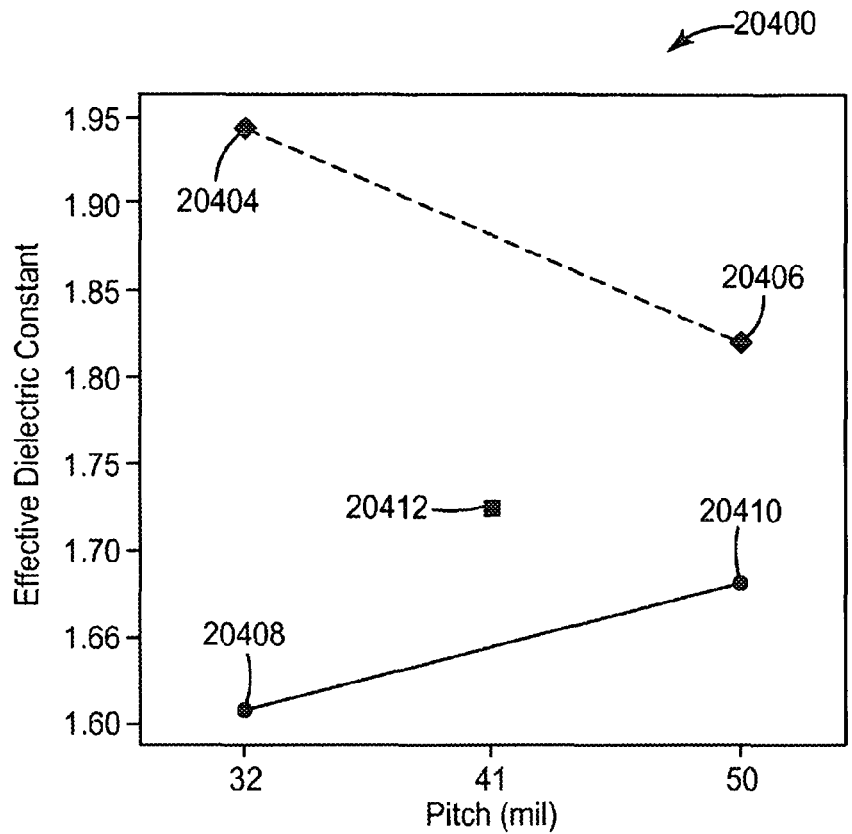
FIG. 36a is a graph illustrating results of analysis of example cable constructions.
Figure 36B:
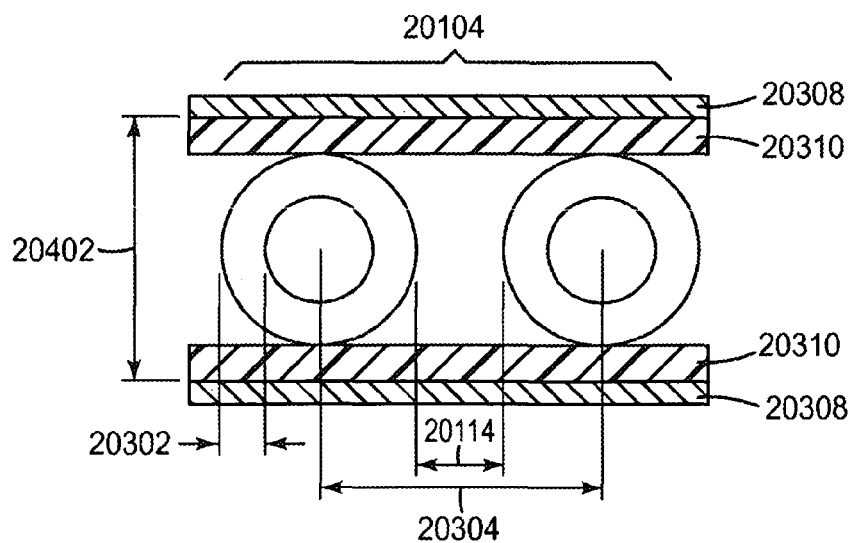

In reference now to FIG. 36*a*, a graph 20400 illustrates an analysis of constructions according to an embodiment of the invention. In FIG. 36*b*, a block diagram includes geometric features of a conductor set according to an example of the invention which will be referred to in discussing FIG. 36*a*. Generally, the graph 20400 illustrates differing dielectric constants obtained for different cable pitch 20304, insulation/dielectric thickness 20302, and cable thickness 20402 (the latter which may exclude thickness of out shielding layer 20308). This analysis assumes a 26 AWG differential pair conductor set 20104, 100 ohms impedance, and solid polyolefin used for insulator/dielectric 20108 and dielectric layers 20310. Points 20404 and 20406 are results for 8 mil thick insulation at respective 56 and 40 mil thicknesses 20302. Points 20408 and 20410 are results for 1 mil thick insulation at respective 48 and 38 mil thicknesses 20302. Point 20412 is a result for 4.5 mil thick insulation at a 42 mil thickness 20302.

As seen in the graph 20400, thinner insulation around wire tends to lower the effective dielectric constant. If the insulation is very thin, a tighter pitch may then tend to reduce the dielectric constant because of the high fields between the wires. If the insulation is thick, however, the greater pitch provides more air around the wires and lowers the effective dielectric constant. For two signal lines that can interfere with one another, the air gap is an effective feature for limiting the capacitive crosstalk between them. If the air gap is sufficient, a ground wire may not be needed between signal lines, which would result in cost savings.

The dielectric loss and dielectric constant seen in graph 20400 may be reduced by the incorporation of air gaps between the insulated conductors. The graph 400 reveals that the reduction due to these gaps is on the same order (e.g., 1.6-1.8 for polyolefin materials) as can be achieved a conventional construction that uses a foamed insulation around the wires. Foamed primary insulation 20108 can also be used in conjunction with the constructions described herein to provide an even lower dielectric constant and lower dielectric loss. Also, the backing dielectric 20310 can be partially or fully foamed.

A potential benefit of using the engineered air gap 20114 instead of foaming is that foaming can be inconsistent along the conductor 20106 or between different conductors 20106 leading to variations in the dielectric constant and propagation delay which increases skew and impedance variation. With solid insulation 20108 and precise gaps 20114, the effective dielectric constant may be more readily controlled and, in turn, leading to consistency in electrical performance, including impedance, skew, attenuation loss, insertion loss, etc.

Figure 36C:
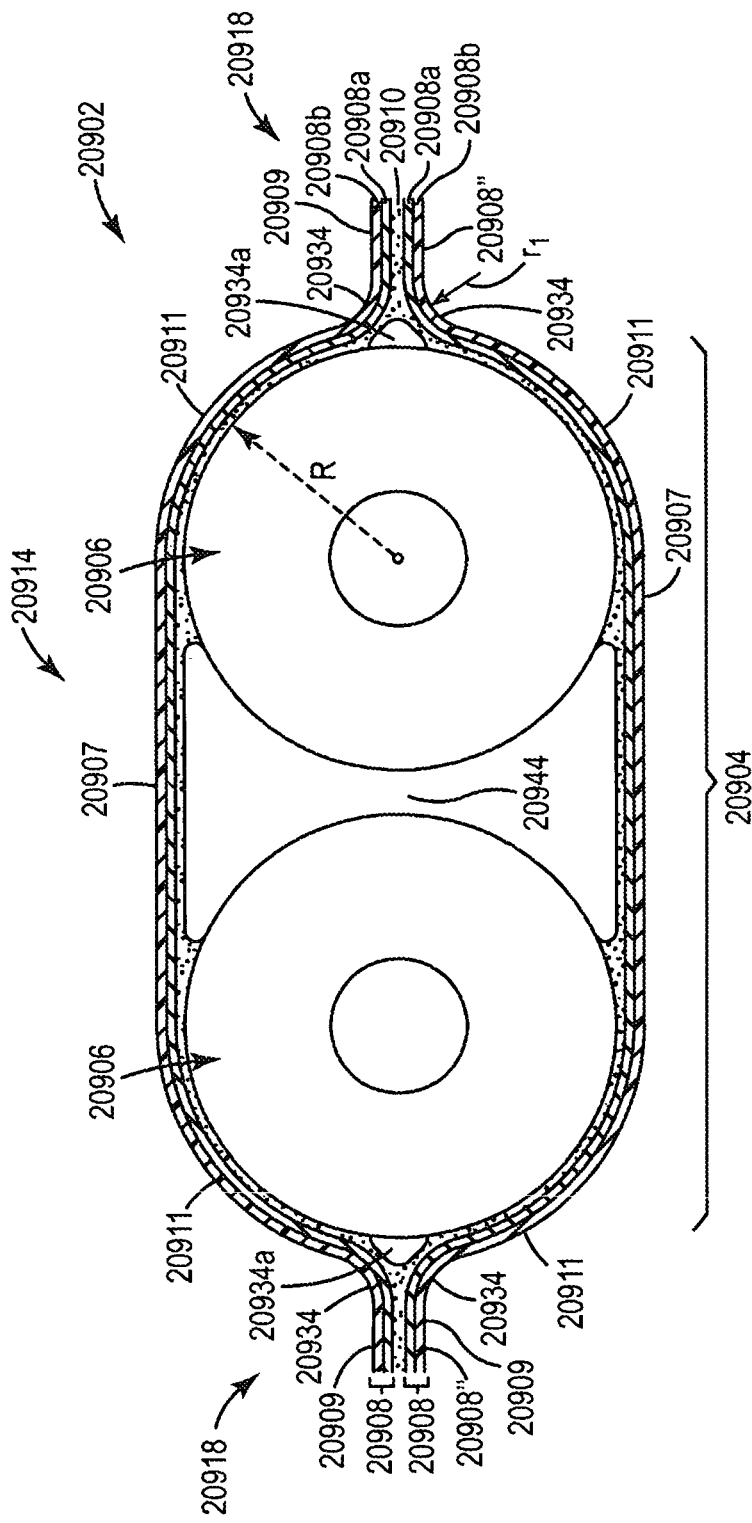
FIG. 36c is a front cross-sectional view of a portion of another exemplary shielded electrical cable.
Figure 36D:
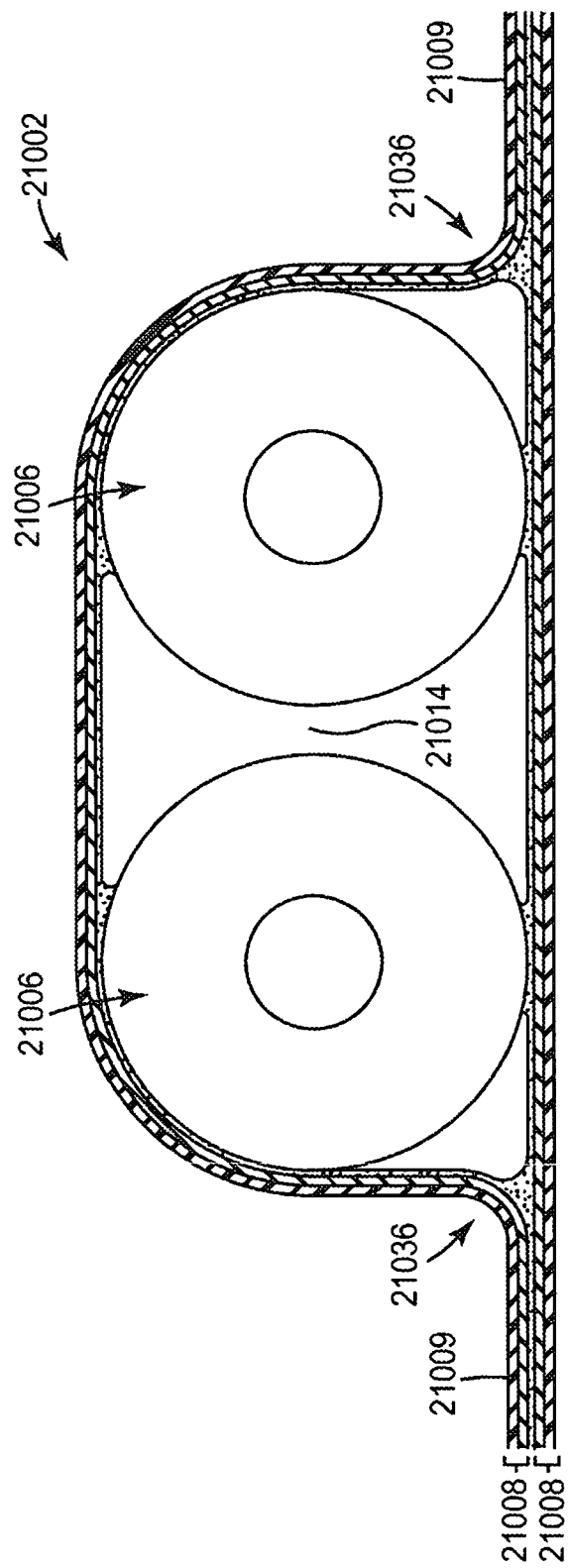
FIG. 36d is a front cross-sectional view of a portion of another exemplary shielded electrical cable.
Figure 36E:
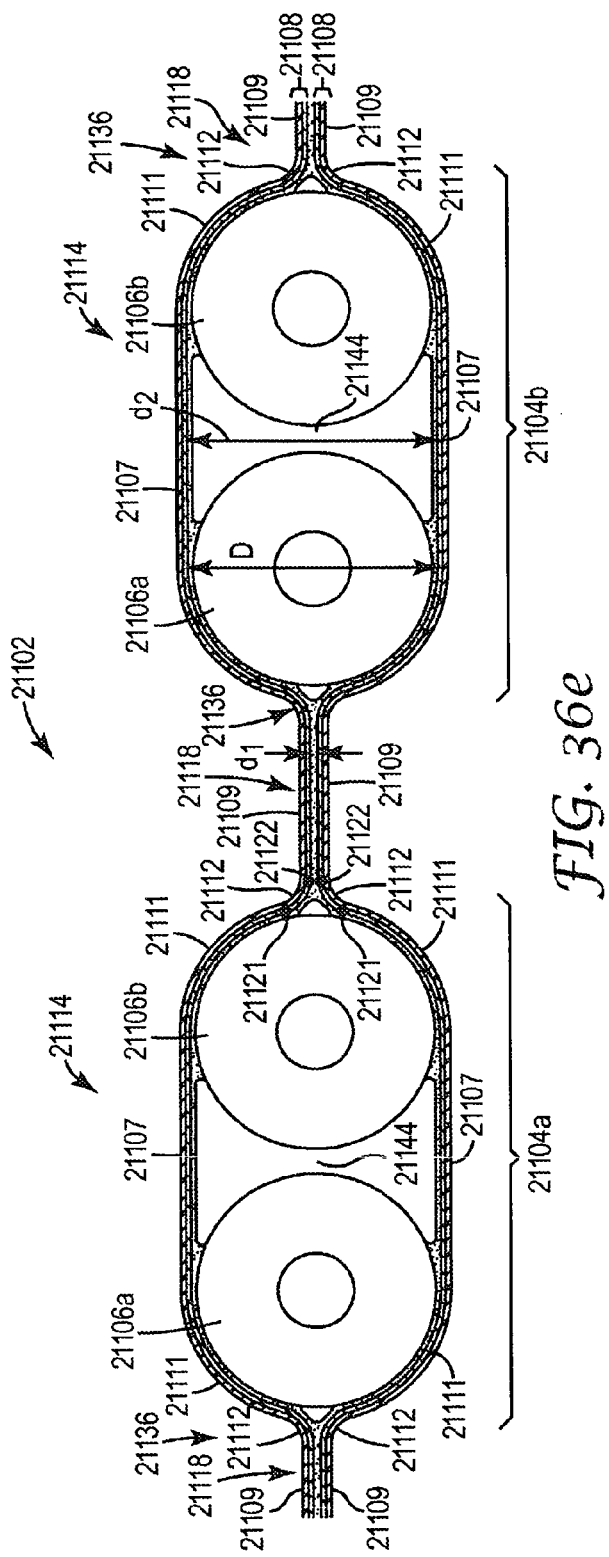
FIG. 36e is a front cross-sectional views of other portions of exemplary shielded electrical cables.
Figure 36F:
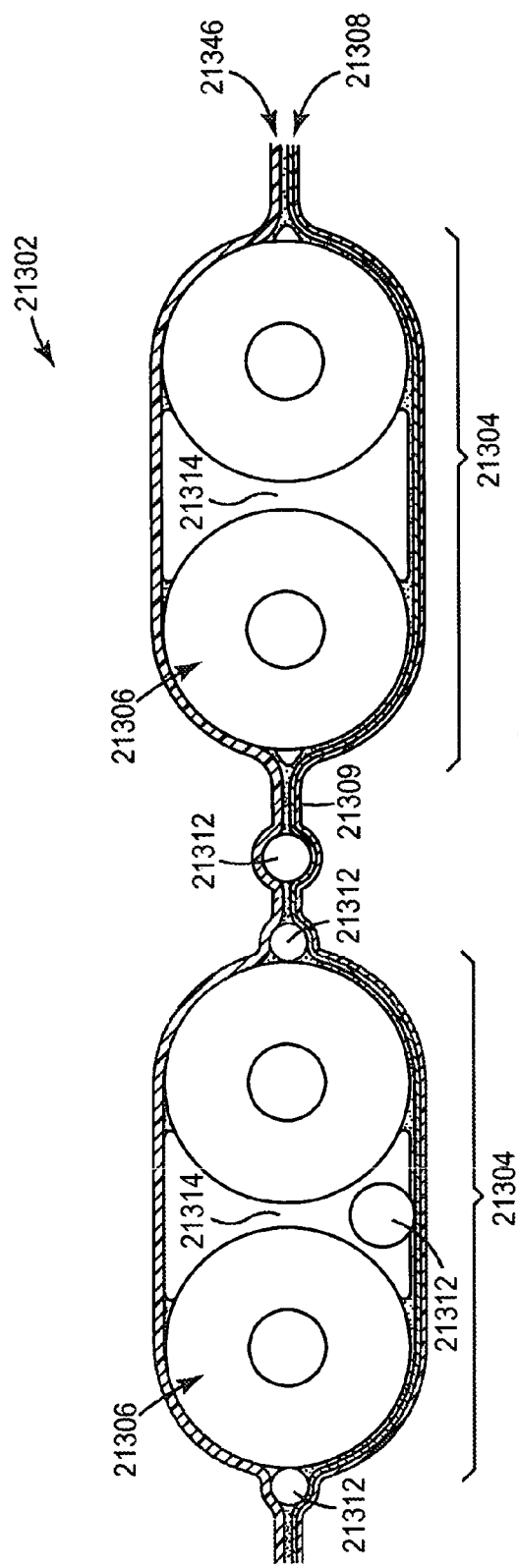
FIG. 36f is a front cross-sectional view of another exemplary shielded electrical cable.
Figure 36G:
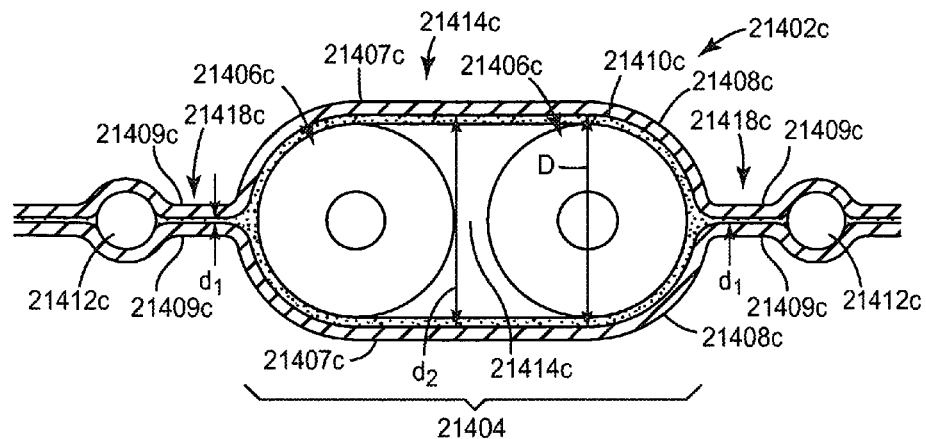

The cross-sectional views of FIGS. 36*g*-37*e* may represent various shielded electrical cables, or portions of cables. Referring to FIG. 36*g*, shielded electrical cable 21402*c* has a single conductor set 21404*c* which has two insulated conductors 21406*c* separated by dielectric gap 20114*c*. If desired, the cable 21402*c* may be made to include multiple conductor sets 21404*c* spaced part across a width of the cable 21402*c* and extending along a length of the cable. Insulated conductors 21406*c* are arranged generally in a single plane and effectively in a twinaxial configuration. The twin axial cable configuration of FIG. 36*g* can be used in a differential pair circuit arrangement or in a single ended circuit arrangement.

Two shielding films 21408*c* are disposed on opposite sides of conductor set 21404*c*. The cable 21402*c* includes a cover region 21414*c* and pinched regions 21418*c*. In the cover region 21414*c* of the cable 20102*c*, the shielding films 21408*c* include cover portions 21407*c* that cover the conductor set 21404*c*. In transverse cross section, the cover portions 21407*c*, in combination, substantially surround the conductor set 21404*c*. In the pinched regions 21418*c* of the cable 21402*c*, the shielding films 21408*c* include pinched portions 21409*c* on each side of the conductor set 21404*c*.

An optional adhesive layer 21410*c* may be disposed between shielding films 21408*c*. Shielded electrical cable 21402*c* further includes optional ground conductors 21412*c* similar to ground conductors 21412 that may include ground wires or drain wires. Ground conductors 21412*c* are spaced apart from, and extend in substantially the same direction as, insulated conductors 21406*c*. Conductor set 21404*c* and ground conductors 21412*c* can be arranged so that they lie generally in a plane.

As illustrated in the cross section of FIG. 36*g*, there is a maximum separation, D, between the cover portions 21407*c* of the shielding films 21408*c*; there is a minimum separation, d1, between the pinched portions 21409*c* of the shielding films 21408*c*; and there is a minimum separation, d2, between the shielding films 21408*c* between the insulated conductors 21406*c*.

In FIG. 36*g*, adhesive layer 21410*c* is shown disposed between the pinched portions 21409*c* of the shielding films 21408*c* in the pinched regions 21418*c* of the cable 20102*c* and disposed between the cover portions 21407c of the shielding films 21408c and the insulated conductors 21406c in the cover region 21414c of the cable 21402c. In this arrangement, the adhesive layer 21410c bonds the pinched portions 21409c of the shielding films 21408c together in the pinched regions 21418c of the cable 21402c, and also bonds the cover portions 21407c of the shielding films 21408c to the insulated conductors 21406c in the cover region 21414c of the cable 21402c.

Figure 36H:
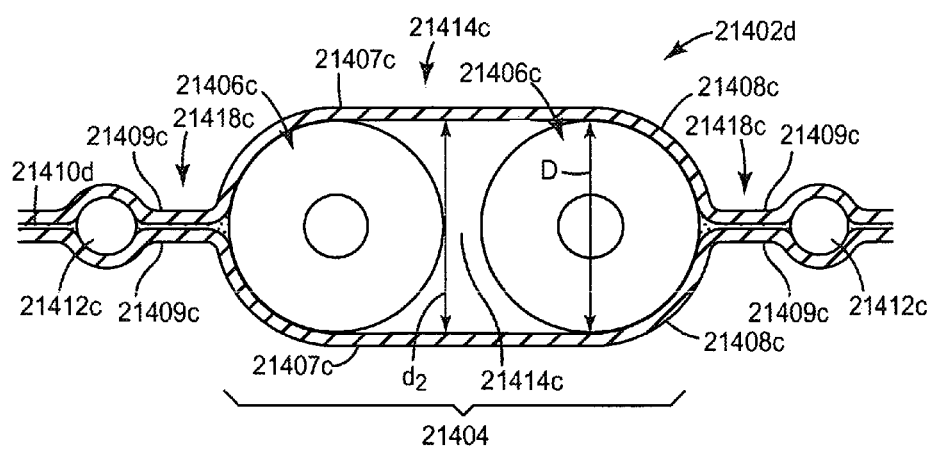

Shielded cable 21402d of FIG. 36h is similar to cable 21402c of FIG. 36g, with similar elements identified by similar reference numerals, except that in cable 21402d the optional adhesive layer 21410d is not present between the cover portions 21407c of the shielding films 21408c and the insulated conductors 21406c in the cover region 21414c of the cable. In this arrangement, the adhesive layer 21410d bonds the pinched portions 21409c of the shielding films 21408c together in the pinched regions 21418c of the cable, but does not bond the cover portions 21407c of the shielding films 21408c to the insulated conductors 1406c in the cover region 21414c of the cable 21402d.

Figure 37A:
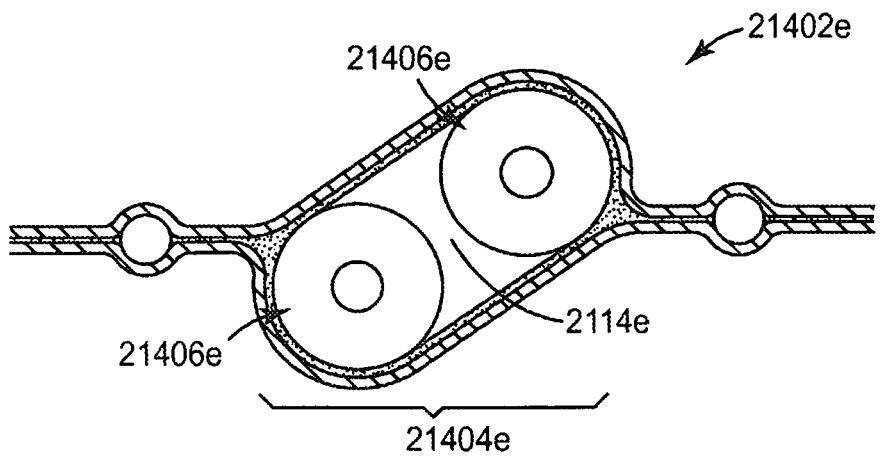

Referring now to FIG. 37a, we see there a transverse cross-sectional view of a shielded electrical cable 21402e similar in many respects to the shielded electrical cable 21402c of FIG. 36g. Cable 21402e includes a single conductor set 21404e that has two insulated conductors 21406e separated by dielectric gap 20114e extending along a length of the cable 21402e. Cable 21402e may be made to have multiple conductor sets 21404e spaced apart from each other across a width of the cable 21402e and extending along a length of the cable 21402e. Insulated conductors 21406e are arranged effectively in a twisted pair cable arrangement, whereby insulated conductors 21406e twist around each other and extend along a length of the cable 21402e.

Figure 37B:
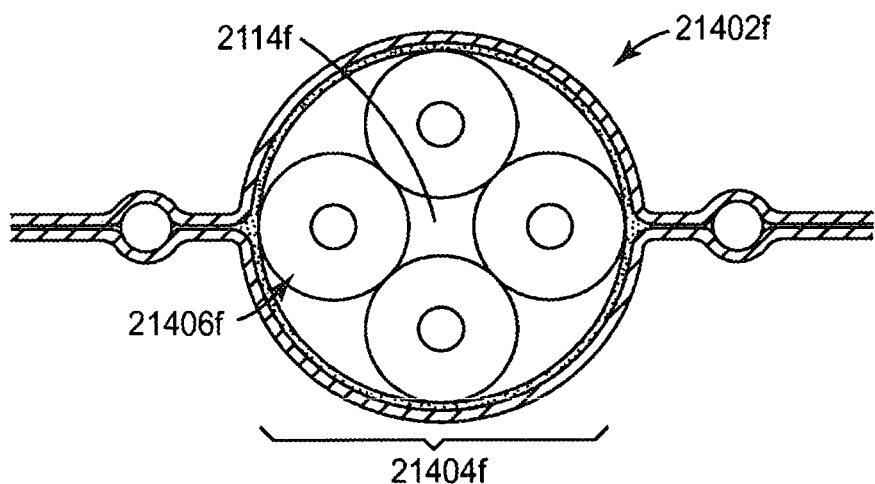

In FIG. 37b another shielded electrical cable 21402f is depicted that is also similar in many respects to the shielded electrical cable 21402c of FIG. 36g. Cable 21402f includes a single conductor set 21404f that has four insulated conductors 21406f extending along a length of the cable 21402f, with opposing conductors being separated by gap 20114f. The cable 21402f may be made to have multiple conductor sets 21404f spaced apart from each other across a width of the cable 21402f and extending along a length of the cable 21402f. Insulated conductors 1406f are arranged effectively in a quad cable arrangement, whereby insulated conductors 21406f may or may not twist around each other as insulated conductors 1406f extend along a length of the cable 21402f.

Figure 37C:
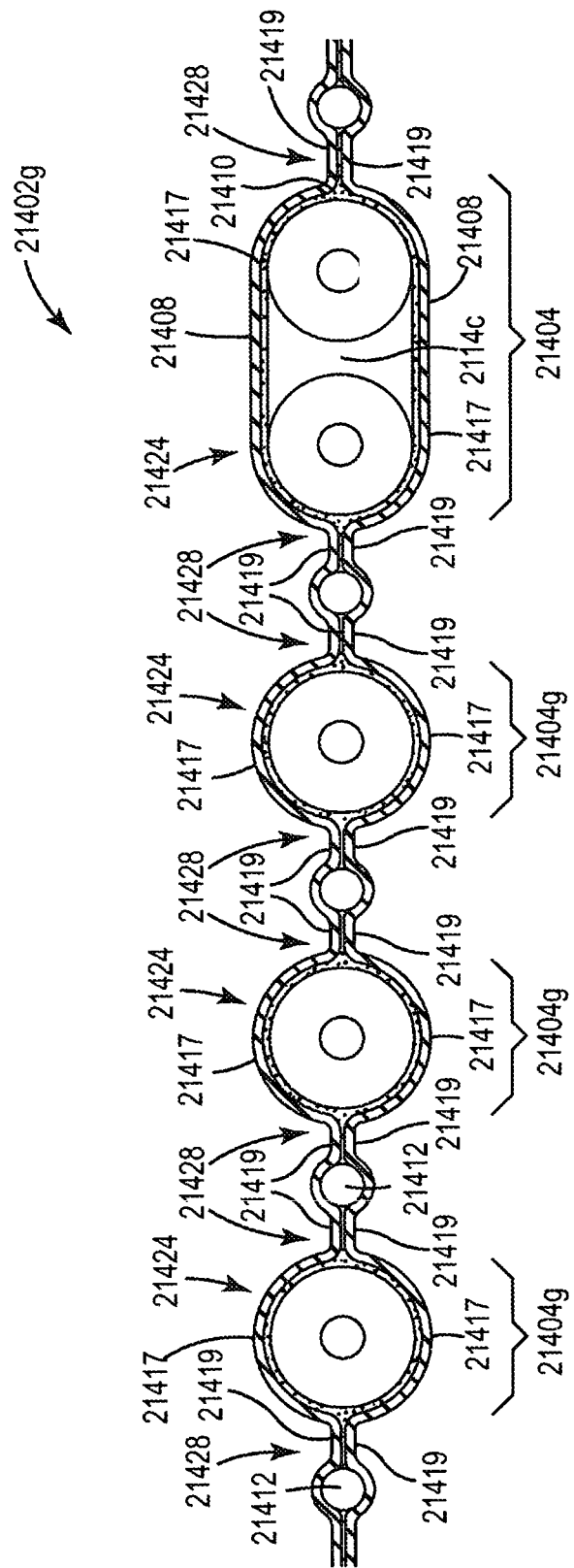

Further embodiments of shielded electrical cables may include a plurality of spaced apart conductor sets 21404, 21404e, or 21404f, or combinations thereof, arranged generally in a single plane. Optionally, the shielded electrical cables may include a plurality of ground conductors 21412 spaced apart from, and extending generally in the same direction as, the insulated conductors of the conductor sets. In some configurations, the conductor sets and ground conductors can be arranged generally in a single plane. FIG. 37c illustrates an exemplary embodiment of such a shielded electrical cable.

Referring to FIG. 37c, shielded electrical cable 20102g includes a plurality of spaced apart conductor sets 21404, 21404g arranged generally in plane. Conductor sets 21404g include a single insulated conductor, but may otherwise be formed similarly to conductor set 21404. Shielded electrical cable 21402g further includes optional ground conductors 21412 disposed between conductor sets 21404, 21404g and at both sides or edges of shielded electrical cable 21402g.

First and second shielding films 21408 are disposed on opposite sides of the cable 21402g and are arranged so that, in transverse cross section, the cable 21402g includes cover regions 21424 and pinched regions 21428. In the cover regions 21424 of the cable, cover portions 21417 of the first and second shielding films 21408 in transverse cross section substantially surround each conductor set 21404, 21404g. Pinched portions 21419 of the first and second shielding films 21408 form the pinched regions 21428 on two sides of each conductor set 21404g.

The shielding films 21408 are disposed around ground conductors 21412. An optional adhesive layer 21410 is disposed between shielding films 21408 and bonds the pinched portions 21419 of the shielding films 21408 to each other in the pinched regions 21428 on both sides of each conductor set 21404, 21404c. Shielded electrical cable 21402g includes a combination of coaxial cable arrangements (conductor sets 21404g) and a twinaxial cable arrangement (conductor set 21404) and may therefore be referred to as a hybrid cable arrangement.

One, two, or more of the shielded electrical cables may be terminated to a termination component such as a printed circuit board, paddle card, or the like. Because the insulated conductors and ground conductors can be arranged generally in a single plane, the disclosed shielded electrical cables are well suited for mass-stripping, i.e., the simultaneous stripping of the shielding films and insulation from the insulated conductors, and mass-termination, i.e., the simultaneous terminating of the stripped ends of the insulated conductors and ground conductors, which allows a more automated cable assembly process. This is an advantage of at least some of the disclosed shielded electrical cables. The stripped ends of insulated conductors and ground conductors may, for example, be terminated to contact conductive paths or other elements on a printed circuit board, for example. In other cases, the stripped ends of insulated conductors and ground conductors may be terminated to any suitable individual contact elements of any suitable termination device, such as, e.g., electrical contacts of an electrical connector.

In FIGS. 38a-38d an exemplary termination process of shielded electrical cable 21502 to a printed circuit board or other termination component 21514 is shown. This termination process can be a mass-termination process and includes the steps of stripping (illustrated in FIGS. 38a-38b), aligning (illustrated in FIG. 38c), and terminating (illustrated in FIG. 38d). When forming shielded electrical cable 21502, which may in general take the form of any of the cables shown and/or described herein, the arrangement of conductor sets 21504, 21504a (with dielectric gap 21520), insulated conductors 21506, and ground conductors 21512 of shielded electrical cable 21502 may be matched to the arrangement of contact elements 1516 on printed circuit board 21514, which would eliminate any significant manipulation of the end portions of shielded electrical cable 21502 during alignment or termination.

Figure 38A:
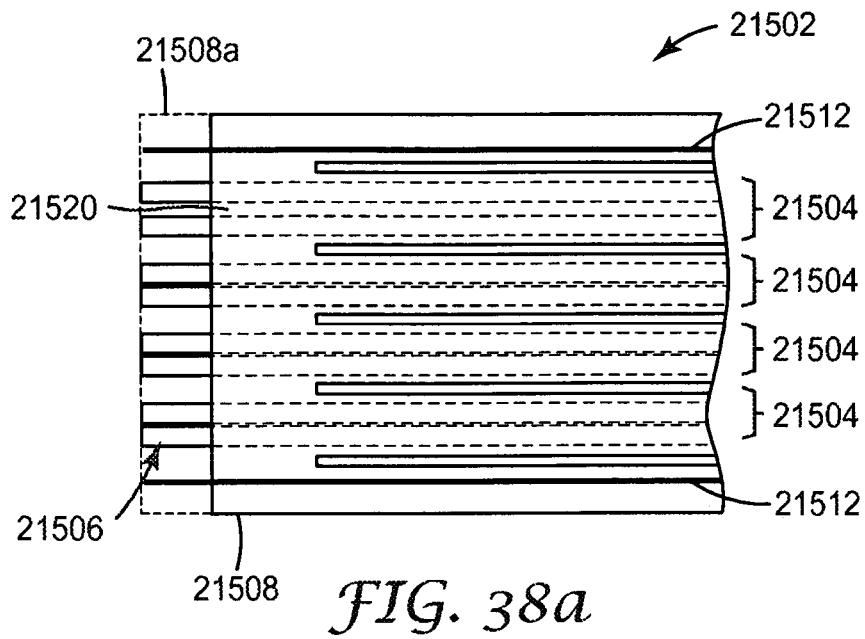
FIGS. 38a-38d are top views that illustrate different procedures of an exemplary termination process of a shielded electrical cable to a termination component.
Figure 38B:
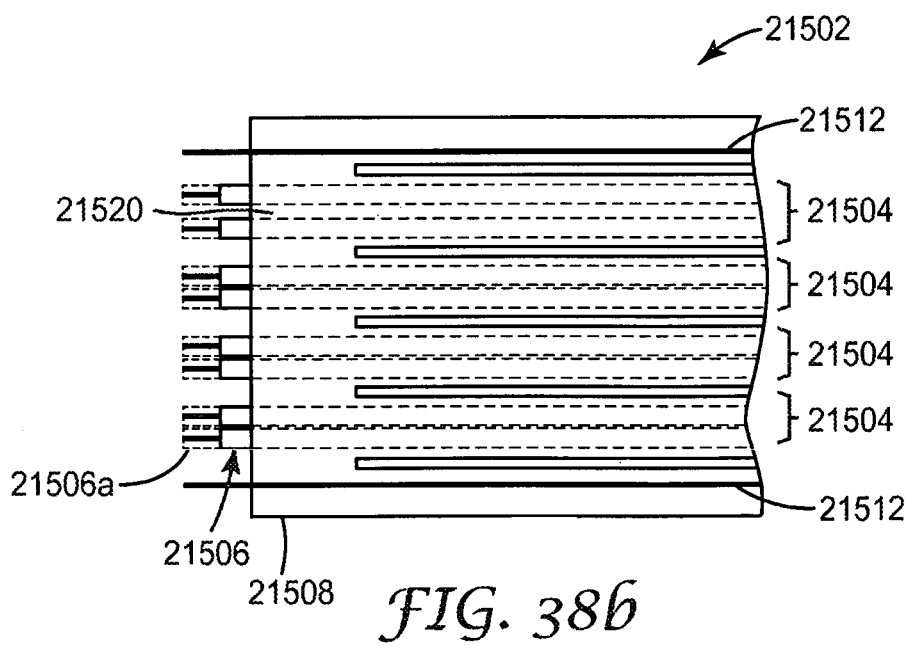
Figure 38C:
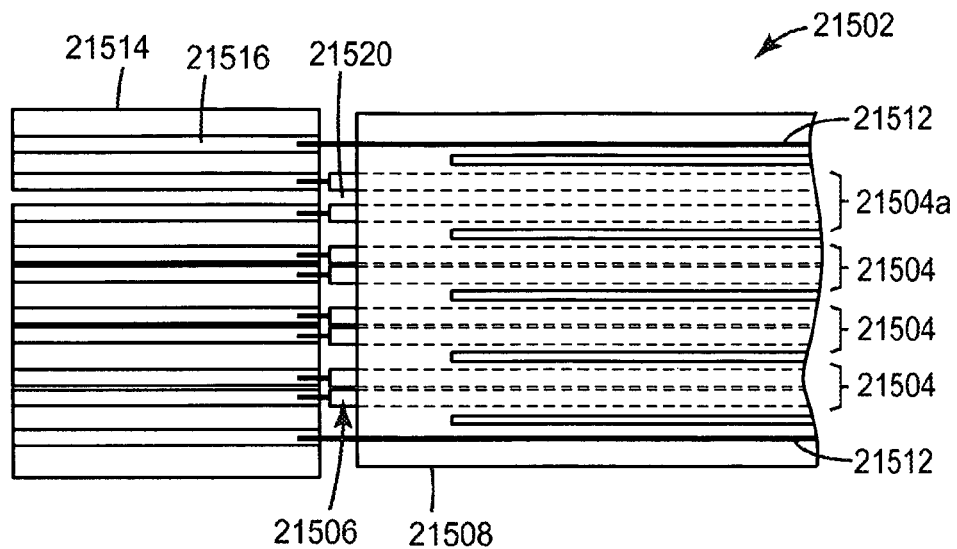
Figure 38D:
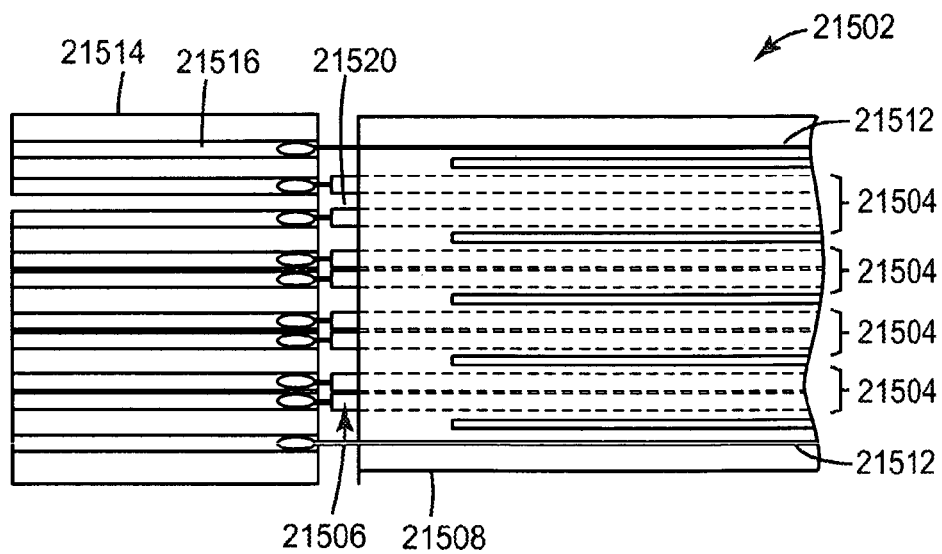

In the step illustrated in FIG. 38a, an end portion 21508a of shielding films 21508 is removed. Any suitable method may be used, such as, e.g., mechanical stripping or laser stripping. This step exposes an end portion of insulated conductors 21506 and ground conductors 21512. In one aspect, mass-stripping of end portion 21508a of shielding films 21508 is possible because they form an integrally connected layer that is separate from the insulation of insulated conductors 21506. Removing shielding films 21508 from insulated conductors 21506 allows protection against electrical shorting at these locations and also provides independent movement of the exposed end portions of insulated conductors 1506 and ground conductors 21512. In the step illustrated in FIG. 38b, an end portion 21506a of the insulation of insulated conductors 21506 is removed. Any suitable method may be used, such as, e.g., mechanical stripping or laser stripping. This step exposes an end portion of the conductor of insulated conductors 21506. In the step illustrated in FIG. 38c, shielded electrical cable 21502 is aligned with printed circuit board 21514 such that the end portions of the conductors of insulated conductors 21506 and the end portions of ground conductors 21512 of shielded electrical cable 21502 are aligned with contact elements 21516 on printed circuit board 21514. In the step illustrated in FIG. 38d, the end portions of the conductors of insulated conductors 21506 and the end portions of ground conductors 21512 of shielded electrical cable 21502 are terminated to contact elements 21516 on printed circuit board 21514. Examples of suitable termination methods that may be used include soldering, welding, crimping, mechanical clamping, and adhesively bonding, to name a few.

Figure 39A:
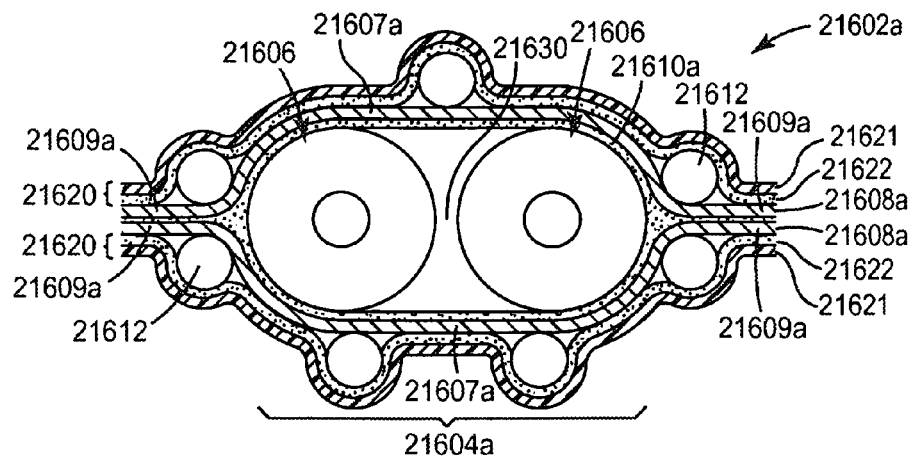
FIGS. 39a-39c are front cross-sectional views of still further exemplary shielded electrical cables.
Figure 39B:
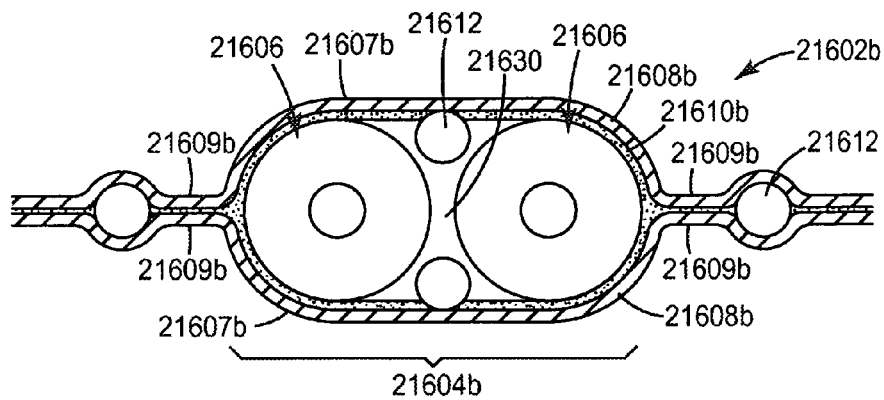
Figure 39C:
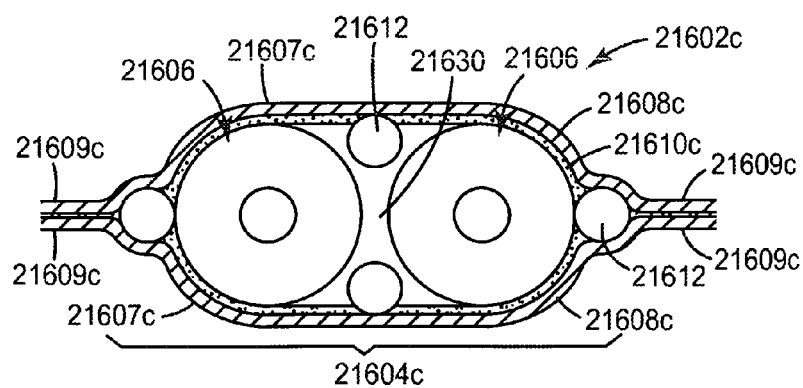

In FIGS. 39a-39c are cross sectional views of three exemplary shielded electrical cables, which illustrate examples of the placement of ground conductors in the shielded electrical cables. An aspect of a shielded electrical cable is proper grounding of the shield, and such grounding can be accomplished in a number of ways. In some cases, a given ground conductor can electrically contact at least one of the shielding films such that grounding the given ground conductor also grounds the shielding film or films. Such a ground conductor may also be referred to as a "drain wire". Electrical contact between the shielding film and the ground conductor may be characterized by a relatively low DC resistance, e.g., a DC resistance of less than 10 ohms, or less than 2 ohms, or of substantially 0 ohms. In some cases, a given ground conductors may not electrically contact the shielding films, but may be an individual element in the cable construction that is independently terminated to any suitable individual contact element of any suitable termination component, such as, e.g., a conductive path or other contact element on a printed circuit board, paddle board, or other device. Such a ground conductor may also be referred to as a "ground wire". FIG. 39a illustrates an exemplary shielded electrical cable in which ground conductors are positioned external to the shielding films. FIGS. 39b and 39c illustrate embodiments in which the ground conductors are positioned between the shielding films, and may be included in the conductor set. One or more ground conductors may be placed in any suitable position external to the shielding films, between the shielding films, or a combination of both.

Referring to FIG. 39a, a shielded electrical cable 21602a includes a single conductor set 21604a that extends along a length of the cable 21602a. Conductor set 21604a has two insulated conductors 21606, i.e., one pair of insulated conductors, separated by dielectric gap 21630. Cable 21602a may be made to have multiple conductor sets 21604a spaced apart from each other across a width of the cable and extending along a length of the cable. Two shielding films 21608a disposed on opposite sides of the cable include cover portions 21607a. In transverse cross section, the cover portions 21607a, in combination, substantially surround conductor set 21604a. An optional adhesive layer 21610a is disposed between pinched portions 21609a of the shielding films 21608a, and bonds shielding films 21608a to each other on both sides of conductor set 21604a. Insulated conductors 21606 are arranged generally in a single plane and effectively in a twinaxial cable configuration that can be used in a single ended circuit arrangement or a differential pair circuit arrangement. The shielded electrical cable 21602a further includes a plurality of ground conductors 21612 positioned external to shielding films 21608a. Ground conductors 21612 are placed over, under, and on both sides of conductor set 21604a. Optionally, the cable 21602a includes protective films 21620 surrounding the shielding films 21608a and ground conductors 21612. Protective films 21620 include a protective layer 21621 and an adhesive layer 21622 bonding protective layer 21621 to shielding films 21608a and ground conductors 21612. Alternatively, shielding films 21608a and ground conductors 21612 may be surrounded by an outer conductive shield, such as, e.g., a conductive braid, and an outer insulative jacket (not shown).

Referring to FIG. 39b, a shielded electrical cable 21602b includes a single conductor set 21604b that extends along a length of cable 21602b. Conductor set 21604b has two insulated conductors 21606, i.e., one pair of insulated conductors, separated by dielectric gap 21630. Cable 21602b may be made to have multiple conductor sets 21604b spaced apart from each other across a width of the cable and extending along the length of the cable. Two shielding films 21608b are disposed on opposite sides of the cable 21602b and include cover portions 21607b. In transverse cross section, the cover portions 21607b, in combination, substantially surround conductor set 21604b. An optional adhesive layer 21610b is disposed between pinched portions 21609b of the shielding films 21608b and bonds the shielding films to each other on both sides of the conductor set. Insulated conductors 21606 are arranged generally in a single plane and effectively in a twinaxial or differential pair cable arrangement. Shielded electrical cable 21602b further includes a plurality of ground conductors 21612 positioned between shielding films v1608b. Two of the ground conductors 21612 are included in conductor set 21604b, and two of the ground conductors 21612 are spaced apart from conductor set 21604b.

Referring to FIG. 39c, a shielded electrical cable 21602c includes a single conductor set 21604c that extends along a length of cable 21602c. Conductor set 21604c has two insulated conductors 21606, i.e., one pair of insulated conductors, separated by dielectric gap 21630. Cable 21602c may be made to have multiple conductor sets 21604c spaced apart from each other across a width of the cable and extending along the length of the cable. Two shielding films 21608c are disposed on opposite sides of the cable 21602c and include cover portions 21607c. In transverse cross section, the cover portions 21607c, in combination, substantially surround the conductor set 21604c. An optional adhesive layer 21610c is disposed between pinched portions 21609c of the shielding films 21608c and bonds shielding films 21608c to each other on both sides of conductor set 21604c. Insulated conductors 21606 are arranged generally in a single plane and effectively in a twinaxial or differential pair cable arrangement. Shielded electrical cable 21602c further includes a plurality of ground conductors 21612 positioned between shielding films 21608c. All of the ground conductors 21612 are included in the conductor set 21604c. Two of the ground conductors 21612 and insulated conductors 21606 are arranged generally in a single plane.

In FIG. 36c, an exemplary shielded electrical cable 20902 is shown in transverse cross section that includes two insulated conductors in a connector set 20904, the individually insulated conductors 20906 each extending along a length of the cable 20902 and separated by dielectric/air gap 20944. Two shielding films 20908 are disposed on opposite sides of the cable 20902 and in combination substantially surround conductor set 20904. An optional adhesive layer 20910 is disposed between pinched portions 20909 of the shielding films 20908 and bonds shielding films 20908 to each other on both sides of conductor set 20904 in the pinched regions 918 of the cable. Insulated conductors 906 can be arranged generally in a single plane and effectively in a twinaxial cable configuration. The twinaxial cable configuration can be used in a differential pair circuit arrangement or in a single ended circuit arrangement. Shielding films 20908 may include a conductive layer 908a and a non-conductive polymeric layer 20908b, or may include the conductive layer 908a without the non-conductive polymeric layer 20908b. In the figure, the conductive layer 20908a of each shielding film is shown facing insulated conductors 20906, but in alternative embodiments, one or both of the shielding films may have a reversed orientation.

The cover portion 20907 of at least one of the shielding films 20908 includes concentric portions 20911 that are substantially concentric with corresponding end conductors 20906 of the conductor set 20904. In the transition regions of the cable 20902, transition portion 20934 of the shielding films 20908 are between the concentric portions 20911 and the pinched portions 20909 of the shielding films 20908. Transition portions 20934 are positioned on both sides of conductor set 20904, and each such portion includes a cross-sectional transition area 20934a. The sum of cross-sectional transition areas 934a is preferably substantially the same along the length of conductors 20906. For example, the sum of cross-sectional areas 20934a may vary less than 50% over a length of 1 m.

In addition, the two cross-sectional transition areas 20934a may be substantially the same and/or substantially identical. This configuration of transition regions contributes to a characteristic impedance for each conductor 20906 (single-ended) and a differential impedance that both remain within a desired range, such as, e.g., within 5-10% of a target impedance value over a given length, such as, e.g., 1 m. In addition, this configuration of the transition regions may minimize skew of the two conductors 20906 along at least a portion of their length.

When the cable is in an unfolded, planar configuration, each of the shielding films may be characterizable in transverse cross section by a radius of curvature that changes across a width of the cable 20902. The maximum radius of curvature of the shielding film 20908 may occur, for example, at the pinched portion 20909 of the cable 20902, or near the center point of the cover portion 20907 of the multi-conductor cable set 20904 illustrated in FIG. 36c. At these positions, the film may be substantially flat and the radius of curvature may be substantially infinite. The minimum radius of curvature of the shielding film 20908 may occur, for example, at the transition portion 20934 of the shielding film 20908. In some embodiments, the radius of curvature of the shielding film across the width of the cable is at least about 50 micrometers, i.e., the radius of curvature does not have a magnitude smaller than 50 micrometers at any point along the width of the cable, between the edges of the cable. In some embodiments, for shielding films that include a transition portion, the radius of curvature of the transition portion of the shielding film is similarly at least about 50 micrometers.

In an unfolded, planar configuration, shielding films that include a concentric portion and a transition portion are characterizable by a radius of curvature of the concentric portion, R1, and/or a radius of curvature of the transition portion r1. These parameters are illustrated in FIG. 36c for the cable 20902. In exemplary embodiments, R1/r1 is in a range of 2 to 15.

In FIG. 36d another exemplary shielded electrical cable 21002 is shown which includes a conductor set having two insulated conductors 21006 separated by dielectric/air gap 1014. In this embodiment, the shielding films 21008 have an asymmetric configuration, which changes the position of the transition portions relative to a more symmetric embodiment. In FIG. 36d, shielded electrical cable 21002 has pinched portions 21009 of shielding films 21008 that lie in a plane that is slightly offset from the plane of symmetry of the insulated conductors. 21006. As a result, the transition regions 21036 have a somewhat offset position and configuration relative to other depicted embodiments. However, by ensuring that the two transition regions 21036 are positioned substantially symmetrically with respect to corresponding insulated conductors 21006 (e.g. with respect to a vertical plane between the conductors 21006), and that the configuration of transition regions 1036 is carefully controlled along the length of shielded electrical cable 21002, the shielded electrical cable 21002 can be configured to still provide acceptable electrical properties.

In FIG. 36e, additional exemplary shielded electrical cables are illustrated. These figures are used to further explain how a pinched portion of the cable is configured to electrically isolate a conductor set of the shielded electrical cable. The conductor set may be electrically isolated from an adjacent conductor set (e.g., to minimize crosstalk between adjacent conductor sets) or from the external environment of the shielded electrical cable (e.g., to minimize electromagnetic radiation escape from the shielded electrical cable and minimize electromagnetic interference from external sources). In both cases, the pinched portion may include various mechanical structures to realize the electrical isolation. Examples include close proximity of the shielding films, high dielectric constant material between the shielding films, ground conductors that make direct or indirect electrical contact with at least one of the shielding films, extended distance between adjacent conductor sets, physical breaks between adjacent conductor sets, intermittent contact of the shielding films to each other directly either longitudinally, transversely, or both, and conductive adhesive, to name a few.

FIG. 36e shows, in cross section, a shielded electrical cable 21102 that includes two conductor sets 21104a, 2104b spaced apart across a width of the cable 20102 and extending longitudinally along a length of the cable. Each conductor set 21104a, 21104b has two insulated conductors 21106a, 21106b separated by gaps 21144. Two shielding films 21108 are disposed on opposite sides of the cable 21102. In transverse cross section, cover portions 21107 of the shielding films 21108 substantially surround conductor sets 21104a, 21104b in cover regions 21114 of the cable 21102. In pinched regions 21118 of the cable, on both sides of the conductor sets 21104a, 21104b, the shielding films 21108 include pinched portions 21109. In shielded electrical cable 21102, the pinched portions 21109 of shielding films 21108 and insulated conductors 21106 are arranged generally in a single plane when the cable 21102 is in a planar and/or unfolded arrangement. Pinched portions 21109 positioned in between conductor sets 21104a, 21104b are configured to electrically isolate conductor sets 21104a, 21104b from each other. When arranged in a generally planar, unfolded arrangement, as illustrated in FIG. 36e, the high frequency electrical isolation of the first insulated conductor 21106a in the conductor set 21104a relative to the second insulated conductor 21106b in the conductor set 21104a is substantially less than the high frequency electrical isolation of the first conductor set 21104a relative to the second conductor set 21104b.

As illustrated in the cross section of FIG. 36e, the cable 21102 can be characterized by a maximum separation, D, between the cover portions 21107 of the shielding films 21108, a minimum separation, d2, between the cover portions 21107 of the shielding films 21108, and a minimum separation, d1, between the pinched portions 21109 of the shielding films 21108. In some embodiments, d1/D is less than 0.25, or less than 0.1. In some embodiments, d2/D is greater than 0.33.

An optional adhesive layer may be included as shown between the pinched portions 21109 of the shielding films 21108. The adhesive layer may be continuous or discontinuous. In some embodiments, the adhesive layer may extend fully or partially in the cover region 21114 of the cable v1102, e.g., between the cover portion 21107 of the shielding films 21108 and the insulated conductors 21106a, 21106b. The adhesive layer may be disposed on the cover portion 21107 of the shielding film 21108 and may extend fully or partially from the pinched portion 21109 of the shielding film 21108 on one side of a conductor set 21104a, 21104b to the pinched portion 21109 of the shielding film 21108 on the other side of the conductor set 21104a, 21104b.

The shielding films 21108 can be characterized by a radius of curvature, R, across a width of the cable 21102 and/or by a radius of curvature, r1, of the transition portion 21112 of the shielding film and/or by a radius of curvature, r2, of the concentric portion 21111 of the shielding film.

In the transition region 21136, the transition portion 21112 of the shielding film 21108 can be arranged to provide a gradual transition between the concentric portion 21111 of the shielding film 21108 and the pinched portion 1109 of the shielding film 21108. The transition portion 21112 of the shielding film 1108 extends from a first transition point 21121, which is the inflection point of the shielding film 1108 and marks the end of the concentric portion 21111, to a second transition point 21122 where the separation between the shielding films exceeds the minimum separation, d1, of the pinched portions 21109 by a predetermined factor.

In some embodiments, the cable 21102 includes at least one shielding film that has a radius of curvature, R, across the width of the cable that is at least about 50 micrometers and/or the minimum radius of curvature, r1, of the transition portion 21112 of the shielding film 21102 is at least about 50 micrometers. In some embodiments, the ratio of the minimum radius of curvature of the concentric portion to the minimum radius of curvature of the transition portion, r2/r1, is in a range of 2 to 15.

In some embodiments, the radius of curvature, R, of the shielding film across the width of the cable is at least about 50 micrometers and/or the minimum radius of curvature in the transition portion of the shielding film is at least 50 micrometers.

In some cases, the pinched regions of any of the described shielded cables can be configured to be laterally bent at an angle α of at least 30°, for example. This lateral flexibility of the pinched regions can enable the shielded cable to be folded in any suitable configuration, such as, e.g., a configuration that can be used in a round cable. In some cases, the lateral flexibility of the pinched regions is enabled by shielding films that include two or more relatively thin individual layers. To warrant the integrity of these individual layers in particular under bending conditions, it is preferred that the bonds between them remain intact. The pinched regions may for example have a minimum thickness of less than about 0.13 mm, and the bond strength between individual layers may be at least 17.86 g/mm (1 lbs/inch) after thermal exposures during processing or use.

In FIG. 36f a shielded electrical cable 21302 is shown having only one shielding film 21308. Insulated conductors 21306 are arranged into two conductor sets 21304, each having only one pair of insulated conductors separated by dielectric/gaps 21314, although conductor sets having other numbers of insulated conductors as discussed herein are also contemplated. Shielded electrical cable 21302 is shown to include ground conductors 21312 in various exemplary locations, but any or all of them may be omitted if desired, or additional ground conductors can be included. The ground conductors 21312 extend in substantially the same direction as insulated conductors 21306 of conductor sets 1304 and are positioned between shielding film 21308 and a carrier film 21346 which does not function as a shielding film. One ground conductor 21312 is included in a pinched portion 21309 of shielding film 21308, and three ground conductors 21312 are included in one of the conductor sets 21304. One of these three ground conductors 21312 is positioned between insulated conductors v1306 and shielding film 21308, and two of the three ground conductors 21312 are arranged to be generally co-planar with the insulated conductors 21306 of the conductor set.

In addition to signal wires, drain wires, and ground wires, any of the disclosed cables can also include one or more individual wires, which are typically insulated, for any purpose defined by a user. These additional wires, which may for example be adequate for power transmission or low speed communications (e.g. less than 1 MHz) but not for high speed communications (e.g. greater than 1 GHz), can be referred to collectively as a sideband. Sideband wires may be used to transmit power signals, reference signals or any other signal of interest. The wires in a sideband are typically not in direct or indirect electrical contact with each other, but in at least some cases they may not be shielded from each other. A sideband can include any number of wires such as 2 or more, or 3 or more, or 5 or more.

The shielded cable configurations described herein provide opportunities for simplified connections to the conductor sets and/or drain/ground wires that promote signal integrity, support industry standard protocols, and/or allow mass termination of the conductor sets and drain wires. In the cover regions, the conductor sets are substantially surrounded by shielding films and the conductor sets are separated from one another by the pinched regions. These circuit configurations may provide intra-cable electrical isolation between the conductor sets within the cable, provide extra-cable isolation between the conductor sets of the cable and the external environment, require fewer drain wires, and/or allow drain wires to be spaced apart from the conductor sets, for example.

As previously illustrated and/or described, the shielding films may include concentric regions, pinched regions and transition regions that a gradual transition between the concentric regions and the pinched regions. The geometry and uniformity of the concentric regions, pinched regions, and/or transition regions impact the electrical characteristics of the cable. It is desirable to reduce and/or control, the impact caused by non-uniformities in the geometry of these regions. Maintaining a substantially uniform geometry (e.g., size, shape, content, and radius of curvature) along the length of a cable can favorably influence the electrical characteristics of the cable. With regard to the transition regions, it may be desirable to reduce the size and/or to control the geometric uniformity of these regions. For example, a reduction in the influence of the transition regions can be achieved by reducing the size of the transition region and/or carefully controlling the configuration of the transition region along the length of the shielded electrical cable. Reducing the size of the transition region reduces the capacitance deviation and reduces the required space between multiple conductor sets, thereby reducing the conductor set pitch and/or increasing the electrical isolation between conductor sets. Careful control of the configuration of the transition region along the length of the shielded electrical cable contributes to obtaining predictable electrical behavior and consistency, which provides for high speed transmission lines so that electrical data can be more reliably transmitted. Careful control of the configuration of the transition region along the length of the shielded electrical cable is a factor as the size of the transition portion approaches a lower size limit.

Electrical characteristics of a cable determine the cable's suitability for high speed signal transmission. Electrical characteristics of a cable include characteristic impedance, insertion loss, crosstalk, skew, eye opening, and jitter, among other characteristics. The electrical characteristics can depend on the physical geometry of the cable, as previously discussed, and can also depend on the material properties of the cable components. Thus is it generally desirable to maintain substantially uniform physical geometry and/or material properties along the cable length. For example, the characteristic impedance of an electrical cable depends on the physical geometry and material properties of the cable. If a cable is physically and materially uniform along its length, then the characteristic impedance of the cable will also be uniform. However, non-uniformities in the geometry and/or material properties of the cable cause a mismatches in the impedance at the points of non-uniformity. The impedance mismatches can cause reflections that attenuate the signal and increase the insertion loss of the cable. Thus, maintaining some uniformity in the physical geometry and material properties along the cable length can improve the attenuation characteristics of the cable. Some typical characteristic impedances for exemplary electrical cables described herein are 50 ohms, 75 ohms, and 100 ohms, for example. In some cases, the physical geometry and material properties of the cables described herein may be controlled to produce variations in the characteristic impedance of the cable of less than 5% or less than 10%.

Insertion loss of a cable (or other component) characterizes the total loss of signal power attributable to that component. The term insertion loss is often used interchangeably with the term attenuation. Attenuation is sometimes defined as all losses caused by a component excluding the impedance mismatch losses. Thus, for a perfectly matched circuit, insertion loss is equal to attenuation. Insertion loss of a cable includes reflection loss (loss due to mismatches in characteristic impedance), coupling loss (loss due to crosstalk), conductor loss (resistive loss in the signal conductors), dielectric loss (loss in the dielectric material), radiation loss (loss due to radiated energy), and resonance loss (loss due to resonance in the cable). Insertion loss may be expressed in dB as:

$$\text{Insertion loss(dB)} = 10\log_{10}\frac{P_T}{P_R},$$

where $P_T$ is the signal power transmitted and $P_R$ is the signal power received. Insertion loss is dependent on the signal frequency.

For cables, or other components of variable length, insertion loss may be expressed per unit length, e.g., as dB/meter. FIGS. 40a and 40b are graphs of insertion loss vs. frequency for shielded cables described herein over a frequency range of 0 to 20 GHz. The cables tested were 1 meter in length, with twinaxial sets of 30 AWG conductors, and 100 ohm characteristic impedance.

Figure 40:
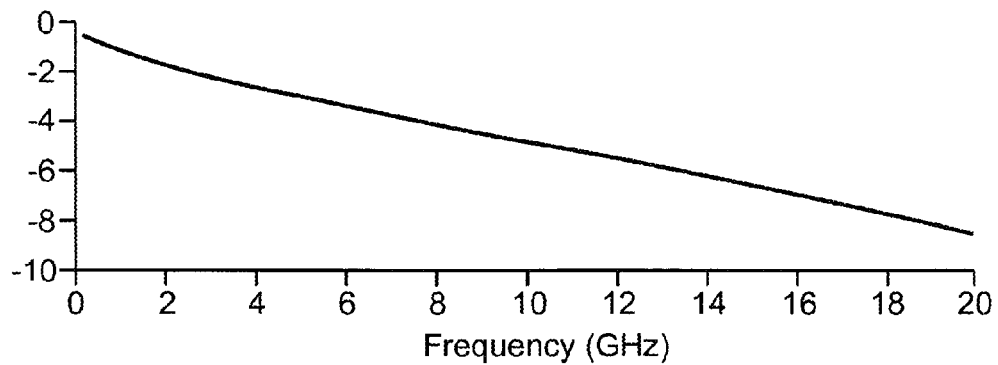
FIG. 40 is a graph of the insertion loss of a shielded electrical cable having 30 AWG silver plated conductors.
Figure 41:
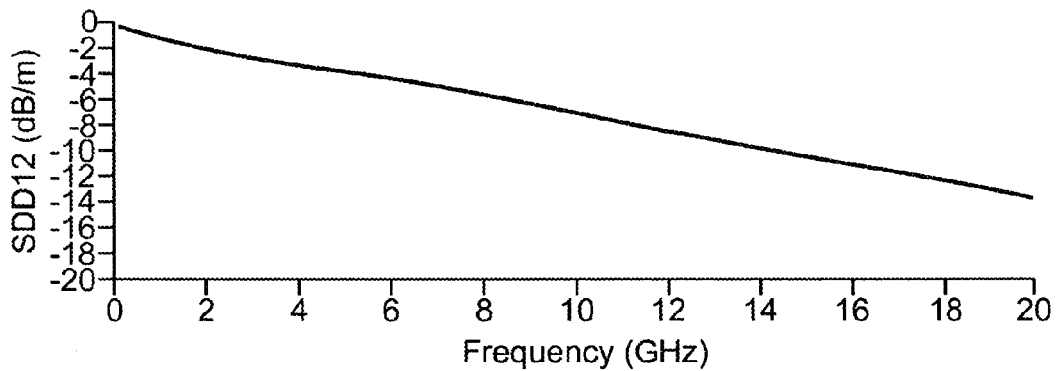
FIG. 41 is a graph of the insertion loss of a shielded electrical cable having 30 AWG tin plated conductors.

FIG. 40 is a graph of the insertion loss (SDD12) of Cable 1 which has silver plated 30 AWG conductors. FIG. 41 is a graph of the insertion loss (SDD12) of Cable 2 which has tin plated 30 AWG conductors. As shown in FIGS. 40 and 41, at a frequency of 5 GHz, Cable 2 (30 AWG tin plated conductors) has an insertion loss of less than about −5 dB/m or even less than about −4 dB/m. At a frequency of 5 GHz, Cable 1 (30 AWG silver plated conductors) has an insertion loss of less than about −5 dB/m, or less than about −4 dB, or even less than about −3 dB/m. Over the entire frequency range of 0 to 20 GHz, Cable 2 (30 AWG tin plated conductors) has an insertion loss less than about −30 dB/m, or less than about −20 dB/m, or even less than about −15 dB/m. Over the entire frequency range of 0 to 20 GHz, Cable 1 (30 AWG silver plated conductors) has an insertion loss of less than about −20 dB/m, or even less than about −15 dB/m, or even less than about −10 dB/m.

All other factors being constant, attenuation is inversely proportional to conductor size. For the shielded cables described in the disclosure, at a frequency of 5 GHz a cable with tin plated signal conductors of a size no smaller than 24 AWG has an insertion loss of less than about −5 dB/m or even less than about −4 dB/m. At a frequency of 5 GHz cable with silver plated signal conductors of a size no smaller than 24 AWG has an insertion loss of less than about −5 dB/m, or less than about −4 dB, or even less than about −3 dB/m. Over the entire frequency range of 0 to 20 GHz, a cable with tin plated signal conductors of a size no smaller than 24 AWG has an insertion loss less than about −25 dB/m, or less than about −20 dB/m, or even less than about −15 dB/m. Over the entire frequency range of 0 to 20 GHz, a cable with silver plated signal conductors of a size no smaller than 24 AWG has an insertion loss of less than about −20 dB/m, or even less than about −15 dB/m, or even less than about −10 dB/m.

The cover portions and pinched portions help to electrically isolate the conductor sets in the cable from each other and/or to electrically isolate the conductor sets from the external environment. The shielding films discussed herein can provide the closest shield for the conductor sets, however additional, auxiliary shielding disposed over these closest shielding films may additionally be used to increase intra-cable and/or extra-cable isolation.

In contrast to using one or more shielding films disposed on one or more sides of the cable with cover portions and pinched portions as described herein, some types of cables helically wrap a conductive film around individual conductor sets as a closest shield or as an auxiliary shield. In the case of twinaxial cables used to carry differential signals, the path of the return current is along opposite sides of the shield. The helical wrap creates gaps in the shield resulting in discontinuities in the current return path. The periodic discontinuities produce signal attenuation due to resonance of the conductor set. This phenomenon is known as "signal suck-out" and can produce significant signal attenuation that occurs at a particular frequency range corresponding to the resonance frequency.

Figure 42:
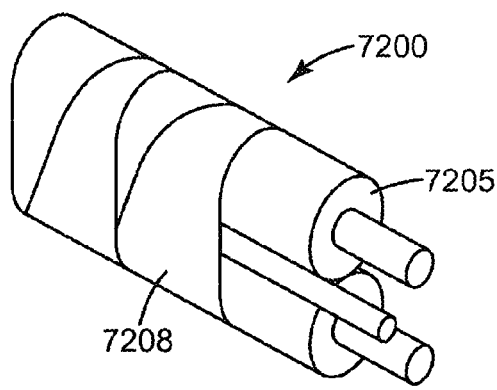
FIG. 42 shows a cable that has a wrapped shield.
Figure 43:
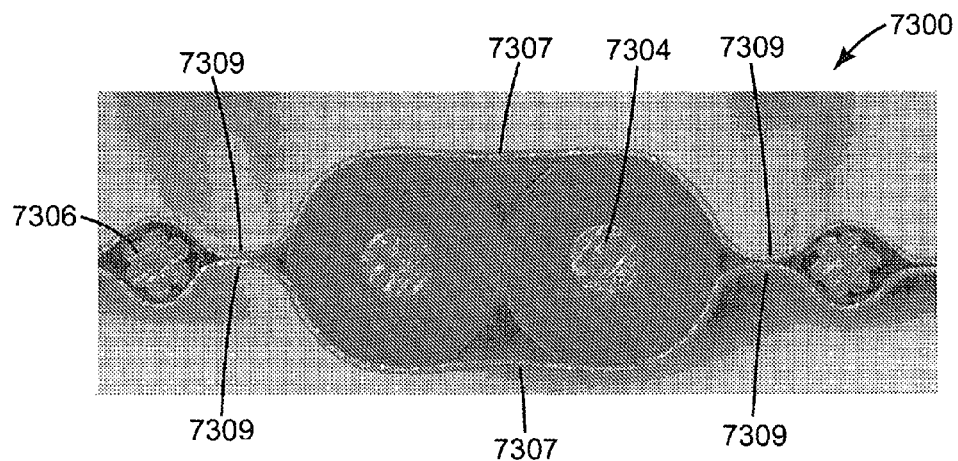
FIG. 43 is a photograph of the cross section of twinaxial configuration of a shielded electrical cable.

FIG. 42 illustrates a twinaxial cable 7200, (referred to herein as Cable 3) that has a helically wrapped film 7208 around the conductor set 7205 as a closest shield. FIG. 43 shows a cross section of a cable 7300, (referred to herein as Cable 4) having a cable configuration previously described herein including a twinaxial conductor set 7305 having 30 AWG conductors 7304, two 32 AWG drain wires 7306 and two shielding films 7308 on opposite sides of the cable 7300. The shielding films 7308 include cover portions 7307 that substantially surround the conductor set 7305 and pinched portions 7309 on either side of the conductor set 7305. Cable 4 has silver plated conductors and polyolefin insulation.

Figure 44:
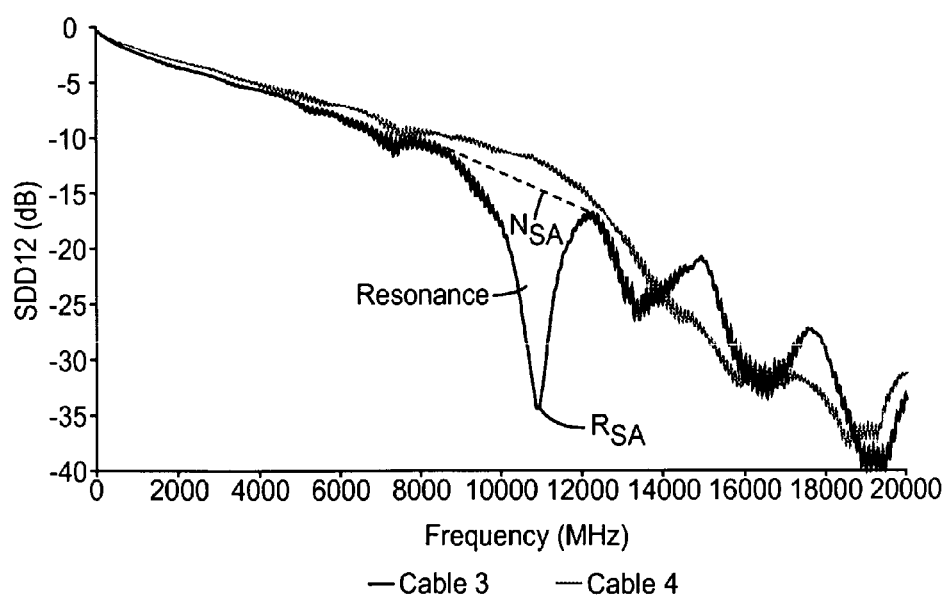
FIG. 44 are graphs that compare the insertion loss due to resonance of a cable having a wrapped shield with a cable having two shielding films with cover portions and pinched portions as described herein.

The graphs of FIG. 44 compare the insertion loss due to resonance of Cable 3 with that of Cable 4 The insertion loss due to resonance peaks in the insertion loss graph of Cable 3 at about 11 GHz. In contrast, there is no insertion loss due to resonance observable in the insertion loss graph of Cable 4. Note that in these graphs, attenuation due to the terminations of the cable are also present.

The attenuation due to resonance of Cable 3 can be characterizable by a ratio between a nominal signal attenuation, $N_{SA}$, and the signal attenuation due to resonance, $R_{SA}$, wherein $N_{SA}$ is a line connecting the peaks of the resonance dip and $R_{SA}$ is the attenuation at the valley of the resonance dip. The ratio between $N_{SA}$ and $R_{SA}$ for Cable 3 at 11 GHz is about −11 dB/−35 dB or about 0.3. In contrast, Cable 4 has $N_{SA}/R_{SA}$ values of about 1 (which corresponds to zero attenuation due to resonance) or at least greater than about 0.5.

Figure 45:
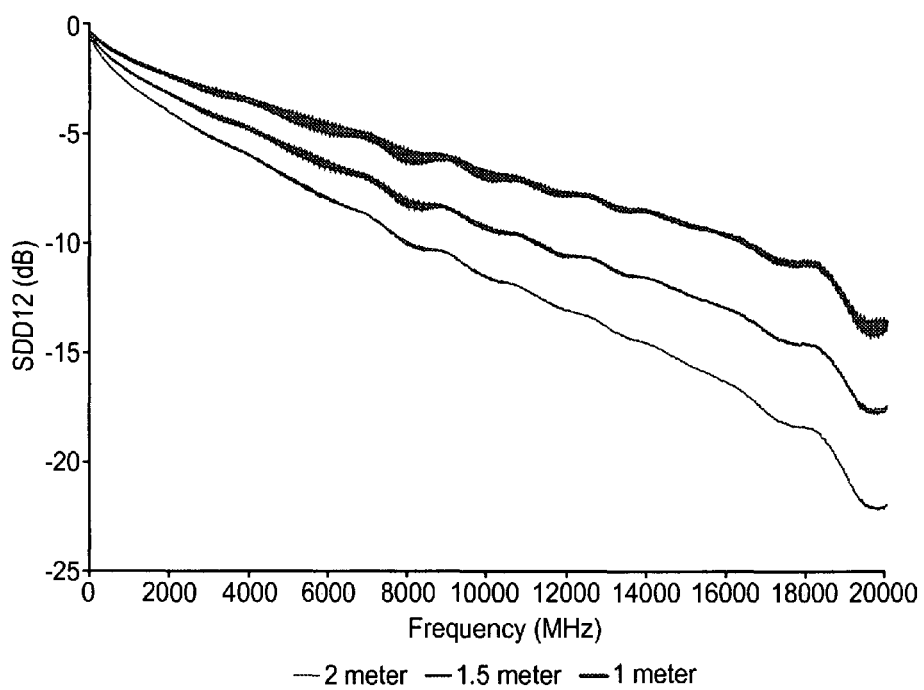
FIG. 45 shows insertion low for three different cable lengths.

The insertion loss of cables having the cross sectional geometry of Cable 4 were tested at three different lengths, 1 meter (Cable 5), 1.5 meters (Cable 6), and 2 meters (Cable 7) The insertion loss graphs for these cables is shown in FIG. 45. No resonance is observed for the frequency range of 0 to 20 GHz. (Note the slight dip near 20 GHz is associated with the termination and is not a resonance loss.)

Figure 46:
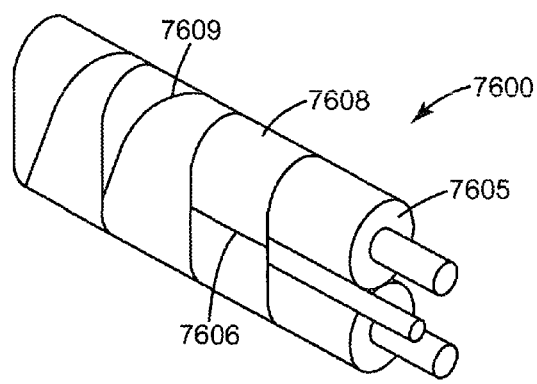
FIG. 46 shows a cable that has a longitudinally folded shield.

As illustrated in FIG. 46, instead of using a helically wrapped shield, some types of cables 7600 include a longitudinally folded a sheet or film of conductive material 7608 around the conductor sets 7605 to form the closest shield. The ends 7602 of the longitudinally folded shield film 7606 may be overlapped and/or the ends of the shield film may be sealed with a seam. Cables having longitudinally folded closest shields may be overwrapped with one or more auxiliary shields 7609 prevent the overlapped edges and/or the seam from separating when the cable is bent. The longitudinal folding may mitigate the signal attenuation due to resonance by avoiding the periodicity of the shield gaps caused by helically wrapping the shield, however the overwrapping to prevent shield separation increases the shield stiffness.

Cables with cover portions that substantially surround the conductor sets and pinched portions located on each side of the conductor set as described herein do not rely on a helically wrapped closest shield to electrically isolate the conductor sets and do not rely on a closest shield that is longitudinally folded around the conductor sets to electrically isolate the conductors sets. Helically wrapped and/or longitudinally folded shields may or may not be employed as auxiliary shields external to the cables described.

Cross talk is caused by the unwanted influence of magnetic fields generated by nearby electrical signals. Crosstalk (near and far-end) is a consideration for signal integrity in cable assemblies. Near end cross talk is measured at the transmitting end of the cable. Far end cross talk is measured at the receiving end of the cable. Crosstalk is noise that arises in a victim signal from unwanted coupling from an aggressor signal. Close spacing between the signal lines in the cable and/or in the termination area can be susceptible to crosstalk. The cables and connectors described herein approaches to reduce crosstalk. For example, crosstalk in the cable can be reduced if the concentric portions, transition portions, and/or pinched portions of the shielding films in combination form as complete a shield surrounding the conductor sets as possible. In the cable, cross talk is reduced if there any gaps between the shields, then making that gap have as high an aspect ratio as possible and/or by using low impedance or direct electrical contact between the shields. For example, the shields may be in direct contact, in connected through drain wires, and/or connected through a conductive adhesive, for example. At electrical contact sites between the conductors of the cable and the terminations of a connector, crosstalk can be reduced by increasing the separation between the contact points, thus reducing the inductive and capacitive coupling.

Figure 47:
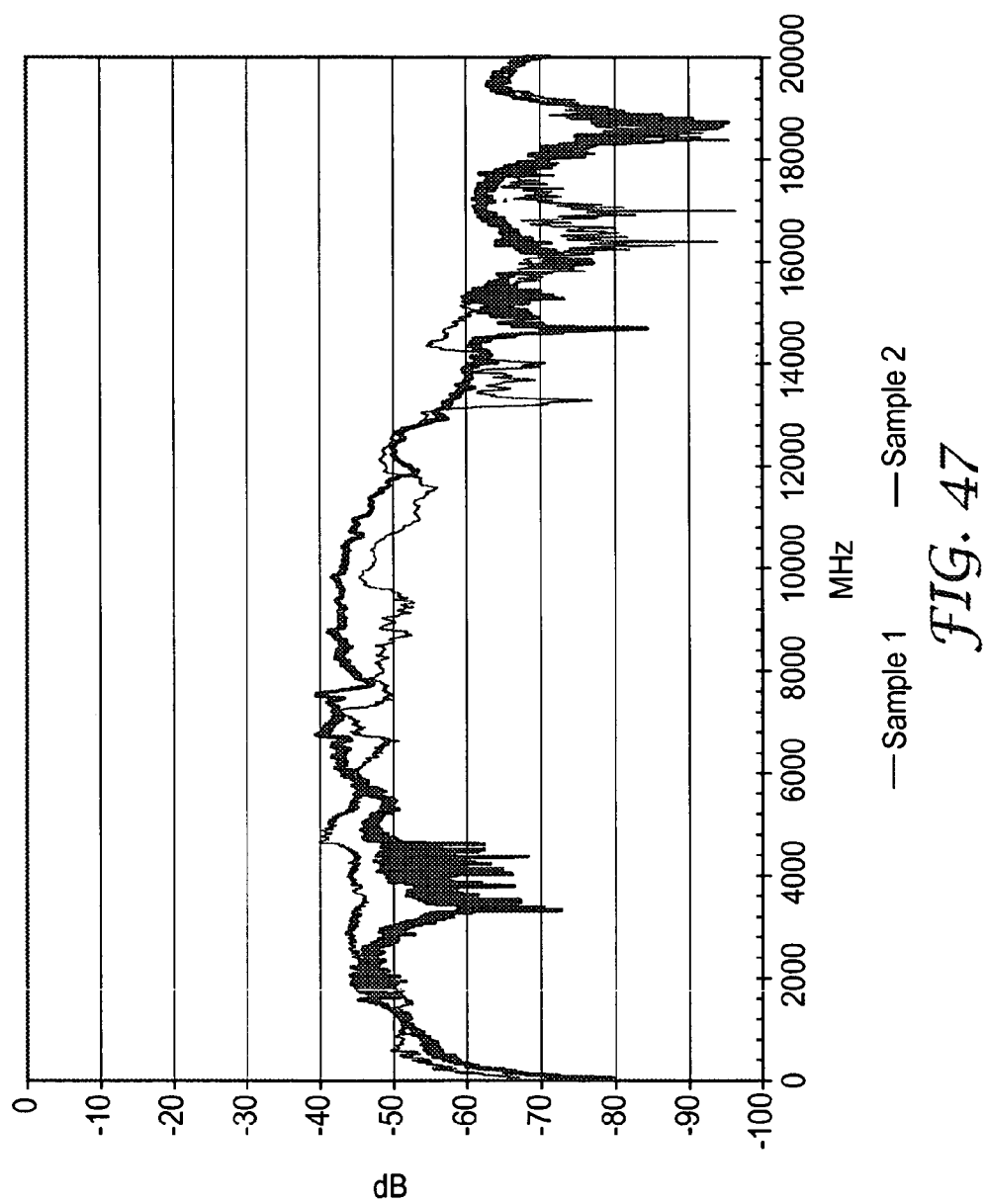
FIG. 47 is a graph comparing the electrical isolation performance of two sample cables.

FIG. 47 illustrates the far end crosstalk (FEXT) isolation between two adjacent conductor sets of a conventional electrical cable wherein the conductor sets are completely isolated, i.e., have no common ground (Sample 1), and between two adjacent conductor sets of shielded electrical cable 2202 illustrated in FIG. 15*a* wherein shielding films 2208 are spaced apart by about 0.025 mm (Sample 2), both having a cable length of about 3 m. The test method for creating this data is well known in the art. The data was generated using an Agilent 8720ES 50 MHz-20 GHz S-Parameter Network Analyzer. It can be seen by comparing the far end crosstalk plots that the conventional electrical cable and shielded electrical cable 2202 provide a similar far end crosstalk performance. Specifically, it is generally accepted that a far end crosstalk of less than about −35 dB is suitable for most applications. It can be easily seen from FIG. 47 that for the configuration tested, both the conventional electrical cable and shielded electrical cable 2202 provide satisfactory electrical isolation performance. The satisfactory electrical isolation performance in combination with the increased strength of the parallel portion due to the ability to space apart the shielding films is an advantage of a shielded electrical cable according to an aspect of the present invention over conventional electrical cables.

Propagation delay and skew are additional electrical characteristics of electrical cables. Propagation delay depends on the velocity factor of the cable and is the amount of time that it takes for a signal to travel from one end of the cable to the opposite end of the cable. The propagation delay of the cable may be an important consideration in system timing analysis. relative to an adjacent conductor set.

The high frequency isolation of the first insulated conductor relative to the second conductor is a first far end crosstalk C1 at a specified frequency range of about 5, to about 15 GHz and a length of 1 meter. The high frequency isolation of the first conductor set relative to the adjacent conductor set is a second far end crosstalk C2 at the specified frequency. C2 can be at least 10 dB lower than C1.

The difference in propagation delay between two or more conductors in a cable is referred to as skew. Low skew is generally desirable between conductors of a cable used in single ended circuit arrangements and between conductors used as a differential pair. Skew between multiple conductors of a cable used in single ended circuit arrangements can affect overall system timing. Skew between two conductors used in a differential pair circuit arrangement is also a consideration. For example, conductors of a differential pair that have different lengths (or different velocity factors) can result in skew between the signals of the differential pairs. Differential pair skew may increase insertion loss, impedance mismatch, and/or crosstalk, and/or can result in a higher bit error rate and jitter. Skew produces conversion of the differential signal to a common mode signal that can be reflected back to the source, reduces the transmitted signal strength, creates electromagnetic radiation, and can dramatically increase the bit error rate, in particular jitter. Ideally, a pair of transmission lines will have no skew, but, depending on the intended application, a differential S-parameter SCD21 or SCD12 value (representing the differential-to common mode conversion from one end of the transmission line to the other) of less than −25 to −30 dB up to a frequency of interest, such as, e.g., 6 GHz, may be acceptable.

Skew of a cable can be expressed as a difference in propagation delay per meter for the conductors in a cable per unit length. Intrapair skew is the skew within a twinaxial pair and interpair skew is the skew between two pairs. There is also skew for two single coax or other even unshielded wires. Shielded electrical cables described herein may achieve skew values of less than about 20 picoseconds/meter (psec/m) or less than about 10 psec/m at data rates up to about 10 Gbps.

Jitter is a complex characteristic that involves skews, reflections, pattern dependent interference, propagation delays, and coupled noise that reduce signal quality. Some standards have defined jitter as the time deviation between a controlled signal edge from its nominal value. In digital signals, jitter may be considered as the portion of a signal when switching from one logic state to another logic state that the digital state is indeterminate. The eye pattern is a useful tool for measuring overall signal quality because it includes the effects of systemic and random distortions. The eye pattern can be used to measure jitter at the differential voltage zero crossing during the logic state transition. Typically, jitter measurements are given in units of time or as a percentage of a unit interval. The "openness" of the eye reflects the level of attenuation, jitter, noise, and crosstalk present in the signal.

Electrical specifications for 4 cable types tested are provided in Table 1. Two of the tested cables, Sn1, Sn2, include sidebands, e.g., low frequency signal cables. Two of the cables tested, Sn2, Ag2 did not include sidebands.

TABLE 1

Insertion loss and skew for four types of shielded electrical cable

| Cable | Configuration | Insertion loss (@ 5 GHz) | Skew |
|---|---|---|---|
| Sn1 | 4 signal pairs, 2 outside grounds, 4 sidebands Sn plated, 30 AWG, Polyolefin dielectric | −4 dB/m | <10 ps/m (picoseconds/ meter) |
| Ag1 | 4 signal pairs, 2 outside grounds 4 sidebands Ag plated, 30 AWG, Polyolefin dielectric | −3 dB/m | <10 ps/m |
| Sn2 | 4 signal pairs, 2 outside grounds No sideband Ag plated, 30 AWG, Polyolefin dielectric | −4 dB/m | <10 ps/m |
| Ag1 | 4 signal pairs, 2 outside grounds 4 sidebands Ag plated, 30 AWG, Polyolefin dielectric | −3 dB/m | <10 ps/m |

As previously discussed helically wrapped shields, longitudinally folded shields, and/or overwrapped shields can undesirably increase cable stiffness. Some of the cable configurations described herein, such as the cable configuration shown in FIG. 43 can provide similar or better insertion loss characteristics to cables having helically wrapped, longitudinally folded and/or overwrapped shields but also provide reduced stiffness.

The stiffness of a cable is characterizable as an amount of force needed to deflect the cable by a distance. In reference now to FIG. 48, a block diagram illustrates a test setup 7800 for measuring deflection of a cable 7801 according to an example embodiment of the invention. In this setup, the cable 7801 is initially laid flat across roller-type supports 7802 as indicated by dashed lines. The supports 7802 prevent downward motion, but otherwise allow free movement of the cable in a side-to-side direction. This may be analogous to the constraint of a simply supported beam, e.g., a beam that has hinged connection at one end and roller connection in other end.

Figure 48:
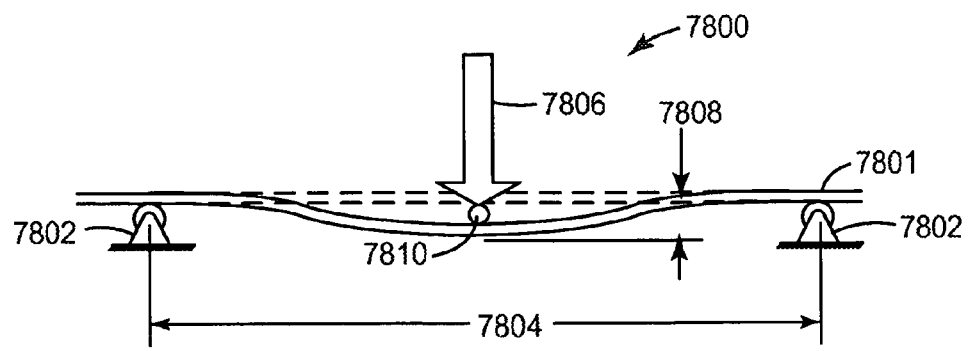
FIG. 48 is a block diagram illustrating an example test setup for measuring force versus deflection of a cable.

The supports 7802 in this test setup were 2.0 inch diameter cylinders separated by a constant distance 7804 of 5.0 inches between the top sides of the cylinders (e.g., 12 o'clock position when viewed from the perspective seen in FIG. 48). A force 7806 is applied to the cable 7801 via a force actuator 7810 at a point equidistant between supports 7804, and deflection 7808 is measured. The force actuator 7810 is a 0.375 inch diameter cylinder, driven at a 5.0 inches per minute crosshead speed.

Figure 49:
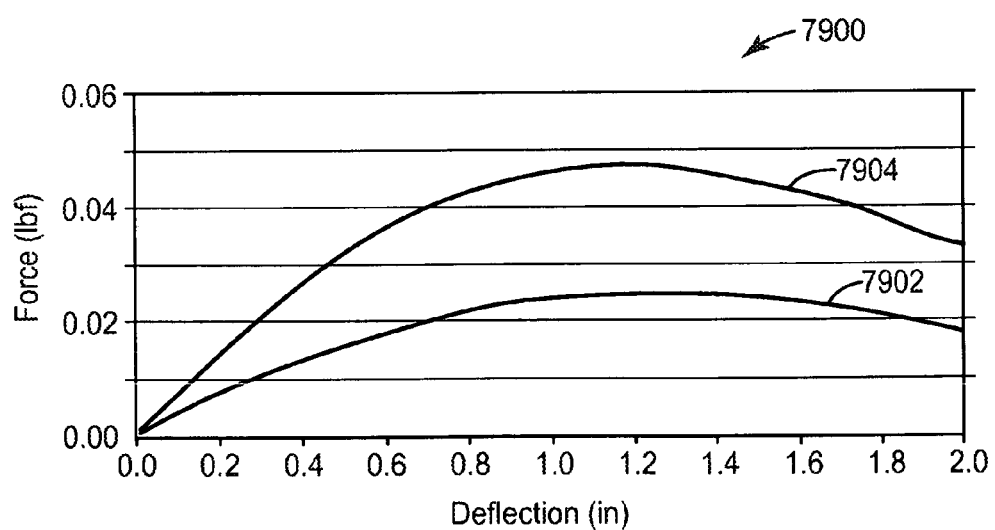
FIGS. 49 and 50 are graphs showing results of example force-deflection tests for cables.

Results of a first test using setup 7800 for cables disclosed herein are shown in graph 7900 of FIG. 49 Curve 7902 represents force-deflection results for a ribbon cable (e.g., similar to the configuration of FIG. 43) with two solid 30 AWG conductors, solid polyolefin insulation, and two 32 AWG drain wires. The maximum force is approximately 0.025 lbs, and occurs at approximately 1.2 inches of deflection. By way of a rough comparison, curve 7904 was measured for a wrapped twinax cable having two 30 AWG wires, and two 30 AWG drain wires. This curve has maximum force of around 0.048 lbs at a deflection of 1.2 inches. All things being equal, it would be expected that the twinax cable would be slightly stiffer due to the thicker (30 AWG vs. 32 AWG) drain wires used, however this would not explain the significant difference between curves 7902 and 7904. Generally, it is expected that the application of the force of 0.03 lbf on the cable represented by curve 7902 midpoint between the supporting points causes the deflection in the direction of the force of at least 1 inch. It should be apparent that the cable represented by curve 7904 would deflect about half that much.

Figure 50:
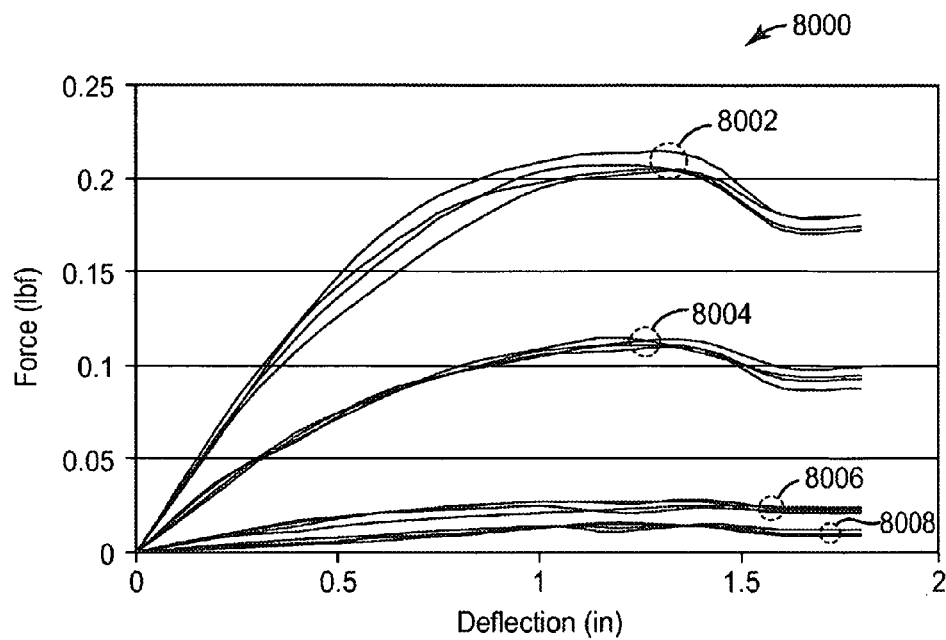

In FIG. 50, a graph 8000 includes results of a subsequent test of cables according to example embodiments of the invention using the force deflection setup of FIG. 48. For each of four wire gauges (24, 26, 30, and 32 AWG), four, cables were constructed, each having exactly two solid wire conductors of the respective gauges. The cables had polypropylene insulation with shielding on both sides, and no drain wires. The force was measured for every 0.2 inches of deflection. Table 2 below summarizes the results at the maximum force points 8002, 8004, 8006, 8008, which respectively correspond to the results for the sets of cables with respective conductor gauge sizes of 24, 26, 30, and 32 AWG. The fifth and sixth columns of Table 2 correspond to the respective highest and lowest maximum forces of the four cables tested within each gauge group.

TABLE 2

Force-deflection results for shielded ribbon cables with one conductor pair

| Conductor gauge (AWG) | Deflection at maximum force (in.) | Average maximum force (lbf) | Standard deviation (lbf) | Max force (lbf) | Min force (lbf) |
|---|---|---|---|---|---|
| 24 | 1.2 | 0.207 | 0.005 | 0.214 | 0.202 |
| 26 | 1.2 | 0.111 | 0.003 | 0.114 | 0.108 |
| 30 | 1.4 | 0.0261 | 0.002 | 0.0284 | 0.0241 |
| 32 | 1.4 | 0.0140 | 0.0006 | 0.0149 | 0.0137 |

Figure 51:
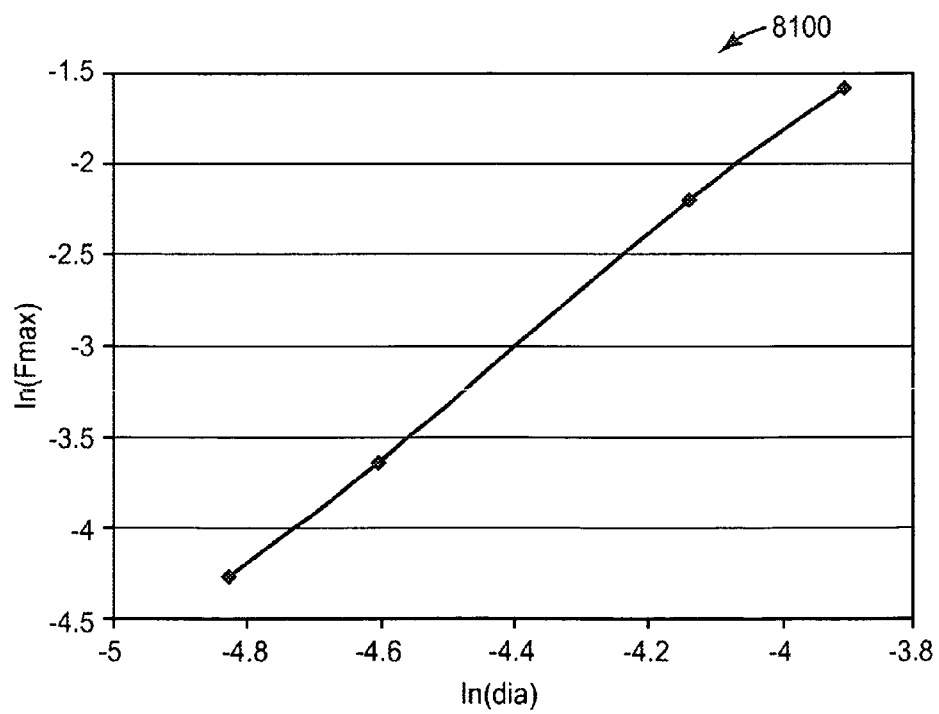
FIG. 51 is a logarithmic graph summarizing average values of force-deflection tests for example cables.

For the data in Table 2, it is possible to perform a linear regression of the form y=mx+b on the logarithms of conductor diameters versus the logarithms of maximum deflection force. The natural logarithms (ln) of the forces in the third column of Table 2 are plotted versus natural logarithms of the respective diameters in graph 8100 of FIG. 51. The diameters of 24, 26, 30, and 32 AWG wires are 0.0201, 0.0159, 0.010, and 0.008, respectively. A least squares linear regression of the curve in graph 8100 results in the following fit: $\ln(F_{max})=2.96*\ln(dia)+10.0$. By solving for $F_{max}$ and rounding to two significant figures, the following empirical result is obtained:

$$F_{max}=M*dia^3, \text{ where } M=22{,}000 \text{ lbf/in}^3 \quad [1]$$

Equation [1] predicts that a similar cable made using two 28 AWG conductors (diameter=0.0126) would bend at a maximum force of 22,000*0.01263=0.044 lbf. Such a result is reasonable in view of the results for other gauges shown in FIG. 49. Further, Equation [1] may be modified to express the individual maximum force ($F_{max\text{-}single}$) for each single insulated conductor as follows:

$$F_{max\text{-}single} = M * dia^3, \text{ where } M = 11{,}000 \text{ lbf/in}^3 \quad [2]$$

The individual forces calculated from [2] for each insulated conductor (and drain wires or other non-insulated conductors) may be combined to obtain a collective maximum bending force for a give cable. For example, a combination of two 30 AWG and two 32 AWG wires would be expected to have a maximum bending resistance force of 0.0261+0.014=0.0301 lbf. This is higher than the 0.025 lbf value seen in curve 1802 of FIG. 18 for the tested cable that had a combination of 30 AWG insulated wires and 32 AWG drain wires. However, such a difference may be expected. The drain wires in the tested cable are not insulated, thereby making the tested cable more flexible than the theoretical case. Generally, the results of Equations [1] and [2] are expected to return a high-end limit of bending forces, which would still be more flexible than a conventional wrapped cable. By way of comparison, using Equation [2] for four 30 AWG wires, the maximum force would be 4*11,000*0.01=0.044 lbf, which is below what is seen with the conventional wrapped cable test curve 7804 in FIG. 48. If the drain wires in the wrapped cable were insulated (which was not the case) the curve 7804 would be expected exhibit an even higher maximum force.

A number of other factors could alter the results predicted by Equations [1] and [2], including the type of wire insulation (polyethylene and foamed insulation would likely be less stiff, and fluoropolymer insulation more stiff), the type of wire (stranded wires would be less stiff), etc. Nonetheless, Equations [1] and [2] may provide a reasonable estimate of maximum bending forces for a given cable assembly, and present ribbon cable constructions exhibiting such properties should be measurably more flexible than equivalent wrapped constructions.

Item 1 is a shielded electrical cable, comprising:
one or more conductor sets extending along a length of the cable and being spaced apart from each other along a width of the cable, each conductor set having one or more conductors having a size no greater than 24 AWG and each conductor set having an insertion loss of less than −20 dB/meter over a frequency range of 0 to 20 GHz; and
first and second shielding films disposed on opposite sides of the cable, the first and second films including cover portions and pinched portions arranged such that, in transverse cross section, the cover portions of the first and second films in combination substantially surround each conductor set, and the pinched portions of the first and second films in combination form pinched portions of the cable on each side of each conductor, wherein a maximum separation between the first cover portions of the first and second shielding films is D, a minimum separation between the first pinched portions of the first and second shielding films is $d_1$, and $d_1/D$ is less than about 0.25.

Item 2 is the cable of item 1, wherein the conductor set comprises two conductors in a twinaxial arrangement and the insertion loss due to resonance of the conductor set is about zero.

Item 3 is the cable of item 1, wherein the conductor set comprises two conductors in a twinaxial arrangement, and a nominal insertion loss without insertion loss due to resonance is about 0.5 times the insertion loss due to resonance of the conductor set.

Item 4 is the cable of item 1, further comprising an adhesive layer disposed between the pinched portions of the shielding films.

Item 5 is the cable of item 1, wherein the insertion loss of each conductor set is less than about −5 dB per meter.

Item 6 is the cable of item 1, wherein the insertion loss of each conductor set is less than about −4 dB per meter.

Item 7 is the cable of item 1, wherein the insertion loss of each conductor set is less than about −3 dB/meter.

Item 8 is the cable of item 1, wherein the cable has a skew of less than about 20 psec/meter at data transfer speeds of up to about 10 Gbps.

Item 9 is the cable of item 1, wherein the cable has a skew of less than about 10 psec/meter at data transfer speeds of up to about 10 Gbps.

Item 10 is the cable of item 1, wherein a characteristic impedance of the cable remains within 5-10% of a target characteristic impedance over a cable length of about 1 meter.

Item 11 is the cable of item 1, wherein the one or more conductor sets comprise a first conductor set and a second conductor set, each conductor set having a first insulated conductor and a second insulated conductor and a high frequency electrical isolation of the first insulated conductor relative to the second insulated conductor in each conductor set is substantially less than a high frequency electrical isolation of the first conductor set relative to an adjacent conductor set.

Item 1 is the cable of item 1, wherein the high frequency isolation of the first insulated conductor relative to the second conductor is a first far end crosstalk C1 at a specified frequency range of 3-15 GHz and a length of 1 meter, and the high frequency isolation of the first conductor set relative to the adjacent conductor set is a second far end crosstalk C2 at the specified frequency, and wherein C2 is at least 10 dB lower than C1.

Item 13 is the cable of item 1, wherein $d_1/D$ is less than 0.1.

Item 14 is a shielded electrical cable, comprising:
a plurality of conductor sets extending along a length of the cable and being spaced apart from each other along a width of the cable, each conductor set having two conductors having a size no greater than 24 AWG and each conductor set having a signal attenuation of less than −20 dB/meter over a frequency range of 0 to 20 GHz; at least one drain wire; and
first and second shielding films disposed on opposite sides of the cable, the first and second shielding films including cover portions and pinched portions arranged such that, in transverse cross section, the cover portions of the first and second films, in combination, substantially surround each conductor set, and the pinched portions of the first and second films, in combination, form pinched portions of the cable on each side of each conductor set, wherein, for at least one conductor set, a separation between the drain wire and a closest conductor of the conductor set is greater than 0.5 times a center to center spacing between the two conductors of the conductor set.

Item 15 is the cable of item 14, wherein the insertion loss of each conductor set is less than about −5 dB per meter or less than about −4 dB per meter, or less than about −3 dB per meter.

Item 16 is the cable of item 14, wherein the cable has a skew of less than about 20 psec/meter or less than about 10 psec/meter at data transfer speeds up to about 10 Gbps.

Item 17 is the cable of item 14, wherein a characteristic impedance of the cable remains within 5-10% of a target characteristic impedance over a cable length of 1 meter.

Item 18 is a shielded electrical cable, comprising:
a plurality of conductor sets extending along a length of the cable and being spaced apart from each other along a width of the cable, each conductor sets having two conductors arranged in a twinaxial configuration, each of the conductors having a size no greater than 24 AWG; and
first and second shielding films disposed on opposite sides of the cable, neither shielding film comprising a longitudinal fold that orients the shielding film to cover the conductor sets on both sides of the cable, wherein each conductor set has an insertion loss of less than −20 dB/meter over a frequency range of 0 to 20 GHz and an insertion loss due to resonance of the conductor set is about zero.

Item 19 is the cable of item 18, further comprising at least one drain wire, wherein the first and second shielding films include cover portions and pinched portions arranged such that, in transverse cross section, the cover portions of the first and second films, in combination, substantially surround each conductor set, and the pinched portions of the first and second films, in combination, form pinched portions of the cable on each side of each conductor set, wherein, for at least one conductor set, a separation between the drain wire and a closest conductor of the conductor set is greater than 0.5 times a center to center spacing between the two conductors of the conductor set.

Item 20 is the cable of item 18, wherein the insertion loss of each conductor set is less than about −5 dB per meter or less than about −4 dB per meter, or less than about −3 dB per meter.

Item 21 is the cable of item 18, wherein the cable has a skew of less than about 20 psec/meter or less than about 10 psec/meter.

Item 22 is the cable of item 18, wherein a characteristic impedance of the cable remains within 5-10% of a target characteristic impedance over a cable length of about 1 meter.

Item 23 is a shielded electrical cable, comprising:
a plurality of conductor extending along a length of the cable and being spaced apart from each other along a width of the cable, each of the conductors sets comprising two conductors arranged in a twinaxial configuration, each conductor having a size no greater than 24 AWG; and
first and second shielding films disposed on opposite sides of the cable, neither shielding film comprising a seam that bonds the shielding film to itself, wherein each conductor set has an insertion loss of less than −20 dB/meter over a frequency range of 0 to 20 GHz and an insertion loss due to resonance loss of the conductor set is about zero.

Item 24 is the cable of item 23, further comprising at least one drain wire, wherein the first and second shielding films include cover portions and pinched portions arranged such that, in transverse cross section, the cover portions of the first and second films, in combination, substantially surround each conductor set, and the pinched portions of the first and second films, in combination, form pinched portions of the cable on each side of each conductor set, wherein, for at least one conductor set, a separation between the drain wire and a closest conductor of the conductor set is greater than 0.5 times a center to center spacing between the two conductors of the conductor set.

Item 25 is the cable of item 24, wherein a maximum separation between the first cover portions of the first and second shielding films is D, a minimum separation between the first pinched portions of the first and second shielding films is $d_1$, and $d_1/D$ is less than about 0.25.

Item 26 is the cable of item 24, wherein each shielding film, individually, surrounds less than all of a periphery of each conductor set.

The embodiments discussed in this disclosure have been illustrated and described herein for purposes of description of the preferred embodiment, it will be appreciated by those of ordinary skill in the art that a wide variety of alternate and/or equivalent implementations calculated to achieve the same purposes may be substituted for the specific embodiments shown and described without departing from the scope of the present invention. Those with skill in the mechanical, electromechanical, and electrical arts will readily appreciate that the present invention may be implemented in a very wide variety of embodiments. This application is intended to cover any adaptations or variations of the preferred embodiments discussed herein. Therefore, it is manifestly intended that this invention be limited only by the claims and the equivalents thereof.

What is claimed is:

1. A shielded electrical cable, comprising:
a plurality of conductor sets extending along a length of the cable and being spaced apart from each other along a width of the cable, each conductor set having two conductors arranged in a twinaxial configuration, each of the conductors having a size no greater than 24 AWG;
first and second shielding films disposed on opposite sides of the cable, neither shielding film comprising a longitudinal fold that orients the shielding film to cover the conductor sets on both sides of the cable, wherein the first and second shielding films include cover portions and pinched portions arranged such that, in transverse cross section, the cover portions of the first and second films, in combination, substantially surround each conductor set, and the pinched portions of the first and second films, in combination, form pinched portions of the cable on each side of each conductor set; and
a drain wire, wherein, for at least one conductor set, a separation between the drain wire and a closest conductor of the conductor set is greater than 0.5 times a center to center spacing between the two conductors of the conductor set.

2. The cable of claim 1, wherein each conductor set has an insertion loss of less than −20 dB/meter over a frequency range of 0 to 20 GHz and an insertion loss due to resonance of the conductor set is about zero.

3. A shielded electrical cable, comprising:
a plurality of conductor sets extending along a length of the cable and being spaced apart from each other along a width of the cable, each of the conductors sets comprising two conductors arranged in a twinaxial configuration, each conductor having a size no greater than 24 AWG;
first and second shielding films disposed on opposite sides of the cable, neither shielding film comprising a seam that bonds the shielding film to itself, wherein the first and second shielding films include cover portions and pinched portions arranged such that, in transverse cross section, the cover portions of the first and second films, in combination, substantially surround each conductor set, and the pinched portions of the first and second films, in combination, form pinched portions of the cable on each side of each conductor set and
a drain wire, wherein, for at least one conductor set, a separation between the drain wire and a closest conductor of the conductor set is greater than 0.5 times a center to center spacing between the two conductors of the conductor set.

4. The cable of claim 3, wherein each conductor set has an insertion loss of less than −20 dB/meter over a frequency range of 0 to 20 GHz and an insertion loss due to resonance loss of the conductor set is about zero.

* * * * *

UNITED STATES PATENT AND TRADEMARK OFFICE
CERTIFICATE OF CORRECTION

| | |
|---|---|
| PATENT NO. | : 9,119,292 B2 |
| APPLICATION NO. | : 13/520347 |
| DATED | : August 25, 2015 |
| INVENTOR(S) | : Douglas Gundel |

It is certified that error appears in the above-identified patent and that said Letters Patent is hereby corrected as shown below:

Specification

<u>Column 8</u>
Line 19, delete "Two," and insert -- Two --

<u>Column 10</u>
Line 16, delete "not around" and insert -- not twist around --

<u>Column 12</u>
Line 17, delete "shielded'electrical" and insert -- shielded electrical --

Line 44, delete "polyphenylene, sulfide," and insert -- polyphenylene sulfide, --

<u>Column 27</u>
Line 20, delete "cover'portions" and insert -- cover portions --

Line 28, delete "when," and insert -- when --

<u>Column 29</u>
Line 45, delete "they to" and insert -- they do --

<u>Column 36</u>
Line 35, delete "4646''" and insert -- 4646''' --

Line 39, delete "4646''" and insert -- 4646''' --

Line 46, delete "4746''" and insert -- 4746''' --

<u>Column 37</u>
Line 11, delete "element," and insert -- element --

Signed and Sealed this
Seventeenth Day of May, 2016

Michelle K. Lee
*Director of the United States Patent and Trademark Office*

CERTIFICATE OF CORRECTION (continued)
U.S. Pat. No. 9,119,292 B2

Specification

Column 39
Line 23, delete "provide," and insert -- provide --

Column 45
Line 5, delete "cages" and insert -- cases --

Column 46
Lines 36-37, delete "electrically," and insert -- electrically --

Column 47
Line 33, delete "E/a" and insert -- $\Sigma/\sigma$ --

Column 48
Line 13, delete "drain," and insert -- drain --

Column 49
Line 24, delete "one ore" and insert -- one or --

Column 51
Line 25, delete "was," and insert -- was --

Column 57
Lines 53-54, delete "for example;" and insert -- for example --

Column 63
Line 33, delete "and," and insert -- and --

Column 72
Line 50, delete "control," and insert -- control --

Column 76
Line 33, delete "about 5," and insert -- about 5 --

Column 78
Line 27, delete "four," and insert -- four --